(12) United States Patent
Torosyan

(10) Patent No.: US 7,532,989 B1
(45) Date of Patent: *May 12, 2009

(54) SYSTEM FOR ANALYSIS AND DESIGN OF DIRECT DIGITAL FREQUENCY SYNTHESIZERS

(75) Inventor: Arthur Torosyan, La Crescenta, CA (US)

(73) Assignee: Pentomics, Inc., Pasadena, CA (US)

( * ) Notice: Subject to any disclaimer, the term of this patent is extended or adjusted under 35 U.S.C. 154(b) by 535 days.

This patent is subject to a terminal disclaimer.

(21) Appl. No.: 10/778,794

(22) Filed: Feb. 13, 2004

Related U.S. Application Data

(60) Provisional application No. 60/447,103, filed on Feb. 13, 2003.

(51) Int. Cl.
*H03B 21/00* (2006.01)
*G01R 13/00* (2006.01)
*G06F 19/00* (2006.01)

(52) U.S. Cl. .................................. 702/66; 327/108
(58) Field of Classification Search .................... 702/66
See application file for complete search history.

(56) References Cited

U.S. PATENT DOCUMENTS 5,128,623 A * 7/1992 Gilmore ..................... 327/107
5,521,533 A * 5/1996 Swanke ..................... 327/107
5,598,440 A * 1/1997 Domagala .................. 375/329
6,785,345 B2 * 8/2004 Blazo ....................... 375/326

OTHER PUBLICATIONS

Torosyan, "Analysis of the output spectrum for direct digital frequency synthesizers in the presence of phase truncation and finite arithmetic precision", Jun. 2001, IEEE, pp. 458-463.*
Crawford, "Frequency Synthesizer Design Handbook", 1994, Library of Congress Cataloging-in-Publication Data, pp. 308-335.*
Analog Devices, "The Effect of Truncating the Phase Accumulator on Spurious Performance", 1999, Analog Devices, Inc., pp. 19-26.*
W. F. Egan, Frequency Synthesis by Phase Lock. New York: Wiley, 1981, pp. 22-25 and 29-49.
A. Rofougaran et al, "A single-chip 900-MHz spread-spectrum wireless transceiver in I-mm CMOS—Part I: Architecture and transmitter design," IEEE Journal of Solid-State Circuits, vol. 33, pp. 515-534, Apr. 1998.
P. H. Saul and D. G. Taylor, "A high-speed digital frequency synthesizer," IEEE Journal of Solid-State Circuits, vol. 25, pp. 215-220, Feb. 1990.

(Continued)

*Primary Examiner*—Michael P. Nghiem
*Assistant Examiner*—Cindy H Khuu
(74) *Attorney, Agent, or Firm*—Law Offices of Donald Cox, LLC

(57) ABSTRACT

The present invention is embodied in a system for the analysis and design of direct digital synthesizers including a windowing engine, and a method that enables the analysis of DDS output spectra in the presence of phase truncation and arbitrary approximations and errors in the implementation of the sine/cosine mapping function (SCMF) without the need to approximate the DDS characteristics.

26 Claims, 91 Drawing Sheets

OTHER PUBLICATIONS

E. M. Mattison and L. M. Coyle, "Phase noise in direct digital synthesizers," in Proceeding of he 42nd Annual Frequency Control Symposium, 1998, pp. 352-356.

M. Kanazawa et al. "Beam test of the acceleration system with the DDS in HIMAC synchrotron," in Proceedings of the 1997 Particle Accelerator Conference, 1997, vol. 2, pp. 2347-2349.

L. Callegaro and V. D'Elia, "A synchronized two-phase sinewave generator for AC metrology system compensations," IEEE Transactions on Instrumentation and Measurement, vol. 49, pp. 320-324, Apr. 2000.

S. Twelves and C. J. Kikkert, "Performance of digital stereo FM modulator with reduced output resolution," IEEE Transactions on Broadcasting, vol. 43, pp. 104-113, Mar. 1997.

R. Giannini, S. Tonkovic, and V. Kozina, "A DSP based method for audio stimuli generation," in Proceedings of the 19th Annual International Conference of the IEEE Engineering in Medicine and Biology Society, 1997, vol. 5, pp. 1974-1977.

J. G. Proakis, Digital Communications, 4th Ed. New York: McGraw-Hill, 2001, pp. 169-171.

J. Tierney, C. M. Rader, and B. Gold, "A digital frequency synthesizer," IEEE Transactions on Audio Electroacoustics, vol. AU-19, pp. 48-57, Mar. 1971.

A. Madisetti, A. Kwentus, and A. N. Willson, Jr., "A 100-MHz 16-b, direct digital frequency synthesizer with a 100-dBc spurious-free dynamic range," IEEE Journal of Solid-State Circuits, vol. 34, pp. 1034-1043, Aug. 1999.

D. A. Sunderland, R. A. Strauch, S. S. Wharfield, H.T. Paterson, and C. R. Cole, "CMOS/SOS frequency synthesizer LSI circuit for spread spectrum communications," IEEE Journal of Solid-State Circuits, vol. 19, pp. 497-505, Aug. 1984.

A. Bellaouar, M. S. O'brecht, A. M. Fahim, and M. I. Elmasry, "Low-power direct digital frequency synthesis for wireless communications," IEEE Journal of Solid-State Circuits, vol. 35, pp. 385-390, Mar. 2000.

A. I. Abu-El-Haija, and M. M. Al-Ibrahim, "Digital oscillators having low sensitivity and roundoff errors," IEEE Transactions on Aerospace and Electronic Systems, vol. AES-22, pp. 23-32, Jan. 1986.

N. J. Fliege and J. Wintermantel, "Complex digital oscillators and FSM modulators," IEEE Transactions on Communications, vol. SP-40, pp. 333-342, Feb. 1992.

J. G. Proakis and D. G. Manolakis, Digital Signal Processing, 3rd Ed. Upper Saddle River, NJ: Prentice Hall, 1996, pp. 247, 394-425 and 590-591.

A. Torosyan, D. Fu, and A. N. Willson, Jr., "A 300-MHz quadrature direct digital synthesizer/mixer in 0.25-mm CMOS," in IEEE International Solid-State Circuits Conference Digest of Technical Papers, vol. 45, Feb. 2002, pp. 132-133.

L. K. Tan and H. Samueli, "A 200-MHz quadrature frequency synthesizer/mixer in 0.8-mm CMOS," IEEE Journal of Solid-State Circuits, vol. 30, pp. 193-200, Mar. 1995.

S. Mehrgardt, "Noise spectra of digital sine-generators using the table-lookup method," IEEE Transactions on Acoustics, Speech, and Signal Processing, vol. 31, pp. 1037-1039, Aug. 1983.

H. T. Nicholas, The Determination of the Output Spectrum of Direct Digital Frequency Synthesizers in the Presence of Phase Accumulator Truncation, M.S. thesis, University of California, Los Angeles, 1985.

H. T. Nicholas and H. Samueli, "An analysis of the output spectrum of direct digital frequency synthesizers in the presence phase-accumulator truncation," in Proceedings of the 41st Annual Frequency Control Symposium, 1987, pp. 495-502.

Y. C. Jenq, "Digital spectra of nonuniformly sampled signals—digital look-up tunable sinusoidal oscillators," IEEE Transactions on Instrumentation and Measurement, vol. 37, pp. 358-362, Sep. 1988.

V. F. Kroupa, "Discrete spurious signals and background noise in direct digital frequency synthesizers," in Proceedings of IEEE International Frequency Control Symposium, 1993, pp. 242-250.

P. P. Vaidyanathan, Multirate Systems and Filter Banks. Englewood Cliffs, NJ: Prentice Hall, 1993, pp. 179-180.

S. C. Kak and N. S. Jayant, "On speech encryption using waveform scrambling," Bell System technical Journal, vol. 56, pp. 781-808, May-Jun. 1977.

D. L. Duttweiler and D. G. Messerschmitt, "Analysis of digitally generated sinusoids with application to A/D and D/A converter testing," IEEE Transactions on Communications, vol. COM-26, pp. 669-675, May 1978.

C. H. Edwards, Jr. and D. E. Penney, Calculus and Analytic Geometry, 3rd Ed. Englewood Cliffs, NJ: Prentice Hall, 1990, pp. 499-501.

J. Vankka, "Methods of mapping from phase to sine amplitude in direct digital synthesis," in IEEE International Frequency Control Symposium, 1996, pp. 942-950.

A. Torosyan, D. Fu, and A. N. Willson, Jr., "A 300-MHz quadrature direct digital synthesizer/mixer in 0.25-mm CMOS," in IEEE Journal of Solid-State Circuits, vol. 38, pp. 875-887, Jun. 2003.

A. Torosyan and A. N. Willson, Jr., "Analysis of the output spectrum for direct digital frequency synthesizers in the presence of phase truncation and finite arithmetic precision," in Proc. 2nd Image and Signal Processing and Analysis Conf., 2001, pp. 458-463.

* cited by examiner $$S_1 = \boxed{\phantom{W}W\phantom{W}} \boxed{s_1} \quad S_2 = \boxed{\phantom{W}W\phantom{W}} \boxed{s_2}$$

$$W(u,m) = \qquad\qquad W(u,m) =$$
$$e^{-j\frac{2\pi}{2^L}um} \qquad\qquad e^{-j\frac{2\pi}{2^L}um}$$
$$\underbrace{\phantom{xxxxxxxx}}_{2^L} \qquad\qquad \underbrace{\phantom{xxxxxxxx}}_{2^L}$$

FIG. 10

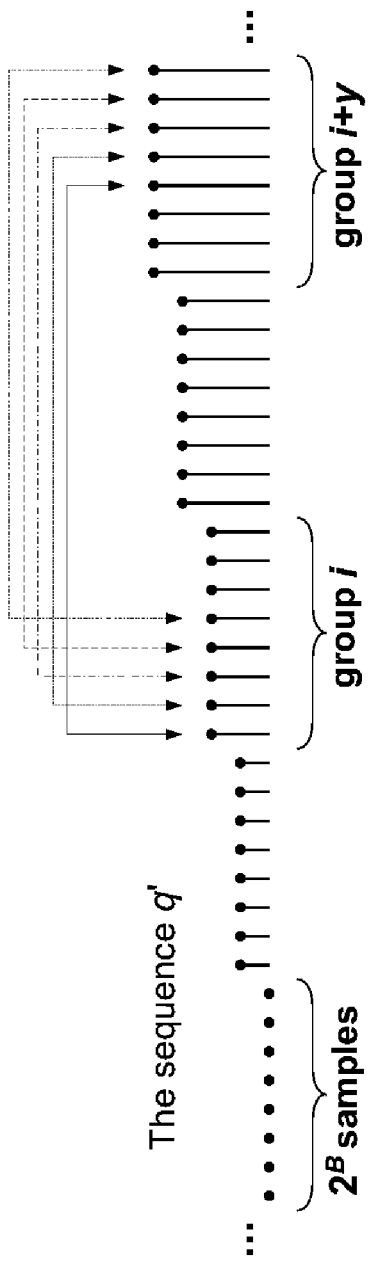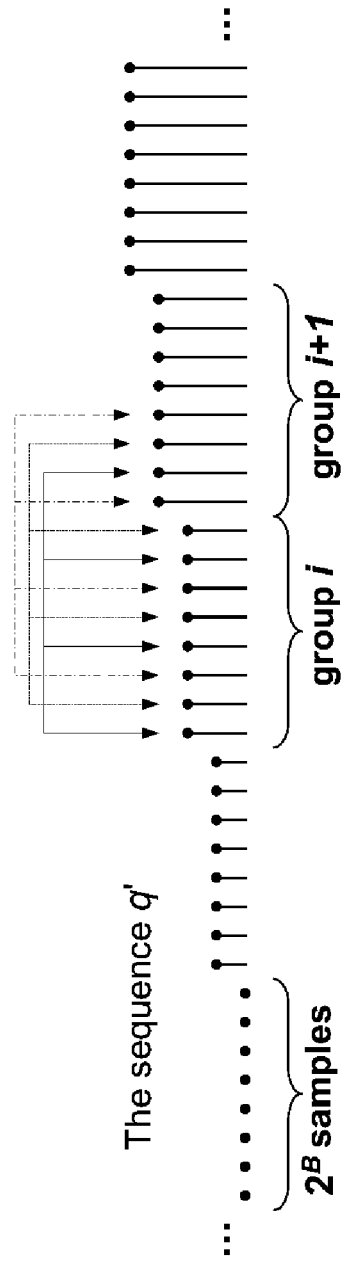
FIG. 14A
FIG. 14B

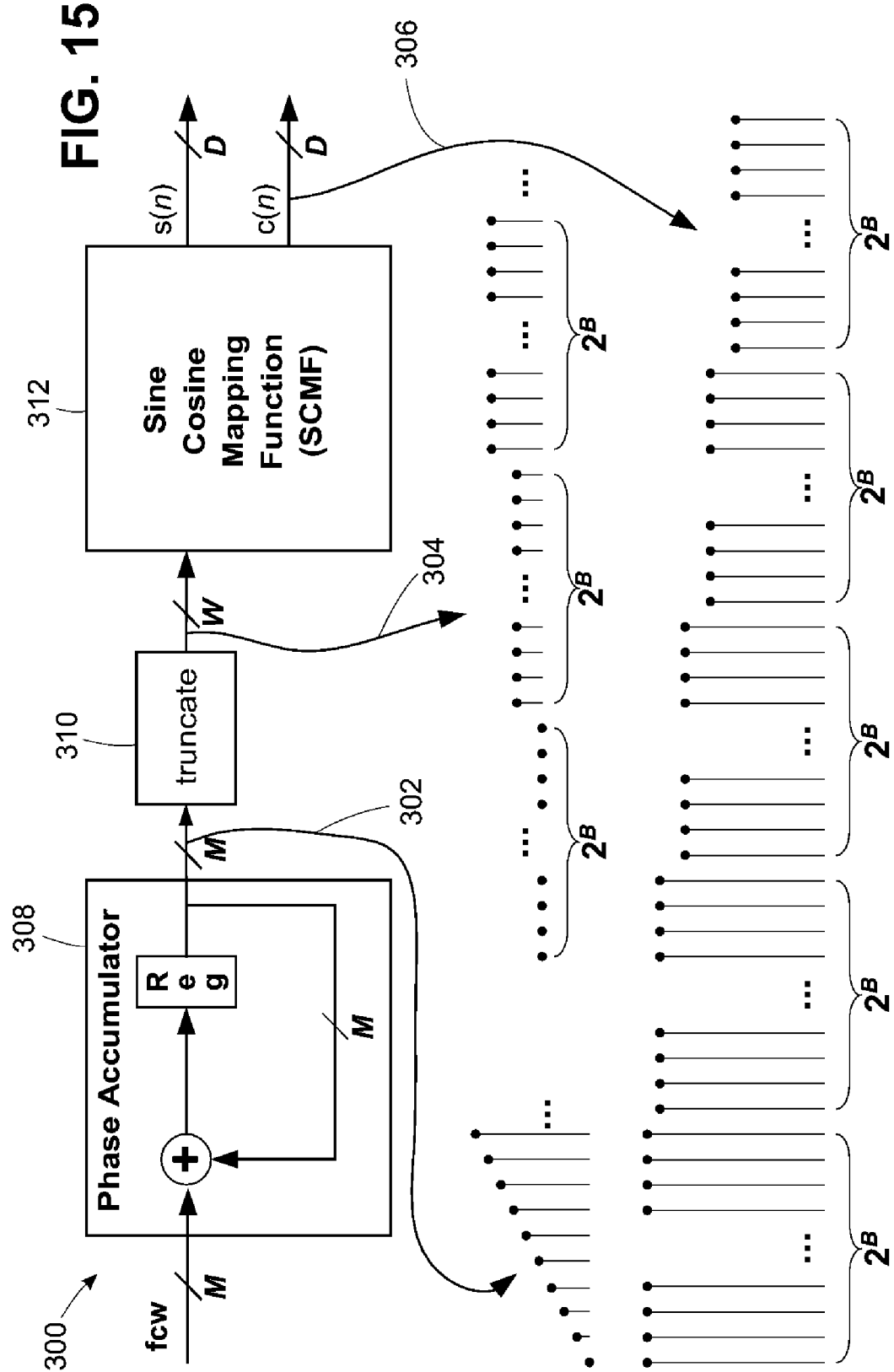

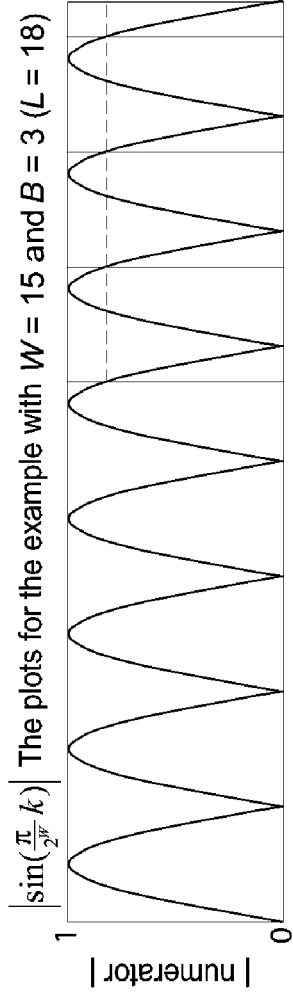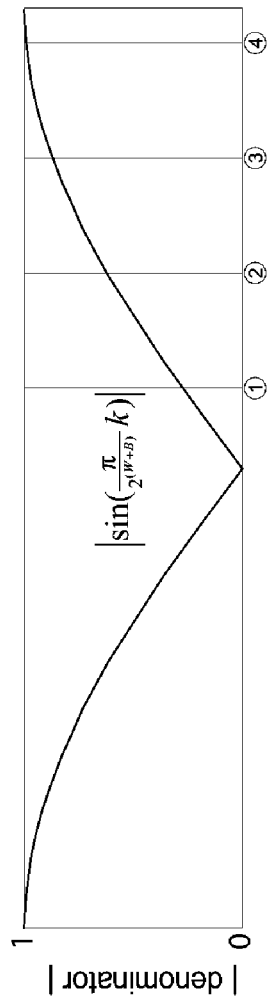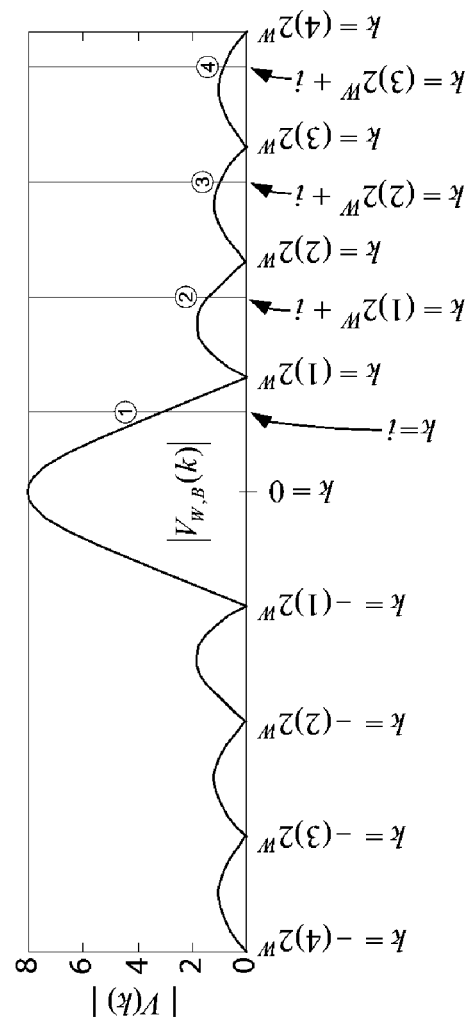
FIG. 23

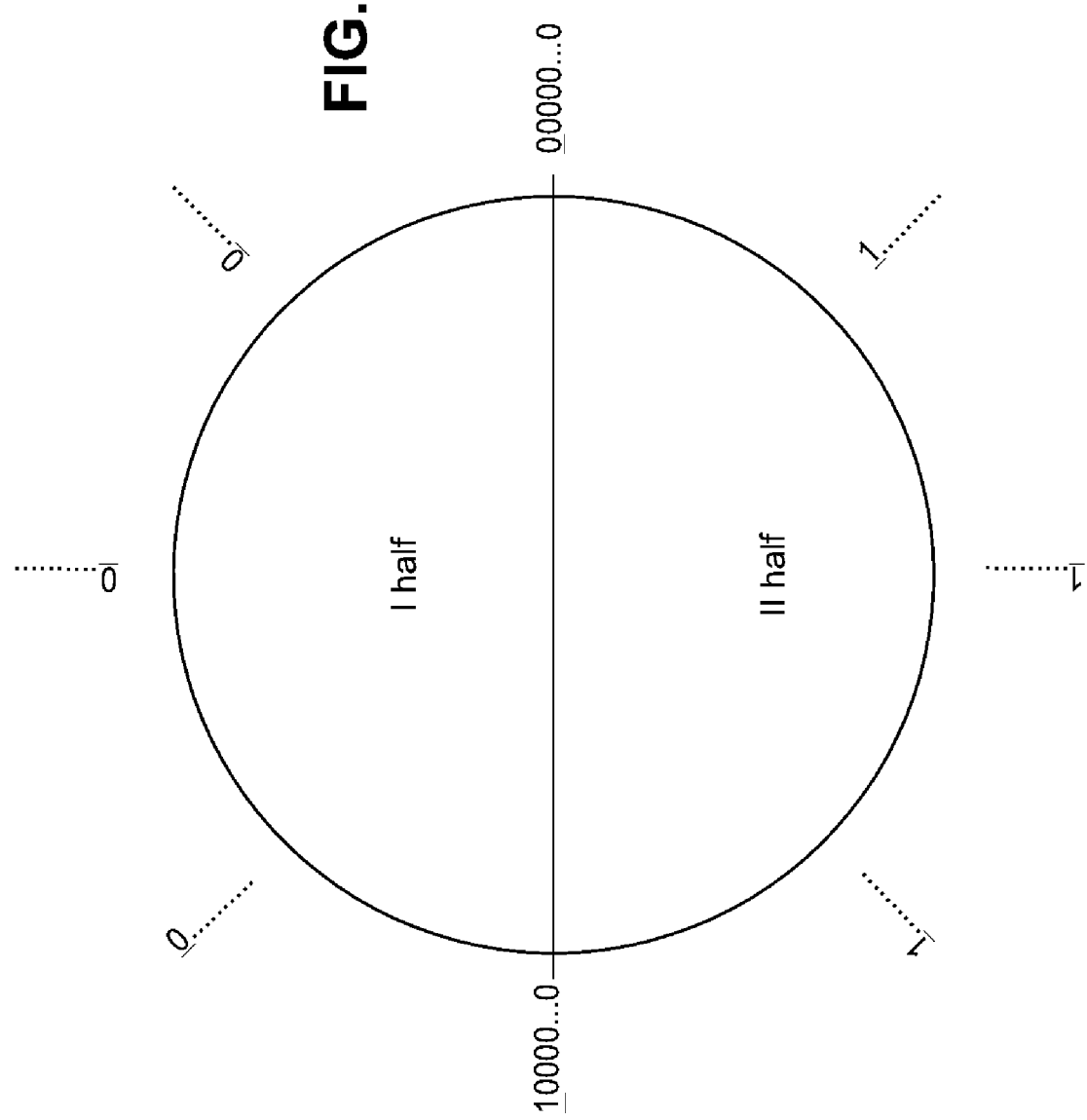

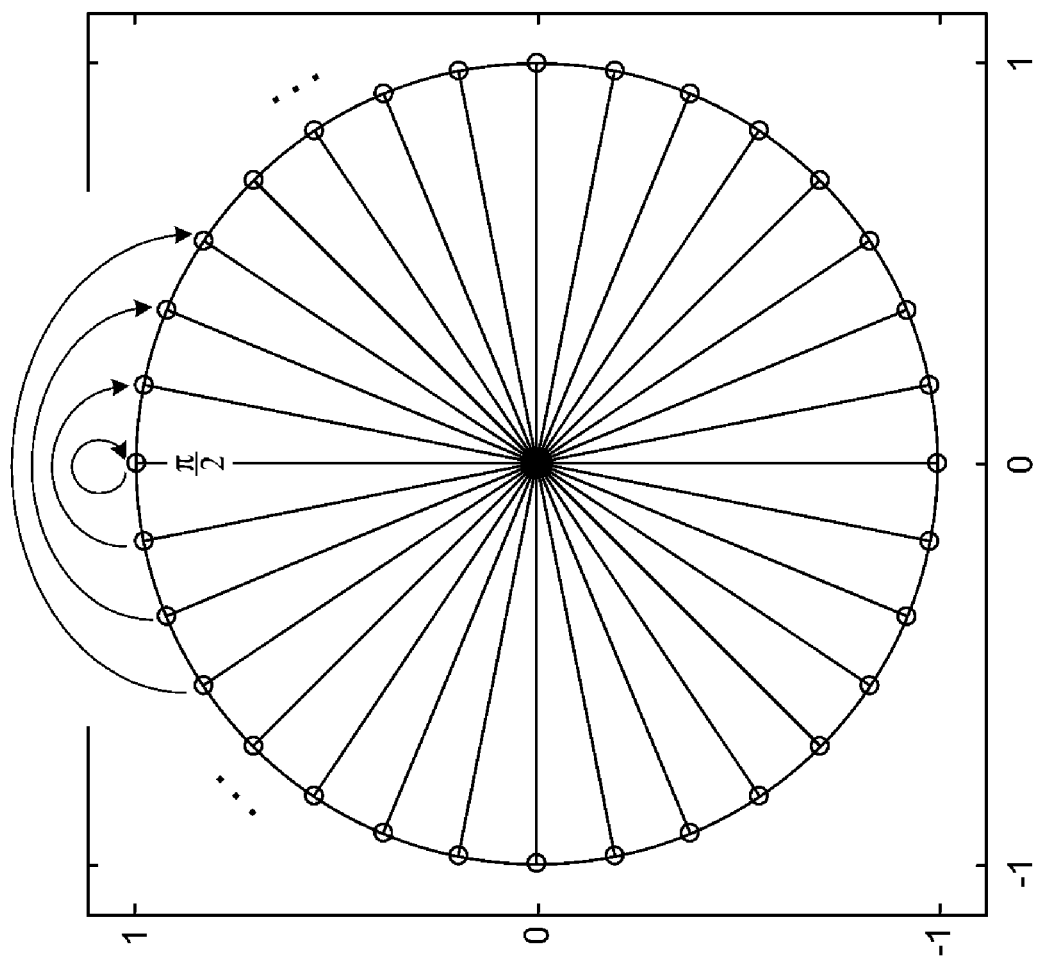

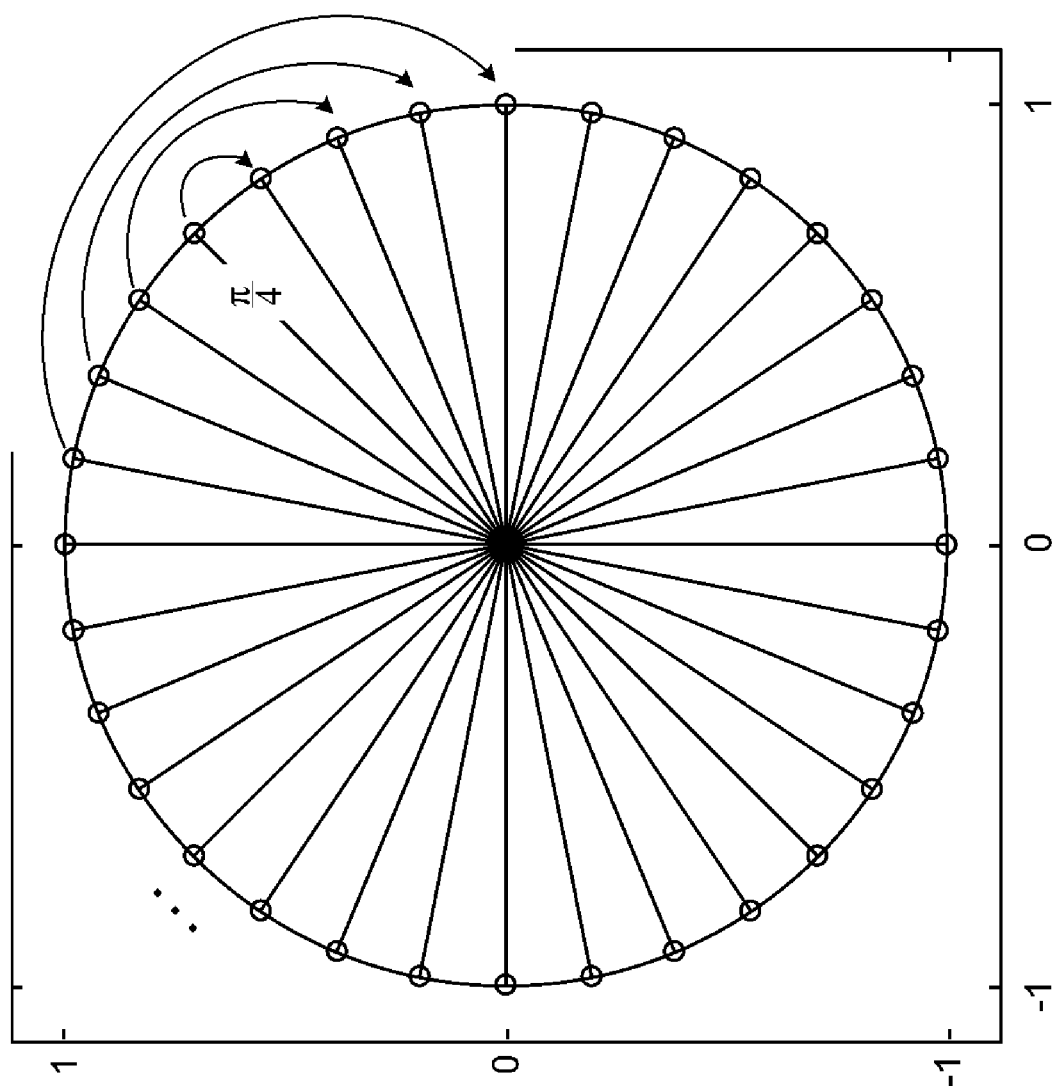

DDFS output error for W=14 and F=∞

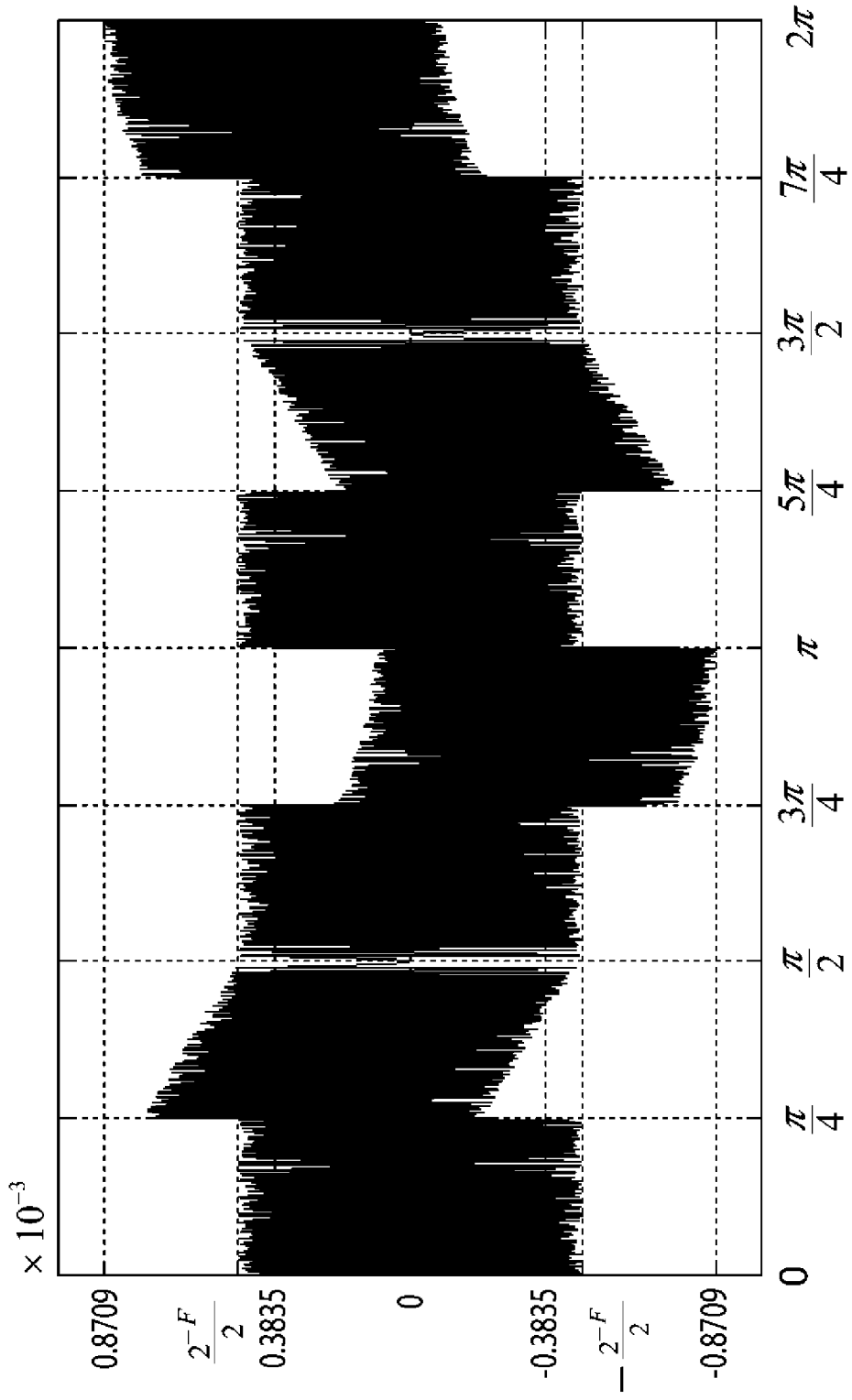
FIG. 42C DDFS output error for $W=14$ and $F=10$

| | m = 0 | m = 1 | m = 2 | ... | m = C−1 |
|---|---|---|---|---|---|
| l = 0 | x(0) | x(1) | x(2) | ... | x(C−1) |
| l = 1 | x(C) | x(C+1) | x(C+2) | ... | x(2C−1) |
| l = 2 | x(2C) | x(2C+1) | x(2C+2) | ... | x(3C−1) |
| ... | ... | ... | ... | ⋱ | ... |
| l = R−1 | x((R−1)C) | x((R−1)C+1) | x((R−1)C+2) | ... | x(RC−1) |

FIG. 44

| q \ p | q=0 | q=1 | q=2 | ... | q=C−1 |
|---|---|---|---|---|---|
| p=0 | $X(0)$ | $X(R)$ | $X(2R)$ | ... | $X((C-1)R)$ |
| p=1 | $X(1)$ | $X(R+1)$ | $X(2R+1)$ | ... | $X((C-1)R+1)$ |
| p=2 | $X(2)$ | $X(R+2)$ | $X(2R+2)$ | ... | $X((C-1)R+2)$ |
| ... | ... | ... | ... | ... | ... |
| p=R−1 | $X(R-1)$ | $X(2R-1)$ | $X(3R-1)$ | ... | $X(CR-1)$ |

FIG. 45

SYSTEM FOR ANALYSIS AND DESIGN OF DIRECT DIGITAL FREQUENCY SYNTHESIZERS

CROSS-REFERENCE TO RELATED APPLICATIONS

This application claims the benefit of U.S. Provisional Application Ser. No. 60/447,103 filed on Feb. 13, 2003, which is incorporated herein by reference.

BACKGROUND OF THE INVENTION

1. Field of the Invention

The present invention relates to a circuit analysis system and more particularly to a circuit analysis and design systems for use with Direct Digital Frequency Synthesizers.

2. Description of the Related Art

Direct Digital Frequency Synthesizers, commonly referred to as DDS or DDFS, have an important role in wide areas of digital electronics. Before the development of direct digital frequency synthesizers, high bandwidth frequency synthesis was achieved by the use of phase-locked loop (PLL) implementations. There are a number of advantages offered by DDS, over PLL-type implementations, that are very important in terms of performance improvement and superior capabilities. For example, DDS offers instantaneous settling time, fast and continuous-phase switching response, very fine (virtually limitless) frequency resolution, large bandwidth, low phase noise, and excellent spectral purity.

The importance of direct digital frequency synthesis has increased in the past decades due to rapid advancements in semiconductor technologies and the development of its applications such as in digital communications, electronic warfare and radar systems, hydrogen maser receivers, particle accelerators, test and measurement equipment, broadcasting, and medical equipment. The importance of DDS in practical applications is expected to continue growing since the need for higher performance circuits and products is inevitable in future generation products. For example, FIG. 1 depicts an application of DDS 20 in a quadrature amplitude modulator (QAM) transceiver block 22, which is used in an array of digital communications products. In this QAM transceiver application the DDS takes a frequency control signal 24, precisely indicating the required carrier frequency, and generates signals with the samples of sine and cosine functions 26 and 28 having the desired carrier frequency. The DDS outputs are used to modulate information-bearing signals I-30 and Q-32 following processing of information from an information source 34 processing of the information into I and Q components by a symbol generator 36 and following pulse shaping filters 38 and 40 and the interpolation filters 42 and 44 to the appropriate carrier frequency for transmission through the communication channel 46 at the multiplier 48. The pulse-shaping and interpolation filter parameters, along with high frequency precision and accuracy of DDS outputs, play a crucial role in the overall level of performance for the QAM modulator.

In some applications, the DDS is used to generate only the sine or only the cosine output. FIG. 2 illustrates an example where a DDS-50 is used to generate a high precision (12-bit) cosine signal 52 in the digital domain, having a specified frequency and phase offset as inputs 54 and 56. The integrated circuit (IC) provides an analog output signal-58 by using a 12-bit digital-to-analog converter (DAC-60). Depending on the configuration of the IC, the DDS output can be fed directly into the DAC (not shown), it can be passed through an "inverse sinc" filter or a digital multiplier before feeding the DAC (not shown), or it can go through both the inverse sinc filter-62 and the digital multiplier 64 (FIG. 2) before reaching the DAC input-66. The inverse sinc filter compensates for distortion introduced by the DAC. The digital multiplier controls according to input signal-68 the amplitude of the generated sinusoid. Therefore, the IC is capable of generating a very high precision analog cosine waveform having a specified frequency, phase offset, and amplitude. With such capabilities the user can generate a wide variety of waveforms with frequency modulation, phase modulation, amplitude modulation, or any combination of these three modulations such as the bandpass pulse-amplitude-modulated (PAM) signal.

In both of the above-illustrated QAM modulator and cosine generator examples, as with other conventional DDS uses, the DDS plays a central role in the functionality and capabilities of the entire system in which it operates; overall system performance highly depends on the level of performance offered by the DDS. Designing a high performance and low cost DDS using conventional technology is a challenging task, one that has been pursued for several decades. The characterization of DDS performance is also a very challenging task. Although some research has been done to suggest techniques and algorithms for DDS characterization, the number of publications addressing this problem seems exceeded by the number of publications discussing various DDS implementations. The complexity of DDS characterization and the challenge presented by the need for a characterization algorithm that is applicable to any DDS with an arbitrary set of design parameters are the reasons for the absence of such a method to date. The present invention provides an exemplary solution to such DDS characterization problems when applied to any DDS implementation.

SUMMARY OF THE INVENTION

The present invention is embodied in a system for the analysis and design of direct digital synthesizers including a windowing engine, and a method that enables the analysis of DDS output spectra in the presence of phase truncation and arbitrary approximations and errors in the implementation of the sine/cosine mapping function (SCMF) without the need to approximate the DDS characteristics.

The windowing engine is used with a DDS having a signature sequence and operating with a plurality of frequency control words. The windowing engine is operative to receive the signature sequence and a frequency control word representative of a group of frequency control words from the plurality of frequency control words. The engine then generates a portion of a DDS output spectrum corresponding to said representative frequency control word.

The DDS output spectrum represents the output spectrum for the group of frequency control words.

The output spectrum of a specific frequency control word is obtained by a rearrangement routine.

The portion of the DDS output spectrum includes spur characterization information representative of the output spectrum for the group of frequency control words.

Considering that the plurality of frequency control words are made up of several sets of frequency control word groups, and that each group has a representative frequency control word, then by operating the windowing engine and a transformer engine on each of the representative frequency control words a complete spur characterization may be achieved for the DDS covering the entire plurality of frequency control words.

A performance engine is disclosed for use with a DDS not using phase truncation and having a plurality of fcw and a signature sequence.

A performance engine is disclosed for use with a DDS using phase truncation and having a plurality of fcw and a signature sequence.

The performance engines may be used to optimize a DDS during its design, to characterize the DDS performance during testing or to provide real time feedback of DDS performance during operation.

Other features and advantages of this invention will be made apparent upon review of the drawings and detailed description of the invention.

BRIEF DESCRIPTION OF THE DRAWINGS

The objects and advantages of the present invention will become more readily apparent to those ordinarily skilled in the art after viewing the following detailed description and accompanying drawings wherein:

FIG. 10. is a diagram of the DFT matrix W.

FIGS. 14a and 14b. are diagrams of the construction of p' from q' for f>$2^B$ and f<$2^B$.

FIG. 15. is a diagram of the DDS sequence patterns for fcw=g.

FIG. 23 is a diagram of spurs from a single spur in $S'_W(k)$ and the windowing function $|V_{W,B}(k)|$.

FIG. 44 is a diagram of a matrix of row-priority arrangement of x(n) in an R×C matrix.

FIG. 45 is a diagram of a matrix of column-priority arrangement of X(k) in an R×C matrix.

DETAILED DESCRIPTION

Figure 1:
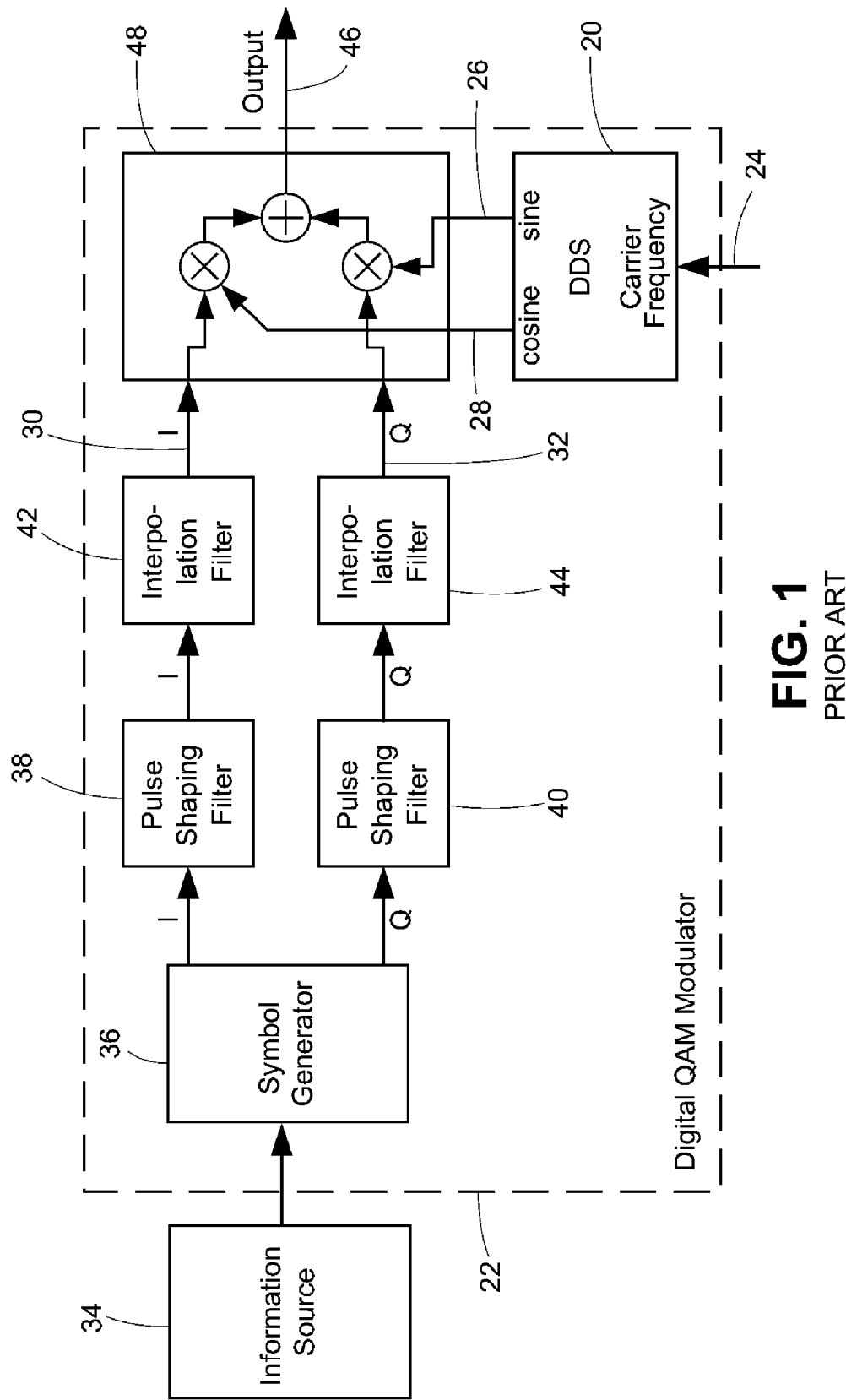
FIG. 1. is a block diagram for a digital QAM modulator.

As shown in the drawings for purposes of illustration, this invention is intended to provide essential methods and design tools for anyone designing and/or evaluating the performance of Direct Digital Frequency Synthesizers (DDS). To date, the presence of a complete, precise, general, and efficient DDS characterization method is absent.

The realizations on DDS operational characteristics made herein, give rise to a key "windowing function," and a method that enables the exact analysis of DDS output spectra in the presence of phase truncation and arbitrary approximations and errors in the implementation of the sine/cosine mapping function (SCMF). It should be noted that the term "exact" as used here and as used throughout this description refers to an analysis and methods for conducting an analysis that do not use techniques approximate DDS characteristics. As an input, the method accepts the SCMF contents, the "signature sequence," which includes all relevant information regarding specific non-idealities due to the actual DDS implementation. The new invention makes evident that the set of spurs from phase truncation and the set resulting from SCMF imprecision are effectively disjoint. Phase-truncation spurs are shown to have distinct magnitudes and their spectral locations, ordered from worst to best, are easily ascertained.

Without computing all spur magnitudes, the method described herein determines the magnitudes and locations of N worst spurs due to phase truncation and arbitrary SCMF imprecision (where N is a user-specified integer), or all spurs above some specified threshold. Similarly, the method described herein, if desired, determines the magnitude and locations of N best, or N through M spuds due to phase truncation and arbitrary SCMF imprecision (where N and M are user-specified integers) or all spurs below or between some specified thresholds. An efficient method of accounting for the effects of phase accumulator initial conditions and their influence on DDS spurs is given.

The "windowing function" and SCMF "signature sequence" yield a simple and precise calculation for DDS output Signal-to-Noise Ratio (SNR) in the presence of phase truncation and arbitrary SCMF imprecision. The resulting expressions produce very tight upper and lower bounds for the SNR. The asymptotic behavior of the SNR curves and a method for computing the asymptote levels is disclosed.

It is also shown that the use of 2's complement negation for reconstruction at the DDS output, instead of 1's complement negation, yields significantly better DDS performance and, the magnitudes of all spurs located in even DFT frequency bins can easily be made zero by careful DDS design.

1.1.1 DDS Operation and Performance Evaluation Overview

Figure 3:
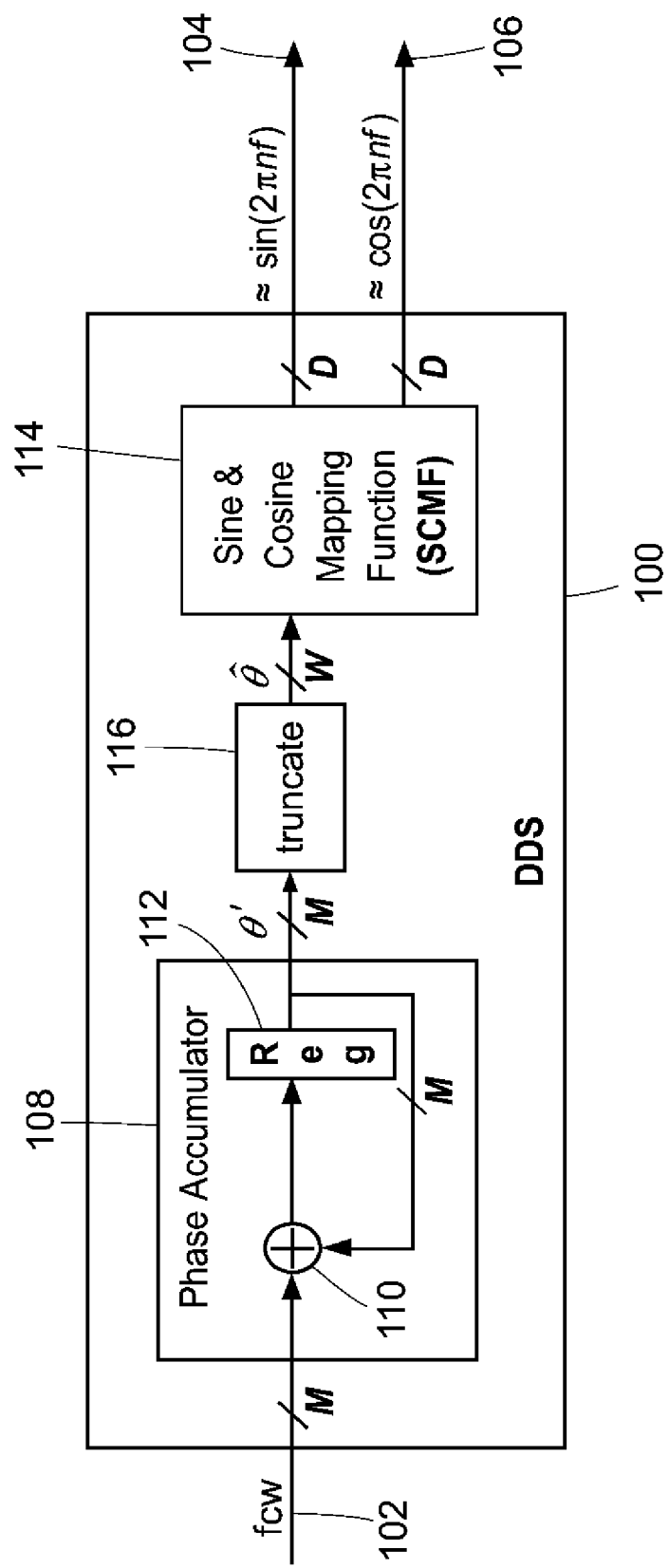
FIG. 3. is a diagram of the general structure for DDS.

A direct digital frequency synthesizer (DDS), is an engine 100 (FIG. 3) that takes an input and generates one output (not shown) or two outputs 104 and 106. The output(s) depend on the input. The input 102 is called a frequency control word (fcw), which is a number represented with a sequence of ones and zeros. The DDS may generate a sine output (s) 104, a cosine output (c) 106, or both sine and cosine outputs (cs) 104 and 106. When a DDS generates just a sine output s, it is referred to as a sine DDS. When a DDS generates just a cosine output c, it is referred to as a cosine DDS. Finally, when a DDS generates both sine and cosine outputs, collectively represented by cs, it is referred to as a quadrature DDS. An example of a quadrature DDS 100 is shown in FIG. 3.

Figure 5:
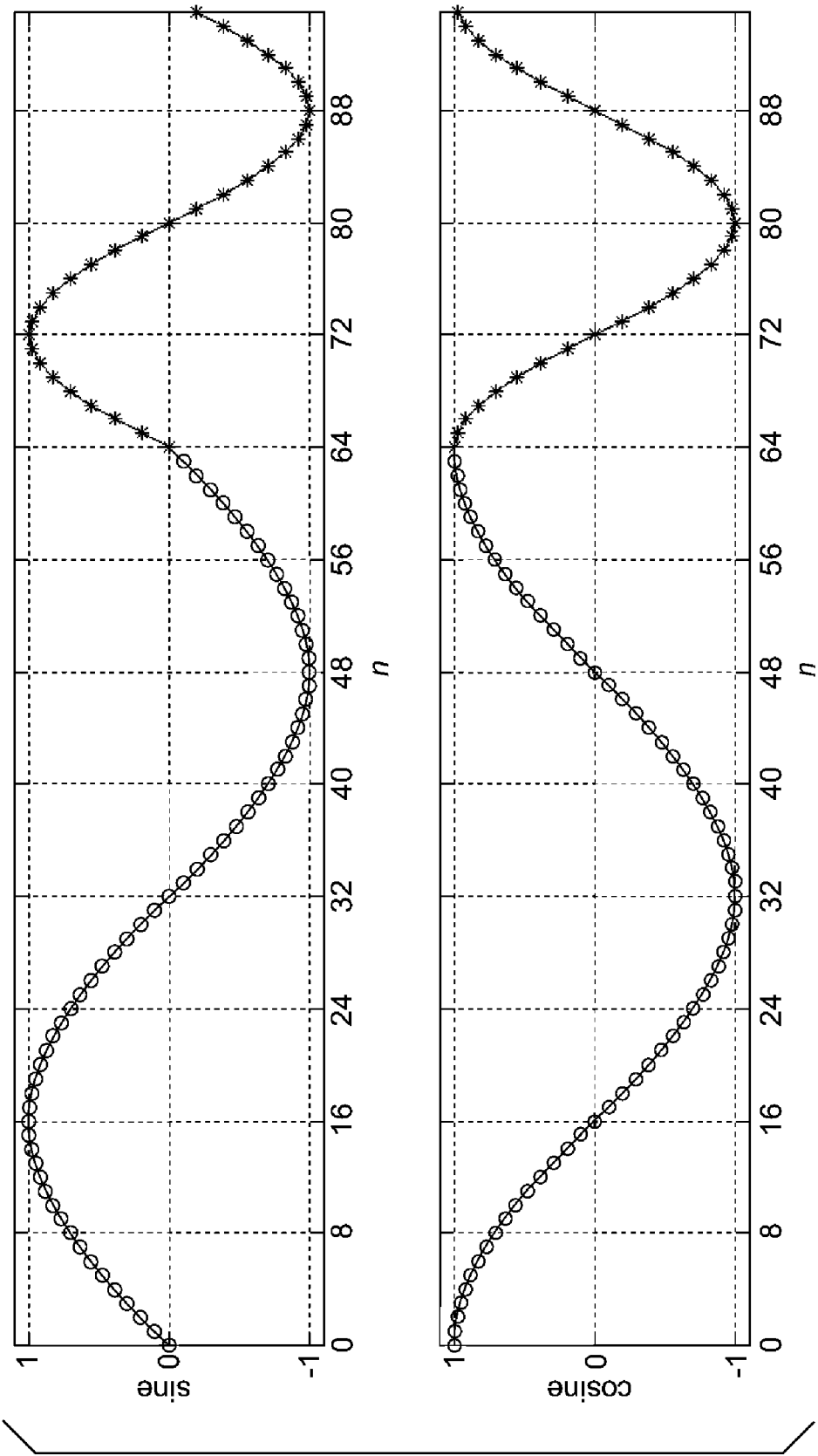
FIG. 5. is a plot of DDS outputs generated from the phase accumulator outputs of FIG. 4.

As one inputs a number for the DDS, the DDS generates a sequence of numbers at its output for s or c or cs. The DDS continues generating numbers at its output for as long as it is operating. Therefore, the length of the sequences s or c, or cs is very large. FIG. 5 illustrates an example of a sequence of numbers for cs (cosine and sine) generated as a result of two different inputs (two different fcw). The vertical axis in FIG. 5 measures the value of the DDS output numbers while the horizontal axis keeps track of the order of the output numbers. In the example of FIG. 5, the first 64 numbers (denoted by circles) are generated by the DDS as a result of some input fcw. The next 32 numbers (denoted by asterisks) are generated by the DDS as a result of a different input fcw. Notice that, at the input of the DDS, only one change occurs at the time between the 64-th and 65-th output samples, and at this time the DDS input is changed. Unlike the input, the DDS output numbers are changing at every cycle. Furthermore, if the DDS input did not change between 64-th and 65-th sample, then the DDS outputs would continue changing similar to the way they were changing during the first 64 cycles. From a quick observation of FIG. 5 it can be concluded that the DDS generates an output, which creates a waveform that is swinging back and forth (as a sinusoid) at a specific frequency. The input is what specifies the frequency of the sinusoid waveform.

Following is the method by which a DDS generates the sequences of output numbers s or c, or cs from a specific input. Consider a device called a phase accumulator that takes an input number and generates an output number. When given an input number and its current output number, it generates its next output number by adding the input number to the current output number. For example, if the input number is 21.3 and the current output number is 6.4, then the number following 6.4 will be, 27.7. The 27.7 is simply computed by adding the input 21.3 to the current output 6.4 which sums to 27.7. Now the current output number is 27.7. Following the same type of mechanism, the numbers following 27.7 will be 49.0, 70.3, 91.6, and so forth. The phase accumulator also performs what is called an overflowing operation, which is when the next output number is greater than or equal to some threshold value, it is modified by subtracting the threshold value. So if the threshold value for the current example is 100, then the numbers following 91.6 will be 12.9, 34.2, 55.5, and so forth. The overflowing operation in the example can be simply done by adding the input number to the current output number and ignoring the hundredth digit. In the example 91.6+21.3=112.9 and by ignoring the hundredth digit one gets the "overflowed" value 12.9. Just as the overflowing operation in this example can be simply done by ignoring the hundredth digit, the phase accumulator performs the overflowing operation in a similar manner, by simply ignoring the binary digits above some position.

Following this simple mechanism, the phase accumulator will therefore keep generating a sequence of numbers between zero and some predetermined threshold (in this example the threshold is 100) with the difference between two consecutive output numbers samples equaling the input fcw and subject to overflowing. A few key properties of the phase accumulator can be easily identified that reflect on the DDS outputs in FIG. 5. If the input fcw is a small number then the sequence of numbers at the output of the phase accumulator will increment slowly and generate many numbers between two consecutive overflow operations. On the other hand, if the input fcw is a bigger number, then the sequence of numbers at the output of the phase accumulator will increment faster and generate less numbers between two consecutive overflow operations. The overflow operation can be viewed as a beginning of a new cycle. Therefore, if the input fcw is small the phase accumulator will overflow less frequently and will generate a sequence of numbers having a small cycling frequency (similar to the first 64 samples of FIG. 5). If the input fcw is a bigger number, the phase accumulator will overflow more frequently and will generate a sequence of numbers having a bigger cycling frequency (similar to the last 32 samples of FIG. 5).

FIG. 3. illustrates the general structure of a DDS 100, where the phase accumulator 108 is depicted with an adder 110 and a register 112. The register 112 keeps track of the current output number and the next output number. The current output number is on the right side while the next output number is on the left side of the register. At the time when the output number needs to get updated the register transfers the number on its left to it's right.

To generate the proper DDS outputs from the sequence of numbers generated by the phase accumulator, the DDS 100 performs a simple mapping operation. This mapping operation, referred to as a sine/cosine mapping function (SCMF) 114, generates a number (a sine or cosine, or both sine and cosine) for each possible input number it receives. There are numerous ways to build (or implement) this mapping function and, depending on the details of a how it is built the sequence of DDS output numbers will be slightly different for different implementations (ways of building) this mapping function. As one can imagine, the greater the number of possible input values to the mapping function 114, the more complex and difficult the implementation of the mapping function. A mapping function capable of mapping 100 different inputs to their corresponding sin and/or cosine values will be much easier to build than a mapping function capable of mapping 1,000,000 inputs to their corresponding sin and/or cosine values. Unfortunately, usual DDS requirements (precision of required input fcw) will produce a phase accumulator such that the mapping function can have an enormous number of different inputs. More than four billion different numbers for example is common in DDS. To make the required amount of resources for building of the mapping function reasonable, the number of possible different inputs to the mapping function is reduced by the "truncate" block found between the phase accumulator and the mapping function (refer to FIG. 5). The "truncate" block 116 (FIG. 3) takes an input number and performs a flooring operation. For the example above, the truncate block would get rid of the decimal portion of the numbers. So the sequence of numbers 6.4, 27.7, 49.0, 70.3, 91.6, 12.9, 34.2, 55.5, and so forth, corresponding to the phase accumulator output in the example will turn into the sequence 6, 27, 49, 70, 91, 12, 34, 55. Therefore, after the truncation, in the example, there will be 100 possible numbers, which are the integers between 0 and 99 (i.e., 0, 1, 2, 3, . . . , 97, 98, 99). So the mapping function in this case would need to map these 100 numbers to their appropriate sin and/or cosine values.

The mapping function, as discussed earlier, generates an output by taking an input number and producing the output corresponding to that input number. Therefore, if a DDS has an SCMF which performs a mapping on X different possible numbers at its input, then the SCMF can be considered a "table" of X numbers, where the entries in the table (which can be though of as a column of length X) are the DDS output numbers corresponding to the X possible numbers at the SCMF input. So when the SCMF gets a new number at its input, it simply "looks up" the corresponding DDS output number in its "table" and produces the number found in that entry in the table at its output. Different DDS will have SCMF with different length "tables" and furthermore, different implementations of DDS will have SCMF with different numbers in their "tables". It should also be noted that regardless of how the SCMF is built (as an actual table or a different way that acts as a table) it can be considered as a table for the purposes of understanding the functionality of DDS and the analysis of its performance.

Since the SCMF "table" contents dictate the sequence of DDS output numbers, only DDS with identical table length and identical table contents will generate identical sequences of numbers at their respective outputs. Furthermore, representing sine and/or cosine numbers exactly will require infinite amount of precision (similar to the precision required to represent the number π). To make the building of SCMF possible, the sine and/or cosine numbers in the table have to get approximated to be represented with a fixed precision (fixed number of digits). This way, each entry in the table will have a number with a fixed number of digits. It turns out that a DDS with an SCMF having the same-length "table" and the same precision for the numbers in the "table", may (and most likely will) have different numbers in their "tables" if they are built in a different way. This is partly due to the fact that the "tables" in SCMF are generally long (they have many entries) and even if there is one entry that is different between two identical-length "tables", they are different since the DDS will generate different output numbers at the time when this one entry with different numbers is accessed. Since the DDS outputs are derived (generated) entirely from the contents of the SCMF "table", this sequence of numbers constituting the "table" is referred to as a "signature sequence". The "signature sequence" alone completely identifies the SCMF (hence identifies the DDS) and captures all of the necessary information relevant to the DDS performance. Given the DDS input fcw one may generate the sequence of values generated by the phase accumulator and, knowing the "signature sequence" (the entire SCMF "table", without necessarily knowing the details of how the SCMF is built) one will be able to generate the exact sequence of DDS output numbers.

Naturally, when building a DDS it is of particular interest to measure the quality of the sequence of numbers that it generates. Of course the closer the DDS output numbers are to their corresponding infinite-precision sine and/or cosine values, the better the DDS quality (i.e., better DDS performance). Notice that good DDS performance depends on the quality of all the output numbers in the DDS output sequence. Also recall that DDS output sequences are very long and may have repeated numbers due to the fact that the phase accumulator overflows and starts a new cycle and the fact that the truncate block between the phase accumulator and the SCMF may take different numbers at its input and produce the same number at its output (for example 31.3 and 31.8 for the considered example would both become 31 at the output of the truncate block, hence they would address the same entry in the SCMF "table" and therefore produce the same DDS output). Therefore, the DDS output sequence is a long sequence whose individual numbers that constitute the sequence are those of the SCMF "table", but in general they appear in a different order and may or may not include all of the numbers in the "table". Finally, as the input fcw to the DDS changes, the DDS output sequence changes, hence generating an output having different quality (different performance characteristics). To evaluate the DDS quality, one needs to analyze the long DDS output sequence of numbers for each possible input fcw.

The analysis of DDS output sequences for all possible input fcw can be done by analyzing the DDS output sequences corresponding to only a small number of specific input fcw. It turns out that the DDS performance is identical for a large number of input fcw. Therefore, the analysis of DDS performance boils down to analyzing the DDS performance for these key input fcw. The way the DDS performance is analyzed for a particular fcw is by taking the DDS output sequence generated from that particular input fcw and performing a complex operation called Discrete Fourier Transform (DFT), which operates on the entire sequence of DDS output numbers. The minimum length of the DDS output sequence necessary for the DFT operation depends on the specific DDS input fcw. Unfortunately, some of the DDS input fcw that are required for the complete performance analysis generate DDS output sequences such that the minimum required length for the DFT is so large, that performing this DFT operation requires an enormous amount of computation. Performing the required amount of computation on the fastest computers available today will require hours, days, months, and even years to complete. The results obtained from this long and complicated DFT operation are summarized in terms of a few key performance metrics, some of which are referred to as "spur magnitudes", "spurious free dynamic range", and "signal-to-noise ratio". These metrics are numerical values, which capture the overall performance level of the DDS. To obtain these numerical values one requires to perform the entire DFT, which is a very complex, long, and computationally very intensive operation.

The invention described here allows one to compute the desired DDS performance metrics without computing the long and complex DFT on the DDS output sequences. Since the DDS outputs are derived from the "signature sequence", in the invention described here these DDS performance metrics are computed from the "signature sequence" as opposed to the DDS output sequence. The length of the "signature sequence" is significantly shorter than the minimum required length of the DDS output sequence for the DFT. In a typical DDS the signature sequence may be of length 32,768 while the DDS output sequence may be of length 4,294,967,296. In this case, the DDS output sequence is 131,072 times longer than the "signature sequence". Naturally, operating on the "signature sequence" instead of the DDS output sequence will be computationally significantly simpler. The necessary computations to be performed on the "signature sequence" are different from the computations performed on the DDS output sequences. These computations based on the "signature sequence" are performed via much smaller length DFT, "windowing function", and sorting, comparing, and updating functions. The following are some important facts and features about the invented analysis method based on the DDS "signature sequence", which is described in this patent application.

1. The results obtained from the invented computation method that is based on the DDS "signature sequence"

are identical to the results obtained from performing the computationally complex DFT operations on the long DDS output sequences. Therefore, using the invented analysis method the DDS can be analyzed (or characterized) very quickly and exactly.

2. Since the "signature sequence" captures all the relevant details of the SCMF implementation (the way the SCMF is built and what's in the SCMF "table") and hence the "signature sequence" completely identifies the DDS being analyzed, the results obtained from the invented analysis method are specific to that DDS.

3. This invented analysis method can be applied to any DDS, regardless of how the SCMF is built, by the virtue of generating the corresponding "signature sequence" (the SCMF "table") and applying it to the invented analysis engine.

4. In addition to the fact that the invented analysis method is based on the "signature sequence" and not on the long DDS output sequence, what makes this analysis very efficient is its capability to compute the desired performance metrics directly. For example, if the spur with the 100-th largest magnitude is desired, and there are more than 4 billion potential spurs, the invented method can identify and compute the 100-th spur without computing all 4 billion spurs and looking for the one with the 100-th with the worst magnitude, where a spur is an undesired occurrence due to DDS implementation imperfections such as the "truncate" block between the phase accumulator and the non-ideal SCMF "table". Similarly, worst N spurs, best N spurs, N through M-th spurs, and other performance metrics such as spurious free dynamic range can be computed without computing all spurs and looking for the desired spur(s). Similarly, signal-to-noise ratio can be computed with minimal amount of computation (directly from the "signature sequence").

1.1.2 Realizations of DDS Structure and Operation

Using a new analytical framework for DDS analysis, common DDS implementation techniques and their impact on DDS performance are investigated and DDS performance levels over a wide range of DDS design parameters are tabulated.

The DDS characterization method based on the realizations of the present invention calculates the exact magnitudes and identifies the spectral locations of spurious frequencies (spurs) at the output of a DDS due to phase accumulator truncation and arbitrary sine/cosine mapping function (SCMF) implementation non-idealities such as finite precision arithmetic and arbitrary approximations. The method accepts DDS design parameters, such as word length M for the input frequency control word (fcw), phase truncation word length W (see FIG. 3) and the specific SCMF contents (which is defined as the "signature sequence") to efficiently compute the exact spur magnitudes for a DDS with arbitrary M, W, and "signature sequence". Hence, this method can be applied to any DDS. by the virtue of applying the corresponding "signature sequence".

All phase truncation spurs are shown to have distinct magnitudes and a technique for easily locating the N-th worst phase-truncation spur is given. A windowing function provides the means to directly calculate the magnitude of the N-th worst phase-truncation spur without generating the entire spectrum. The method developed for the characterization of phase-truncation spurs has been shown to gracefully extend to include the effects of arbitrary SCMF non-idealities. As a result, the magnitudes of spurious frequencies, relative to the main carrier (or main component) magnitude, arising from the set of spurs due to phase truncation are shown to be disjoint from the set of spurs created from SCMF non-idealities.

The windowing function provides the means for generating the DDS output spectrum in the presence of both phase accumulator truncation and finite precision and approximations in the SCMF implementation. Special properties of the windowing function are exploited to create a fast method for the direct computation of the magnitudes and locations of the N worst spurs or all spurs above a desired threshold c in the presence of both phase truncation and non-ideal SCMF, without generating the magnitudes of all spurs.

Using the developed methods for DDS spur calculation and, in particular, the windowing function, the present invention offers an efficient method for computing the DDS output SNR. For the first time, an SNR expression that can be applied to any DDS is introduced; the DDS-specific signature sequence clearly enters into the SNR expressions. Hence, the exact SNR value specific to any SCMF is computed via (4.3) for sine only or cosine only DDS, and via (4.6) for quadrature DDS as disclosed in section 4.2. Similarly, the SNR lower and upper bounds specific to any SCMF are revealed below, and the large-W maximum and minimum asymptote levels are computed as well. Furthermore, the more general and practical SNR expressions simplify to idealized conventional expressions under the special assumption of an ideal SCMF, which provides an important theoretical agreement with conventional results. It will be shown that for practical DDS implementations, the idealized SCMF SNR curves and their bounds can be very inaccurate, and should be replaced by the exact and efficient computation methods described herein.

1.2 Basic DDS Structure and Operation

The DDS, viewed as a single functional unit, accepts a normalized input frequency control word (fcw) and generates a sequence of samples of sine and/or cosine functions having the precise frequency dictated by the input fcw. With reference to FIG. 3, the general structure of a DDS 100 can be partitioned into two functional units. The first, the phase accumulator 108, consisting of an overflowing adder 110 and a feedback register 112, accumulates the normalized input frequency control word (fcw) to produce a normalized phase angle for the sine/cosine mapping function (SCMF) 114, which is the second functional unit.

The normalized rotation angle θ' is generated at the output of the phase accumulator while the angle $\hat{\theta}$ addressing the SCMF is obtained from θ' via a truncation operation. The phase accumulator is an M-bit adder, repeatedly incrementing θ' according to the input fcw. If considered as a binary integer valued number, and assuming the value of the phase accumulator output register to be zero at time n=0, the phase accumulator output has the value $\theta'=(n \times fcw)_{mod 2^M}$ at an arbitrary time n. This represents the radian-angle $$\theta = \frac{2\pi}{2^M} \theta' = \frac{2\pi}{2^M} (n \times fcw)_{mod 2^M}.$$

The SCMF input $\hat{\theta}$ is obtained from θ' by retaining the W most-significant bits of θ'. Therefore, as a binary integer valued number $$\hat{\theta} = \left\lfloor \frac{\theta'}{2^{(M-W)}} \right\rfloor,$$

where the "floor function" notation $\lfloor \ \rfloor$ is used to denote the largest integer not greater than x.

The SCMF can be viewed as a mapper (e.g., lookup table) between an input phase angle θ (or its normalized and truncated counterpart $\hat{\theta}$) and its corresponding sin θ and cos θ values. A number of conventional efficient alternative implementations (i.e., alternatives to a simple but very large lookup table) are known for this mapping function. For purposes of understanding the present invention, one only needs to consider that, however implemented, SCMF performs a mapping from the input angle θ (or its counterpart $\hat{\theta}$) to sin θ and/or cos θ.

Figure 4A:
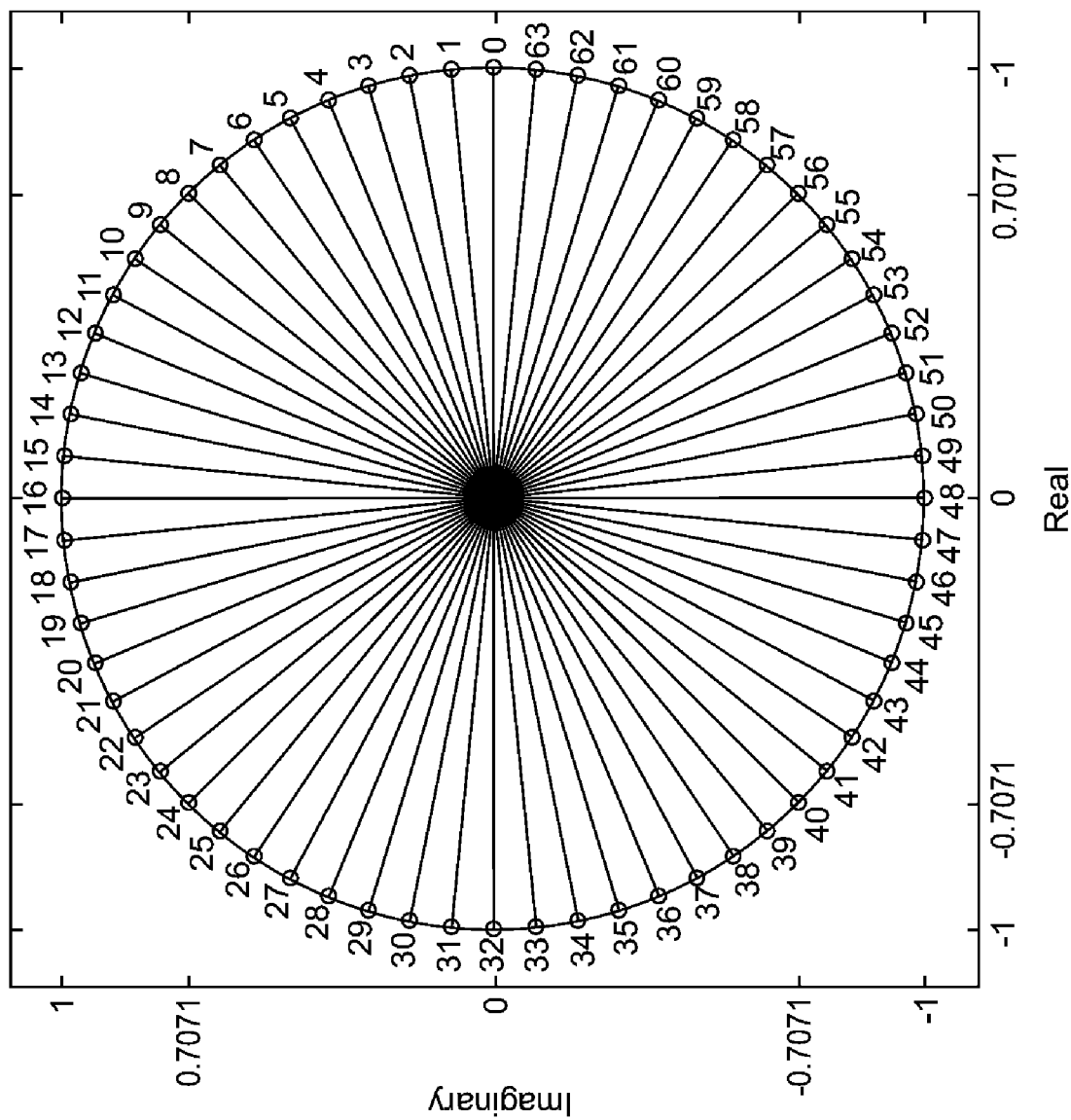
FIGS. 4a and 4b. are plots of phase accumulator outputs generated from two different input fcw.
Figure 4B:
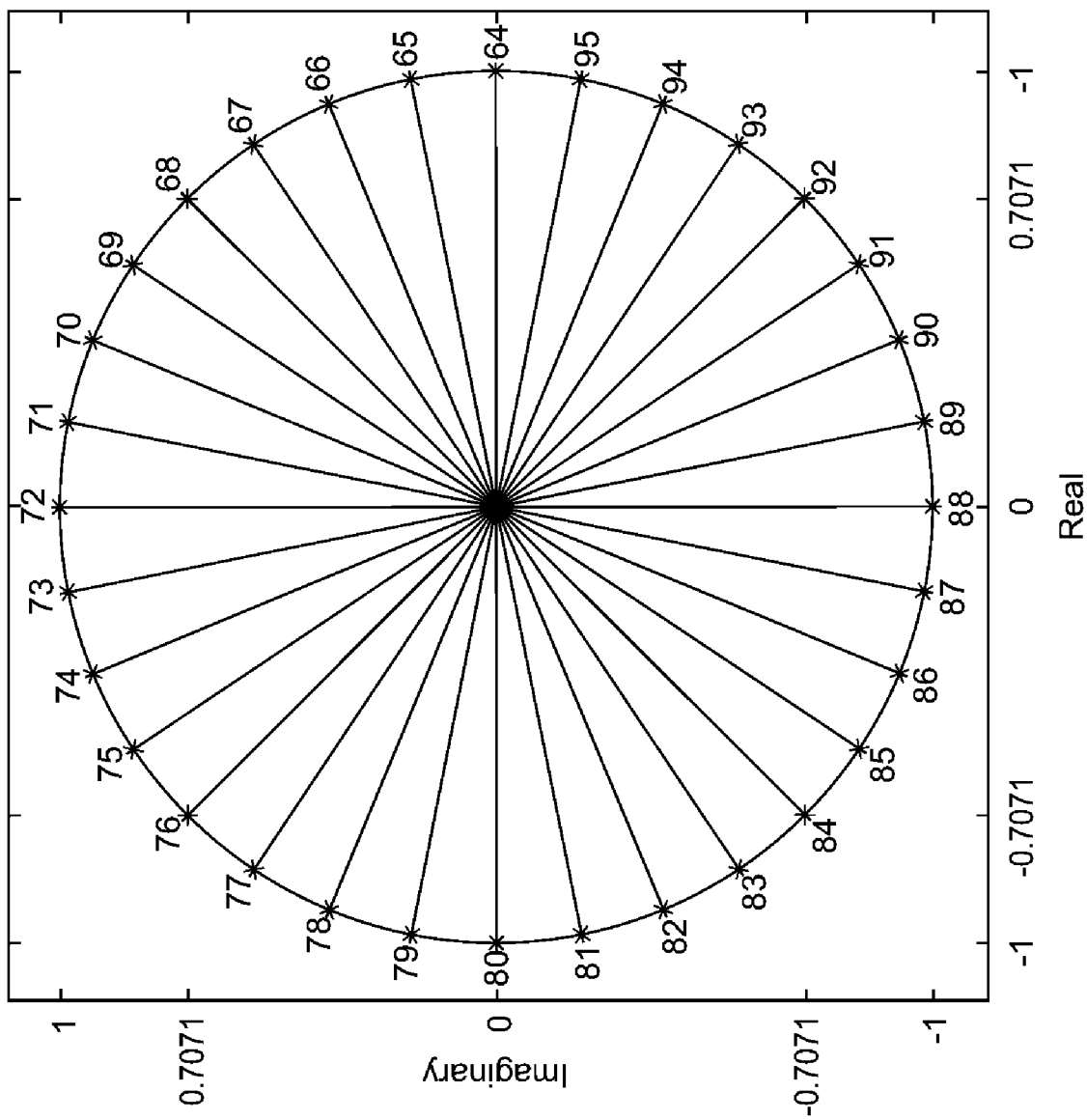

To illustrate the mechanism by which the DDS of FIG. 3 generates the outputs corresponding to an input fcw, consider, for simplicity, an M=8-bit phase accumulator, an ideal SCMF with infinite precision outputs, and ignore the truncation operation between the phase accumulator and the SCMF (i.e., let W=M). The 8-bit phase accumulator output value represents an angle corresponding to one of the $2^8$=256 equally spaced points (more generally, $2^M$ equally spaced points) on the unit circle in the complex plane. For example, the 8-bit phase accumulator output '00000000' represents the angle 0 radians, while '00000001', '00000010', and '11111111' represent the angles $$1 \times \frac{2\pi}{256} = \frac{\pi}{128}, 2 \times \frac{2\pi}{256} = \frac{\pi}{64}, \text{ and } 255 \times \frac{2\pi}{256} = 2\pi - \frac{\pi}{128},$$

respectively. Let one assume that the DDS input fcw='00000100', which corresponds to an angular frequency of $$4 \times \frac{2\pi}{256} = \frac{\pi}{32}$$

radians/sample, is applied at time n=0 and that the phase accumulator output at n=0 has been reset to '00000000'. At each iteration thereafter, the overflowing adder in the phase accumulator will begin incrementing the phase accumulator output by the amount corresponding to the input fcw. This will generate successive phase accumulator output values corresponding to the sequence of angles $$0, \frac{\pi}{32}, \frac{\pi}{16}, \frac{3\pi}{32}, \frac{\pi}{8}, \ldots$$

and so forth. At n=63 the phase accumulator output will be '11111100' and to generate the output corresponding to n=64 the adder will overflow by adding '00000100'+'11111100' (the output at n=63) to produce the next output '00000000'. Furthermore, let one assume that the input fcw is changed from '00000100' to '00001000' (i.e., the fcw is doubled from $$\frac{\pi}{32}$$

radians/sample to $$\frac{\pi}{16}$$

radians/sample) immediately after n=64. The overflowing accumulator will begin incrementing the phase accumulator output according to the new fcw and will generate output values corresponding to the sequence of angles $$0, \frac{\pi}{16}, \frac{\pi}{8}, \frac{3\pi}{16}, \frac{\pi}{4}, \frac{5\pi}{16}, \ldots$$

and so forth for n=64, 65, 66, 67, 68, . . . respectively. FIG. 4 illustrate the unit circle with the details pertaining to the discussed example, where FIG. 4a shows the evolution of angles generated from the first fcw='00000100' (i.e., the fcw corresponding to $$\frac{\pi}{32}$$

radians/sample) for 0≦n≦64 and FIG. 4b shows the evolution of angles generated from the second fcw='00001000' (i.e., that corresponding to $$\frac{\pi}{16}$$

radians/sample) for 64≦n<96.

The SCMF 114 following the phase accumulator in FIG. 3 generates the DDS outputs by taking the sequence of phase accumulator outputs and performing a mapping from the angles to their corresponding sine and cosine values. The DDS outputs for the phase accumulator output sequence shown in FIGS. 4a and 4b are given in FIG. 5. The outputs for 0≦n<64, plotted by circles in FIG. 5, correspond to the first fcw of $$\frac{\pi}{32}$$

radians/sample and are generated from the phase sequence of FIG. 4a, while the outputs for 64≦n<96, plotted by asterisks in FIG. 5, correspond to the second fcw of $$\frac{\pi}{16}$$

radians/sample and are generated from the phase sequence of FIG. 4b. As illustrated in FIG. 5, the frequency of output sinusoids for n≧64 is twice the frequency of output sinusoids for n<64. This is due to the doubling of the input fcw, occurring at n=64, which causes the phase accumulator to sweep the unit circle twice as fast. The overflowing characteristic of the phase-accumulator adder performs the necessary modulo-$2\pi$ operation, mapping all phase angles greater than $2\pi$ to their corresponding angles between zero and $2\pi$. The relationships between the input fcw and the ideal DDS outputs are $$s(n) = \text{Im}\left\{ e^{j\frac{2\pi}{2^M}(fcwn+\phi)_{mod 2^M}} \right\} = \sin\frac{2\pi}{2^M}(fcwn+\phi)_{mod 2^M} \quad (1.1)$$

and $$c(n) = \text{Re}\left\{ e^{j\frac{2\pi}{2^M}(fcwn+\phi)_{mod 2^M}} \right\} = \cos\frac{2\pi}{2^M}(fcwn+\phi)_{mod 2^M} \quad (1.2)$$

where n is the sample-time index with n=0 corresponding to the instance when the fcw was applied to the DDS and $\phi$ corresponding to the "initial phase" amount (the value of the phase accumulator output registers) at n=0. For a DDS generating both sine and cosine outputs, as in FIG. 3, the outputs can be considered a complex valued signal where the cosine and sine comprise the real and imaginary parts of the complex exponential. Therefore, $$cs(n) = c(n) + js(n) = e^{j\frac{2\pi}{2^M}(fcwn+\phi)_{mod 2^M}} \quad (1.3)$$

where cs(n) is used to highlight a DDS generating both cosine and sine outputs. A DDS generating both sine and cosine outputs will be referred to as a quadrature DDS, while a sine-only or cosine-only DDS will be referred to as a sine DDS or a cosine DDS, respectively.

Although the overwhelming majority of DDS implementations have the basic structure of FIG. 3, there are also alternative implementations which utilize second-order recursive structures. Such recursive structures are rarely used for DDS implementations since they suffer from undesirable instabilities and computational inaccuracies. For purposes of understanding the present invention, references to SCMF described herein pertain to any DDS having the general structure of FIG. 3, with an SCMF that generates its sine and/or cosine output(s) for a particular time instance, generally from the corresponding SCMF input $\hat{\theta}$.

1.3 DDS Characterization Metrics and Definitions

In order to limit the complexity of the SCMF such that it can be built with a reasonable amount of hardware, the phase accumulator 108 output is typically truncated 116 before being fed to the SCMF 114, as shown in FIG. 3, where only W bits out of M bits are retained. This phase truncation causes errors (deterministic, periodic errors, often referred to as noise) at the DDS output and manifests itself as a set of spurious frequencies (output signal components at undesired frequencies). Furthermore, the SCMF has finite precision outputs and its implementation may employ approximations and quantization operations, features that also generate deterministic noise at the DDS output and hence contribute another set of spurious frequencies. Spurious frequencies are often referred to as spurs. The spurs due to phase truncation are referred to as phase-truncation spurs and the spurs due to SCMF imperfections are referred to as SCMF spurs.

For any input fcw, the DDS generates periodic outputs with the period depending on the input fcw. Furthermore, different input fcws may generate outputs having identical periods but the sequence of their successive outputs will be different. Therefore, the performance of the DDS depends on the input fcw. If desired, one could tabulate the level of DDS performance for each possible input fcw, but instead, for realized practical advantages, the level of DDS performance is measured for all possible input fcw and only the worst performance metrics are used as the level of DDS performance. This way, the DDS can be characterized with a single performance metric and the actual performance of the DDS will always be equal or better than the given specification.

Given a certain fcw and a specific SCMF, the DDS output is a deterministic and periodic signal. The metric used to measure the level of DDS performance needs to somehow capture all the samples comprising the DDS output. The fact that the outputs are periodic narrows the problem down to considering a single period of the output. Even with this simplification, the problem is still very complex since there are many fcw that produce outputs with extremely long periods. Even though there are time-domain metrics such as maximum deviation or mean square error between the actual DDS output and the corresponding ideal infinite-precision output, these metrics are not normally used for number of reasons. For example, a DDS with a single output sample having an error of amount e and all other output samples having no errors would have the same maximum deviation as the DDS with all output samples having an error of amount e. Similarly, a DDS with output samples having very large and very small errors may have the same mean square error as the DDS with all output samples having moderate amount of errors. A system employing a DDS, for example in a communications application, may tolerate moderate error levels but may not tolerate even a few large errors. Therefore, the use of maximum error or mean square error measurements is unacceptable.

Figure 6:
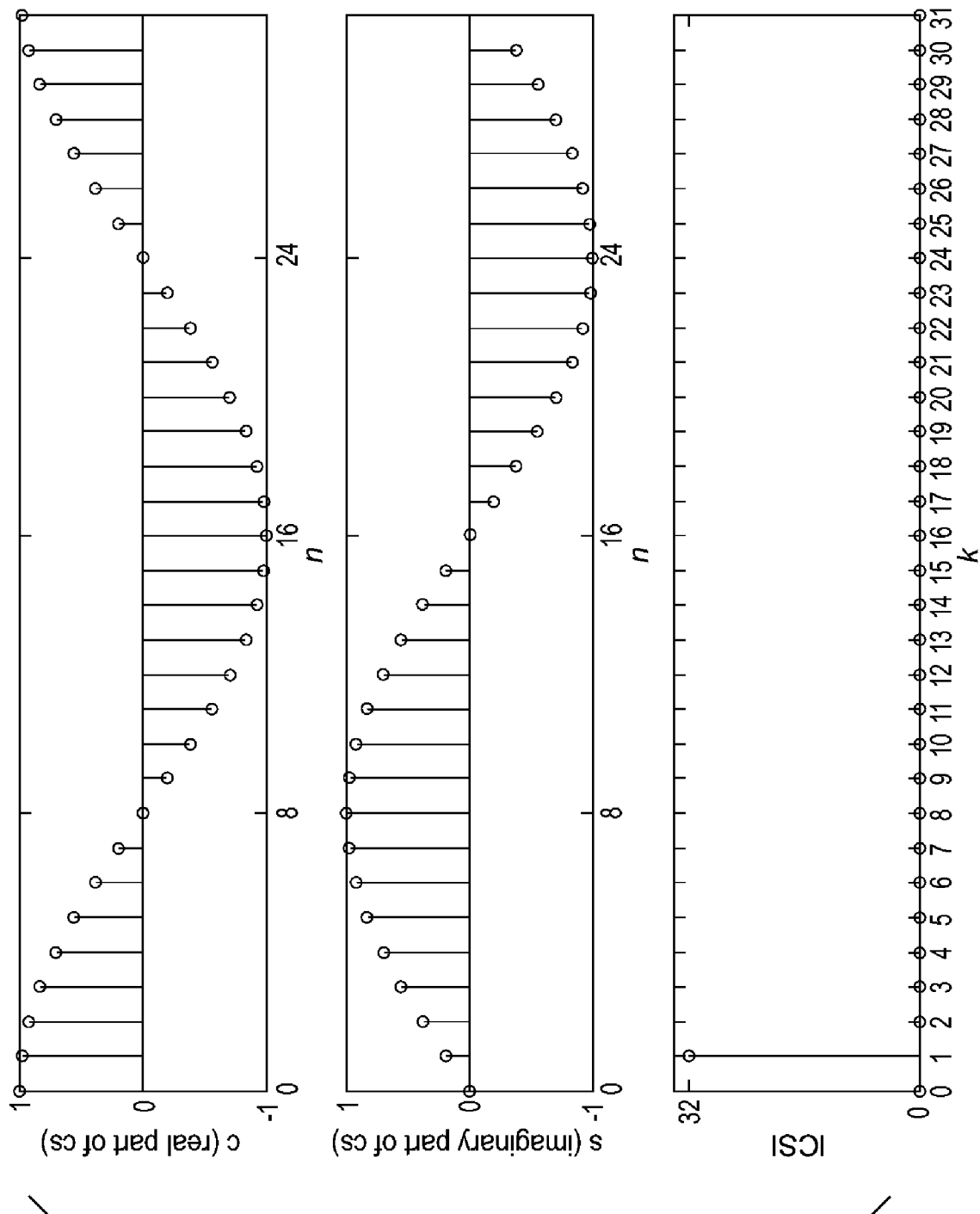
FIG. 6. is a representation of ideal DDS outputs in frequency domain via DFT.
Figures 7A, 7B:
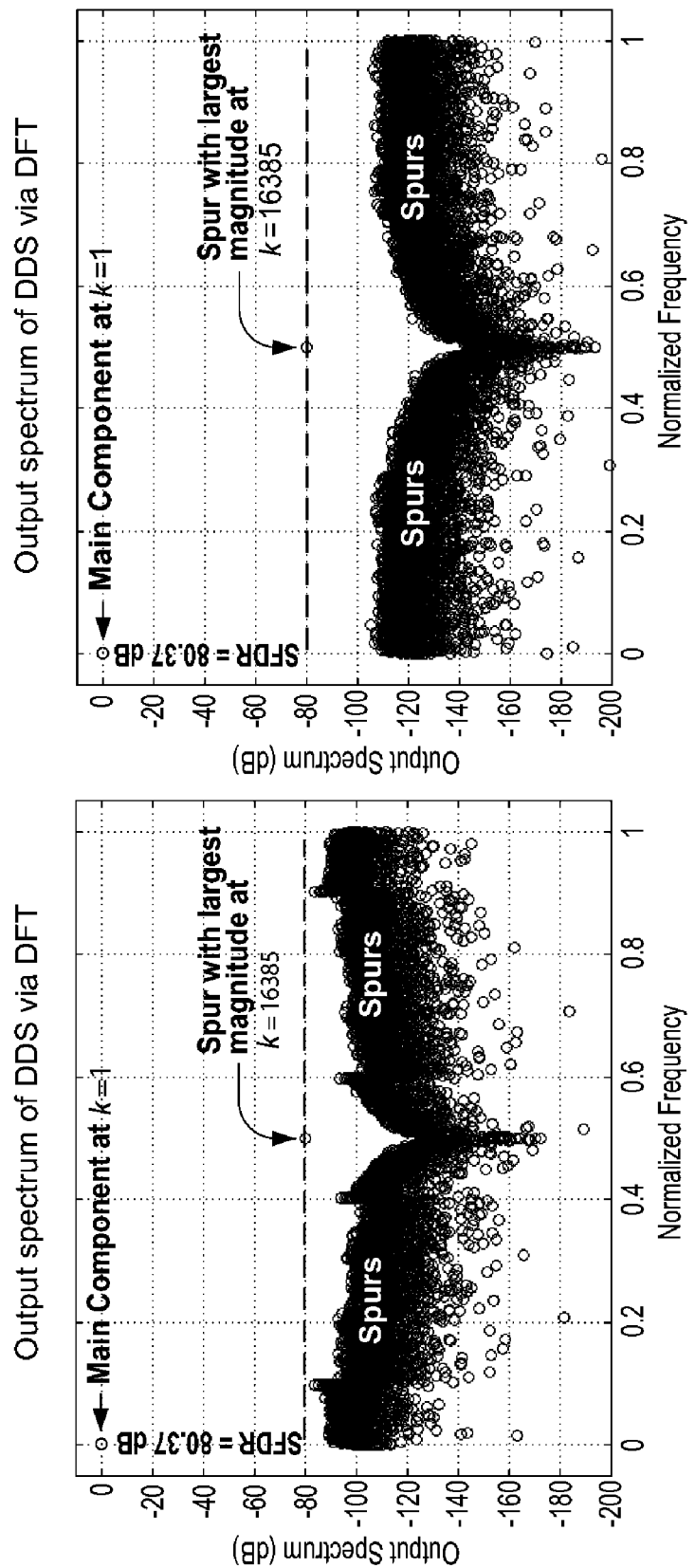
FIGS. 7a and 7b. are example spectra of practical (non-ideal) DDS.

Alternatively, frequency domain information provides a practical method for the analysis of many systems. For example, undesired signal contents at particular frequencies may be irrelevant because a system utilizes filtering techniques to remove them. This is why a DDS is characterized using frequency domain metrics. One, therefore, should consider the frequency domain representation of DDS output via Discrete Fourier Transform (DFT). The DFT of a single period of an ideal quadrature DDS output will have a single frequency component containing all of the output energy, while all of the remaining frequency components will contain no energy. With reference to FIG. 6, an example is described herein where |CS(k)| denotes the magnitude of DDS output DFT and index k enumerates the frequency components. The DFT output frequency components are often referred to as frequency bins. The fact that the entire energy of an ideal DDS output is concentrated in a single frequency bin is an important feature and is utilized by the characterization of DDS in the frequency domain. In a sense, the concentration of DDS output energy in a single frequency bin is a function of all DDS output samples. Therefore, the DFT assists in measuring the quality of all DDS outputs in a collective manner. As imperfections are introduced in the DDS implementation and, as a result, the DDS generates approximations to the ideal outputs (1.1), (1.2), and (1.3), some energy appears in frequency bins other than the one (or ones for sine DDS or cosine DDS) containing the energy of the main component. Again, the DFT provides the means to measure the quality of all DDS outputs by considering the amount of energy in the undesired frequency bins; these are referred to as spurious frequencies. Two examples of practical (i.e., non-ideal) DDS output spectra obtained via DFT are illustrated in FIGS. 7a and 7b.

The most common metric for DDS characterization is the spurious free dynamic range (SFDR), which is the ratio of the magnitude of the main frequency component to the magnitude of the spurious frequency with maximum energy. Therefore, using the dB notation $$SFDR_{quadrature} = 20\log_{10} \frac{|CS(k)_{k=main\ component}|}{\max_{\forall k \neq main\ component} \{|CS(k)|\}} \quad (1.4)$$

and the worst case spur is said to be $$20\log_{10} \frac{\max_{\forall k \neq main\ component} \{|CS(k)|\}}{|CS(k)_{k=main\ component}|}$$

dBc, where Definition of dBc is: dB relative to the carrier. For example, as illustrated by FIG. 7a and FIG. 7b, the main frequency component is at k=1 and the spurious frequency component with maximum energy is at k=16385. Therefore, the SFDR for both examples of FIG. 1-7 is $$20\log_{10} \frac{|CS(1)|}{|CS(16385)|} = 80.37 dB.$$

For the cosine only or sine only DDS the magnitude of the output DFT will be denoted by |C(k)| or |S(k)|, respectively, and the definition of SFDR can be expressed in a manner similar to (1.4) by substituting C or S for CS. Hence, one obtains $$SFDR_{cosine\ only} = 20\log_{10} \frac{|C(k)_{k=main\ components}|}{\max_{\forall k \neq main\ components} \{|C(k)|\}} \quad (1.5)$$

$$SFDR_{sine\ only} = 20\log_{10} \frac{|S(k)_{k=main\ components}|}{\max_{\forall k \neq main\ components} \{|S(k)|\}}. \quad (1.6)$$

Many systems are required to tolerate noise levels at arbitrary frequencies that are below some specified threshold. For such systems SFDR provides a very effective way to quickly decide if a DDS meets this specification since, by definition, all of the spurious frequencies are below the SFDR level. The shortcoming of SFDR though, is its inability to distinguish between DDS having identical SFDR but different "overall" spectral characteristics. For example, FIGS. 7a and 7b illustrates spectra of two distinct DDS where the magnitudes of the worst-case spurs are identical, therefore the SFDR for both DDS is identical. On the other hand, the magnitudes of the remaining spurs are considerably lower for the DDS corresponding to FIG. 7b in comparison to those of FIG. 7a. This distinction is important since, given the choice between the DDS corresponding to FIG. 7a and FIG. 7b, and assuming the design parameters of both DDS meet the system requirements for which they are being considered (including cost), one would naturally prefer the DDS corresponding to FIG. 7b over that of FIG. 7a. To effectively capture the "overall" spectral purity of DDS, a metric that is a function of all spurious components is needed. The signal-to-noise ratio (SNR) is a popular choice as it can capture the quality of the "overall" spectrum. It is the ratio of the power pertaining to the main frequency component(s) to the total cumulative power in all remaining frequency components. Using dB notation, the SNR is therefore expressed as $$SNR_{quadrature} = 10\log_{10} \frac{|CS(k)_{k=main\ component}|^2}{\sum_{\forall k \neq main\ component} |CS(k)|^2} \quad (1.7)$$

$$SNR_{cosine\ only} = 10\log_{10} \frac{|CS(k)_{k=main\ components}|^2}{\sum_{\forall k \neq main\ components} |C(k)|^2} \quad (1.8)$$

$$SNR_{sine\ only} 10\log_{10} \frac{|CS(k)_{k=main\ components}|^2}{\sum_{\forall k \neq main\ components} |S(k)|^2}. \quad (1.9)$$

1.4 The DDS Characterization Problem

Figure 2:
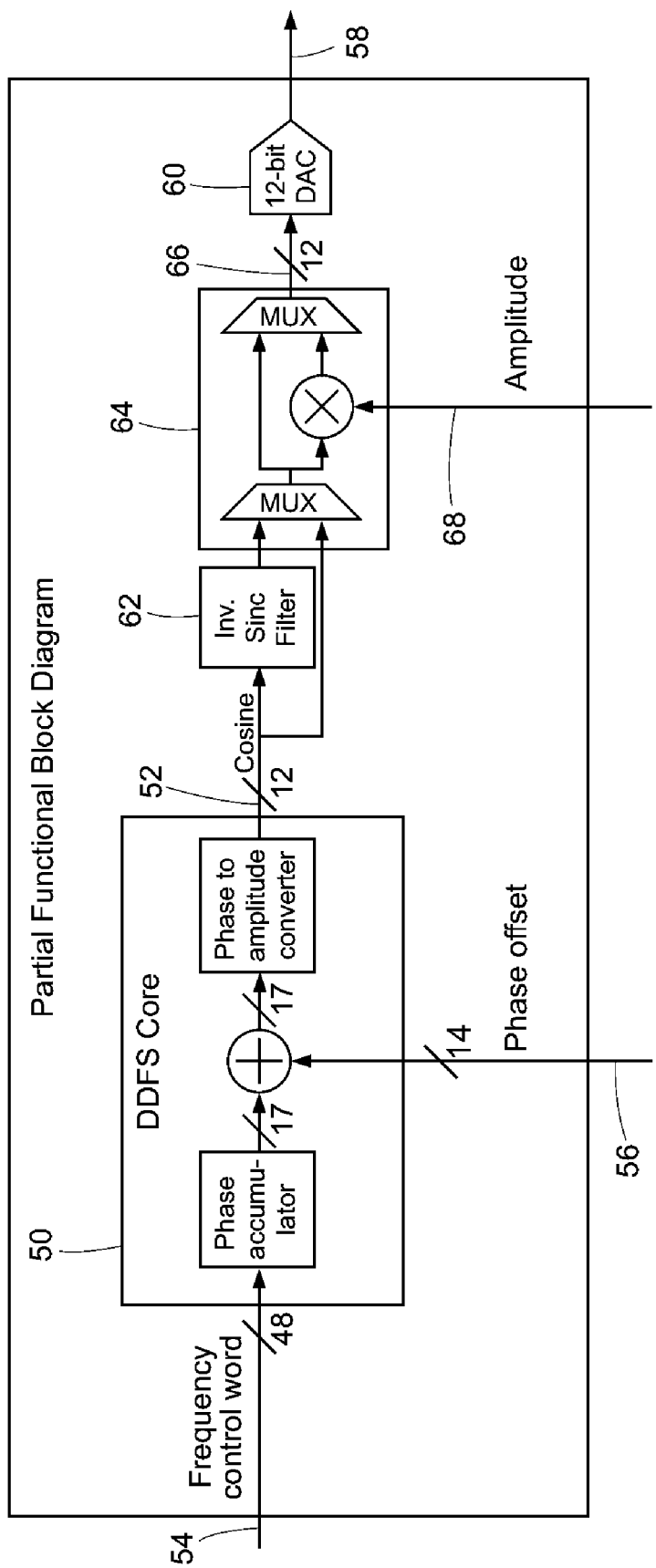
FIG. 2. is a block diagram of a cosine DDS integrated circuit.

The expressions (1.1) through (1.9) provide the means for exact and direct computation of SFDR and SNR for an arbitrary DDS. While it may seem a straightforward and easy task to apply these expressions for the analysis of an arbitrary DDS, a closer investigation of the problem at hand reveals its overwhelming complexity, length, and need for prohibitively large computational and storage resources. For example, a typical DDS has an input fcw comprised of 20-50 bits (i.e., M in FIGS. 1-3 is typically between 20 and 50). Since there are $2^M$ distinct fcw, the DDS analysis needs to be done for all $2^M$ possible fcw. With this typical word length for M one is already faced with a very large problem. This problem can be reduced down to analyzing the DDS for only M fcws. These M fcw are carefully chosen such that the SFDR and SNR results obtained from one of these M fcw are identical to the results corresponding to any fcw in a larger set of fcw. The M fcw are chosen such that the DDS performance for any one of the $2^M$ possible fcw is identical to the performance for one of the M chosen fcw. That is, analyzing the DDS for these M special fcw provides the DDS performance metrics for all possible fcw.

Given any one of these M fcw, the application of (1.1) through (1.9) requires the computation of a DFT, which varies in size depending on the particular fcw. The required DFT sizes corresponding to the M fcw are $2^L$, where L takes on the M integer values between one and M. Therefore, the complete analysis requires the capability of computing and storing the results of DFTs having 2, 4, 8, 16, ..., $2^{M-3}, 2^{M-2}, 2^{M-1}$, and $2^M$ points. Since M may be as large as fifty, the use of any Fast Fourier Transform (FFT) method is still insufficient to compute a $2^M$ point DFT within a reasonable amount of time, while utilizing practical quantities of storage. Using a Dell Precision 330 workstation having a 1.7 GHz Pentium 4 processor and 512 MB of RAM and utilizing an optimized FFT method, the computation of $2^{17}$, $2^{18}$, $2^{19}$, $2^{20}$, and $2^{21}$ point DFTs took 0.5, 1.2, 2.8, 6.0, and 13.9 seconds, respectively. As expected, doubling the DFT size more than doubles the required time for computation. Assuming a best case scenario of only doubling the computation time with a doubling of the DFT length, and also assuming the computer has an unlimited amount of memory, the amount of time to compute a single $2^M$ point DFT is, at best, $0.5 \times 2^{M-17}$ seconds. With M=32, using conventional techniques, the time to complete one $2^M$ point DFT, at best, will take approximately five hours, while with M=40 the time to complete one $2^M$ point DFT will, at best, take more than 51 days, and for the DDS of FIG. 2 where M=48 the time to complete one $2^M$ point DFT is, at best, 34 years.

The DFT computation mentioned above needs to access the inputs and store the computed outputs, which requires the capability to store an array of $2^M$ floating-point complex-valued numbers. For M=32, M=40, and M=48, a DFT computational memory would be required to store more than four billion, more than a trillion, and more than 280 trillion complex-valued floating-point numbers, respectively. Due to these limiting factors for the direct application of (1.1) through (1.9), a computationally feasible and fast alternative approach is needed. The availability of a fast and computationally feasible method can be a valuable tool for a DDS designer since, with such a tool, the DDS performance and implementation tradeoff studies can be done quickly and repeatedly, allowing the designer to converge on the best possible implementation meeting performance and system requirement specifications.

1.5 Novel Approach in Relation to Prior

In order to fully understand the full scope and scale of this invention, one should note that the first efforts for determining the magnitude and spectral location of only phase-truncation spurs were reported in the 1980s. These conventional approaches generally base their analyses on the phase-error sequence due to phase truncation and, using properties of this error sequence along with the assistance of small-angle approximations, derive a rather complex procedure for the characterization of phase-truncation spurs. Shortly thereafter, a more elegant conventional approach was used one for analyzing a class of non-uniformly sampled signals, to model the phase error due to phase truncation and, without approximations, derived an expression for magnitudes of only phase-truncation spurs. Later attempts to improve conventional methods resulted in a method for the estimation of phase-truncation spurs with the introduction of more approximations. However, none of these conventional methods considers the exact characterization of spurs due to SCMF non-idealities, since the theories developed there are derived solely from the properties of phase-truncation error. For the evaluation of SFDR expressions (1.4), (1.5), and (1.6) one should compute the magnitude of the spur having the maximum amount of energy. A characterization method that computes only the phase-truncation spurs will be able to compute the SFDR only for a DDS where the spur of largest magnitude is a phase-truncation spur. Furthermore, with a method that computes only phase-truncation spurs, the evaluation of SNR expressions (1.7), (1.8), and (1.9) would be unfeasible since these expressions depend on all spurs, not just phase-truncation spurs.

As will be described below, the overwhelming majority of spurs generated by any DDS are those caused by SCMF non-idealities. Also, since no method to date has been reported for the precise or exact characterization of spurs due to both phase-truncation and SCMF non-idealities, naturally, there is yet no method for the characterization of the N worst spurs (where N is a user-specified integer) or all spurs above some desired threshold ϵ. This invention describes the interaction between SCMF spurs and phase-truncation spurs. The resulting realization gives rise to a "super-efficient" method for the complete (i.e., including both SCMF non-idealities and phase-truncation) characterization of an arbitrary DDS and a method for the complete characterization of the N worst spurs or all the spurs above a user-specified threshold ϵ. The described method can also be used to compute N-th through M-th spurs and all spurs below or between user-specified thresholds.

2.1 Special Frequency Control Words

Figures 8A, 8B:
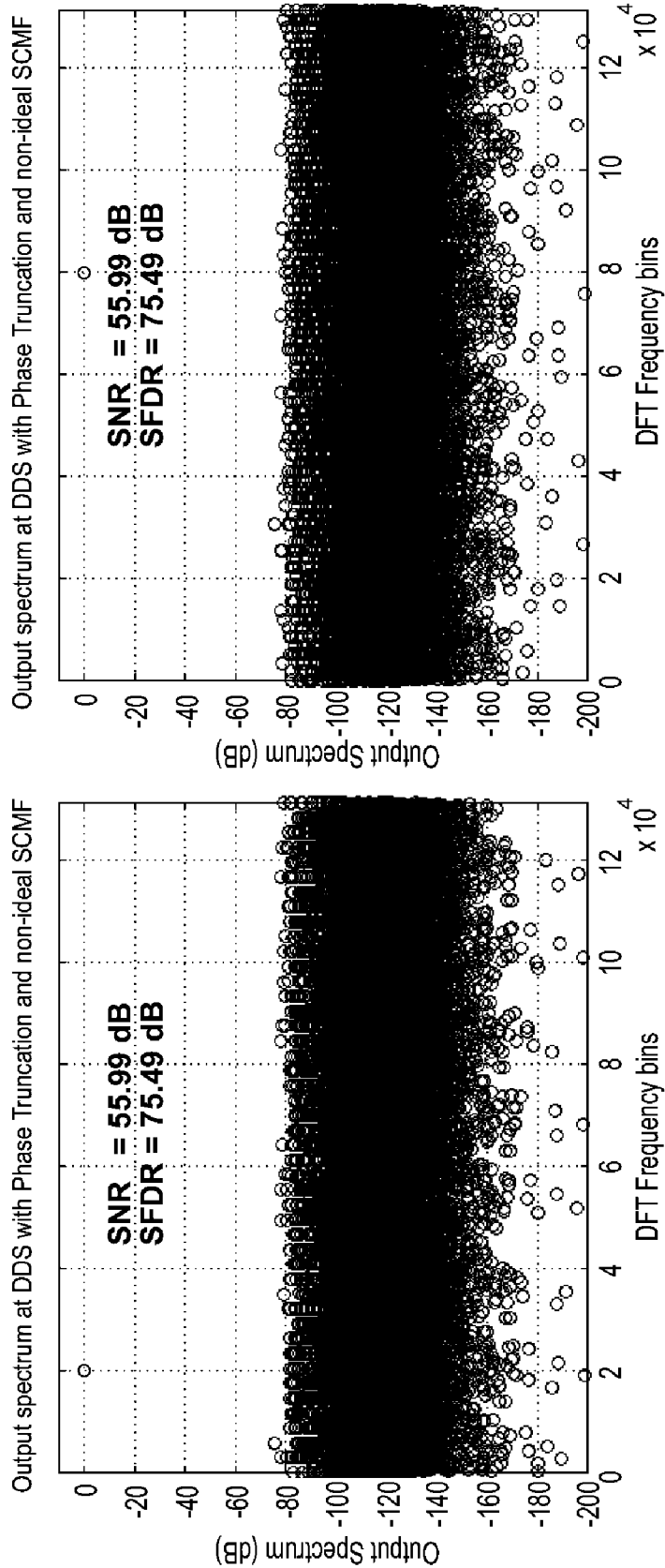
FIGS. 8a and 8b are plots of the spectra of DDS outputs from different fcw from the same group.

The DDS output spurious free dynamic range (SFDR) and signal-to-noise ratio (SNR) change with different DDS input frequency control words (fcw). Hence, a complete DDS characterization requires the computation of SFDR and SNR for all possible fcw. With an M-bit fcw, a DDS can therefore have $2^M$ distinct fcw. Since M is, in general, greater than twenty and very commonly greater than thirty, computing the DDS output SFDR and SNR for all $2^M$ fcw would be a very long and computationally intensive task. The zero fcw will generate a constant value at the DDS output which, in the frequency domain, will have only a DC component, giving rise to infinite SFDR and SNR. Therefore, the zero fcw need not be considered for analysis. Fortunately, the remaining $2^M-1$ nonzero fcw can be grouped into M groups, where the corresponding DDS output SFDR and SNR are identical for all fcw in a common group. The spectra of DDS outputs generated from fcw in a common group are rearrangements of each other. The magnitudes of main signal components and corresponding spurious components are identical and hence the SFDR and SNR are also identical. FIGS. 8a and 8b illustrate spectra for DDS outputs corresponding to two different fcw from a common group. One spectrum can be obtained from the other by a simple rearrangement of the frequency components. Hence, the SFDR and SNR are identical for the two fcw. This means that computing the SFDR and SNR for a single fcw from a particular group provides the SFDR and SNR for all fcw in that group. Moreover, computing the SFDR and SNR for M fcw, one from each of the M groups, provides the SFDR and SNR for all $2^M-1$ nonzero fcw.

The following is the definition of a group for all nonzero fcw: all fcw with a common rightmost nonzero bit position constitute a group. For example, fcw=011001011001̲00 and fcw=111010001011̲00 are from the same group with an underlined rightmost nonzero bit at position 12 (where position 1 corresponds to the most significant bit (MSB)). Notice that this definition of a group naturally groups all $2^M-1$ nonzero M-bit fcw into M mutually exclusive groups since any nonzero fcw will have a rightmost nonzero bit that is located in one of the M possible positions. Also, the M groups have different numbers of fcw. For instance, the group for fcw having their rightmost nonzero bit at position M (i.e., the LSB is '1') will contain $2^{(M-1)}$ fcw, while the group for fcw having their rightmost nonzero bit at position M−1 (i.e., the two LSB are '10') will contain $2^{(m-2)}$, and so forth until the group for fcw having their rightmost nonzero bit at position 1 (i.e., the MSB is '1' and the remaining M−1 LSB are zeros) will contain a single fcw.

Figure 9:
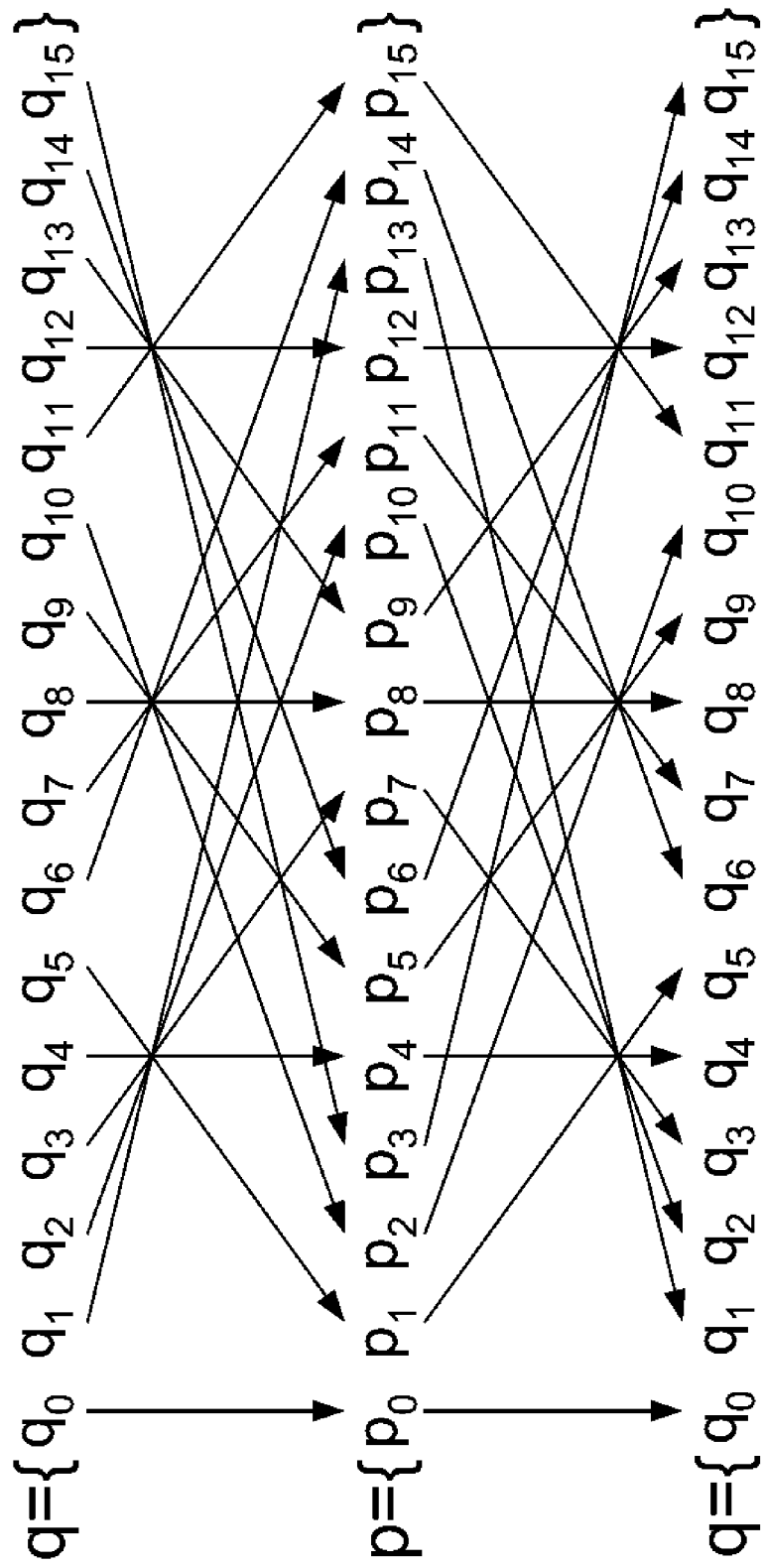
FIG. 9. is a diagram of sequences p and q for fcw1=0101 and fcw2=0001.

Understanding may be reached by investigating the relationship between the set of spurs created by an arbitrary frequency control word, fcw1, and the set of spurs created from fcw2, a frequency control word that is comprised of all zeros except for the rightmost (least significant) nonzero bit of fcw1. An example of such frequency control words is: if fcw1=0101101̲000, then fcw2=0000001̲000, where the nonzero LSB is underlined. The fcw1 and fcw2 are, of course, from the same group of fcw since they share their rightmost nonzero bit position. One now considers sequences p and q generated at the output of the phase accumulator by such fcw1 and fcw2, respectively. One denotes the rightmost nonzero bit of fcw1 and fcw2 as location L, where location 1 corresponds to the MSB. (In the above example L=7.) Both sequences p and q have a period of $2^L$ samples, which is easily seen for sequence q and which is evident as well for sequence p because the elements of sequence p are just a rearrangement of the elements of sequence q. This last claim follows from the fact that fcw1, when considered a binary L-bit positive integer, after omitting any of its LSB zero-bits, is an odd integer (as its LSB is 1) and therefore fcw1 and $2^L$ are relatively prime, i.e. $2^L$ and fcw1 share no prime factors. FIG. 9 illustrates the issue just discussed in the instance where the (normalized, by omitting the LSB zero-bits) frequency control words are fcw1=0101 (five) and fcw2=0001. After such normalization, of course, fcw2 will always be 1. Here, one can see that the terms of the p sequence are obtained by picking terms from the q sequence in steps of five and wrapping around to the beginning of the q sequence when reaching its end. In fact, this rearrangement can be written as p(n)=q((n×fcw1)$_{mod2^L}$) where the sequence index n begins at 0, where fcw1 is the value after normalization, and where $(\cdot)_{mod2^L}$ denotes a modulo operation. Furthermore, to invert this mapping process, let l=(n×fcw1)$_{mod2^L}$ and assume that there exists an integer J with $0<J<2^L$ and such that n=(l×J)$_{mod2^L}$. Then q(l)=p((l×J)$_{mod2^L}$). One need only find J. But, using the verifiable identity $(a_{mod\,c}b_{mod\,c})_{mod\,c}=(ab)_{mod\,c}$ one has n=((n×fcw1)$_{mod2^L}$ J)$_{mod2^L}$=((fcw1×J)$_{mod2^L}$ n)$_{mod2^L}$ which holds if and only if (fcw1×J)$_{mod2^L}$=1. Thus, one defines J as the smallest positive integer satisfying (fcw1×J)$_{mod2^L}$=1. The existence of J is a fundamental result from conventional number theory. For such J, $$p(n)=q((n\times fcw1)_{mod2^L}); \quad q(n)=p((n\times J)_{mod2^L}) \quad (2.1)$$

In the FIG. 9 example, J=13.

2.2 Basis Sets for all Spurious Frequencies

Since the SCMF maps the phase angle (ignoring, for now, the presence of the "truncate block" in FIG. 3) to the corresponding sine and cosine values, the sequence of values at the output of the DDS corresponding to fcw1 can be obtained from the sequence of values at the output of the DDS corresponding to fcw2 by simply performing the same rearrangement of (2.1) needed to obtain the sequence p from the sequence q. In other words, let $s_1(n)$ and $s_2(n)$ be the outputs of a sine DDS corresponding to fcw1 and fcw2, respectively. Then, $s_1(n)=s_2((n\times fcw1)_{mod2^L})$ and $s_2(n)=s_1((n\times J)_{mod2^L})$. Since one is interested in the spectra of the DDS outputs, one needs to investigate the relationship between the Discrete Fourier Transforms (DFT) of $s_1(n)$ and $s_2(n)$. Let $S_1$ and $S_2$ denote the $2^L$-point DFT vectors of $s_1$ and $s_2$, respectively. Then, $S_1=Ws_1$ and $S_2=Ws_2$, where $W\equiv W_{2^L}$ is the $2^L\times 2^L$ matrix with $$W(k,n)=e^{-j\frac{2\pi}{2^L}kn}$$

for k, n=0, ..., $2^L-1$. FIG. 10 illustrates $S_1=Ws_1$ and $S_2=Ws_2$ in the matrix form.

To establish the relationship between the spectra $S_1$ and $S_2$ one first observes that H, the matrix obtained from W by replacing the n-th column of W with column (n×fcw1)$_{mod2^L}$, for n=0, ..., $2^L-1$, is symmetric. The value of the element in position (k,n) of H is $$e^{-j\frac{2\pi}{2^L}k(n\times fcw1)_{mod2^L}}$$

but since the integer part of $$\frac{1}{2^L}k(n\times fcw1)_{mod2^L}$$

contributes nothing to this expression, it can be rewritten as $$e^{-j\frac{2\pi}{2^L}\left(k(n\times fcw1)_{mod2^L}\right)_{mod2^L}} = e^{-j\frac{2\pi}{2^L}n(k\times fcw1)_{mod2^L}}$$

which is the value of the element in position (n,k) of H. That is, H is symmetric. This last step again relies on the identity $(a_{mod\,c}b_{mod\,c})_{mod\,c}=(ab)_{mod\,c}$.

Since H is symmetric, a similar rearrangement on the rows of W (replacing the n-th row of W with row (n×fcw1)$_{mod2^L}$) would also yield the matrix H. Finally, performing the inverse rearrangement on either the rows or columns of H, i.e. replacing the n-th row (column) of H with row (column) (n×J)$_{mod2^L}$, for n=0, ..., $2^L-1$, will reproduce the DFT matrix W.

Now consider the matrix equation v=Mu, where v and u are column vectors while M is a square matrix. Rearranging the elements of vector u and performing the same rearrangement on the columns of M will leave the resulting vector v unchanged. Finally, leaving u unchanged and rearranging the rows of M will similarly rearrange the elements of v.

Figure 11:
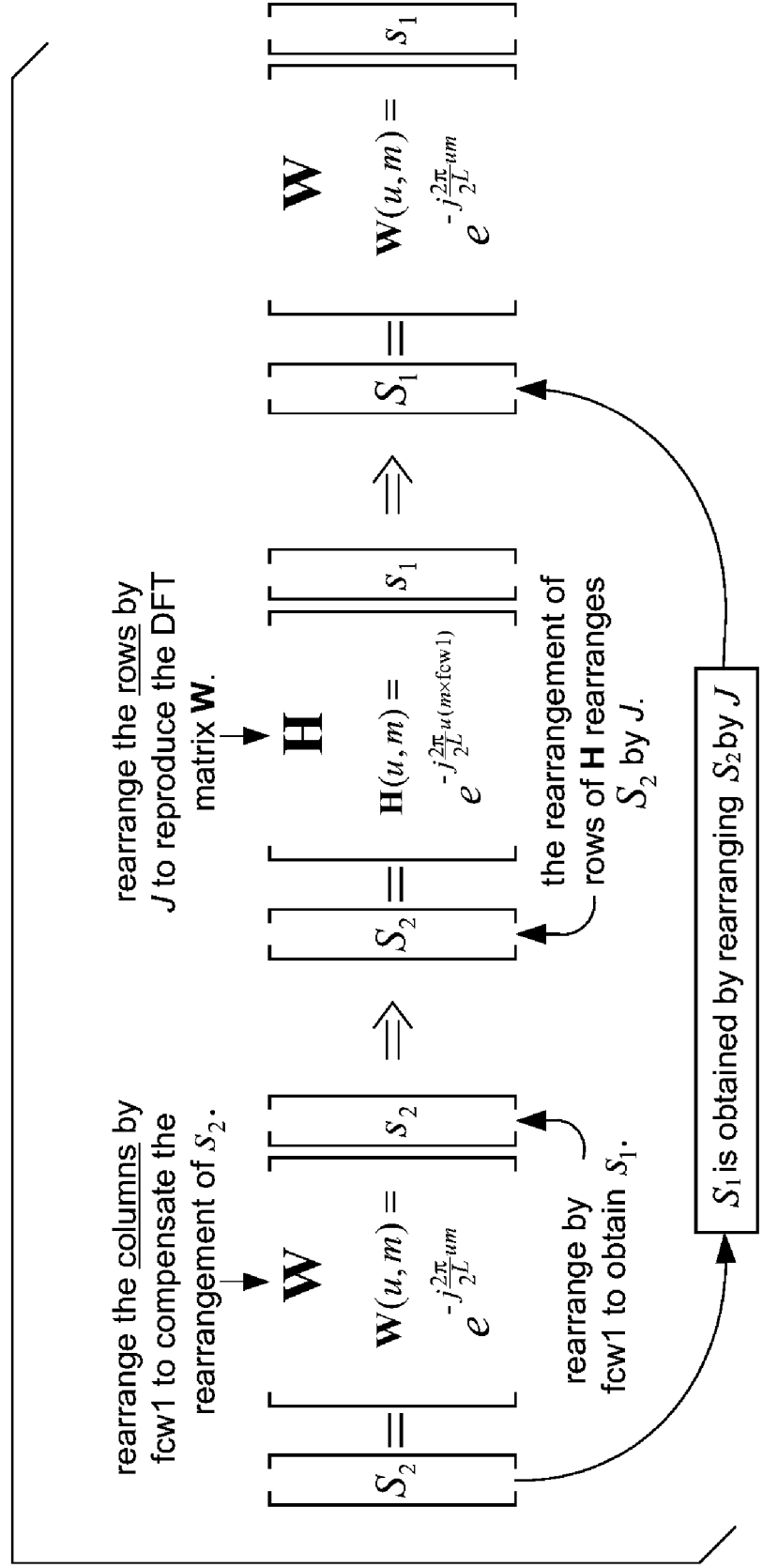
FIG. 11. is a diagram of relationship between spectra generated from fcw in the same group.

Now, consider the spectrum $S_2=Ws_2$ and perform the forward rearrangement (by fcw1) on the elements of 52 and the columns of W to produce the following expression: $S_2=Hs_1$. Next, perform the inverse rearrangement (by J) on the rows of H to change H back to W and reproduce $S_1=Ws_1$. Since the row rearrangement on H rearranges the elements of $S_2$ one concludes that $S_1$ is obtained by performing an inverse rearrangement on the elements of $S_2$. Consequently, $S_2$ is obtained by performing a forward rearrangement on the elements of $S_1$. Refer to FIG. 11 for an illustration. Summarizing:

$$s_1(n)=s_2((n\times fcw1)_{mod2^L}); \quad s_2(n)=s_1((n\times J)_{mod2^L})$$

$$S_1(k)=S_2((k\times J)_{mod2^L}); \quad S_2(k)=S_1((k\times fcw1)_{mod2^L}) \quad (2.2)$$

For cosine DDS and quadrature DDS the relationship between the time-domain outputs and frequency-domain spectra are similar and can be expressed using (2.2) and substituting c(n) for s(n) and C(k) for S(k) for cosine DDS and substituting cs(n) for s(n) and CS(k) for S(k) for quadrature DDS. Therefore, the set of spur magnitudes created by fcw1 is identical to the set created by fcw2; the spurs are simply rearranged in frequency. Furthermore, the set of spurs created by any frequency control word is a rearrangement of one of the M sets of spectra corresponding to the M distinct frequency control words having a single nonzero bit. These M sets of spectra can be viewed as basis sets. Section 3.6 will discuss a generalization of these basis sets such that the "single nonzero bit" becomes a group of one or more bits, not all zero.

2.3 Appropriate DFT Size for Analysis

There are a few critical points to consider when characterizing DDS spurs and computing the SFDR and SNR. As discussed earlier, for a given frequency control word, the corresponding spectrum is generated by computing the DFT of the DDS output sequence(s). It is important to take into account certain properties associated with the DFT. More specifically, for an N-point DFT of the time domain sequence x(n) the periodicity property states that x(n+N)=x(n) for all n.

Figure 12:
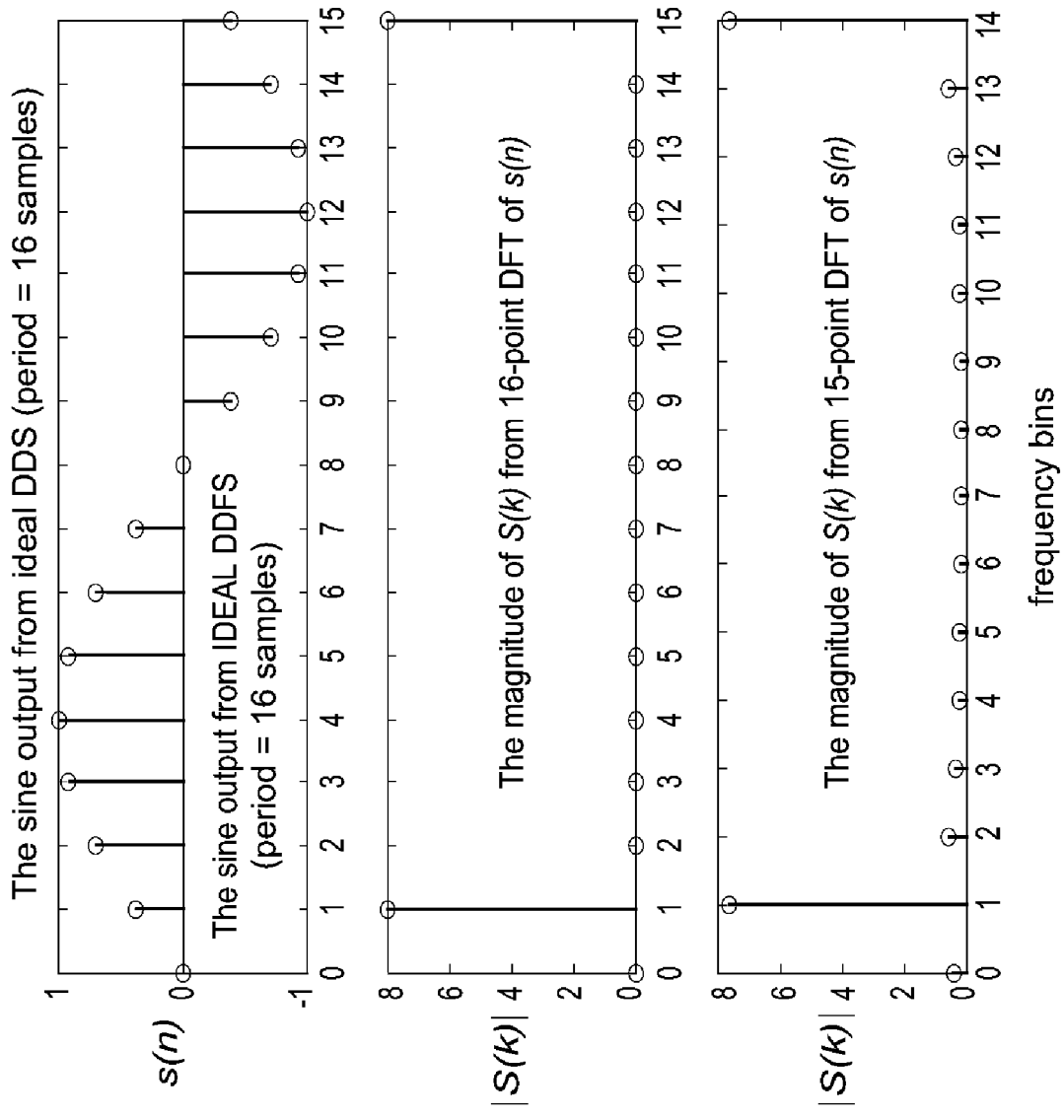
FIG. 12. is a diagram of DFT size and aliasing.

To satisfy the DFT periodicity property, the length of the DDS output sequence considered must be an integer multiple of its period. From Sections 2.1 and 2.2 one knows that for a frequency control word having its rightmost nonzero bit at position L, the DDS output sequence has period $2^L$. Hence, the appropriate sequence length for the DFT is an integer multiple of $2^L$. For computational efficiency one should always choose a single period ($2^L$ points). If an inappropriate sequence length were employed, the periodicity property would be violated and aliasing could corrupt the generated spectrum. For example, assume that the SCMF is ideal with L=4, and therefore the frequency control word to consider is fcw2=0001. The DDS output sequence in this case has a period of sixteen samples. FIG. 12 depicts the sine DDS output. The magnitude of the sixteen-point DFT for that sequence is also shown in FIG. 12, and since the DDS is ideal, as expected, it consists of a pair of impulses. FIG. 12 also includes the fifteen-point DFT, where the alias components are present throughout the spectrum. This issue of proper DFT size can easily be overlooked when performing laboratory measurements. Equipment used for capturing DDS outputs and performing the DFT to generate the spectrum have limited capability in terms of a maximum DFT size. If the considered frequency control word is such that the required DFT length is greater than the maximum capability of the equipment, then DFT aliasing can (and most probably will) occur and be incorrectly interpreted as DDS spurs.

Figure 13:
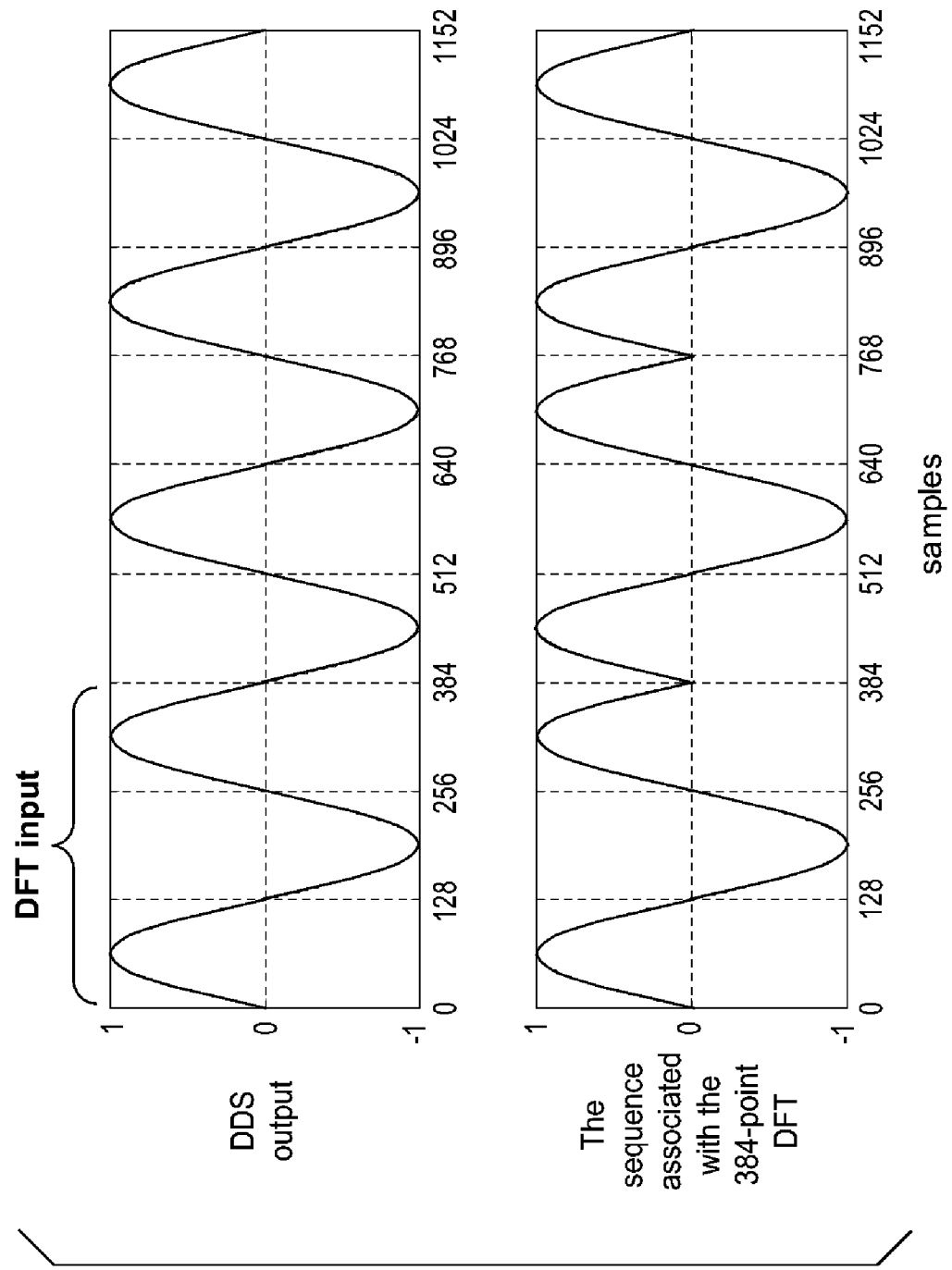
FIG. 13. is a diagram of the periodicity property of DFT.

Notice also that choosing a DFT size greater than, but not a multiple of, the DDS output sequence period $2^L$ will also result in aliasing. For example, consider fcw=00000001, hence L=8. The period of the DDS output corresponding to this fcw is $2^8$=256; therefore a 256-point DFT could be used for analysis. Assume instead a 384-point DFT is used. The DFT will contain $$\frac{384}{256} = 1.5$$

periods of the DDS output sequence and will violate the periodicity property for the sequence produced by the DDS. It satisfies the periodicity property for a different sequence and therefore the DFT results pertain to that other sequence. FIG. 13 illustrates this issue. Serious errors can be introduced when a designer simply chooses a large size DFT (such as 16,000 or 64,000) and uses it for the analysis of the spurs generated from various frequency control words. With a DFT size of 16,000=125×$2^7$ the periodicity property will be violated for all fcw with L≧8 and with a 64,000-point DFT the periodicity property will be violated for all fcw with L≧10. Clearly, the best choice for DFT size (the smallest size not violating the periodicity property) is $2^L$.

2.4 Spectra for Sine DDS, Cosine DDS, and Quadrature DDS

With an fcw having the rightmost nonzero bit at position L one knows from the discussion of Sections 2.1 and 2.2 that the output of the DDS will have a period of $2^L$ samples and, as illustrated in Section 2.3, the DDS output spectrum is the result of performing a $2^L$-point DFT on a single period of the DDS output. A sine DDS generates a sequence s(n) of period $2^L$ which approximates the ideal output (1.1), a cosine DDS generates a sequence c(n) of period $2^L$ which approximates the ideal output (1.2), and a quadrature DDS generates a complex valued sequence c(n)+js(n) of period $2^L$ which approximates the ideal output (1.3). Since $$\cos\theta = \sin\left(\theta + \frac{\pi}{2}\right)$$

any practical implementation of a sine DDS can be easily modified to produce the complementary cosine DDS by adding $$\frac{\pi}{2}$$

(actually the normalized equivalent of $$\frac{\pi}{2})$$

to the normalized phase angle $\hat{\theta}$ of FIG. 3. Similarly, any practical implementation of a cosine DDS can be easily turned into its complementary sine DDS by subtracting the equivalent of $$\frac{\pi}{2}$$

from $\hat{\theta}$. Therefore, the outputs of complementary sine and cosine DDS are simply shifted versions of one another. More specifically, c(n)=s(n+d) where, since the period of sequences c(n) and s(n) are $2^L$ samples and $2^L$ corresponds to $2\pi$, the shift amount corresponding to $$\frac{\pi}{2}$$

is therefore $$d = \frac{2^L}{4}.$$

Any sine DDS and cosine DDS pair will be called complementary if, for any fcw with a rightmost nonzero bit position L, the cosine DDS and sine DDS outputs have the following relationship $$c(n) = s\left(n + \frac{2^L}{4}\right). \tag{2.3}$$

Most implementations of quadrature DDS generate sine and cosine outputs that satisfy (2.3).

Applying the DFT to one period of the sine DDS output s(n) and cosine DDS output c(n) one obtains their corresponding spectra $$C(k) = \sum_{n=0}^{2^L-1} c(n) e^{-j\frac{2\pi}{2^L}kn} \quad (2.4)$$

$$S(k) = \sum_{n=0}^{2^L-1} s(n) e^{-j\frac{2\pi}{2^L}kn}. \quad (2.5)$$

Substituting (2.3) into the DFT expression (2.4) one obtains $$C(k) = \sum_{n=0}^{2^L-1} s\left(n + \frac{2^L}{4}\right) e^{-j\frac{2\pi}{2^L}kn} = e^{j\frac{\pi}{2}k} \sum_{n'=0}^{2^L-1} s(n') e^{-j\frac{2\pi}{2^L}kn'}.$$

And using (2.5) one establishes the relationship $$C(k) = e^{j\frac{\pi}{2}k} S(k) \quad (2.6)$$

between the spectra of sine DDS and its complementary cosine DDS. Taking the magnitude of both sides of (2.6) one obtains $$|C(k)| = |S(k)| \quad (2.7)$$

and conclude that the magnitudes of spectra corresponding to complementary sine DDS and cosine DDS are identical. The SFDR for cosine DDS and sine DDS defined in (1.5) and (1.6) and SNR defined in (1.8) and (1.9) are functions of $|C(k)|$ and $|S(k)|$. Therefore, one concludes from (2.6) that complementary sine DDS and cosine DDS have identical SFDR and SNR. Notice also, for any sine DDS and cosine DDS satisfying the condition $c(n)=s(n+d)$ with d an arbitrary integer, the corresponding spectra $S(k)$ and $C(k)$ are related through $$C(k) = e^{j\frac{2\pi}{2^L}kd} S(k).$$

Hence, the magnitudes of the spectra satisfy (2.7). Therefore, in addition to complementary sine DDS and cosine DDS, one concludes that any sine DDS and cosine DDS satisfying the condition $c(n)=s(n+d)$ for any integer d, have identical SFDR and SNR.

A quadrature DDS generates both the sine and cosine outputs and as a complex-valued sequence, expressed as $cs(n)=c(n)+js(n)$. The output spectrum $CS(k)$ can be expressed in terms of the spectra of its cosine output $C(k)$ and sine output $S(k)$ by using the superposition property of DFT and $cs(n)=c(n)+js(n)$ to obtain $$CS(k)=C(k)+jS(k). \quad (2.8)$$

The term "quadrature" implies the output sine and cosine values having a phase difference of exactly $$\frac{\pi}{2}$$

radians (i.e., being exactly 90 degrees apart from one another). While it is possible to implement a quadrature DDS that does not generate outputs that have a phase difference of exactly $$\frac{\pi}{2}$$

radians, an implementation of a quadrature DDS that generates outputs that have a phase difference of exactly $$\frac{\pi}{2}$$

radians (i.e., the outputs satisfy (2.3) for an arbitrary fcw) is desirable. Assuming (2.3) is satisfied for the outputs of the quadrature DDS, one can see that the spectra of cosine output $C(k)$ and sine output $S(k)$ are related through (2.6). Substituting (2.6) into (2.8) one obtains $$CS(k) = e^{j\frac{\pi}{2}k} S(k) + jS(k) = \left(e^{j\frac{\pi}{2}k} + j\right) S(k) \quad (2.9)$$

where k is the frequency bin index and a complete period of $CS(k)$ is obtained when considering all $0 \leq k < 2^L$. Now consider values of k that are multiples of four, i.e., let $k=4r$ where r is an integer and $$0 \leq r \leq \frac{2^L}{4}.$$

Substituting $k=4r$ into (2.9) one gets $$CS(4r) = \left(e^{j\frac{\pi}{2}4r} + j\right) S(4r) = (1+j) S(4r), \quad (2.10)$$

while the magnitude of the spectrum is $$|CS(4r)| = \sqrt{2} |S(4r)|. \quad (2.11)$$

Consider next all values of $k=4r+1$ where r is an integer and $$0 \leq r < \frac{2^L}{4}.$$

Substituting $k=4r+1$ into (2.9) one obtains $$CS(4r+1) = \left(e^{j\frac{\pi}{2}(4r+1)} + j\right) S(4r+1) = 2jS(4r+1), \quad (2.12)$$

and the corresponding magnitude of the spectrum is $$|CS(4r+1)| = 2|S(4r+1)|. \quad (2.13)$$

Similarly, for all values of k=4r+2 one finds $$CS(4r+2) = \left(e^{j\frac{\pi}{2}(4r+2)} + j\right)S(4r+2) = (-1+j)S(4r+2), \quad (2.14)$$

and $|CS(4r+2)| = \sqrt{2}|S(4r+2)|.$ (2.15)

For the remaining values of k=4r+3 the expression (2.9) simplifies to $$CS(4r+3) = \left(e^{j\frac{\pi}{2}(4r+3)} + j\right)S(4r) = 0 \quad (2.16)$$

and the magnitude of the spectrum is $|CS(4r+3)|=0.$ (2.17)

With the assistance of (2.10), (2.12), (2.14), and (2.16) one can obtain the entire spectrum of a quadrature DDS CS(k) from the spectrum corresponding to its sine output S(k). As one might expect, similar expressions can easily be derived to establish the relationship between CS(k) and the spectrum corresponding to the cosine output C(k). One notices from (2.17) that all of the spectral components corresponding to k=4r+3 have zero energy. Therefore, all spurious frequency components at these locations are guaranteed to be zero. Considering that this set of zero-spur locations constitutes 25% of the entire spectrum, one concludes that designing the quadrature DDS such that the necessary condition (2.3) is satisfied may significantly improve the overall performance. Furthermore, in Section 5 a design method is discussed that produces spectra C(k) and S(k) such that for all even frequency bins (i.e., for the sets k=4r and k=4r+2) the spurs are zero. From (2.10), (2.11), (2.14), and (2.15) one concludes that, using the method described in Section 5, a quadrature DDS that is also made to satisfy (2.3) will have a spectrum with 75% of potential spurs having zero energy.

In general, if a quadrature DDS does not satisfy (2.3) but rather has the property c(n)=s(n+d) for some integer value of d, then the spectrum CS(k) can be expressed as $$CS(k) = e^{j\frac{2\pi}{2^L}kd}S(k) + jS(k) = \left(e^{j\frac{2\pi}{2^L}kd} + j\right)S(k). \quad (2.18)$$

A similar expression can be derived that expresses CS(k) in terms of C(k). From (2.18) one concludes that the spectrum CS(k) of a quadrature DDS with cosine and sine outputs c(n) and s(n), respectively, satisfying the condition c(n)=s(n+d) for some arbitrary integer d, can be obtained from the spectrum of only the cosine output C(k) or the spectrum of only the sine output S(k). For such quadrature DDS, with the assistance of (2.18), the computational complexity of the required DFT is reduced since a direct computation of CS(k) requires a complex-input DFT while the computation of S(k) (or C(k)) requires only a real-input DFT.

3.1 Phase Word Truncation

As shown in FIG. 3, the phase sequence at the output of the phase accumulator is truncated to W bits before addressing the SCMF. Consequently, all input frequency control words can be grouped into two categories. (Recall that the MSB bit position is denoted as position 1.) The first group includes all fcw with their rightmost nonzero bit position L at or above position W, i.e. L≦W. In this case there will be no phase truncation and all spurs at the DDS output will be due to the non-ideal SCMF. DDS behavior for such fcw will be discussed in Section 3.6. The second group includes all fcw with L>W and for such fcw there will be phase truncation. For example, with W=15 the fcw=0110101110010<u>0</u>0000000000 (where L=12) is from the first group, while the fcw=11010100001010<u>1</u>11010100 (where L=22) belongs to the second group. The underlined positions correspond to W=15, the position of phase truncation. Consider first the analysis of DDS spurs for fcw with L>W.

Now consider, for example, a DDS with a 24-bit fcw, and a 15-bit SCMF input. In FIG. 3, this corresponds to M=24 and W=15. Assume the frequency control word is g= 000000000000000010000, with its rightmost nonzero bit at position L=20. The rightmost nonzero bit is therefore B=L−W=5 bits below the truncation position W=15. The four LSB bits could be omitted since they do not impact the outcome, and after such normalization one notices that the sequence q at the output of the phase accumulator will increment by one on every cycle. The corresponding sequence q' at the output of the truncate block will step once for every $2^B=2^5=32$ cycles. In other words, it will be 0 for 32 cycles, then 1 for 32 cycles, then 2 for 32 cycles, and so forth.

Now consider an arbitrary fcw with its rightmost nonzero bit at L=20 (e.g. f=<u>0</u>100110110111101011100000) and its corresponding sequences p and p' at the output of the phase accumulator and the truncate block, respectively. From the discussion of Section 2.1 it is known that both sequences p and q have period $2^L$ and one sequence is a rearrangement of the other, as dictated by (2.1). The sequence q' is also periodic with period $2^L$ since it increments by one every $2^B$ cycles and will begin to repeat itself only when the phase accumulator overflows, which occurs once every $2^L$ cycles. Since the truncation operation is a simple mapping from its input to its output, any rearrangement of the sequence before truncation will result in the same rearrangement of the sequence after truncation. This means that the sequences p' and q' are also related through (2.1) and therefore the set of spurs generated by the sequences p' and q'(corresponding to fcw f and g respectively) are identical in the number and magnitude of spurs. Therefore, even in the case of phase truncation, the sets of spur magnitudes are identical for all fcw with a common rightmost nonzero bit position and their spectra are the rearrangements of one another dictated by (2.2).

The sequences p' and q' are periodic of period $2^L$. Furthermore, $2^L$ samples of sequence p' can be reconstructed by rearranging one period of q', as shown in FIGS. 14a and 14b for the B=3 case. This construction, however, is insufficient to conclude that $2^L$ samples of p' cannot contain multiple smaller periods. This is an important issue because, if the sequence p' were to have a period smaller than $2^L$ samples, then the required DFT size for analysis could be reduced, as discussed in Section 2.3.

Theorem: The smallest period of p' contains all $2^L$ samples.

Proof From Sections 2.1 and 3.1 one knows p' repeats every $2^L$ samples. Assume $2^L$ samples of p' contain P periods, where P>1. Then, since 2 is the only prime factor of $2^L$, one concludes that P must be a power of 2; in particular, P must be even. One can further deduce that any subsequence of consecutive samples having length $$r \leq \frac{2^L}{P}$$

must occur an even number of times within a length $2^L$ sequence of samples of p'. Now, consider the construction of a length-$2^L$ sequence of p' samples by picking every f-th sample (where f is the non-trivial fcw after omitting all of its zero LSB bits) from the sequence q' and wrapping around to the beginning of the q' sequence when reaching its end. Notice that f is odd since its LSB is '1'. Next, index the groups of $2^B$ samples in q' from 0 to $2^{L-B}-1$ and index the samples within each group from 0 to $2^B-1$. Finally, consider the i-th group of $2^B$ samples in q'. These samples have the value i.

Case 1. Assume $2^B < f < 2^L$.

Since $f > 2^B$, in the construction of p' each sample from group i will be followed by a sample from a different group. If the first sample (corresponding to index 0) of group i is followed by a sample from group i+y, then the index of this sample from group i+y must be odd since f is odd. (Refer to FIG. 3-1$a$ for an example.) Consequently, all pairs of consecutive samples from groups i and i+y have even-odd or odd-even index pairs. Therefore, there must be an odd number of subsequences with consecutive values i and i+y since there are the odd number $2^B - f_{mod 2^B}$ of such pairs whose second sample lies in group i+y. Hence, one has a contradiction establishing that for $f > 2^B$ the $2^L$ samples of the sequence p' constitute its smallest period.

Case 2. Assume $f < 2^B$.

Here, one has repeated values from the same group. In particular, there will be subsequences with $$\left\lfloor \frac{2^B}{f} \right\rfloor$$

consecutive samples having value i and subsequences with $$\left\lfloor \frac{2^B}{f} \right\rfloor + 1$$

consecutive samples with value i. (Refer to FIG. 14 for this case.) It is evident that there will be $x = \text{rem}(2^B, f)$ subsequences with $$\left\lfloor \frac{2^B}{f} \right\rfloor + 1$$

consecutive samples having value i, and f−x subsequences with $$\left\lfloor \frac{2^B}{f} \right\rfloor$$

consecutive samples having value i. If x is odd, then there is an odd number of subsequences with $$\left\lfloor \frac{2^B}{f} \right\rfloor + 1$$

consecutive samples having value i and one has a contradiction. On the other hand, if x is even, then f−x is odd and there is an odd number of subsequences with $$\left\lfloor \frac{2^B}{f} \right\rfloor$$

consecutive samples having value i and one again has a contradiction. Therefore, when $f < 2^B$ one concludes that $2^L$ samples of the sequence p' constitute its smallest period. Since f is odd, by definition, one need not consider the case $f = 2^B$. Combining the results from both cases (i.e., $f > 2^B$ and $f < 2^B$), one concludes that $2^L$ and no less than $2^L$ samples of p' constitute one period for each fcw f. □

Now assume that the SCMF is ideal (with infinite precision outputs). Once one gains a firm understanding of the spurious frequencies generated from phase-word truncation, the analysis will be extended to include spurs due to a finite precision SCMF. Since it was shown that the sets of spur magnitudes for all fcw with a common rightmost nonzero bit are identical, the fcw with a single nonzero bit are investigated. Consider again the case with M=24, W=15, B=5 and g=<u>00000000000000</u>000*10000*, the single-nonzero-bit fcw for this case, where underlined bits correspond to phase-word bit positions that address the SCMF and italicized bits correspond to truncated LSBs. The corresponding sequence at the output of the phase accumulator is q and the sequence at the output of the truncate block is q'. Since the SCMF simply outputs the sine and cosine values for the input phase, the same "redundant" behavior can be observed at the outputs s(n) and c(n) of the DDS. Notice that the SCMF will go through all possible $2^{15}=32,768$ inputs and their corresponding outputs, each repeated 32 times, before repeating the cycle again. FIG. 15 illustrates a DDS 300 having these properties with corresponding outputs 302,304 and 306 for respective phase accumulator 308, truncator 310 and SCMF 312.

Now examine the magnitudes and spectral positions of the spurious frequencies at the output of the sine DDS. Now Perform a $2^{20}$-point DFT (the smallest appropriate DFT size according to Section 2.3) of the DDS output and observe the spurious frequencies:

$$S(k) = \sum_{n=0}^{2^{20}-1} s(n) e^{-j \frac{2\pi}{2^{20}} nk} \text{ where } 0 \leq n, k < 2^{20}. \quad (3.1)$$

Expanding (3.1) as 32 summations one has $$S(k) = \sum_{n=0}^{2^{15}-1} s(32n) e^{-j \frac{2\pi}{2^{20}} (32n)k} +$$

$$\sum_{n=0}^{2^{15}-1} s(32n+1) e^{-j \frac{2\pi}{2^{20}} (32n+1)k} + \ldots + \sum_{n=0}^{2^{15}-1} s(32n+31) e^{-j \frac{2\pi}{2^{20}} (32n+31)k}$$

where $0 \leq k < 2^{20}$, $0 \leq n < 2^{15}$ which, by factoring expressions not depending on n out of the summations, and writing $$\frac{32}{2^{20}} = \frac{1}{2^{15}},$$

becomes $$S(k) = \sum_{n=0}^{2^{15}-1} s(32n)e^{-j\frac{2\pi}{2^{15}}nk} + e^{-j\frac{2\pi}{2^{20}}k}\sum_{n=0}^{2^{15}-1} s(32n+1)e^{-j\frac{2\pi}{2^{15}}nk} + \ldots + \\ e^{-j\frac{2\pi}{2^{20}}31k}\sum_{n=0}^{2^{15}-1} s(32n+31)e^{-j\frac{2\pi}{2^{15}}nk} \text{ for } 0 \leq k < 2^{20}. \quad (3.2)$$

Using the fact that s(32n)=s(32n+1)=s(32n+2)=...=s(32n+30)=s(32n+31), as discussed previously (and as depicted in FIG. 15), one can again rewrite (3.2) as $$S(k) = \left(1 + e^{-j\frac{2\pi}{2^{20}}k} + e^{-j\frac{2\pi}{2^{20}}2k} + \ldots + e^{-j\frac{2\pi}{2^{20}}31k}\right)\sum_{n=0}^{2^{15}-1} s(32n)e^{-j\frac{2\pi}{2^{15}}nk}$$

$$= \left(1 + e^{-j\frac{2\pi}{2^{20}}k} + e^{-j\frac{2\pi}{2^{20}}2k} + \ldots + e^{-j\frac{2\pi}{2^{20}}31k}\right)S'(k) \text{ for } 0 \leq k < 2^{20}$$

where S'(k) is the $2^{15}$-point DFT of the non-redundant subsequence (i.e., the signature sequence) s'(n)=s(32n). Thus, by summing the finite geometric series, one obtains $$S(k) = V(k)S'(k) \quad (3.3)$$

where $$V(k) = \frac{1 - e^{-j\frac{2\pi}{2^{15}}k}}{1 - e^{-j\frac{2\pi}{2^{20}}k}}.$$

Notice that if the SCMF is implemented as a lookup table, s'(n) corresponds to the contents of the table at address n. For this particular example, the SCMF would have $2^{15}$ entries since W=15 was chosen. Referring to V(k) as the windowing function, clearly, the entire derivation for S(k) and V(k) in (3.3) can be carried out with the variables W and B instead of 15 and 5 as in this example, in which case one obtains the following general expressions for S(k) and V(k):

$$\boxed{\begin{aligned} S'_W(k) &= \sum_{n=0}^{2^W-1} s'(n)e^{-j\frac{2\pi}{2^W}nk} & k=0,1,\ldots,2^{W+B}-1 \\ V_{W,B}(k) &= \frac{1 - e^{-j\frac{2\pi}{2^W}k}}{1 - e^{-j\frac{2\pi}{2^{(W+B)}}k}} & k=0,1,\ldots,2^{W+B}-1 \\ S_{W,B}(k) &= V_{W,B}(k)S'_W(k) & k=0,1,\ldots,2^{W+B}-1 \end{aligned}} \quad (3.4)$$

where $S'_W(k)$ is periodic in k with period $2^W$ and one period of $V_{W,B}(k)$ windows over $2^B$ periods of $S'_W(k)$. The expressions in (3.4) can also be applied to cosine DDS and quadrature DDS (with the appropriate substitutions for s(n) and S(k)) since all the properties used in the derivation process of (3.4) hold for both cosine DDS and quadrature DDS.

3.2 Windowing Function V and the Spurious Frequencies Due to Phase Word Truncation At this point one has all the necessary tools to address the question of spurious frequencies at the output of the DDS. To begin the discussion on the meaning of the windowing function $V_{W,B}(k)$ following are a few comments regarding $S'_W(k)$ (which is windowed by V). When employing the assumption of an ideal SCMF (with infinite precision outputs) the expressions for $S'_W(k)$ and $|S'_W(k)|$ (also for $C'_W(k)$, $|C'_W(k)|$, $CS'_W(k)$, and $|CS'_W(k)|$) are quite simple. Recall that s'(n), the signature sequence, is the sine with frequency $$\frac{2\pi}{2^W}$$

radians per sample. Therefore, for $$s'(n) = \sin\frac{2\pi n}{2^W}$$

one has $$S'_W(k) = \sum_{n=0}^{2^W-1} \left(\sin\frac{2\pi n}{2^W}\right)e^{-j\frac{2\pi}{2^W}nk} =$$

$$\sum_{n=0}^{2^W-1}\left(\frac{e^{j\frac{2\pi}{2^W}n} - e^{-j\frac{2\pi}{2^W}n}}{2j}\right)e^{-j\frac{2\pi}{2^W}nk} = \frac{1}{2j}\sum_{n=0}^{2^W-1}\left(e^{-j\frac{2\pi}{2^W}(k-1)n} - e^{-j\frac{2\pi}{2^W}(k+1)n}\right)$$

and, using the well-known relationship $$\sum_{n=0}^{M-1} e^{-j\frac{2\pi}{M}nl} = \begin{cases} M & \text{if } l \text{ is an integer multiple of } M \\ 0 & \text{if } l \text{ is any other integer} \end{cases}$$

one has $$S'_W(k) = \frac{1}{2j}(2^W\delta(k-1) - 2^W\delta(k-(2^W-1))).$$

Hence, for a sine DDS $$|S'_W(k)| = 2^{W-1}\delta(k-1) + 2^{W-1}\delta(k-(2^W-1)) \quad (3.5)$$

where δ(0)=1 and δ(k)=0 for k≠0. Similarly, for a cosine DDS $$c'(n) = \cos\frac{2\pi n}{2^W}$$

and $C'_W(k) = \frac{1}{2}(2^W\delta(k-1) - 2^W\delta(k-(2^W-1)))$ and therefore $|C'_W(k)|$ is identical to (3.5). For a quadrature DDS, on the other hand, with $$cs'(n) = \cos\frac{2\pi n}{2^W} + j\sin\frac{2\pi n}{2^W} = e^{j\frac{2\pi n}{2^W}}$$

the corresponding $CS'_W(k)$ and $|CS'_W(k)|$ are $CS'_W(k)=2^W\delta(k-1)$ and $$|CS'_W(k)|=2^W\delta(k-1). \quad (3.6)$$

Now recall (see (3.1)) that $S_{W,B}(k)$ is periodic in k with period $2^{W+B}$ and it is the result of multiplying $S'_W(k)$ with $V_{W,B}(k)$ (see (3.4)). It is easy to verify that $V_{W,B}(k)$ is periodic in k with period $2^{W+B}$. From (3.4), $$V_{W,B}(k+2^{W+B}) =$$

$$\frac{1-e^{-j\frac{2\pi}{2^W}(k+2^{W+B})}}{1-e^{-j\frac{2\pi}{2^{(W+B)}}(k+2^{W+B})}} = \frac{1-e^{-j\frac{2\pi}{2^W}k}e^{-j\frac{2\pi}{2^W}2^B}}{1-e^{-j\frac{2\pi}{2^{(W+B)}}k}e^{-j\frac{2\pi}{2^{(W+B)}}2^{W+B}}} = V_{W,B}(k).$$

Figure 16:
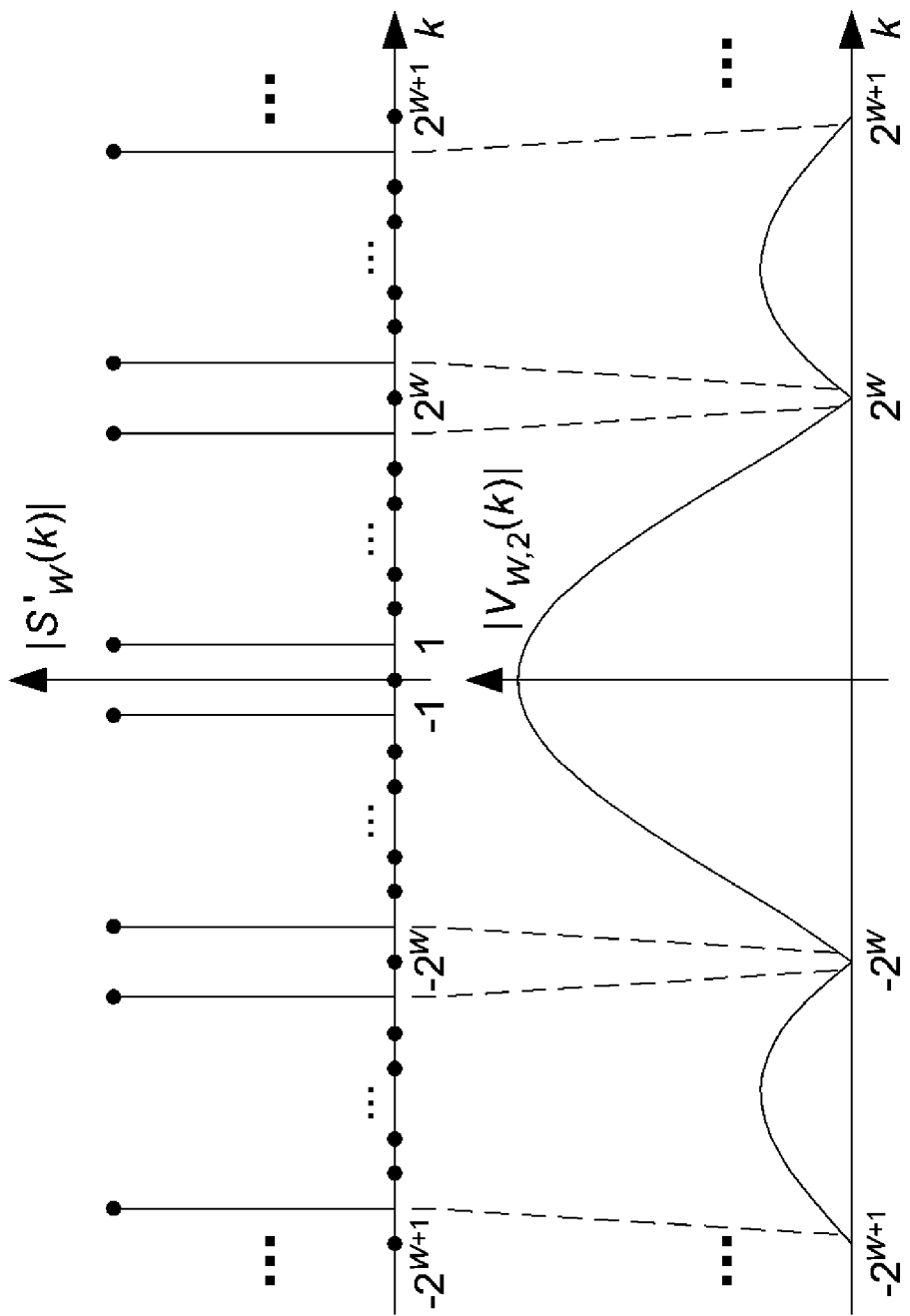
FIG. 16. is a diagram of a windowing function $V_{W,2}(k)$ over $S'_W(k)$.

Therefore, one period of V includes (i.e., windows over) $2^B$ periods of $S'_W(k)$. Notice that in the case when B=0, which means there is no phase-word truncation, $V_{W,B}(k)=1$ and, of course, with no phase-word truncation there is no phase-truncation distortion, hence $S_{W,B}(k)=S'_W(k)$. When B>0 however, $V_{W,B}(k)$ will assume some nontrivial shape and, by windowing $S'_W(k)$, it will introduce spurious frequencies at the locations of the deltas in $S'_W(k)$ for all $|k|\neq 1$. The deltas at $k=\pm 1$ will also be attenuated by the magnitude of $V_{W,B}(1)$. To demonstrate these points, consider the case for B=2. That is, assume one has a frequency control word with its rightmost nonzero bit at position W+2, counting from the MSB at location 1. Recall that $S'_W(k)$ and $S_{W,2}(k)$ are periodic in k with periods $2^W$ and $2^{W+2}$ respectively. Therefore, $S_{W,2}(k)$ can be constructed by considering four periods of $S'_W(k)$ and windowing them with $V_{W,2}(k)$, as depicted in FIG. 16. Since it is known that the locations of the deltas in $S'_W(k)$ not only does one know the locations of the spurs created from phase truncation, but one also knows the spur magnitudes precisely since one can evaluate the windowing function V for the values of k corresponding to the locations of the deltas in $S'_W(k)$. More precisely, the magnitude of the spurious frequency at k, corresponding to the locations of the deltas, relative to that of the desired sinusoid, is $$\frac{|S_{W,B}(k)|}{|S_{W,B}(1)|} = \frac{|2^{W-1}V_{W,B}(k)|}{|2^{W-1}V_{W,B}(1)|},$$

which simplifies to $$\frac{|S_{W,B}(k)|}{|S_{W,B}(1)|} = \frac{|V_{W,B}(k)|}{|V_{W,B}(1)|}. \quad (3.7)$$

That is, using dBc notation, where the Definition of dBc is: dB relative to the carrier, the spur magnitude at k will be $$20\log_{10}|V_{W,B}(k)|-20\log_{10}|V_{W,B}(1)| \text{ dBc}. \quad (3.8)$$

Clearly, for $k\neq 0$, the value of (3.8) is negative. The spur magnitude is $20\log_{10}|V_{W,B}(1)|-20\log_{10}|V_{W,B}(k)|$ dB down from the main components at $k=\pm 1$. Notice that the phase-truncation spur magnitudes in (3.8) depend only on the windowing function $V_{W,B}(k)$. For this particular B=2 case, one simply evaluates (3.8) at the six points $k=\{(2^W\pm 1),(2\times 2^W\pm 1),(3\times 2^W\pm 1)\}$. To characterize the spurs for any frequency control word, one simply repeats this exercise for all possible values of $1\leq B\leq(M-W)$. For an arbitrary B the spurious frequencies will be located at $k\epsilon\{(d2^W\pm 1):$ for $1\leq d\leq(2^B-1)\}$. All of these results also hold for the cosine DDS since $|C'_W(k)|$ is identical to $|S'_W(k)|$ given by (3.5).

Figure 17:
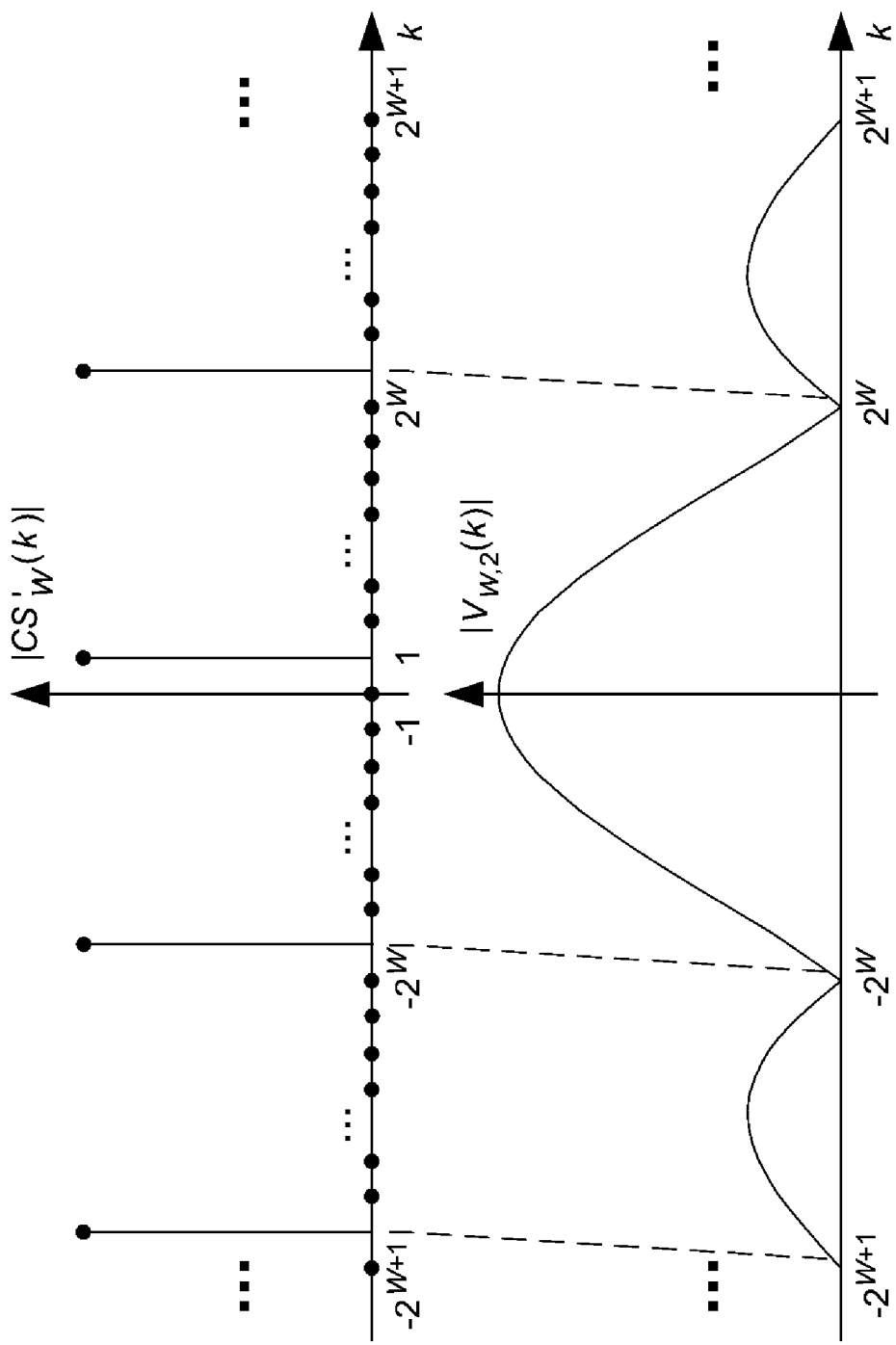
FIG. 17. is a diagram of a windowing function $V_{W,2}(k)$ over $CS'_W(k)$.

For a quadrature DDS, the absence of the delta at $k=2^W-1$ in $|CS'_W(k)|$ given by (3.6) reduces the set of spurs at the output of the quadrature DDS to the values of $k\epsilon\{(d2^W+1):$ for $1\leq d\leq(2^B-1)\}$. The sets of phase-truncation spur magnitudes of quadrature DDS and sine DDS or cosine DDS are identical, as expected. In the case of sine DDS or cosine DDS there are two corresponding spurs with identical magnitudes ($|S_{W,B}(k)|$ and $C_{W,B}(k)|$ are symmetric around the origin) while in the quadrature DDS case there is a single spur for a given magnitude. Furthermore, the phase-truncation spurs for quadrature DDS may be obtained from the phase-truncation spurs for sine DDS or cosine DDS by keeping every other spur beginning at the main k=1 component. FIG. 17 depicts the details of an example similar to that of FIG. 16, but for a quadrature DDS where the absence of the delta at $k=2^W-1$ in $|CS'_W(k)|$ is shown to reduce the set of phase-truncation spurs to the locations $k\epsilon\{(d2^W+1):$ for $1\leq d\leq(2^B-1)\}$. The spurs at $k=\pm(2^W-1)$ in FIG. 16 have identical magnitudes and their corresponding spur (i.e., the spur with identical magnitude) in FIG. 17 is the one at $k=-2^W+1$. The spurs at $k=\pm(2^W+1)$ and $k=\pm(2^{W+1}-1)$ in FIG. 16 have their corresponding spurs in FIG. 17 at $k=2^W+1$ and $k=-2^{W+1}+1$, respectively.

As mentioned in Section 1, by analyzing a class of non-uniformly sampled ideal sinusoids, an expression is derived conventionally which can also be obtained by sampling the windowing function V for the values of k corresponding to the locations of the deltas in $S'_W(k)$, $C'_W(k)$, or $CS'_W(k)$. Since the windowing function can be evaluated over the entire spectrum, and not just at the locations of the delta functions, it is gracefully extended to include the spurs due to SCMF non-idealities, as will be shown in Section 3.4. This capability of the windowing function is very important since it enables the computation of all spurs (i.e., both phase-truncation and SCMF spurs).

3.3 The Worst Phase Truncation Spurs

The analysis developed thus far allows one to identify the locations of all phase-truncation spurs and compute their magnitudes relative to the main component with the assistance of the windowing function $V_{W,B}$. The identification of the worst (i.e., the one having greatest magnitude) spur (or spurs) is usually the most critical issue when characterizing DDS spurs. Although the techniques developed in the preceding sections could be used to compute all of the spurs and one could then identify the worst one or ones by ordering them, this approach would require far more time and effort than necessary. There is a much more powerful technique which directly identifies the locations of worst-case spurs and, through (3.8), enables one to directly calculate their magnitudes. Therefore, by using this method, the N worst phase-truncation spur magnitudes are calculated by evaluating (3.8) only N times. Hence, the magnitude of the worst spur can be obtained by evaluating the windowing function only once.

Since the set of distinct phase-truncation spur magnitudes are identical for sine or cosine DDS and quadrature DDS, as discussed in Section 3.2, one proceeds by analyzing a sine DDS without any loss in generality. One begins by referring to expression (3.8) and noticing that the worst spur is the one from the set $\{(d2^W \pm 1): \text{for } 1 \leq d \leq (2^B-1)\}$ that maximizes the magnitude of the windowing function $|V_{W,B}(k)|$. Using (3.4), $$|V_{W,B}(k)| = \left|\frac{1-e^{-j\frac{2\pi}{2^W}k}}{1-e^{-j\frac{2\pi}{2^{(W+B)}}k}}\right| = \frac{|1-e^{-j\frac{2\pi}{2^W}k}|}{|1-e^{-j\frac{2\pi}{2^{(W+B)}}k}|}.$$

The result is a ratio of absolute values, each having the form $|1-e^{j\theta}|$. If one views $|1-e^{j\theta}|$ as the magnitude of the difference between two unit-length vectors, then FIG. 18 captures the situation and assists in deriving the result.

Figure 18:
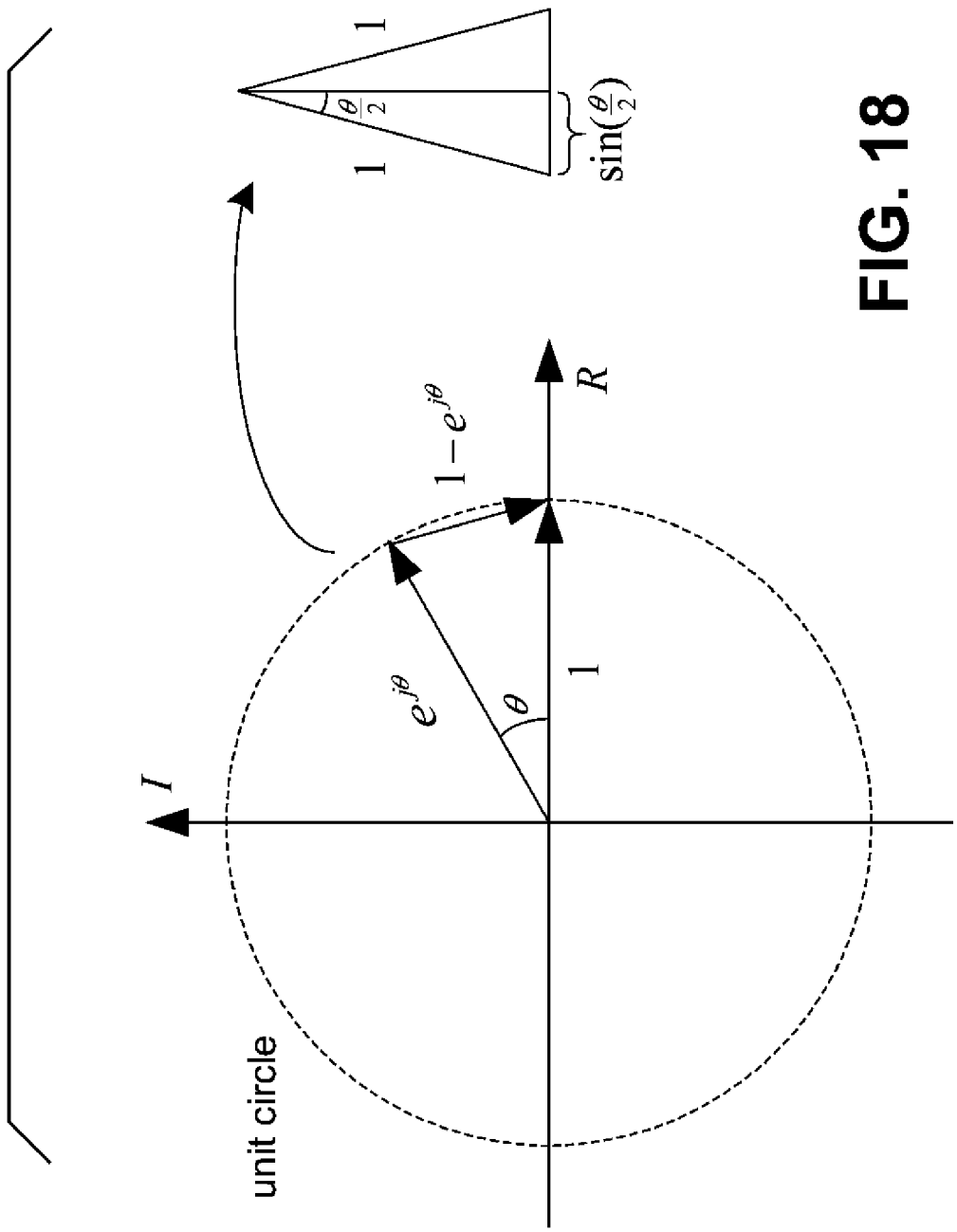
FIG. 18. is a diagram of $$|1 - e^{j\theta}| = 2\sin\frac{\theta}{2}.$$

FIG. 18 shows that $$|1-e^{j\theta}| = 2\sin\frac{\theta}{2},$$

and one obtains the following convenient form for $|V_{W,B}(k)|$:

$$|V_{W,B}(k)| = \frac{|1-e^{-j\frac{2\pi}{2^W}k}|}{|1-e^{-j\frac{2\pi}{2^{(W+B)}}k}|} = \frac{|2\sin(\frac{\pi}{2^W}k)|}{|2\sin(\frac{\pi}{2^{(W+B)}}k)|} = \frac{|\sin(\frac{\pi}{2^W}k)|}{|\sin(\frac{\pi}{2^{(W+B)}}k)|}. \quad (3.9)$$

Notice that $|V_{W,B}(k)|$ is an even function and recall that it is periodic in k with period $2^{(W+B)}$. Therefore, one need only investigate the set of spurs with index k for $$0 \leq k \leq \frac{2^{(W+B)}}{2}.$$

The following observation can be made about the denominator $$\left|\sin\left(\frac{\pi}{2^{(W+B)}}k\right)\right|$$

of (3.9). Since $|\sin \theta|$ is strictly monotone increasing for $$0 \leq \theta \leq \frac{\pi}{2}$$

and since $$\frac{\pi}{2^{(W+B)}}k = \frac{\pi}{2}$$

for $$k = \frac{2^{(W+B)}}{2}$$

one concludes that the denominator of (3.9) is strictly monotone increasing when k lies within the closed interval of interest $$\left[0, \frac{2^{(W+B)}}{2}\right].$$

Next, one performs a similar analysis on the numerator of (3.9). Since $|\sin \theta|$ is zero for $\theta = d\pi$, where d is an arbitrary integer, $$\left|\sin\left(\frac{\pi}{2^W}k\right)\right|$$

is zero for $k = d2^W$. These zeros in the numerator create the nulls of the windowing function. Also, $$\left|\sin\left(\frac{\pi}{2^W}k\right)\right|$$

is symmetric (even symmetry) around these nulls. What are considered are the points immediately to the right and immediately to the left of these nulls since these are the locations of the phase-truncation spurs, as indicated by the set $\{(d2^W \pm 1): \text{for } 1 \leq d \leq (2^B-1)\}$. The following is a simple proof, showing that the value of the numerator in (3.9) is the same for all k where phase-truncation spurs occur. For $k \in \{(d2^W \pm 1): \text{for } 1 \leq d \leq (2^B-1)\}$, $$\left|\sin\left(\frac{\pi}{2^W}(d2^W+1)\right)\right| = \left|\sin\left(d\pi + \frac{\pi}{2^W}\right)\right| = \left|\sin\frac{\pi}{2^W}\right|$$

and similarly, $$\left|\sin\left(\frac{\pi}{2^W}(d2^W-1)\right)\right| = \left|\sin\left(d\pi - \frac{\pi}{2^W}\right)\right| = \left|\sin\frac{\pi}{2^W}\right|.$$

Therefore, the numerator of (3.9) is constant for the location of all phase truncation spurs and the denominator is strictly monotone increasing as k increases from 0 to $$k = \frac{2^{(W+B)}}{2}.$$

Figure 19:
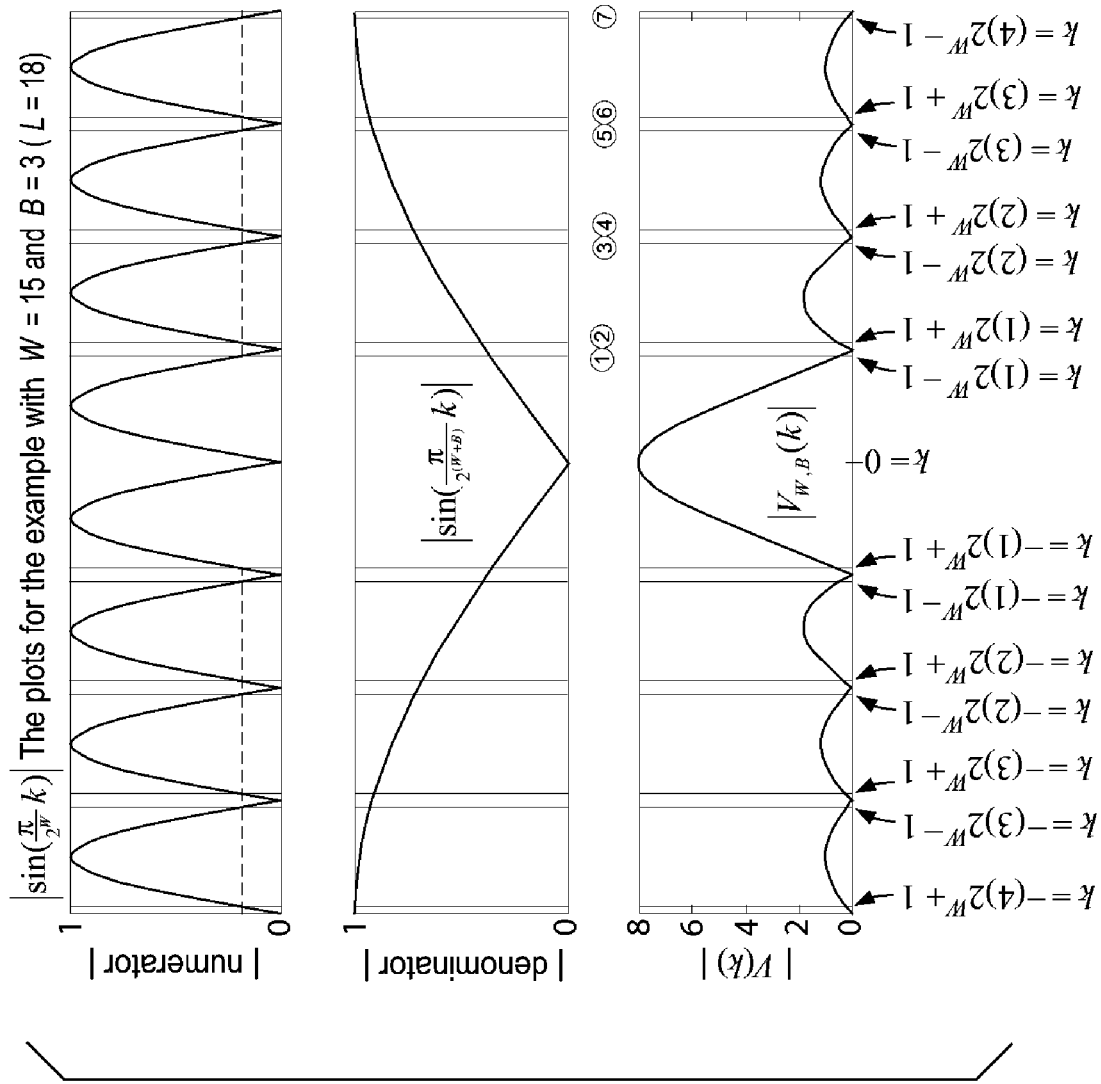
FIG. 19 is a diagram of phase-truncation spurs and the windowing function $|V_{W,B}(k)|$.

Hence, the worst (largest magnitude) phase-truncation spur is the one closest to the origin. That worst spur is therefore located at $k = 2^W - 1$. Since the denominator is strictly monotone increasing, it follows that all phase-truncation spurs in the closed interval $$\left[0, \frac{2^{(W+B)}}{2}\right]$$

have distinct magnitudes, and that they arrange themselves from largest to smallest as their location moves away from the origin. This suggests that the N worst spurs could be calculated by evaluating the windowing function at the N phase truncation spur locations closest to the origin. FIG. 19 illustrates this point for W=15 and B=3.

The worst phase-truncation spur, relative to the main component, is therefore obtained by using (3.9) and evaluating (3.7) for $k=2^W-1$. The result is $$\frac{|S_{W,B}(2^W-1)|}{|S_{W,B}(1)|} = \frac{|\sin(\pi - \frac{\pi}{2^W})|}{|\sin(\frac{\pi}{2^B}(1-\frac{1}{2^W}))|} \times \frac{|\sin(\frac{\pi}{2^{(W+B)}})|}{|\sin(\frac{\pi}{2^W})|}.$$

The absolute values for the sine terms in the above expression can be omitted since all of them are positive for W>0 and B>0. Furthermore, using the trigonometric identity $\sin(\alpha-\beta)=\sin\alpha\cos\beta-\cos\alpha\sin\beta$ one obtains $$\frac{|S_{W,B}(2^W-1)|}{|S_{W,B}(1)|} = \frac{\sin\pi\cos\frac{\pi}{2^W} - \cos\pi\sin\frac{\pi}{2^W}}{\sin(\frac{\pi}{2^B}(1-\frac{1}{2^W}))} \times \frac{\sin\frac{\pi}{2^{(W+B)}}}{\sin\frac{\pi}{2^W}}.$$

Substituting $\sin\pi=0$ and $\cos\pi=-1$ the expression simplifies to $$\frac{|S_{W,B}(2^W-1)|}{|S_{W,B}(1)|} = \frac{\sin\frac{\pi}{2^{(W+B)}}}{\sin(\frac{\pi}{2^B}(1-\frac{1}{2^W}))}. \quad (3.10)$$

Using the dBc notation, the worst phase-truncation spur is $$20\log_{10}\sin\frac{\pi}{2^{(W+B)}} - 20\log_{10}\sin\left(\frac{\pi}{2^B}\left(1-\frac{1}{2^W}\right)\right) dBc. \quad (3.11)$$

For a DDS with a W-bit input SCMF the worst phase truncation spur for an fcw with L>W (i.e., in the presence of phase truncation) is computed using (3.10) or (3.11). The expressions (3.10) and (3.11) depend only on W and B. Hence, for a DDS with specific W, the worst phase truncation spur over all fcw with L>W can be obtained by evaluating (3.10) or (3.11) for all values of B in the range $1 \leq B \leq (M-W)$. A careful examination of (3.10) reveals its monotone decreasing behavior for a fixed W and increasing B. Since (3.11) is obtained from (3.10) via the log function, the monotone decreasing behavior of (3.10) implies the same for (3.11). For a fixed W>1, consider the sequence of worst case phase truncation spurs $\mu(B)$ obtained by evaluating (3.10) for integer values of $B \geq 1$. Applying the double angle trigonometric identity $\sin(2\theta)=2\sin\theta\cos\theta$ to the numerator and denominator of (3.10) one obtains a recurrence relation between any adjacent samples of $\mu(B)$ as follows $$\mu(B) = \frac{\sin\frac{\pi}{2^{(W+B)}}}{\sin(\frac{\pi}{2^B}(1-\frac{1}{2^W}))} = \frac{\sin 2\frac{\pi}{2^{(W+B+1)}}}{\sin(2\frac{\pi}{2^{(B+1)}}(1-\frac{1}{2^W}))} \quad (3.12)$$

-continued $$= \frac{2\sin\frac{\pi}{2^{(W+B+1)}}\cos\frac{\pi}{2^{(W+B+1)}}}{2\sin(\frac{\pi}{2^{(B+1)}}(1-\frac{1}{2^W}))\cos(\frac{\pi}{2^{(B+1)}}(1-\frac{1}{2^W}))}$$

$$= \mu(B+1)\frac{\cos\frac{\pi}{2^{(W+B+1)}}}{\cos(\frac{\pi}{2^{(B+1)}}(1-\frac{1}{2^W}))}.$$

For W>1 and $B \geq 1$ the arguments for both cosine terms in (3.12) are $$0 < \frac{\pi}{2^{(W+B+1)}} < \frac{\pi}{2}$$

and $$0 < \frac{\pi}{2^{(B+1)}}\left(1 - \frac{1}{2^W}\right) < \frac{\pi}{2},$$

a range is a positive monotone decreasing function. Consequently, since $$\frac{\pi}{2^{(W+B+1)}} < \frac{\pi}{2^{(B+1)}}\left(1 - \frac{1}{2^W}\right)$$

for W>1, one concludes that $$\cos\frac{\pi}{2^{(W+B+1)}} > \cos\left(\frac{\pi}{2^{(B+1)}}\left(1 - \frac{1}{2^W}\right)\right)$$

one $$\frac{\cos\frac{\pi}{2^{(W+B+1)}}}{\cos(\frac{\pi}{2^{(B+1)}}(1-\frac{1}{2^W}))} > 1.$$

Applying this result to (3.12) one obtains $\mu(B)>\mu(B+1)$ (i.e., (3.10) and (3.11) are monotone decreasing functions of $B \geq 1$ for any fixed W>1).

Therefore, for a DDS with a W-bit input SCMF, the worst phase truncation spur, relative to the main components, over all fcw with L>W can be obtained by evaluating (3.10) or (3.11) only for B=1. The result is $$\frac{\sin\frac{\pi}{2^{(W+1)}}}{\sin(\frac{\pi}{2} - \frac{\pi}{2^{(W+1)}})} = \frac{\sin\frac{\pi}{2^{(W+1)}}}{\cos\frac{\pi}{2^{(W+1)}}} = \tan\frac{\pi}{2^{(W+1)}}$$

and using the dBc notation one obtains $$20\log_{10}\tan\frac{\pi}{2^{(W+1)}}. \quad (3.13)$$

With the assistance of (3.13) the worst phase-truncation spur can be computed for various values of W. The results are shown in FIG. 20.

Figure 20:
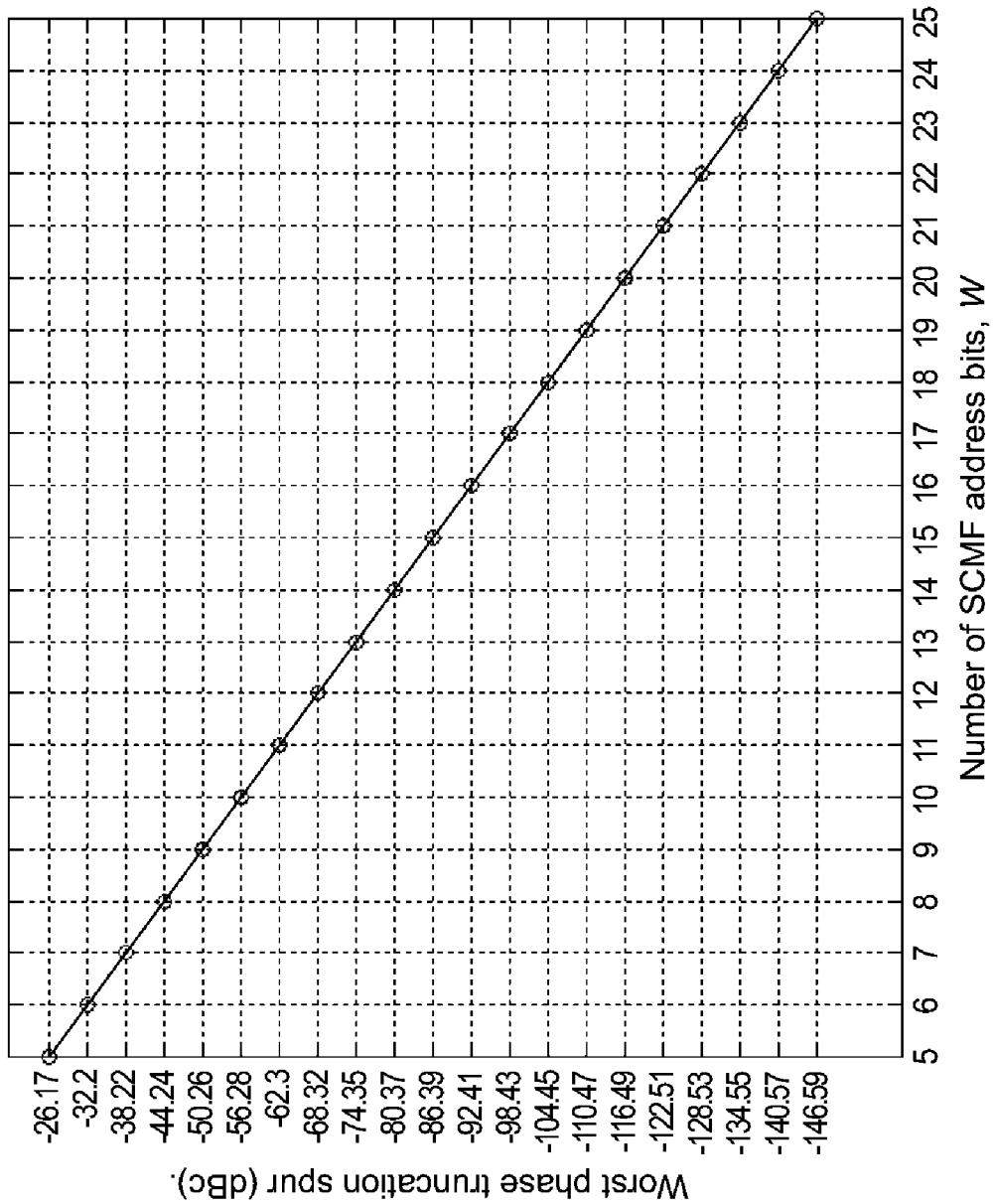
FIG. 20 is a plot of worst phase truncation spur (dBc) vs. number of SCMF address bits W.

From FIG. 20 it is apparent that the worst phase truncation spur in dBc decreases linearly with increasing W at the rate of approximately 6.02 dB per additional bit for W. The same conclusion can be reached from (3.13) by observing that the argument to the tangent function, $$\frac{\pi}{2^{(W+1)}},$$

in (3.13) is small for the considered values of W, hence, the tangent function can be accurately approximated as tan α≈α and used to approximate (3.13) as $$20\log_{10}\tan\frac{\pi}{2^{(W+1)}} \approx 20\log_{10}\frac{\pi}{2^{(W+1)}}$$
$$= 20\log_{10}\pi - (W+1)20\log_{10}2$$
$$\approx 3.92 - 6.02 \times W.$$

3.4 Spurs Generated from a Non-Ideal SCMF in the Presence of Phase Truncation One can easily extend the analysis of Sections 3.1 and 3.2 to include the spurious frequencies resulting from the necessity to employ finite precision SCMF outputs and, more generally, due to whatever approximation errors are employed to facilitate efficient SCMF implementation. All arguments made in Section 3.2 still hold when one has such an SCMF implementation, except that $S'_W(k)$, $C'_W(k)$, and $CS'_W(k)$ will have spurs between the previously discussed delta functions. The magnitudes of these spurs depend on the output precision and implementation details of the SCMF. Therefore, for frequency control words with L>W (i.e., where there is phase-word truncation) the spurs in $S'_W(k)$ $C'_W(k)$, and $CS'_W(k)$ are also windowed by the windowing function $V_{W,B}(k)$. The expressions s'(n), $|S'_W(k)|$, and $S_{W,B}(k)$ for a non-ideal sine DDS are:

$$s'(n) = \sin\left(\frac{2\pi n}{2^W}\right) + q(n) \quad (3.14)$$

$$|S'_W(k)| = a_0\delta(k) + a_1 2^{W-1}(\delta(k-1) + \delta(k-(2^W-1))) +$$

$$a_{2^{W-1}}\delta(k-2^{W-1}) + \sum_{i=2}^{2^{W-1}-1} a_i(\delta(k-i) + \delta(k-(2^W-i)))S_{W,B}(k) =$$

$$V_{W,B}(k)S'_W(k)$$

where q(n) is the arbitrary quantization and approximation error sequence for the SCMF, where $a_1$ is the distortion of the main components at $k=\pm 1$ (and $2^W\pm 1, \ldots$), where $a_0$ (DC spur) and $a_2$ through $a_{2^{W-1}}$ are the spur magnitudes in $S'_W(k)$. Since the sequence s'(n) in (3.14) is a real-valued sequence, $|S'_W(k)|=|S'_W(-k)|$ (it is an even function). Therefore, the two main components $|S'_W(\pm 1)|$ in (3.14) have identical distortion $a_1$ and, in general, $|S'_W(\pm 1)|=|S'_W(d2^W\pm 1)|$ for any integer d. Consequently, the spur magnitude at $k=d2^W\pm 1$ relative to that of the desired sinusoid is:

$$\frac{|S_{W,B}(k)|}{|S_{W,B}(1)|} = \frac{|V_{W,B}(k)||S'_W(k)|}{|V_{W,B}(1)||S'_W(1)|} = \frac{|V_{W,B}(k)|}{|V_{W,B}(1)|}.$$

Hence the magnitudes of the spurs generated from phase-word truncation, relative to the main carrier magnitude, remain dictated by (3.8) (i.e., they are only a function of $V_{W,B}(k)$). That is, the phase truncation spur magnitudes (and locations) are identical for the ideal and non-ideal SCMF. The expressions in (3.14) are also valid for a cosine DDS (after the appropriate substitutions).

For a quadrature DDS, following are the expressions similar to (3.14)

$$cs'(n) = \cos\left(\frac{2\pi n}{2^W}\right) + q_{cos}(n) + j\left(\sin\left(\frac{2\pi n}{2^W}\right) + q_{sin}(n)\right) \quad (3.15)$$

$$|CS'_W(k)| = a_0\delta(k) + a_1 2^W\delta(k-1) + \sum_{i=2}^{2^W-1} a_i\delta(k-i)$$

$$CS_{W,B}(k) = V_{W,B}(k)CS'_W(k),$$

where $q_{cos}(n)$ and $q_{sin}(n)$ are the arbitrary quantization and approximation error sequences for the cosine output and sine output of SCMF, where $a_1$ is the distortion of the main component at k=1 (and $2^W+1, \ldots$), where $a_0$ (DC spur) and $a_2$ through $a_{2^W-1}$ are the spur magnitudes in $CS'_W(k)$. The sequence cs'(n) in (3.15) is a complex-valued sequence and one period of the spectrum CS'(k) has a single main component. Therefore, the main components in subsequent periods of CS'(k) have identical distortion $a_1$ and, in general, $|CS'_W(1)|=|CS'_W(d2^W+1)|$ for any integer d. Consequently, the spur magnitude at $k=d2^W+1$ relative to that of the desired sinusoid is:

$$\frac{|CS_{W,B}(k)|}{|CS_{W,B}(1)|} = \frac{|V_{W,B}(k)||CS'_W(k)|}{|V_{W,B}(1)||CS'_W(1)|} = \frac{|V_{W,B}(k)|}{|V_{W,B}(1)|}.$$

Figure 21:
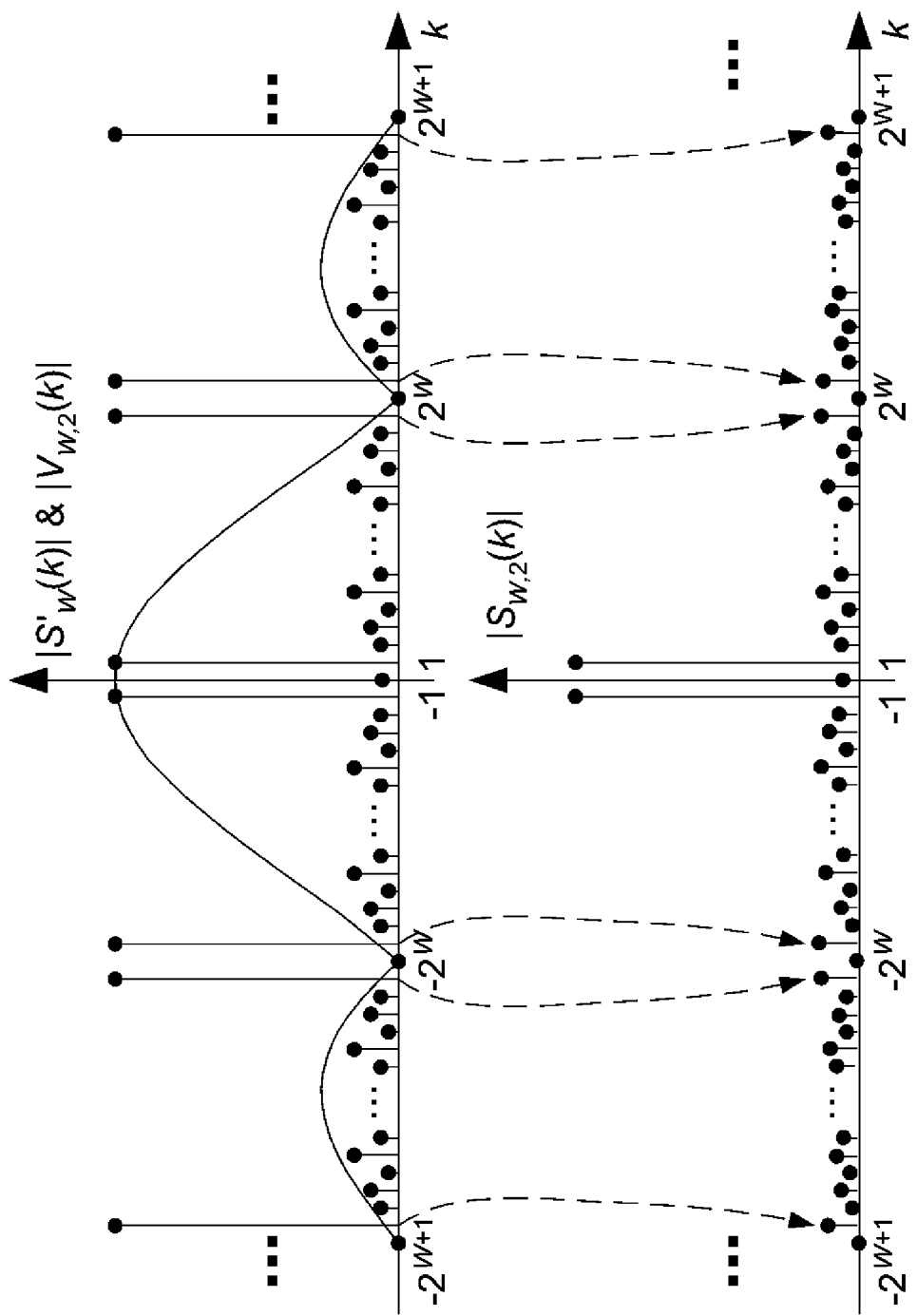
FIG. 21 is a diagram of windowing function $V_{W,2}(k)$ over $S'_W(k)$ in a sine DDS with a non-ideal SCMF.
Figure 22:
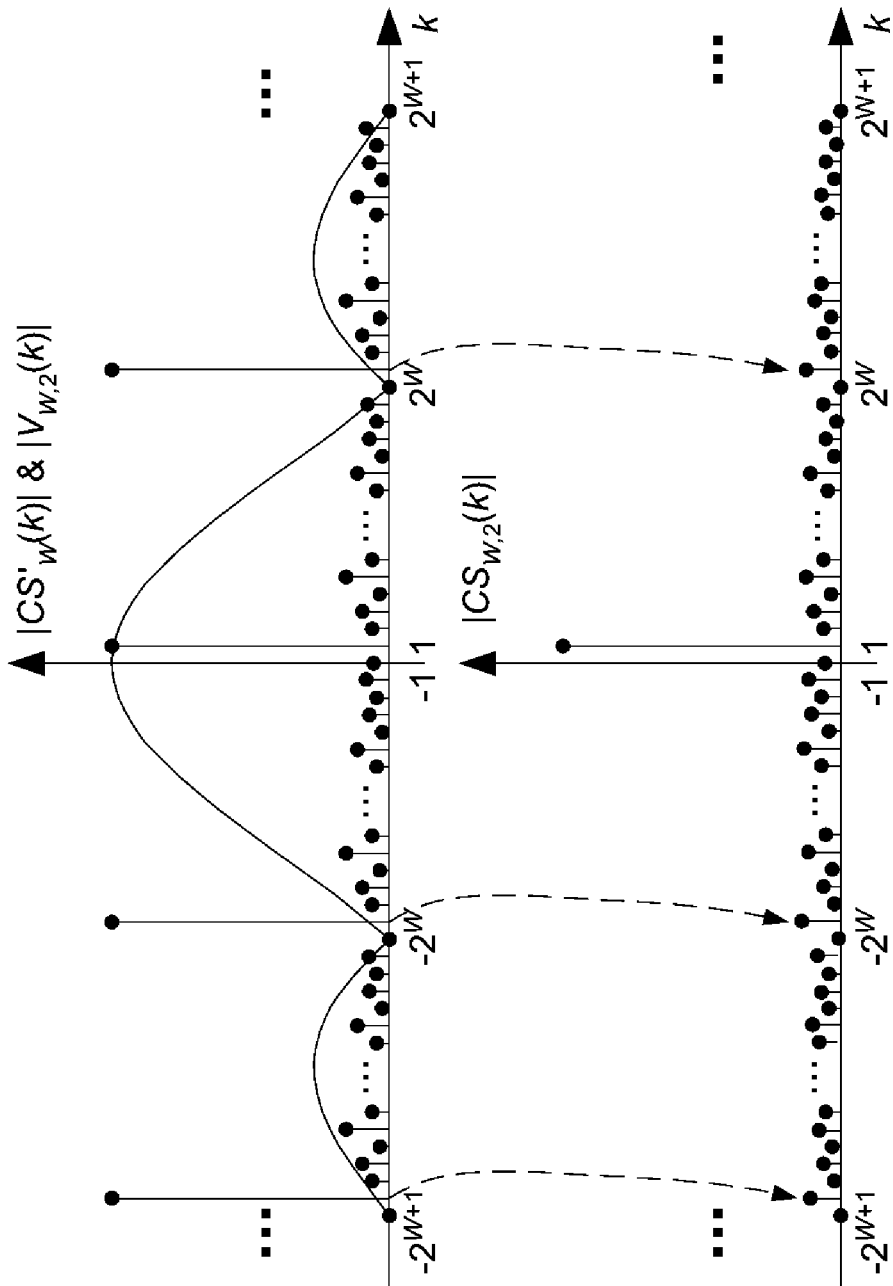
FIG. 22 is a diagram of windowing function $V_{W,2}(k)$ over $CS'_W(k)$ in a quadrature DDS with a non-ideal SCMF.

Hence for a quadrature DDS, similar to a sine DDS or cosine DDS, the magnitudes of the spurs generated from phase-word truncation, relative to the main carrier magnitude, remain dictated by (3.8) (i.e., they are only a function of $V_{W,B}(k)$). That is, the phase truncation spur magnitudes (and locations) are identical for the ideal and non-ideal SCMF. Effectively, the set of spurs caused by phase truncation and the set generated from a non-ideal SCMF, relative to those of the main carrier components, are disjoint. The only spur not attenuated by $V_{W,B}(k)$ is the DC spur, hence (3.8) indicates the increase of the nonzero DC spur relative to the main components. In Section 5 it will be shown that, when the SCMF is implemented to exploit the sine/cosine wave symmetry, the DC spur and all spurs in even DFT frequency bin locations will be zero. FIG. 21 illustrates the general situation for a sine DDS or cosine DDS and FIG. 22 depicts the general situation for a quadrature DDS.

3.5 Method for the Characterization of Worst Spurs in the Presence of Phase Truncation and SCMF Non-Idealities The realizations developed thus far can be used to completely characterize all spurs due to phase truncation and non-ideal SCMF for any fcw with L>W through the expressions (3.4). For fcw with large values of L (such as L=32 or L=48) the spectra $S_{W,B}(k)$, $C_{W,B}(k)$, and $CS_{W,B}(k)$ will contain $2^L$ components. The characterization and storage of all $2^L$ components may require a prohibitively large amount of memory and computation. The computation necessary to characterize a single spur is small (3.4), but there are too many spurs. If all the spurs need to be characterized, then one has no choice but to evaluate (3.4) for all k=0, 1, . . . , $2^L$−1. If, instead, the worst N spurs (for example the worst 100 spurs), or all spurs above a specified threshold $\epsilon$ (such as $\epsilon$=−100 dBc) need to be characterized, then the strictly monotone property of the windowing function, from Section 3.3, can be extended to the SCMF spurs (along with the already discussed phase-truncation spurs) to create a very fast and exact characterization method based on an arbitrary SCMF signature sequence s'(n), c'(n), or cs'(n) for a sine DDS, cosine DDS, or quadrature DDS, respectively.

3.5.1 Efficient Characterization Method for Sine DDS or Cosine DDS

Considering a sine DDS, recall (3.4) or (3.14) which construct the entire spectrum $S_{W,B}(k)$ by concatenating $2^B$ copies of $S'_W(k)$ and windowing them with $V_{W,B}(k)$. The main components of $S'_W(k)$ give rise to all phase-truncation spurs in $S_{W,B}(k)$, and every spur in $S'_W(k)$ gives rise to $2^B$ spurs in $S_{W,B}(k)$ (which are uniformly distributed in frequency at intervals of length $2^W$). Since the sine DDS output s(n) is a real-valued sequence, $|S_{W,B}(k)|$ is an even function and periodic in k of period $2^{W+B}=2^L$. Therefore, one need only investigate the set of spurs with index k for $$0 \le k \le \frac{2^{(W+B)}}{2}.$$

From Section 3.3, one knows that the denominator of $|V_{W,B}(k)|$ in (3.9) is strictly monotone increasing when k lies within the closed interval of interest $[0, 2^{L-1}]$. From Section 3.3, one also knows that the numerator of $|V_{W,B}(k)|$ is periodic in k with period $2^W$. Therefore, since the set of $2^B$ spurs in $S_{W,B}(k)$ generated from one spur in $S'_W(k)$ are equally spaced at length-$2^W$ intervals, one concludes that the numerator of $|V_{W,B}(k)|$ is constant at the positions of these spurs. FIG. 23 illustrates an example for the numerator and denominator of $|V_{W,B}(k)|$ with W=15 and B=3. Hence, similar to the phase truncation spurs, the set of spurs created from one spur in $S'_W(k)$ arrange themselves with decreasing magnitudes as k increases from 0 to $2^{L-1}$ in steps of $2^W$. The same set of arguments holds for cosine DDS since, for the real-valued DDS output c(n) the DDS output spectrum $|C_{W,B}(k)|$ is also an even function, periodic in k of period $2^{W+B}=2^L$.

The described monotone property of $|V_{W,B}(k)|$ can be used to create a fast method for the characterization of the N worst spurs or all spurs with magnitudes above a specified threshold value $\epsilon$ in the presence of phase truncation and arbitrary SCMF non-idealities. The following is an outline for a method to accept a signature sequence s'(n), L, and N or $\epsilon$, and to generate the magnitudes and locations of the worst N spurs or all the spurs having magnitudes larger than $\epsilon$. The following method can be used for a cosine DDS by using the signature sequence c'(n) instead of s'(n).

Phase I
1. Compute $|S'_W(k)|$ from s'(n) for $0 \le k < 2^W$.
2. Compute $|S_{W,B}(k)|=|V_{W,B}(k)||S'_W(k)|$ for $0 \le k < 2^W$ and sort in the order of decreasing magnitudes. Also keep track of the indices in a vector k_ord.
3. The first element of k_ord is 1, corresponding to the index of the main component, and the first element of S_ord will contain the magnitude of the main component. Save the magnitude of the main component and remove it from both k_ord and S_ord.
4. Construct a vector potential_index_set (which keeps track of the potential locations for the next worst spur) containing only the first element of k_ord. Remove that first element from k_ord. If B>1, then append potential_index_set with $2^W+1$.
5. Create two vectors spurs and locations to store the magnitudes and locations of the worst spurs to be computed in Phase II.

Phase II (Repeat these steps N times for the worst N spurs, or repeat until the obtained spur magnitude is below c to obtain all spurs with magnitudes above $\epsilon$.)
1. Compute the spur magnitudes for the indices in potential_index_set using (3.4) and store the magnitude and location of the worst one in the vectors spurs and locations respectively.
2. If (the index of the worst spur from step 1 is less than $2^W$), then, if B>1, increment that index in potential_index_set by $2^W$. If B=1, then remove that index from potential_index_set.
   If the vector k_ord is not empty, remove its first element and add it to potential_index_set as well.
   Else If (the index of the worst spur from step 1 is greater than $2^{L-1}-2^W$), then remove it from potential_index_set.
   Otherwise, increment the index of the worst spur from step 1 in potential_index_set by $2^W$.

The above method exploits the monotone properties of the windowing function corresponding to the locations of the spurs arising from a single spur in $|S'_W(k)|$ to identify the locations of spurs having largest magnitudes in the presence of both phase truncation and arbitrary SCMF non-idealities. Therefore, a sorting routine similar to that of Section 3.3 identifies the locations of the N spurs with largest magnitudes (in the order of decreasing magnitudes). Once the locations of worst spurs are identified via the above simple sorting routine, one at a time in the order of decreasing spur magnitudes, they are easily computed via the windowing function by evaluating (3.4). The method can be applied to any DDS with an arbitrary SCMF implementation since it accepts the DDS signature sequence as an input. Furthermore, the computational efficiency obtained from the ability to identify the locations of worst spurs and compute their magnitudes directly, as opposed to computing the entire DDS output spectrum (i.e., all spurs) and searching for the worst spurs, is enormous. For example, to compute the SFDR, one only needs the single spur having largest magnitude. Traditional methods require the computation of a $2^L$-point DFT followed by a sorting routine to identify the spur with the largest magnitude out of $2^L$ spurs. For example, where L may be 48, $2^L$ is more than 281 trillion. The method of the present invention, instead, identifies the location of the worst spur and computes the corresponding magnitude directly without the need for computing a $2^L$-point DFT. Also, the method of present invention accepts the signature sequence as an input, therefore the results specifically apply to the DDS corresponding to the input signature sequence and the method can be applied to and DDS by inputting the corresponding signature sequence.

3.5.2 Efficient Characterization Method for Quadrature DDS

The monotone properties of the windowing function can be exploited to create an efficient characterization method for quadrature DDS as well. For quadrature DDS recall (3.4) or (3.15), which constructs the entire spectrum $CS_{W,B}(k)$ by concatenating $2^B$ copies of $CS'_W(k)$ and windowing them with $V_{W,B}(k)$. Similar to sine or cosine DDS, the main component of $CS'_W(k)$ gives rise to all phase-truncation spurs in $CS_{W,B}(k)$ and every spur in $CS'_W(k)$ gives rise to $2^B$ spurs in $CS_{W,B}(k)$ (which are uniformly distributed in frequency at intervals of length $2^W$). Unlike the sine or cosine DDS, since the quadrature DDS output cs(n) is complex valued, its corresponding output spectrum is periodic in k with period $2^{W+B}=2^L$, but the magnitude $|CS(k)|$ is not necessarily an even function. Therefore, one needs to investigate the set of spurs for all k, $0 \leq k < 2^{(W+B)}$. Equivalently, one can consider the values of k where $$-\frac{2^{(W+B)}}{2} < k \leq \frac{2^{(W+B)}}{2}.$$

From Section 3.3, it is known that the numerator of $|V_{W,B}(k)|$ is periodic in k with period $2^W$ and since the set of $2^B$ spurs in $CS_{W,B}(k)$ generated from one spur in $CS'_W(k)$ are equally spaced at length-$2^W$ intervals, one can conclude that the numerator of $|V_{W,B}(k)|$ is constant at the positions of these spurs. Instead of considering a single period of $CS'_W(k)$ values for $0 \leq k < 2^W$ now consider a period where $$-\frac{2^W}{2} < k \leq \frac{2^W}{2}.$$

The set of $2^B$ spurs in $CS_{W,B}(k)$ generated from the DC spur in $CS'_W(k)$ (i.e., $CS'_W(0)$) corresponds to the set of locations of the nulls in the numerator of $|V_{W,B}(k)|$; the denominator of $|V_{W,B}(k)|$ is nonzero for all k except for k=0. Therefore, all of the spurs except $CS_{W,B}(0)$ generated from $CS'_W(0)$ are zero. From Section 3.3 it is also known that the denominator of $|V_{W,B}(k)|$ is periodic in k with period $2^{(W+B)}$, it is an even function, and it is strictly monotone increasing in k for $$0 \leq k \leq \frac{2^{(W+B)}}{2}$$

(hence it is strictly monotone decreasing in k for $$-\frac{2^{(W+B)}}{2} < k \leq 0 \bigg).$$

Figure 24:
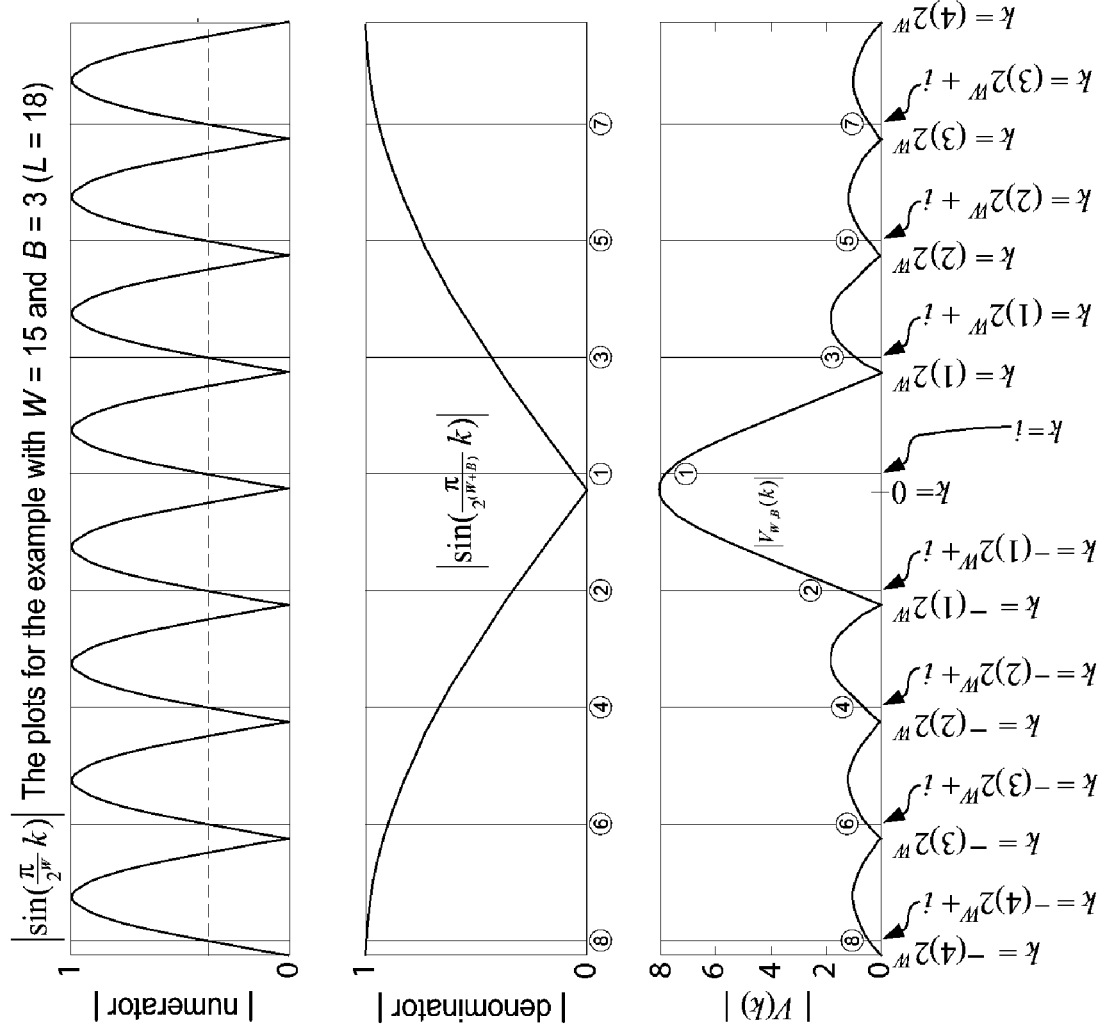
FIG. 24 is a diagram of $|V_{W,B}(k)|$ and the spurs from a single spur in $CS'_W(i)$ for $$0 < i \leq \frac{2^W}{2}.$$
Figure 25:
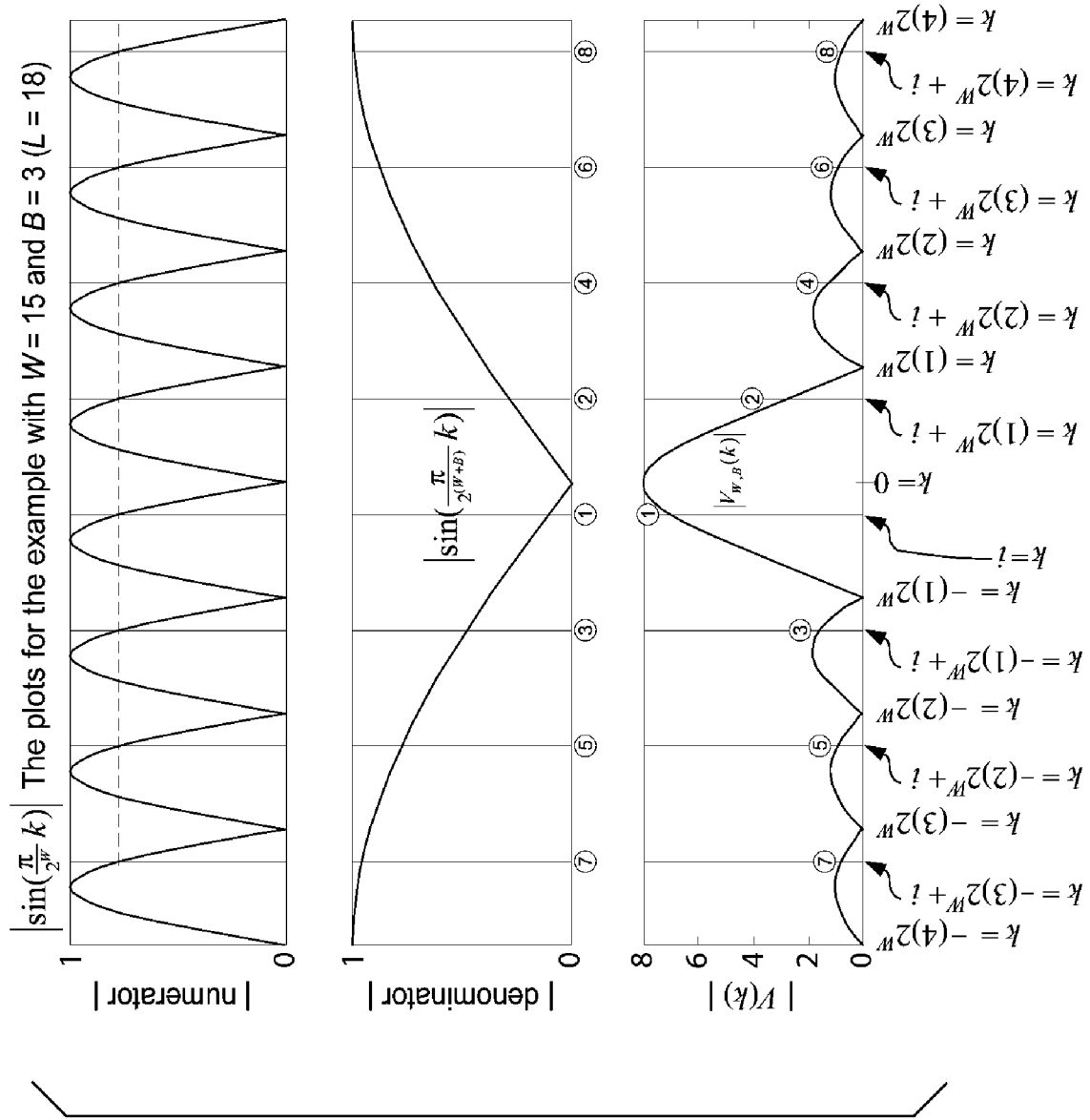
FIG. 25 is a diagram of $|V_{W,B}(k)|$ and the spurs from a single spur in $CS'_W(i)$ for $$-\frac{2^W}{2} < i < 0.$$

Then, the set of $2^B$ spurs generated from a single spur in $CS'_{W,B}(k)$ for k=i where $$0 < i \leq \frac{2^W}{2}$$

arrange themselves from largest to smallest in magnitude as their locations move away from the origin. The locations of these $2^B$ spurs arranged from largest to smallest are i, i−(1)$2^W$, i+(1)$2^W$, i−(2)$2^W$, i+(2)$2^W$, . . . Similarly, the set of $2^B$ spurs generated from a single spur in CS'W,B (k) for k where $$-\frac{2^W}{2} < i < 0$$

arrange themselves from largest to smallest in magnitude as their locations move away from the origin and their corresponding locations are i, i+(1)$2^W$, i−(1)$2^W$, i+(2)$2^W$, i−(2)$2^W$, . . . . FIG. 24 and FIG. 25 illustrate the arrangement of 2B spurs generated from a single spur in $CS'_{W,B}(i)$ and the windowing function for $$0 < i < \frac{2^W}{2}$$

and $$-\frac{2^W}{2} < i < 0,$$

respectively.

The described method of identifying the locations of quadrature DDS spurs from largest to smallest in magnitude can be used to create a fast method for the characterization of the N worst spurs or all spurs with magnitudes above a specified threshold value $\epsilon$ in the presence of phase truncation and arbitrary SCMF non-idealities. Similarly, as fast method can be created for the characterization of N best spurs or N through M worst spurs or all spurs below or between some specified thresholds. The following is an outline for a method to accept a signature sequence cs'(n), L, and N or $\epsilon$, and to generate the magnitudes and locations of the worst N spurs or all the spurs with magnitudes larger than $\epsilon$.

Phase I

1. Compute $|CS'_W(k)|$ from cs'(n) for $$-\frac{2^W}{2} < k \leq \frac{2^W}{2}$$

2. Compute $|CS_{W,B}(k)| = |V_{W,B}(k)| |CS'_W(k)|$ for $$-\frac{2^W}{2} < k \leq \frac{2^W}{2}$$

and sort in a vector S_ord in the order of decreasing magnitudes. Also keep track of the indices in a vector k_ord.

3. The first element of k_ord is 1, corresponding to the index of the main component, and the first element of S_ord will contain the magnitude of the main component. Save the magnitude of the main component and remove it from both k_ord and S_ord.
4. Construct a vector potential_index_set (which keeps track of the potential locations for the next worst spur) containing only the first element of k_ord. Remove that first element from k_ord. Append potential_index_set with $1-2^W$.
5. Create two vectors spurs and locations to store the magnitudes and locations of the worst spurs to be computed in Phase II.

Phase II (Repeat these steps N times for the worst N spurs, or repeat until the obtained spur magnitude is below $\epsilon$ to obtain all spurs with magnitudes above $\epsilon$.)
  1. Compute the spur magnitudes for the indices in potential_index_set using (3.4) and store the magnitude and location of the worst one in the vectors spurs and locations, respectively.
  2. If (the index k of the worst spur from step 1 is $$-\frac{2^W}{2} < k \leq \frac{2^W}{2}),$$

update the index k in potential_index_set by $$k_{new} = k - \text{sgn}(k - 0.5)2^W \left( \left\lfloor \frac{|k - 0.5|}{2^{(W-1)}} \right\rfloor + 1 \right)$$

where sgn denotes the signum function, where sgn(x) denotes the signum function defined as sgn(x)=1 if x>0, sgn(x)=0 if x=0, and sgn(x)=−1 if x<0. If the vector k_ord is not empty, remove its first element and add it to potential_index_set as well.

Else If (the index k of the worst spur from step 1 is $$k > 2^{L-1} - \frac{2^W}{2}$$

or $$k \leq -2^{L-1} + \frac{2^W}{2}),$$

then remove it from potential_index_set.
  Otherwise, update the index k of the worst spur from step 1 in potential_index_set by $$k_{new} = k - \text{sgn}(k - 0.5)2^W \left( \left\lfloor \frac{|k - 0.5|}{2^{(W-1)}} \right\rfloor + 1 \right).$$

3.6 Initial Phase Conditions

For frequency control words having a rightmost nonzero bit positioned at or above location W, i.e. $L \leq W$, the set of spurs is obtained simply by computing the DFT of the SCMF output. In such cases there is no phase-word truncation and the set of spurs generated is due only to the non-ideal SCMF.

One of the advantages of a DDS is its ability to provide "continuous phase" when changing frequency control words; the phase accumulator need not be reset when a new fcw is applied. The state of the phase accumulator at the point in time when a new fcw is applied provides a natural phase-offset for the subsequent DDS output, thereby providing continuous-phase frequency switching. The state of the phase accumulator register's MSB bits 1, . . . , W at the time when a new fcw is applied could, however, also be a factor in determining the output spurs, but this can happen only for an fcw with L<W. For any fcw with $L \geq W$, different initial phase conditions generate output sequences that are shifted versions of one another. The magnitude of spectra corresponding to all $2^L$ distinct initial conditions are therefore identical. On the other hand, for fcw with L<W, different initial conditions can generate output samples having very different sets of values and, as a result, generate spectra that are very different from each other. For example, if the fcw has its rightmost nonzero bit T bits above W, i.e. T=W−L>0, then the DDS accesses every $2^T$-th entry in the SCMF starting at an initial point K dictated by the state of the phase accumulator register at the time when this new fcw is applied. Since there are $2^W$ entries in the SCMF, and $2^T$ is a factor of $2^W$, the same set of points will repeat when the phase accumulator overflows. This means that a particular proper subset of points from the SCMF (lookup table) will constitute the DDS output, specifically omitting certain entries in the SCMF; they are never accessed. For a particular value of $L \leq W$, there are $2^T$ such subsets where, depending on the initial point K, each one could constitute the DDS output.

From the perspective of Section 2.2, the T bits at positions L+1, . . . , W of the phase accumulator register provide a constant value (from 0 to $2^T-1$) by which the accumulated phase (by the single-nonzero-bit fcw2) gets offset when specifying the DDS output values selected by fcw2 as it traverses the SCMF table, yielding one of the $2^T$ proper subsets. The phase accumulator register's T bits at positions L+1, . . . , W, therefore, indicate the proper $2^L$-point subset whose $2^L$-point DFT provides the basis set for the specific group of these T bits. Different basis sets are thereby obtained for different bit patterns among these T bits in the initial state and these, in turn, can provide different sets of spurs. (This group of bits is comprised of the T LSBs of the initial point K mentioned above. While the remaining MSBs of K simply cause a constant phase shift of the DDS output, these T LSBs actually influence the spur magnitudes.) As usual, the specific more complex fcw (the fcw1 of Section 2.2) causes the basis set to be rearranged according to (2.2).

Consider, for example, a fcw with its rightmost nonzero bit located one position above W, i.e. T=1. The DDS outputs in this case are constructed by selecting every other entry in the SCMF (lookup table). If the W-th bit of the phase accumulator register is initially '0', it will always remain '0' and the DDS output will be comprised of samples from the even locations of the SCMF. On the other hand, if the W-th bit of the phase accumulator register is initially '1', then the DDS will access all the odd entries of the SCMF. Since the SCMF is non-ideal, the values it generates will include associated errors; these errors are the cause of all spurs (since there is no phase truncation in this case). If, for example, the SCMF is such that all even entries have zero errors while the odd entries have nonzero errors, then, when the W-th bit of the initial phase is '0', there will be no spurs, but when it is '1', there will be spurs. While it is unlikely one would actually encounter a set with no errors, it is reasonable to assume that different sets will have different sets of errors associated with them. Hence, the initial state of the phase accumulator register will dictate the output spurious response. Therefore, to completely characterize the spurs generated from an fcw with $L \leq W$, all initial phases associated with distinct sets of outputs must be considered. For a given value of $T=W-L$, there are $2^T$ initial phase values to consider, $0 \leq \hat{\theta}_{initial} \leq 2^T-1$.

At first this may seem like an overwhelming task, since T may be as large as W−1 (corresponding to L=1). However, even though the number of initial values to be considered doubles every time T is increased by one, the required DFT size ($2^L$) decreases by a factor of two (refer to Section 2.3). This relationship between DFT size and number of initial phases can be exploited to efficiently perform spur analyses for all initial phase values. In fact, for any fcw with L<W, performing all $2^T$ DFTs (where each one is a $2^L$-point DFT) requires less computation than performing a single 2-point DFT.

Consider the sequence s'(n) (the entire contents of the SCMF), and arrange it in a $2^L \times 2^T$ matrix A in a row-priority fashion. In other words, the first $2^T$ elements of s'(n) constitute the first row of A, the next $2^T$ elements of s'(n) constitute the second row of A, and so forth until the last of the $2^L$ sets, which makes up the last row of A. The matrix A will contain the $2^W$ elements of s'(n) and will have the following special property: The first column of A is one period of the DDS output corresponding to the initial phase $\hat{\theta}_{initial}=0$, the second column is one period of the DDS output corresponding to $\hat{\theta}_{initial}=1$, and so on until the last column, corresponding to $\hat{\theta}_{initial}=2^T-1$. Therefore, by simply performing $2^L$-point DFTs on the columns of A one will obtain spectra for the fcw with $L \leq W$ associated with all $0 \leq \hat{\theta}_{initial} \leq 2^T-1$.

Figure 26:
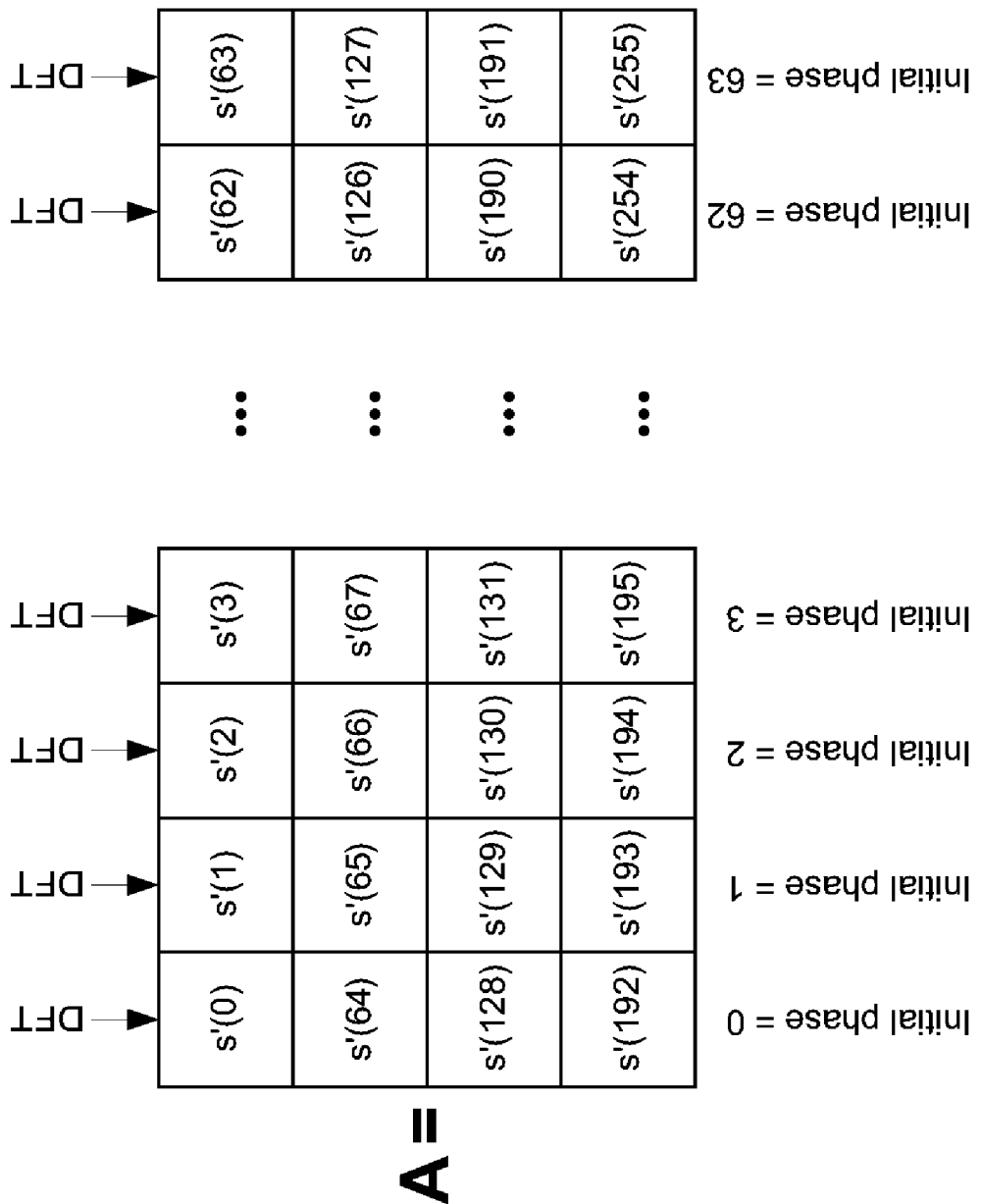
FIG. 26 is a diagram of a matrix of DFTs for all initial phases (example with W=8, L=2, and T=6).
Figure 27B:
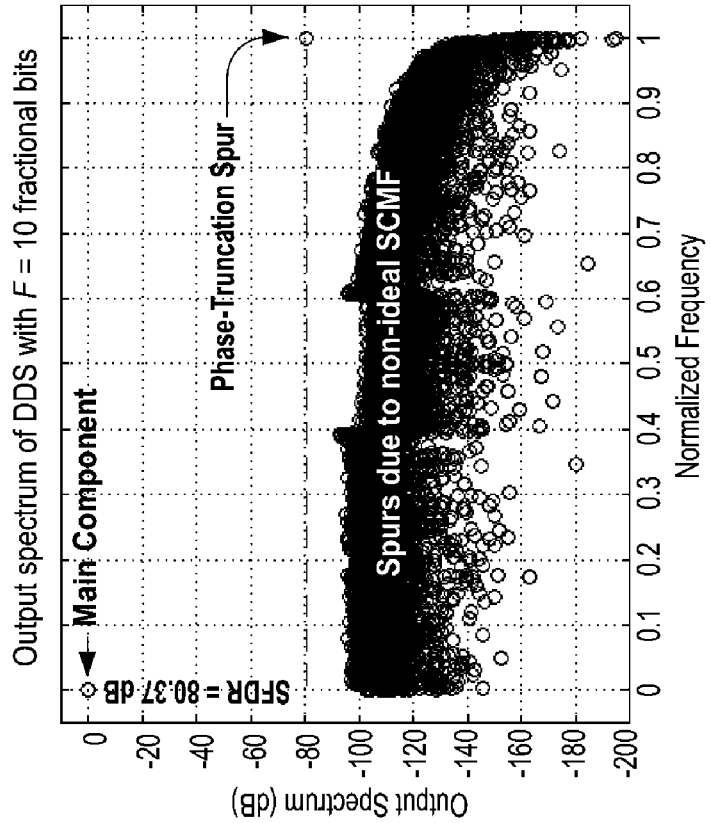
FIGS. 27 a, b, c, and d are plots of spectra from DDS with various output precisions but identical SFDR.
Figure 27A:
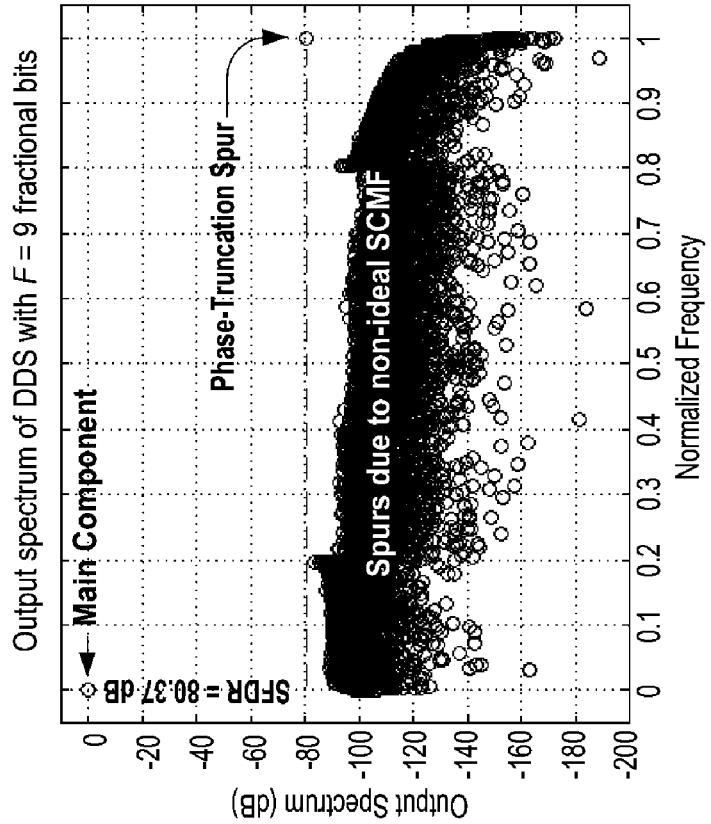
Figure 27D:
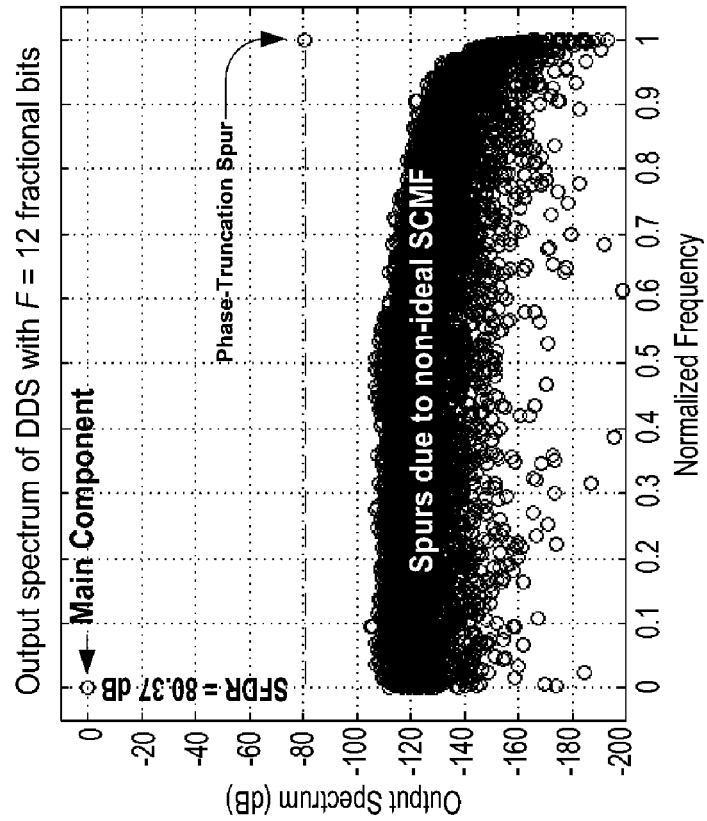
Figure 27C:
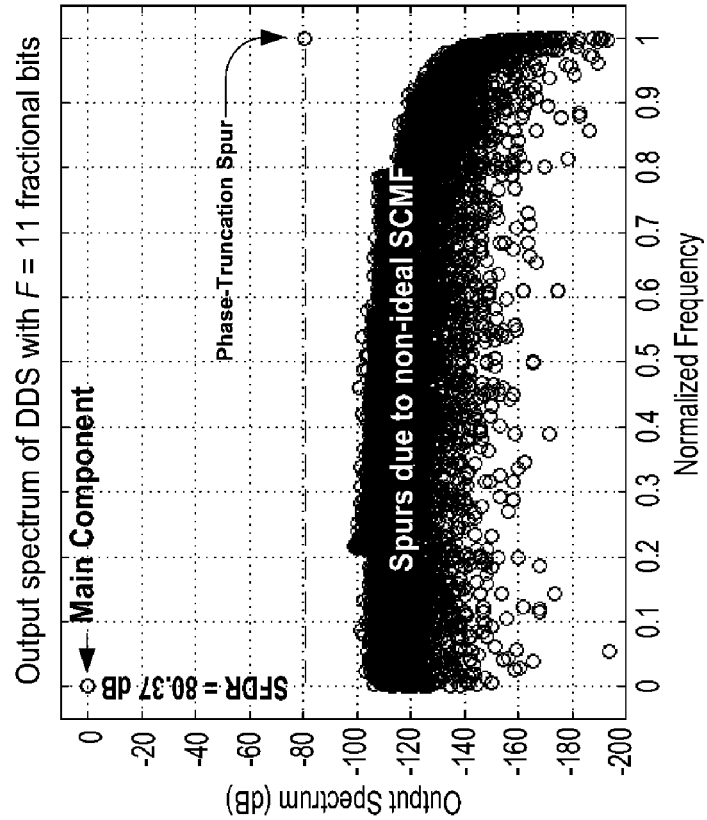

Notice that, if a $2^W$-point DFT is computed using a decimation-in-time FFT method, then computing the DFTs on the columns of A would constitute a first part of the FFT method. Therefore, for T>0, the computation required for a single $2^W$-point DFT is greater than that needed to compute $2^T$ different DFTs where each is a $2^L$-point DFT and W=T+L. FIG. 26 illustrates these points for W=8, L=2, and T=6. In fact, by using a decimation-in-time method, the computation of S'$_W$(k) (the single $2^W$-point DFT of s'(n)) could be arranged such that all $2^T$ different DFTs for all $1 \leq T \leq W-1$ are obtained as intermediate results. Hence, the characterization of the complete basis set of spurious frequencies (for all fcw with $L \leq W$ and all initial phases) requires the same amount of computation as a single $2^W$-point DFT. The computation of S'$_W$(k) in a manner that generates all $2^T$ different DFTs for all $1 \leq T \leq W-1$ as intermediate results is the topic of Section 6.

Typically, the worst-case (and also the best-case) spurs will be generated by frequency control words having rightmost nonzero bits located close to the MSB of the frequency control word. The reason for this behavior is that, for such frequency control words, the DDS output will have a small period, producing a small set of periodic error signals. If the errors combine "destructively," then the DDS outputs will always be corrupted by these small errors and will produce spurs with small magnitudes. On the other hand, if the errors combine "constructively," then the DDS outputs will always be corrupted by these large errors and will produce spurs with large magnitudes. As indicated earlier, the initial phase will have a large impact on the set of spurs since the errors in a particular column of A may be very different from the errors in another column. The entire discussion of initial phase conditions applies to all three types of DDS (i.e., sine DDS, cosine DDS, and quadrature DDS).

3.7 Method for Complete DDS Spur Characterization

A. Complete Characterization

For a DDS with an M-bit frequency control word and a W-bit input non-ideal SCMF, the following is the method for spur characterization, where s'(n), c'(n), and cs'(n) are the $2^W$-point signature sequences corresponding to the contents of the SCMF for a sine DDS, cosine DDS, and quadrature DDS, respectively:

1) Characterize the spurs for fcw with $L \leq W$ as follows: For each $1 \leq L \leq W$ construct the matrix A from s'(n), c'(n), or cs'(n) as described in Section 3.6 and perform DFTs on the columns of A.
2) Characterize the spurs for fcw with L>W as follows: For each $W < L \leq M$ evaluate (3.4). Or, if only the worst N spurs or all the spurs above a certain threshold ε are needed, then use the method of Section 3.5.1 for sine or cosine DDS and the method of Section 3.5.2 for quadrature DDS.
3) The spurs computed for any single-nonzero-bit frequency control word can be relocated for a corresponding more complex frequency control word by the relations given by (2.2).

If the DDS exploits the sine/cosine wave symmetry and, as a result, for a sine DDS $s'(n)=-s'(n+2^{W-1})$, for a cosine DDS $c'(n)=-c'(n+2^{W-1})$, and for a quadrature DDS $cs'(n)=-cs'(n+2^{W-1})$, then all the spurs at even DFT frequency bin locations for all fcw will always be zero. This includes the DC spur, and will be further discussed in Section 5.4.

B. Characterization of Spurs in a Neighborhood of Interest

For some DDS applications it is particularly of interest to characterize the N worst spurs in a neighborhood of some specific fundamental output frequency $f_0$ that is being generated by the DDS, say spurs $f_s \in (f_0 - f_\Delta^-, f_0 + f_\Delta^+)$. This problem can be addressed as follows:

If the rightmost nonzero bit of $f_0$ is at or above position W, i.e. $L \leq W$, then the set $f_s$ contains fewer than $2^W$ elements and in this case the best approach is to generate all the spurs as discussed in Section 3.6, then for each spur location in the set $f_s$ obtain the corresponding spur by performing the index mapping using (2.2).

If $f_0$ is such that L>W, then the spurs in the set $f_s$ could be characterized by mapping all the spur locations in $f_s$ to their corresponding locations in the spectrum associated with the single-nonzero-bit fcw2 of $f_0$ using (2.2) and evaluating (3.4) for these mapped locations. This approach will be efficient if the set $f_s$ is not too large.

4.1 DDS Output Signal-to-Noise Ratio

The spurious free dynamic range (SFDR) is a widely used measure to characterize the quality of DDS output(s). It captures the magnitude of the largest spur, relative to the magnitude of the main component(s). The SFDR is, therefore, independent of all spurs other than the one with the largest magnitude. For this reason, different DDS with significantly different "spectral purity" can have identical SFDR. Consider, for example, four DDS that are identical except for their output precision (i.e., the number of output bits). To make the discussion to the point and avoid excessive complexities associated with different implementations of the SCMF, now assume for this introductory discussion that rounding of DDS output(s) is the only source of non-ideality in the SCMF. Furthermore, let the four DDS have output precision of nine, ten, eleven, and twelve fractional bits, and an SCMF with a W=14 bit input. For any fcw with L=15, one knows, from the analysis of Section 3, that the worst phase-truncation spur is −80.37 dBc (computed by (3.11)) and, since phase-truncation spurs are independent from SCMF implementation details, this worst phase-truncation spur will be the same for any DDS with W=14 and fcw with L=15. For the four considered DDS with nine, ten, eleven, and twelve fractional bit outputs the worst spur is the one due to phase truncation, hence, all four have the same SFDR (80.37 dB). The majority of the spurs will be significantly different across the different DDS, with an overall improvement trend as the output precision increases. Unfortunately, this improvement is not reflected in the SFDR. FIG. 4-1 illustrates the spectra for the four DDS with various output precisions.

Despite identical SFDR, it is apparent from FIGS. 27*a*,27*b*, 27*c* and 27*d* that DDS with higher output precision have a "purer" spectrum. A measure other than SFDR is necessary to make this distinction. Signal-to-Noise Ratio (SNR) is ideal for capturing the "overall" spectral purity since it is the ratio of signal power (the power of the DDS main component(s)) to total noise power (the sum of all spur powers). In the examples of FIGS. 27*a*, 27*b*,27*c* and 27*d*, the signal power is common between all four cases. On the other hand, since the total noise power is higher for DDS with lower output precision, the corresponding SNR will be lower. Therefore, the SNR captures the "overall" spectral purity of DDS output(s) while SFDR captures the spur with "largest" magnitude. Both SFDR and SNR should, of course, be used to characterize DDS performance.

Any frequency control word fcw1 with a rightmost nonzero bit position L and the frequency control word fcw2 comprised of all zeros except for a single nonzero bit at position L are shown in Section 2 to generate sequences $s_1(n)$ and $S_2(n)$, respectively, at the output of DDS that are special rearrangements of one another given by (2.2). This special rearrangement of time-domain sequences $s_1(n)$ and $s_2(n)$ leads to a special rearrangement of their Discrete Fourier Transform (DFT) components $S_1(k)$ and $S_2(k)$ in the frequency domain, which is also given by (2.2). The relations in (2.2) hold for all three types of DDS (i.e., sine DDS, cosine DDS, and quadrature DDS).

The total power for any periodic time-domain sequence x(n) can be computed directly from x(n) as $$P = \frac{1}{N}\sum_{n=0}^{N-1}|x(n)|^2,$$

or from its DFT X(k) as $$P = \frac{1}{N^2}\sum_{k=0}^{N-1}|X(k)|^2,$$

where N is the period of x(n). Since the spectra (i.e., the DFTs) $S_1(k)$ and $S_2(k)$ of the sine DDS output sequences $s_1(n)$ and $s_2(n)$ are rearrangements of one another, the sum of the magnitude squares $$\sum_{k=0}^{2^L-1}|S_1(k)|^2$$

and $$\sum_{k=0}^{2^L-1}|S_2(k)|^2$$

must be identical. Therefore, the total power of sine DDS outputs $$P_{Total}^{fcw1} = \frac{1}{2^{2L}}\sum_{k=0}^{2^L-1}|S_1(k)|^2$$

and $$P_{Total}^{fcw2} = \frac{1}{2^{2L}}\sum_{k=0}^{2^L-1}|S_2(k)|^2$$

corresponding to fcw1 and fcw2, respectively, are identical. Furthermore, since the signal power corresponding to fcw1 and fcw2 are dictated solely by the squared magnitude of their corresponding main DFT components, and the main DFT components are identical since the DFTs are rearrangements of one another, one concludes that the signal power for DDS outputs generated by fcw1 and fcw2 are also identical. Consequently, the noise power $P_{noise}=P_{total}-P_{Signal}$ and signal-to-noise ratio $$SNR = \frac{P_{Signal}}{P_{Noise}}$$

are identical for fcw1 and fcw2. It is therefore concluded that the DDS output SNR is identical for all fcw with a common rightmost nonzero bit position. For a DDS with an M-bit fcw, the output SNR for all possible fcw can be obtained by computing the SNR for M distinct frequency control words having a single nonzero bit. These results also apply to cosine DDS and quadrature DDS.

4.2 Computation of SNR Using the Windowing Function V in the Presence of Both Phase Truncation and SCMF Non-Idealities As discussed in Section 3, there are two classes of input frequency control words. The first class includes all fcw with their rightmost nonzero bit position L at or above position W, i.e. L≦W. In this case there will be no phase truncation and any noise at the DDS output will be entirely due to the non-ideal SCMF. The SNR for such fcw will be discussed in Section 4.6. The second group includes all fcw with L>W and, for such fcw there will be phase truncation along with SCMF non-idealities. The SNR for such fcw is analyzed next with the assistance of windowing function V derived in Section 3. Using a different approach, one for analyzing a class of non-uniformly sampled signals, Jenq derived SNR bounds where the noise considered is limited to that due to only phase-truncation. Using (3.4) from Section 3 along with Parseval's theorem, one can derive an expression for SNR that considers noise due both to phase-truncation and SCMF non-idealities. One can then show that for many practical DDS implementations the actual SNR can substantially deviate from Jenq's bounds.

Consider the sine DDS output s(n) corresponding to a single-nonzero-bit fcw with L=W+B (i.e., an fcw which effectively causes a B-bit phase truncation). Applying Parseval's theorem to one period of s(n) and using (3.4), one obtains the following expression for the total power at the output of the sine DDS $$P_{Total} = \frac{1}{2^{(W+B)}} \sum_{n=0}^{2^{(W+B)}-1} |s(n)|^2 = \quad (4.1)$$

$$\frac{1}{2^{(2W+2B)}} \sum_{k=0}^{2^{(W+B)}-1} |S(k)|^2 = \frac{1}{2^{(2W+2B)}} \sum_{k=0}^{2^{(W+B)}-1} |V(k)S'(k)|^2.$$

Using the fact that $s(2^B n)=s(2^B n+1)=s(2^B n+2)=\ldots=s(2^B n+2^B-1)$, as discussed in Section 3.1 (and as depicted in FIGS. 3-2), along with Parseval's theorem, one can rewrite (4.1) as $$P_{TOTAL} = \frac{1}{2^W} \sum_{n=0}^{2^W-1} |s'(n)|^2 = \frac{1}{2^{2W}} \sum_{k=0}^{2^W-1} |S'(k)|^2 \quad (4.2)$$

where $s'(n)=s(2^B n)$ is the non-redundant subsequence (i.e., signature sequence) corresponding to the contents of the SCMF and S'(k) is the $2^W$-point DFT of s'(n).

$$P_{SIGNAL} = \frac{1}{2^{(2W+2B)}} |S(1)|^2 + \frac{1}{2^{(2W+2B)}} |S(2^{(W+B)}-1)|^2$$

The signal power resides in the deltas corresponding to the main frequency components and the magnitudes of these deltas are identical as shown in Section 3.4 (i.e., $|S(1)|=|S(2^{(W+B)}-1)|$). Therefore, by using (3.4) one can express the signal power as $$P_{SIGNAL} = \frac{1}{2^{(2W+2B)}} |V(1)S'(1)|^2.$$

The total power is given by (4.2); hence, subtracting the signal power from the total power, one obtains the total noise power (that due to both non-ideal SCMF and phase-truncation):

$$P_{NOISE} = \frac{1}{2^W} \sum_{n=0}^{2^W-1} |S'(n)|^2 - \frac{2}{2^{(2W+2B)}} |V(1)S'(1)|^2$$

or, equivalently $$P_{NOISE} = \frac{1}{2^{2W}} \sum_{k=0}^{2^W-1} |S'(k)|^2 - \frac{2}{2^{(2W+2B)}} |V(1)S'(1)|^2.$$

Hence, the $$SNR = \frac{P_{SIGNAL}}{P_{NOISE}}$$

in dB can be expressed as:

$$SNR = 10 \log_{10} \frac{|V(1)S'(1)|^2}{2^{(W+2B-1)} \sum_{n=0}^{2^W-1} |s'(n)|^2 - |V(1)S'(1)|^2} \quad \text{or} \quad (4.3)$$

$$SNR = 10 \log_{10} \frac{|V(1)S'(1)|^2}{2^{(2B-1)} \sum_{k=0}^{2^W-1} |S'(k)|^2 - |V(1)S'(1)|^2}.$$

Since the entire contents of the SCMF, s'(n), enters into the expressions (4.3), the impact of both SCMF non-idealities and phase-truncation on the DDS output SNR are considered in (4.3). Different DDS implementations with identical phase-truncation and identical output precision can have substantially different SNR since different implementations of the SCMF can give rise to different signature sequences s'(n). All of the arguments made for the derivation of (4.3) for the SNR of a sine DDS also hold for a cosine DDS. Therefore, (4.3) can be used to obtain the SNR for a cosine DDS after substituting c'(n) for s'(n) and C'(k) for S'(k).

For a quadrature DDS, the only difference in the derivation of an SNR expression is in the fact that a quadrature DDS has a single main component instead of two main components as in the case of a sine DDS or a cosine DDS. The following expression for the total power of a quadrature DDS output is similar to (4.2)

$$P_{TOTAL} = \frac{1}{2^W} \sum_{n=0}^{2^W-1} |cs'(n)|^2 = \frac{1}{2^{2W}} \sum_{k=0}^{2^W-1} |CS'(k)|^2. \quad (4.4)$$

The signal power is obtained from the single main component at k=1 and it is $$P_{SIGNAL} = \frac{1}{2^{(2W+2B)}} |CS(1)|^2 = \frac{1}{2^{(2W+2B)}} |V(1)CS'(1)|^2. \quad (4.5)$$

The total noise power is therefore obtained by subtracting the signal power (4.5) from the total power (4.4). The results is $$P_{NOISE} = \frac{1}{2^W} \sum_{n=0}^{2^W-1} |cs'(n)|^2 - \frac{1}{2^{(2W+2B)}} |V(1)CS'(1)|^2$$

or, equivalently $$P_{NOISE} = \frac{1}{2^{2W}} \sum_{k=0}^{2^W-1} |CS'(k)|^2 - \frac{1}{2^{(2W+2B)}} |V(1)CS'(1)|^2.$$

The $$SNR = \frac{P_{SIGNAL}}{P_{NOISE}}$$

in dB for a quadrature DDS can be expressed as:

$$SNR = 10 \log_{10} \frac{|V(1)CS'(1)|^2}{2^{(W+2B)}\sum_{n=0}^{2^W-1}|cs'(n)|^2 - |V(1)CS'(1)|^2} \text{ or} \quad (4.6)$$

$$SNR = 10 \log_{10} \frac{|V(1)CS'(1)|^2}{2^{(2B)}\sum_{k=0}^{2^W-1}|CS'(k)|^2 - |V(1)S'(1)|^2}.$$

A Major Practical Issue: A point of major importance is that the SNR expressions (4.3) and (4.6) are computationally very efficient. In practice, a sequence s(n), c(n), or cs(n) at the output of a DDS has a (large!) period of $2^{(W+B)}$ samples, therefore its SNR computation is proportional to $2^{(W+B)}$. Since the expressions (4.3) and (4.6) are computed from the windowing function V and the related signature sequence s'(n), c'(n), or cs'(n), with a period of $2^W$ samples, the computational complexity of (4.3) and (4.6) is proportional to $2^W$. Therefore, the SNR expressions (4.3) and (4.6) are more efficient by a factor of $2^B$. This efficiency factor is crucial since B is typically as large as 18 or more. This large efficiency factor makes the exact evaluation of the SNR, e.g. by expressions (4.3) and (4.6), feasible.

4.3 Minimum and Maximum SNR Bounds

It is now shown that the SNR, given by (4.3) and (4.6) are decreasing functions of B, and thereby obtain minimum and maximum SNR bounds by evaluating them for B=∞ and B=1, respectively. For a sine DDS or cosine DDS, from (4.3):

$$SNR = 10 \log_{10} \frac{\left|\frac{V(1)}{2^B}S'(1)\right|^2}{2^{-1}\sum_{k=0}^{2^W-1}|S'(k)|^2 - \left|\frac{V(1)}{2^B}S'(1)\right|^2}$$

which, using (3.9), becomes $$SNR = 10 \log_{10} \frac{\left(\frac{|S'(1)|\sin\frac{\pi}{2^W}}{2^B\sin\frac{\pi}{2^{(W+B)}}}\right)^2}{2^{-1}\sum_{k=0}^{2^W-1}|S'(k)|^2 - \left(\frac{|S'(1)|\sin\frac{\pi}{2^W}}{2^B\sin\frac{\pi}{2^{(W+B)}}}\right)^2} \text{ or} \quad (4.7)$$

$$SNR = 10 \log_{10} \frac{\left(\frac{|S'(1)|\sin\frac{\pi}{2^W}}{2^B\sin\frac{\pi}{2^{(W+B)}}}\right)^2}{2^{(W-1)}\sum_{n=0}^{2^W-1}|s'(n)|^2 - \left(\frac{|S'(1)|\sin\frac{\pi}{2^W}}{2^B\sin\frac{\pi}{2^{(W+B)}}}\right)^2}.$$

But $$2^B \sin\frac{\pi}{2^{(W+B)}}$$

is an increasing function of B, for B>0, because its derivative is positive:

$$\frac{d}{dB}\left(2^B \sin\frac{\pi}{2^{(W+B)}}\right) = (\ln 2)2^B \sin\frac{\pi}{2^{(W+B)}} - \frac{2^B\pi\ln 2}{2^{(W+B)}}\cos\frac{\pi}{2^{(W+B)}} > 0$$

since tan x>x for $$0 < x \leq \frac{\pi}{2}.$$

Therefore $$\left(\frac{|S'(1)|\sin\frac{\pi}{2^W}}{2^B\sin\frac{\pi}{2^{(W+B)}}}\right)^2$$

is a decreasing function of B and $$2^{-1}\sum_{k=0}^{2^W-1}|S'(k)|^2 - \left(\frac{|S'(1)|\sin\frac{\pi}{2^W}}{2^B\sin\frac{\pi}{2^{(W+B)}}}\right)^2$$

is an increasing function of B, and hence, from (4.7), the SNR for a sine DDS or cosine DDS is a decreasing function of B, for B>0.

Similarly for a quadrature DDS, from (4.6):

$$SNR = 10\log_{10}\frac{\left|\frac{V(1)}{2^B}CS'(1)\right|^2}{\sum_{k=0}^{2^W-1}|CS'(k)|^2 - \left|\frac{V(1)}{2^B}CS'(1)\right|^2}$$

which, using (3.9), becomes $$SNR = 10\log_{10}\frac{\left(\frac{|CS'(1)|\sin\frac{\pi}{2^W}}{2^B\sin\frac{\pi}{2^{(W+B)}}}\right)^2}{\sum_{k=0}^{2^W-1}|CS'(k)|^2 - \left(\frac{|CS'(1)|\sin\frac{\pi}{2^W}}{2^B\sin\frac{\pi}{2^{(W+B)}}}\right)^2} \text{ or} \quad (4.8)$$

-continued $$SNR = 10\log_{10} \frac{\left(\frac{|CS'(1)|\sin\frac{\pi}{2^W}}{2^B \sin\frac{\pi}{2^{(W+B)}}}\right)^2}{2^W \sum_{n=0}^{2^W-1} |cs'(n)|^2 - \left(\frac{|CS'(1)|\sin\frac{\pi}{2^W}}{2^B \sin\frac{\pi}{2^{(W+B)}}}\right)^2}.$$

But, as illustrated, $$2^B \sin\frac{\pi}{2^{(W+B)}}$$

is an increasing function of B, for B>0. Therefore $$\left(\frac{|CS'(1)|\sin\frac{\pi}{2^W}}{2^B \sin\frac{\pi}{2^{(W+B)}}}\right)^2$$

is a decreasing function of B and $$\sum_{k=0}^{2^W-1} |CS'(k)|^2 - \left(\frac{|CS'(1)|\sin\frac{\pi}{2^W}}{2^B \sin\frac{\pi}{2^{(W+B)}}}\right)^2$$

is an increasing function of B and, from (4.8), one concludes that the SNR for a quadrature DDS is also a decreasing function of B, for B>0.

Such behavior is to be expected since the amount of phase truncation (i.e., the amount of phase error) increases with increasing values of B and with additional phase error the SNR is expected to decrease. Notice however, since increasing B corresponds to moving the rightmost non-zero bit more towards the LSB of the fcw, the amount by which the phase error increases with each addition to the value of B diminishes with increasing B. Similarly, the diminishing increase of the phase error causes the SNR to decrease diminishingly with increasing B, and as a result the SNR quickly approaches a lower bound which is derived next.

The minimum SNR over all values of B for a sine DDS or cosine DDS is obtained by evaluating (4.7) for B=∞. First by l'Hospital's rule, $$\lim_{B\to\infty} \frac{2^{-B}\sin\frac{\pi}{2^W}}{\sin\frac{\pi}{2^{(W+B)}}} = \frac{2^W}{\pi}\sin\frac{\pi}{2^W}.$$

Hence, $SNR_{MIN} = \lim_{B\to\infty} SNR$ becomes $$SNR_{MIN} = 10\log_{10} \frac{|S'(1)|^2 \left(\frac{2^W}{\pi}\sin\frac{\pi}{2^W}\right)^2}{2^{-1}\sum_{k=0}^{2^W-1} |S'(k)|^2 - |S'(1)|^2 \left(\frac{2^W}{\pi}\sin\frac{\pi}{2^W}\right)^2} \quad \text{or} \quad (4.9)$$

$$SNR_{MIN} = 10\log_{10} \frac{|S'(1)|^2 \left(\frac{2^W}{\pi}\sin\frac{\pi}{2^W}\right)^2}{2^{(W-1)}\sum_{n=0}^{2^W-1} |s'(n)|^2 - |S'(1)|^2 \left(\frac{2^W}{\pi}\sin\frac{\pi}{2^W}\right)^2}.$$

Similarly, the maximum SNR is obtained by evaluating (4.7) for B=1:

$$SNR_{MAX} = 10\log_{10} \frac{|S'(1)|^2 \left(\frac{\sin\frac{\pi}{2^W}}{2\sin\frac{\pi}{2^{(W+1)}}}\right)^2}{2^{-1}\sum_{k=0}^{2^W-1} |S'(k)|^2 - |S'(1)|^2 \left(\frac{\sin\frac{\pi}{2^W}}{2\sin\frac{\pi}{2^{(W+1)}}}\right)^2} \quad \text{or}$$

$$SNR_{MAX} = 10\log_{10} \frac{|S'(1)|^2 \left(\frac{\sin\frac{\pi}{2^W}}{2\sin\frac{\pi}{2^{(W+1)}}}\right)^2}{2^{(W-1)}\sum_{n=0}^{2^W-1} |s'(n)|^2 - |S'(1)|^2 \left(\frac{\sin\frac{\pi}{2^W}}{2\sin\frac{\pi}{2^{(W+1)}}}\right)^2}$$

which can be further simplified by using the trigonometric double-angle identity sin 2α=2 sin α cos α from which one obtains $$\frac{\sin\frac{\pi}{2^W}}{2\sin\frac{\pi}{2^{(W+1)}}} = \cos\frac{\pi}{2^{(W+1)}}.$$

Thus, $$SNR_{MAX} = 10\log_{10} \frac{|S'(1)|^2 \cos^2\frac{\pi}{2^{(W+1)}}}{2^{-1}\sum_{k=0}^{2^W-1} |S'(k)|^2 - |S'(1)|^2 \cos^2\frac{\pi}{2^{(W+1)}}} \quad \text{or} \quad (4.10)$$

$$SNR_{MAX} = 10\log_{10} \frac{|S'(1)|^2 \cos^2\frac{\pi}{2^{(W+1)}}}{2^{(W-1)}\sum_{n=0}^{2^W-1} |s'(n)|^2 - |S'(1)|^2 \cos^2\frac{\pi}{2^{(W+1)}}}.$$

The derivation of minimum and maximum SNR bounds for a quadrature DDS is similar and the minimum bound is $$SNR_{MIN} = 10\log_{10}\frac{|CS'(1)|^2\left(\frac{2^W}{\pi}\sin\frac{\pi}{2^W}\right)^2}{\sum_{k=0}^{2^W-1}|CS'(k)|^2 - |CS'(1)|^2\left(\frac{2^W}{\pi}\sin\frac{\pi}{2^W}\right)^2} \text{ or} \quad (4.11)$$

$$SNR_{MIN} = 10\log_{10}\frac{|CS'(1)|^2\left(\frac{2^W}{\pi}\sin\frac{\pi}{2^W}\right)^2}{2^W\sum_{n=0}^{2^W-1}|cs'(n)|^2 - |CS'(1)|^2\left(\frac{2^W}{\pi}\sin\frac{\pi}{2^W}\right)^2},$$

while the maximum bound is $$SNR_{MAX} = 10\log_{10}\frac{|CS'(1)|^2\cos^2\frac{\pi}{2^{(W+1)}}}{\sum_{k=0}^{2^W-1}|CS'(k)|^2 - |CS'(1)|^2\cos^2\frac{\pi}{2^{(W+1)}}} \text{ or} \quad (4.12)$$

$$SNR_{MAX} = 10\log_{10}\frac{|CS'(1)|^2\cos^2\frac{\pi}{2^{(W+1)}}}{2^W\sum_{n=0}^{2^W-1}|cs'(n)|^2 - |CS'(1)|^2\cos^2\frac{\pi}{2^{(W+1)}}}.$$

4.4 SNR and its Bounds Due to Phase Truncation

For a sine DDS or cosine DDS with an ideal SCMF (i.e., a ROM whose contents have infinite precision) the SNR expression (4.3) and the SNR bounds (4.9) and (4.10) can be simplified by using the ideal SCMF contents $$s'(n) = \sin\left(\frac{2\pi}{2^W}n\right),$$

and $$c'(n) = \cos\left(\frac{2\pi}{2^W}n\right).$$

One then obtains $|S'(k)|=|C'(k)|=2^{(W-1)}\delta(k-1)+2^{(W-1)}\delta(k-(2^W-1))$ as shown by (3.5). Hence, $|S'(1)|=|S'(2^W-1)|=2^{W-1}$ and $$\sum_{k=0}^{2^W-1}|S'(k)|^2 = |S'(1)|^2 + |S'(2^W-1)|^2 = 2^{(2W-1)}$$

and, from Parseval's theorem, one obtains $$\sum_{k=0}^{2^W-1}|S'(n)|^2 = \frac{1}{2^W}\sum_{k=0}^{2^W-1}|S'(k)|^2 = 2^{(W-1)}.$$

From (4.3) one therefore gets $$SNR^{PHASE-TRUNCATION} = 10\log_{10}\frac{|V(1)S'(1)|^2}{2^{(2W+2B-2)} - |V(1)S'(1)|^2} \quad (4.13)$$

$$= 10\log_{10}\frac{2^{(2W-2)}|V(1)|^2}{2^{(2W+2B-2)} - 2^{(2W-2)}|V(1)|^2}$$

$$= 10\log_{10}\frac{|V(1)|^2}{2^{2B} - |V(1)|^2}$$

$$= 10\log_{10}\frac{\left|\frac{V(1)}{2^B}\right|^2}{1-\left|\frac{V(1)}{2^B}\right|^2},$$

while for the bounds (4.9) and (4.10) one obtains $$SNR_{MIN}^{PHASE-TRUNCATION} = 10\log_{10}\frac{2^{(2W-2)}\left(\frac{2^W}{\pi}\sin\frac{\pi}{2^W}\right)^2}{2^{(2W-2)} - 2^{(2W-2)}\left(\frac{2^W}{\pi}\sin\frac{\pi}{2^W}\right)^2} \quad (4.14)$$

$$= 10\log_{10}\frac{\left(\frac{2^W}{\pi}\sin\frac{\pi}{2^W}\right)^2}{1-\left(\frac{2^W}{\pi}\sin\frac{\pi}{2^W}\right)^2}$$

$$SNR_{MAX}^{PHASE-TRUNCATION} = 10\log_{10}\frac{2^{(2W-2)}\cos^2\frac{\pi}{2^{(W+1)}}}{2^{(2W-2)} - 2^{(2W-2)}\cos^2\frac{\pi}{2^{(W+1)}}} \quad (4.15)$$

$$= 20\log_{10}\cot\frac{\pi}{2^{(W+1)}}.$$

For a quadrature DDS with ideal SCMF contents $$cs'(n) = \cos\left(\frac{2\pi}{2^W}n\right) + j\left(\sin\left(\frac{2\pi}{2^W}n\right)\right)$$

and the corresponding spectrum $|CS'(k)|=2^W\delta(k-1)$ given by (3.6) one obtains $$|CS'(1)| = 2^W, \quad \sum_{k=0}^{2^W-1}|CS'(k)|^2 = |CS'(1)|^2 = 2^{2W},$$

and, from Parseval's theorem, $$\sum_{n=0}^{2^W-1}|cs'(n)|^2 = \frac{1}{2^W}\sum_{k=0}^{2^W-1}|CS'(k)|^2 = 2^W.$$

Substituting these expressions into the SNR expression (4.6), and SNR bounds (4.11) and (4.12) yields the same phase-truncation SNR expression (4.13) and minimum and maximum phase-truncation SNR bounds (4.14) and (4.15), respectively. The phase-truncation SNR is identical for sine DDS, cosine DDS, and quadrature DDS. This behavior is to be expected since phase-truncation is common between sine DDS, cosine DDS, and quadrature DDS.

The SNR expression for an ideal SCMF (4.13) and the bounds (4.14) and (4.15) correspond to solutions found by conventional techniques. In practice, of course, the SCMF is non-ideal and therefore, to illustrate how the actual SNR (computed by (4.3) or (4.7) for sine DDS or cosine DDS and computed by (4.6) or (4.8) for quadrature DDS) differs from the idealized expression (4.13), one can perform the following exercise:

Consider a "best-case" practical quadrature DDS, one capable of generating outputs by rounding the infinite precision sine and cosine functions to the specified output precision. One can generate plots for the SNR bounds vs. the number of SCMF address bits (i.e., the number of lookup table address bits for a purely lookup-based DDS) by employing (4.11) and (4.12) with the various values of W and their corresponding sequences cs'(n). FIG. 4-2 shows the results for output bit precisions varying from 5 fractional bits to 15 fractional bits and SCMF address bits W varying from 5 bits to 22 bits. Notice that the curves corresponding to $SNR_{MIN}$ and $SNR_{MAX}$ are very close to one another near the ideal SCMF, also referred to as Jenq bounds, and become indistinguishable from each other as they reach their asymptotes for increasing values of W. The curves of FIG. 28 ignore the asymmetry created in the data by the inability to represent the value +1 when using two's complement notation with a sign bit and fractional bits immediately following the sign bit. When this asymmetry is accounted for, the outcome is to further increase the noise, causing the curves plotted in FIG. 28 to move down slightly. Next, one observes that a DDS with an output precision of b fractional bits (and ignoring the asymmetry) follows Jenq's bounds rather closely for W<(b+1) but for W>(b+1) starts deviating and quickly reaches a horizontal asymptote. This behavior is expected since, for a short-length SCMF the phase-granularity of the stored (or computed) sinusoid in the SCMF is coarse and therefore the output noise (or distortion) is mainly due to phase-truncation, which is modeled by the Jenq bounds. As the size of the SCMF increases, for a fixed output precision, the phase-granularity of the stored (or computed) sinusoid becomes finer and finer and eventually reaches a point where the output noise (or distortion) is mainly due to the finite precision output and any other non-idealities of the SCMF.

4.5 SNR asymptotes

In general, i.e., without making the above-discussed restrictions that the SCMF simply rounds the infinite-precision sine and cosine values to the specified output precision, one can examine the behavior of the SNR for large values of W. Practical DDS implementations often introduce other errors into the SCMF in order to achieve certain hardware efficiencies or reductions in specific spurious component amplitude. For this purpose, one first considers the lower bound (4.9) for sine DDS or cosine DDS and, using the fact that $$\frac{\sin x}{x} \to 1$$

as x→0, one obtains:
or $$SNR_{MIN}^{LargeW} = 10\log_{10}\frac{|S'(1)|^2}{2^{-1}\sum_{k=0}^{2^W-1}|S'(k)|^2 - |S'(1)|^2} \text{ or} \quad (4.16)$$

$$SNR_{MIN}^{LargeW} = 10\log_{10}\frac{|S'(1)|^2}{2^{(W-1)}\sum_{n=0}^{2^W-1}|s'(n)|^2 - |S'(1)|^2}.$$

Similarly, one considers the upper bound (4.10) and, since cos x→1 as x→0, one obtains:

$$SNR_{MAX}^{LargeW} = 10\log_{10}\frac{|S'(1)|^2}{2^{-1}\sum_{k=0}^{2^W-1}|S'(k)|^2 - |S'(1)|^2} \text{ or} \quad (4.17)$$

$$SNR_{MAX}^{LargeW} = 10\log_{10}\frac{|S'(1)|^2}{2^{(W-1)}\sum_{n=0}^{2^W-1}|s'(n)|^2 - |S'(1)|^2}.$$

For quadrature DDS, similar large-W expressions are obtained for the minimum bound from (4.11) (again using the fact that $$\frac{\sin x}{x} \to 1$$

as x→0)

$$SNR_{MIN}^{LargeW} = 10\log_{10}\frac{|CS'(1)|^2}{\sum_{k=0}^{2^W-1}|CS'(k)|^2 - |CS'(1)|^2} \text{ or} \quad (4.18)$$

$$SNR_{MIN}^{LargeW} = 10\log_{10}\frac{|CS'(1)|^2}{2^W\sum_{n=0}^{2^W-1}|cs'(n)|^2 - |CS'(1)|^2},$$

and the maximum bound from (4.12) (using cos x→1 as x→0)

$$SNR_{MAX}^{LargeW} = 10\log_{10}\frac{|CS'(1)|^2}{\sum_{k=0}^{2^W-1}|CS'(k)|^2 - |CS'(1)|^2} \text{ or} \quad (4.19)$$

$$SNR_{MAX}^{LargeW} = 10\log_{10}\frac{|CS'(1)|^2}{2^W\sum_{n=0}^{2^W-1}|cs'(n)|^2 - |CS'(1)|^2}.$$

Clearly, $SNR_{MIN}^{Large\ W} = SNR_{MAX}^{Large\ W}$ for sine DDS, cosine DDS, and quadrature DDS and, moreover, these large-W expressions are, in fact, the SNR of the SCMF output (4.3) for sine DDS and cosine DDS and the SNR of the SCMF output (4.6) for quadrature DDS, when no phase truncation is present, i.e. B=0. (Recall from (3.4), that V(k)=1, for all k, when B=0.)

Figure 28:
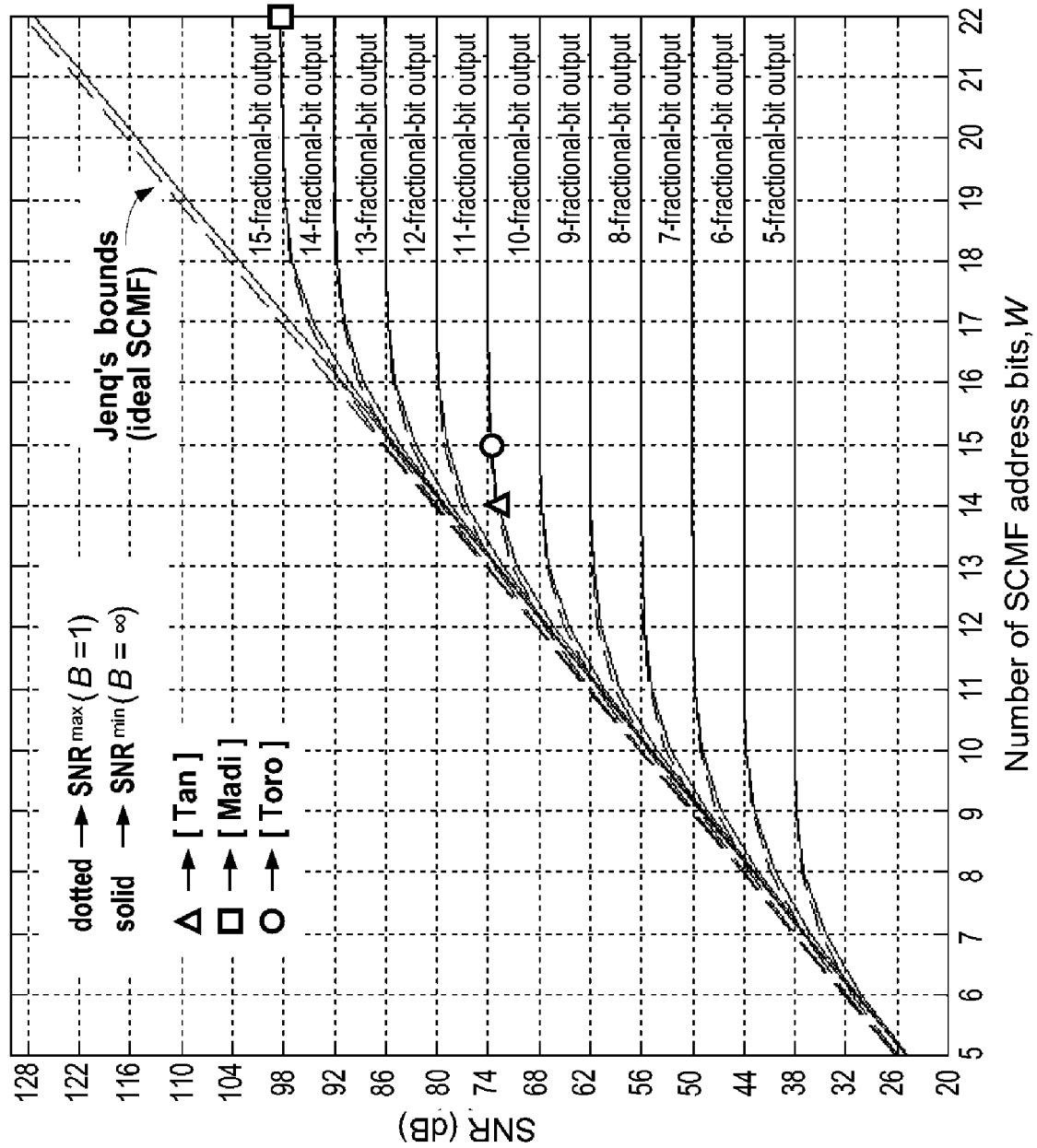
FIG. 28 is a plot of SNR curves for quadrature DDS with various output precisions and comparisons with some known quadrature DDS implementations.

It is now shown that the "saturation type" behavior shown in FIG. 28 occurs in general DDS implementations when the number of output bits is fixed and when W increases. For this purpose, one considers the general SCMF for a sine DDS as given in (3.14) with the SCMF output quantization and approximation error q(n) modeled as a uniformly-distributed random process in the range $$\left[-\frac{2^{-F}}{2}, \frac{2^{-F}}{2}\right],$$

with F denoting the number of DDS output fractional bits. This model might not be accurate for very-short-length SCMF (i.e., for very small values of W), but will likely be suitable for most practical DDS implementations. To obtain the large-W asymptotes one first considers $$\sum_{n=0}^{2^W-1} |s'(n)|^2 = \sum_{n=0}^{2^W-1} s'(n)^2 = \sum_{n=0}^{2^W-1} \left(\sin\left(\frac{2\pi n}{2^W}\right) + q(n)\right)^2 \quad (4.20)$$

$$= \sum_{n=0}^{2^W-1} \left(\sin^2\left(\frac{2\pi n}{2^W}\right) + 2\sin\left(\frac{2\pi n}{2^W}\right)q(n) + q^2(n)\right).$$

Since one assumes the error sequence q(n) to be a random process with a well-defined probability distribution (i.e., uniform) and since it is uncorrelated with $$\sin\left(\frac{2\pi n}{2^W}\right),$$

the expression (4.20) can be simplified by use of the expectation operator E. The error sequence q(n) has zero mean, hence E(q(n))=0 and, from its uniform distribution, one obtains $$E(q^2(n)) = \frac{2^{-2F}}{12}.$$

Applying the expectation operator to (4.20) one obtains:

$$\sum_{n=0}^{2^W-1} |s'(n)|^2 = \sum_{n=0}^{2^W-1} E\left(\sin^2\left(\frac{2\pi n}{2^W}\right) + 2\sin\left(\frac{2\pi n}{2^W}\right)q(n) + q^2(n)\right) \quad (4.21)$$

$$= \sum_{n=0}^{2^W-1} \left[E\left(\sin^2\left(\frac{2\pi n}{2^W}\right)\right) + 2E\left(\sin\left(\frac{2\pi n}{2^W}\right)\right)E(q(n)) + E(q^2(n))\right]$$

$$= \sum_{n=0}^{2^W-1} \sin^2\left(\frac{2\pi n}{2^W}\right) + \sum_{n=0}^{2^W-1} E(q^2(n)) = \sum_{n=0}^{2^W-1} \sin^2\left(\frac{2\pi n}{2^W}\right) +$$

$$\sum_{n=0}^{2^W-1} \frac{2^{-2F}}{12}$$

$$= \sum_{n=0}^{2^W-1} \sin^2\left(\frac{2\pi n}{2^W}\right) + 2^W \frac{2^{-2F}}{12}$$

-continued $$= 2^{(W-1)} + 2^W \frac{2^{-2F}}{12}.$$

Substituting (4.21) into (4.17) and assuming the quantization noise does not significantly change the magnitude of the main component (i.e., $|S'(1)| \approx 2^{(W-1)}$) one gets the SNR asymptote as a function of DDS output precision (i.e., number of fractional bits F):

$$SNR_{asymptote} = 10\log_{10} \frac{2^{2(W-1)}}{2^{(W-1)}\left(2^{(W-1)} + 2^W \frac{2^{-2F}}{12}\right) - 2^{2(W-1)}} \quad (4.22)$$

$$= 10\log_{10} \frac{2^{2(W-1)}}{2^{2(W-1)} + 2^{(2W-1)}\frac{2^{-2F}}{12} - 2^{2(W-1)}}$$

$$= 10\log_{10} \frac{2^{2(W-1)}}{2^{(2W-1)}\frac{2^{-2F}}{12}}$$

$$= 10\log_{10} \frac{1}{\frac{2^{-2F}}{6}}$$

$$= 10\log_{10}(6) + 10\log_{10}(2^{2F})$$

$$= 10\log_{10}(6) + 20F\log_{10}(2)$$

$$\approx 7.78 + 6.02F \text{ dB}.$$

The SNR asymptote expression (4.22) also applies to cosine DDS and, by considering the general SCMF for a quadrature DDS as given in (3.15) with the SCMF output quantization and approximation errors $q_{cos}(n)$ and $q_{sin}(n)$ modeled as a uniformly-distributed random process in the range $$\left[-\frac{2^{-F}}{2}, \frac{2^{-F}}{2}\right],$$

with F denoting the number of DDS output fractional bits for both sine and cosine outputs, one gets $$\sum_{n=0}^{2^W-1} |cs'(n)|^2 = \sum_{n=0}^{2^W-1} \left|\cos\left(\frac{2\pi n}{2^W}\right) + q_{cos}(n) + j\left(\sin\left(\frac{2\pi n}{2^W}\right) + q_{sin}(n)\right)\right|^2 \quad (4.23)$$

$$= \sum_{n=0}^{2^W-1} \left(\left(\cos\left(\frac{2\pi n}{2^W}\right) + q_{cos}(n)\right)^2 + \left(\sin\left(\frac{2\pi n}{2^W}\right) + q_{sin}(n)\right)^2\right)$$

$$= \sum_{n=0}^{2^W-1} \left(\cos^2\left(\frac{2\pi n}{2^W}\right) + 2q_{cos}(n)\cos\left(\frac{2\pi n}{2^W}\right) + q_{cos}^2(n)\right) +$$

$$\sum_{n=0}^{2^W-1} \left(\sin^2\left(\frac{2\pi n}{2^W}\right) + 2q_{sin}(n)\sin\left(\frac{2\pi n}{2^W}\right) + q_{sin}^2(n)\right).$$

With the expectation operator E and E $(q_{cos}(n))$= E $(q_{sin}(n))$= 0, and $$E(q_{cos}^2(n)) = E(q_{sin}^2(n)) = \frac{2^{-2F}}{12}$$

one obtains form (4.23)

$$\sum_{n=0}^{2^W-1} |cs'(n)|^2 = \sum_{n=0}^{2^W-1} E\left(\cos^2\left(\frac{2\pi n}{2^W}\right) + 2q_{cos}(n)\cos\left(\frac{2\pi n}{2^W}\right) + q_{cos}^2(n)\right) + \qquad (4.24)$$

$$\sum_{n=0}^{2^W-1} E\left(\sin^2\left(\frac{2\pi n}{2^W}\right) + 2q_{sin}(n)\sin\left(\frac{2\pi n}{2^W}\right) + q_{sin}^2(n)\right)$$

$$= \sum_{n=0}^{2^W-1} \left(\cos^2\left(\frac{2\pi n}{2^W}\right) + \right.$$

$$2\cos\left(\frac{2\pi n}{2^W}\right)E(q_{cos}(n)) + E(q_{cos}^2(n))\right) +$$

$$\sum_{n=0}^{2^W-1} \left(\sin^2\left(\frac{2\pi n}{2^W}\right) + \right.$$

$$\left. 2\sin\left(\frac{2\pi n}{2^W}\right)E(q_{sin}(n)) + E(q_{sin}^2(n))\right)$$

$$= \sum_{n=0}^{2^W-1} \left(\cos^2\left(\frac{2\pi n}{2^W}\right) + \right.$$

$$\left. \sin^2\left(\frac{2\pi n}{2^W}\right)E(q_{cos}(n)) + E(q_{sin}^2(n))\right)$$

$$= \sum_{n=0}^{2^W-1} (1 + E(q_{cos}^2(n)) + E(q_{sin}^2(n)))$$

$$= 2^W + 2^{(W+1)}\frac{2^{-2F}}{12}.$$

Finally, substituting (4.24) into (4.19) and assuming the quantization noise does not significantly change the magnitude of the main component (i.e., $|CS'(1)| \approx 2^W$) one gets the SNR asymptote (4.22) as a function of DDS output precision in terms of number of fractional bits F. The SNR asymptotes obtained by modeling the output rounding error as a uniformly-distributed random process for all three types of DDS (i.e., sine DDS, cosine DDS, and quadrature DDS) are given by (4.22).

It is concluded from (4.22), for example, that a DDS with 11 fractional bits at the output has an SNR asymptote at 74 dB, which is consistent with the plot in FIGS. 4-2 (which is to be expected since the "best case" DDS on which the figure is based is consistent with the current general model). From (4.22) one can also conclude that every additional output bit will raise the asymptote by approximately 6 dB, a feature that is exhibited by FIG. 28 as well.

For some reported DDS implementations with various output precisions and SCMF input address bits W, the SNR bounds are marked on a "best case" SCMF implementation model curves on FIG. 28. The lower bounds for such implementations deviate from Jenq bounds by 6.26 dB, 11.42 dB, and 28.77 dB, respectively. The upper bounds for such implementations deviate from Jenq bounds by 7.24 dB, 12.59 dB, and 30.01 dB, respectively. If instead of the "best case" model the actual s'(n), c'(n), or cs'(n) sequences (which would, in addition to the finite precision outputs, include other SCMF approximations and errors) corresponding to these DDS implementations were used to compute the actual SNR using (4.3) or (4.7) for sine DDS or cosine DDS, and (4.6) or (4.8) for quadrature DDS, the deviation from the Jenq bounds would be even greater.

While the assumptions of the general model are reasonable and should apply to many practical DDS implementations, it is possible to implement a DDS where they do not apply. A DDS that employs other approximations and computes the outputs by introducing other error sources may, of course, have an error sequence q(n) that is very different from the one considered above. In this case, the SNR may not exhibit the asymptotes specified by (4.22). For such DDS implementations the SNR computation should be done using (4.3) or (4.7), and (4.6) or (4.8), the upper and lower bound computations should be done using (4.9) and (4.10) respectively for sine DDS and cosine DDS, and using (4.11) and (4.12) respectively for quadrature DDS, and the SNR asymptotic behavior could likely be investigated in a manner similar to the present approach, considering the specific properties of the pertinent error sequences q(n), $q_{cos}(n)$, and $q_{sin}(n)$.

4.6 SNR, SFDR, and Initial Phase Conditions in the Absence of Phase Truncation

As discussed in Section 3.6, for frequency control words having a rightmost nonzero bit positioned at or above location W, i.e. L≦W, different initial phase conditions can give rise to different sets of spurs, hence, different SNR. Therefore, to obtain the worst-case SNR for all frequency control words with a particular rightmost nonzero bit at location L=W−T, all possible $2^T$ initial phase conditions must be considered. In such cases there is no phase-word truncation and the set of spurs generated is due only to the non-ideal SCMF. Jenq's bounds are naturally inapplicable for such fcw, since they model only phase truncation. In Section 3.6, the spurs for all initial phase conditions were computed with the assistance of a $2^L \times 2^T$ matrix A, which was constructed from the signature sequence s'(n), c'(n), or cs'(n), the entire contents of the SCMF. The matrix A could also be used to compute the SNR for all initial phase conditions as follows. First, construct A by arranging s'(n), c'(n), or cs'(n) in a row-priority fashion. From Section 3.6 one knows that such construction of A makes its first column correspond to one period of the DDS output for the initial phase $\hat{\theta}_{initial}$=0, the second column for the initial phase $\hat{\theta}_{initial}$=1, and so on until the last column for the initial phase $\hat{\theta}_{initial}$=$2^T$−1. Therefore, spectra associated with all possible $2^T$ initial phase conditions can be obtained by simply performing $2^L$-point DFTs on the columns of A. For sine DDS or cosine DDS, let $s_i(n)$ and $S_i(k)$ denote the i-th column of A and the DFT of the i-th column of A, respectively. Then $s_i(n)$=s'($2^T n+i$) and $$S_i(k) = \sum_{n=0}^{2^L-1} s_i(n) e^{-j\frac{2\pi}{2^L}nk},$$

where 0≦n, k<$2^L$ and 0≦i<$2^T$. The SNR corresponding to initial phase condition $\hat{\theta}_{initial}$=i could then be computed from $S_i(k)$ as follows. The signal power resides in the main components $S_i(1)$ and $S_i(2^L-1)$ and since their magnitudes must be identical, because $s_i(n)$ is a real-valued sequence, one obtains $$P_{SIGNAL}^i = \frac{1}{2^{2L}}|S_i(1)|^2 + \frac{1}{2^{2L}}|S_i(2^L-1)|^2 = \frac{2}{2^{2L}}|S_i(1)|^2. \quad (4.25)$$

Similar to (4.2), the total power can be computed from either $s_i(n)$ or $S_i(k)$ as $$P_{TOTAL}^i = \frac{1}{2^L}\sum_{n=0}^{2^L-1}|s_i(n)|^2 = \frac{1}{2^{2L}}\sum_{k=0}^{2^L-1}|S_i(k)|^2, \quad (4.26)$$

and the total noise power is easily obtained by subtracting the signal power (4.25) from the total power (4.26). The result is $$P_{NOISE}^i = \frac{1}{2^L}\sum_{n=0}^{2^L-1}|s_i(n)|^2 - \frac{1}{2^{2L}}|S_i(1)|^2 \text{ or} \quad (4.27)$$

$$P_{NOISE}^i = \frac{1}{2^L}\sum_{k=0}^{2^L-1}|S_i(k)|^2 - \frac{1}{2^{2L}}|S_i(1)|^2.$$

Notice that since $L \leq W$ the noise power $P_{NOISE}^i$ in (4.27) requires a small amount of computational resources. The $$SNR^i = \frac{P_{SIGNAL}^i}{P_{NOISE}^i}$$

is easily obtained from (4.25) and (4.27) and using the dB notation it is $$SNR^i = 10\log_{10}\frac{|S_i(1)|^2}{2^{(L-1)}\sum_{n=0}^{2^L-1}|s_i(n)|^2 - |S_i(1)|^2} \text{ or} \quad (4.28)$$

$$SNR^i = 10\log_{10}\frac{|S_i(1)|^2}{2^{-1}\sum_{k=0}^{2^L-1}|S_i(k)|^2 - |S_i(1)|^2}.$$

The SNR corresponding to a sine DDS or cosine DDS with a W-bit input SCMF from any fcw with $L \leq W$ and all possible $2^T$ initial phase conditions, where $T=W-L$, is obtained with the assistance of the matrix A and (4.28) applied to the columns of A. FIG. 4-3 illustrates an example with $W=8$, $L=3$, and $T=5$.

Figure 29:
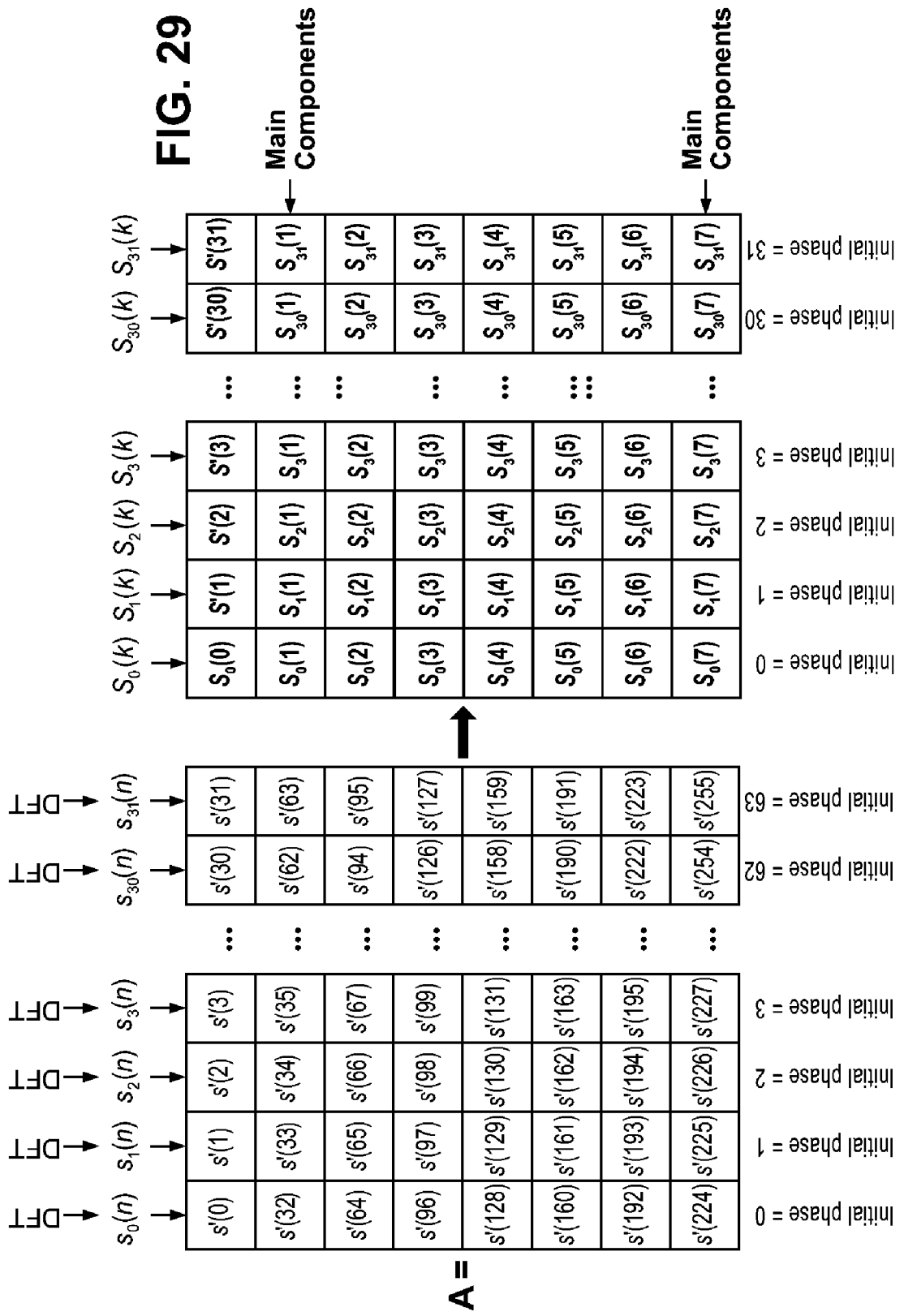
FIG. 29 is a diagram of a construction of matrix A and computation of SNR for fcw with L≦W for all initial phases (example with W=8, L=3, and T=5).
Figure 30:
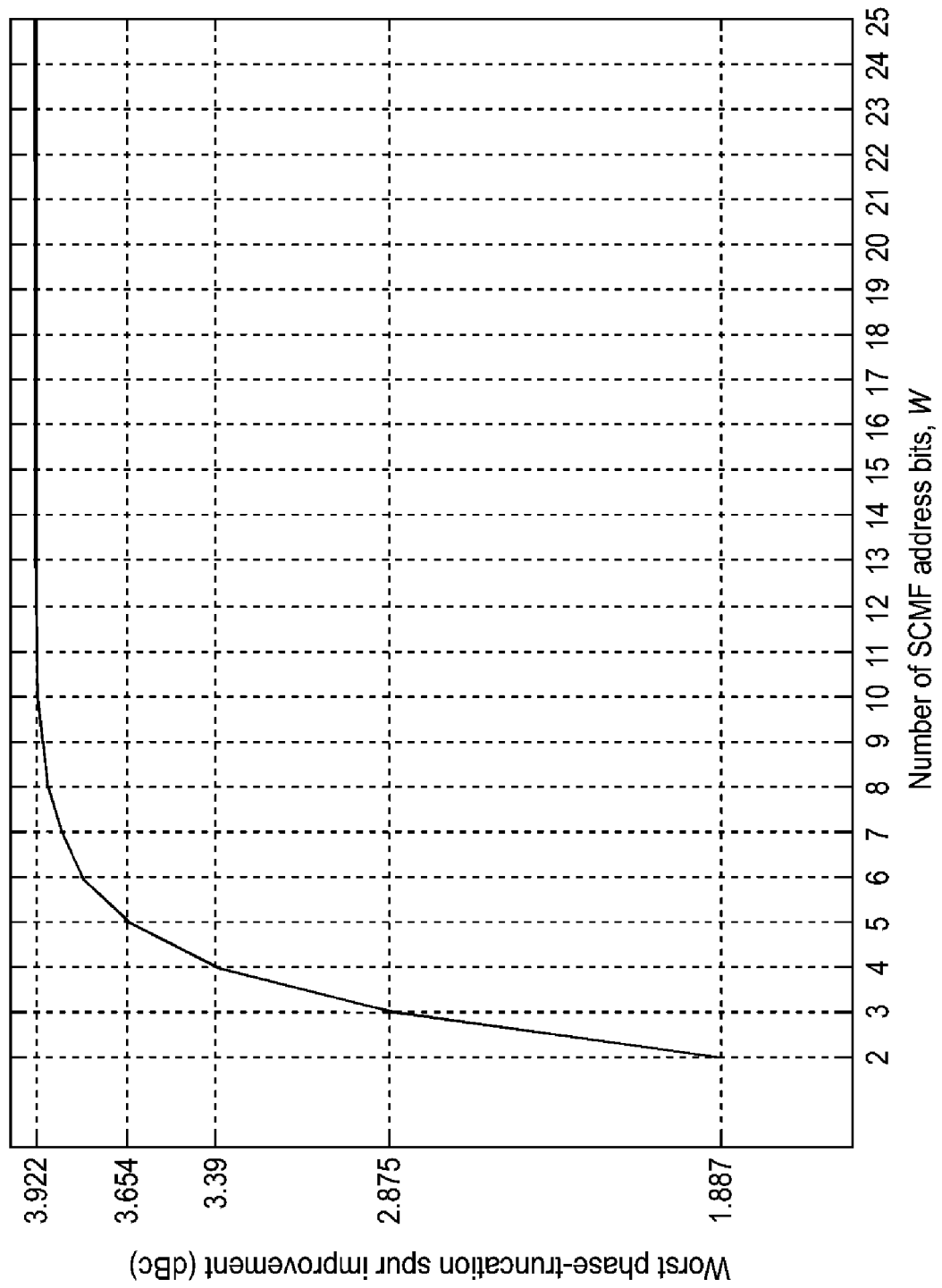
FIG. 30 is a plot of worst phase-truncation spur improvement Δ(W) due to modified phase accumulator.

The SNR expressions for quadrature DDS are similar to (4.28) and they are derived in a similar fashion. For a quadrature DDS there is a single main component and it is at $k=1$. In the context of FIG. 29, the main components on the bottom row of the matrix on the right hand side would be a row of spurs instead of a row of main components. The SNR expressions for quadrature DDS are $$SNR^i = 10\log_{10}\frac{|CS_i(1)|^2}{2^L\sum_{n=0}^{2^L-1}|cs_i(n)|^2 - |CS_i(1)|^2} \text{ or} \quad (4.29)$$

$$SNR^i = 10\log_{10}\frac{|CS_i(1)|^2}{\sum_{k=0}^{2^L-1}|CS_i(k)|^2 - |CS_i(1)|^2}.$$

Similarly, the SFDR for a sine DDS or cosine DDS with a W-bit input SCMF from any fcw with $L \leq W$ and all possible $2^T$ initial phase conditions, is obtained by applying (1.5) or (1.6), respectively, to the columns of the matrix A. The result is $$SFDR_{cosine\ only}^i = 20\log_{10}\frac{|C_i(k)_{k=main\ components}|}{\max_{\forall k \neq main\ components}\{|C_i(k)|\}} \quad (4.30)$$

$$SFDR_{sine\ only}^i = 20\log_{10}\frac{|S_i(k)_{k=main\ components}|}{\max_{\forall k \neq main\ components}\{|S_i(k)|\}}. \quad (4.31)$$

The following SFDR expression for quadrature DDS $$SFDR_{quadrature}^i = 20\log_{10}\frac{|CS_i(k)_{k=main\ component}|}{\max_{\forall k \neq main\ component}\{|CS_i(k)|\}} \quad (4.32)$$

is obtained by applying (1.7) to the columns of A.

4.7 Method for Complete DDS SNR Computation

The results emerging from the realizations developed in previous sections are consolidated into a method for the computation of SNR for a DDS with an M-bit input frequency control word and a W-bit input SCMF with its corresponding length-$2^W$ signature sequence s'(n), c'(n), or cs'(n), for sine DDS, cosine DDS, or quadrature DDS, respectively. All imprecision due to SCMF non-idealities and finite precision arithmetic are embodied in the signature sequences s'(n), c'(n), and cs'(n).

A. Complete SNR Computation for Sine DDS or Cosine DDS
1) Compute the SNR for fcw with $L \leq W$ as follows: For each L, $1 \leq L \leq W$ construct the matrix A from s'(n) or c'(n) as described in Section 3.6 and perform DFTs on the columns of A. Compute the SNR for each resulting column via (4.28).
2) Compute the minimum and maximum SNR bounds over all fcw with $L > W$ using (4.9) and (4.10).
3) Compute the SNR for all fcw with $L > W$ by evaluating (4.3) or (4.7) for each L, $W < L \leq M$.

B. Complete SNR Computation for Quadrature DDS
1) Compute the SNR for fcw with $L \leq W$ as follows: For each L, $1 \leq L \leq W$ construct the matrix A from cs'(n) as described in Section 3.6 and perform DFTs on the columns of A. Compute the SNR for each resulting column via (4.29).
1) Compute the minimum and maximum SNR bounds over all fcw with $L > W$ using (4.11) and (4.12).
2) Compute the SNR for all fcw with $L > W$ by evaluating (4.6) or (4.8) for each L, $W < L \leq M$.

5.1 Modified Phase Accumulator

Next, common DDS design techniques are reviewed and their impact on performance is analyzed. One such design technique is a modified phase accumulator which simply augments the M-bit input frequency control word of FIG. 3 with a '1' at the phase accumulator's LSB (i.e., at the M+1 bit position). From the discussion of Section 2.2 one concludes that, with the modified phase accumulator, the set of spurs for any frequency control word is the set generated from the single frequency control word having a single nonzero bit at position M+1. There are several advantages to this modified phase accumulator approach. First, by eliminating the cases where the rightmost nonzero fcw bit is close to the MSB, one eliminates the short-period error sequences at the output of the DDS and the associated large magnitude spurious frequencies. Second, the initial state of the phase accumulator register has no impact on the spurs generated at the output of the DDS. Third, the magnitudes of all spurs become independent of the value of the input frequency control word. Finally, for a particular choice of W and B=M−W+1, the phase-truncation spur magnitudes and the worst phase-truncation spur magnitude are set by (3.8) and (3.11) respectively, and the SCMF can be designed such that $S'_H(k)$ has all its spurs just below the worst-case phase-truncation spur. To characterize the spurs for the modified phase accumulator, Step 1 of the spur characterization method in Section 3.7 is omitted and Step 2 is executed only with L=M+1. Similarly, to compute the SNR for the modified phase accumulator, only Step 3 of the SNR computation method of Section 4.7 is executed and it is executed only for L=M+1.

The magnitude of the worst phase-truncation spur for a specific value of B is given by (3.11), which was shown in Section 3.3 to be a monotone decreasing function of B and, as a result, the worst phase-truncation spur over all fcw with L>W was obtained in (3.13) by evaluating (3.11) for B=1 (or, equivalently L=W+1). The modified phase accumulator "fixes" the value of B=M−W+1, which is typically greater than ten. Since (3.11) is a decreasing function of B, the modified phase accumulator will improve the worst case phase-truncation spur over all fcw with L>W. This improvement $\Delta$ can be easily computed by evaluating (3.10) for large values of B, expressing it in dBc, and comparing it with (3.13) (the result of evaluating (3.11) for B=1). Using l'Hospital's rule to evaluate (3.10) for large B one obtains $$\lim_{B \to large} \frac{\sin\frac{\pi}{2^{(W+B)}}}{\sin\left(\frac{\pi}{2^B}\left(1 - \frac{1}{2^W}\right)\right)} = \frac{\frac{1}{2^W}\cos\frac{\pi}{2^{(W+B)}}}{\left(1 - \frac{1}{2^W}\right)\cos\left(\frac{\pi}{2^B}\left(1 - \frac{1}{2^W}\right)\right)} = \frac{1}{2^W - 1}$$

hence, $\Delta$ is obtained by expressing the above in dBc and subtracting it from (3.13). The result is $$\Delta(W) = 20\log_{10}\tan\frac{\pi}{2^{(W+1)}} + 20\log_{10}(2^W - 1). \quad (5.1)$$

FIG. 5-1 shows a plot for $\Delta(W)$ given by (5.1) for various values of W. Notice, in FIG. 5-1 the improvement $\Delta(W)$ approaches 3.922 dB for large values of W (W>11). This result is consistent with conventional techniques and can be obtained by evaluating (5.1) for large W as follows $$\lim_{W \to large} \Delta(W) = 20\log_{10}\frac{\pi}{2^{(W+1)}} + 20\log_{10}2^W = 20\log_{10}\frac{\pi}{2} = 3.922.$$

For a fixed fcw, the modified phase accumulator guarantees that each SCMF entry will get accessed at some point in time. Notice, however, that in some cases it may take a very long time before the SCMF ceases accessing one proper subset of SCMF entries and begins accessing a new set of entries. Consider, for example, an fcw with M=32, W=14, L<14 (e.g., L=5), and an initial phase of zero. In this case, as discussed in Section 3.6, a DDS using the original (i.e., unmodified) phase accumulator will indefinitely output every $2^T$-th entry (every $2^9$-th, for the example with L=5) in the SCMF starting at address zero and wrapping around to address zero when reaching its end. The DDS output s(n), c(n), or cs(n) will have a period of $2^L$ samples (a short period of 32 samples for L=5) and be influenced by the associated $2^L$-sample-period error sub-sequence. With the modified phase accumulator, the DDS will similarly output every $2^T$-th entry in the SCMF starting at address zero and wrapping around to address zero when reaching its end for $2^{(M-W+1)}$ cycles (which is $2^{19}$=524,288 cycles with M=32 and W=14) since the W−L LSB bits addressing the SCMF will remain zero for $2^{(M-W+1)}$ cycles until the modified phase accumulator's augmented bit propagates upward to reach the LSB of the SCMF. When the augmented bit reaches the LSB of the SCMF, the DDS starts accessing a new set of $2^L$ points by addressing every $2^T$-th entry in the SCMF starting at address one and wrapping around to address one when reaching its end. The set of $2^L$ points changes every $2^{(M-W+1)}$ cycles, which can be very long for typical values of M and W, when the augmented bit propagates to the LSB addressing the SCMF. Hence, in particular, for the first $2^{(M-W+1)}$ cycles, a DDS using the modified phase accumulator with a zero initial condition is indistinguishable from a DDS using the original phase accumulator with any initial condition having zero for all W bits addressing the SCMF. Similarly, for the following $2^{(M-W+1)}$ cycles it is indistinguishable from a DDS using the original phase accumulator with any initial condition having zero for all W−1 MSB bits and having one for the LSB addressing the SCMF.

In some applications, those where, for example, the processed data appears in "frames," the frame length may be far less than the $2^{(M-W+1)}$ cycles required for the DDS to change the set of points being accessed from the SCMF. In this case the processed data will be impacted by the short-period error sequence corresponding to the particular set of points being accessed from the SCMF. Furthermore, in other applications, the fcw may be updated every X cycles where $X < 2^{(M-W+1)}$ and then the DDS output samples corresponding to any particular fcw can be indistinguishable from the ones produced by a DDS using the original phase accumulator. Therefore, even when the modified phase accumulator is used, it may be useful to analyze the performance of the DDS assuming it uses the original phase accumulator, in addition to the analysis performed for the modified phase accumulator. To analyze the DDS for both the original and modified phase accumulators, one completes Steps 1 and 2 of the spur characterization method of Section 3.7 and execute Step 2 for L=M+1. Also, Steps 1, 2, and 3 of the SNR computation method of Section 4.7 are completed and Step 3 is executed with L=M+1 as well.

5.2 Common Mapping-Function-Reduction Techniques

The sine and cosine functions have symmetry properties that are very often exploited in DDS design to reduce the complexity of the SCMF implementation. In general, the complexity of the SCMF implementation increases with an increasing number of SCMF input bits W in FIG. 3. For example, if the SCMF accepts the W bits as the address to a lookup table with pre-computed and stored values for the corresponding sine and/or cosine functions, each increase of one bit in W would increase the lookup table size by a factor or two. There are, of course, many alternative and more efficient implementations for the SCMF known to those of ordinary skill in the art, where the complexity of the SCMF still grows with increasing W, but may not grow exponentially fast as in the pure lookup-table case.

Recall from Section 1.2 that the normalized SCMF input $\hat{\theta}$, if considered as a binary integer-valued number between 0 and $2^W-1$, represents the radian angle $$\theta = \hat{\theta}\frac{2\pi}{2^W}.$$

As expected, the SCMF input $\hat{\theta}$ represents the entire range of radian angles [0, 2π), where "[" is used to indicate that 0 is included in the interval and ")" is used to indicate that 2π is excluded from the interval. In fact, since the sine and cosine functions have a period of 2π radians, the sine and cosine of the radian angle 2π are identical to the sine and cosine of the angle 0. The angle 2π is equivalent to 0, and therefore 2π can be considered included in the interval via the inclusion of the angle 0. As discussed in Section 2.1, the overflowing characteristic of the phase accumulator adder provides the necessary (and very efficient) mechanism of mapping all the angles in the range (−∞, +∞) into their corresponding angles in the range [0, 2π) via a modulo 2π operation. Therefore, the range [0, 2π) is sufficient to represent all radian angles.

Figure 31B:
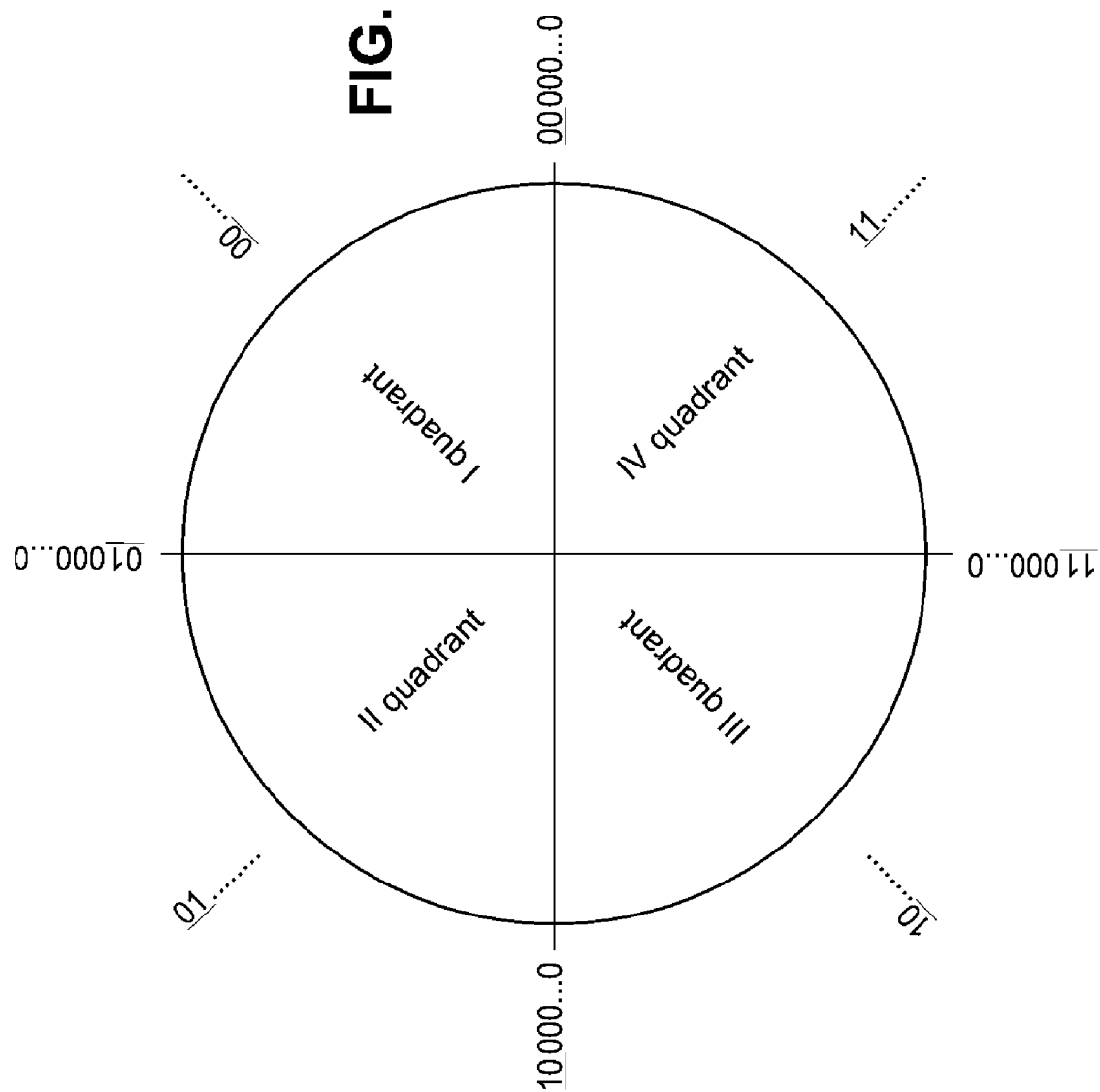
FIGS. 31 a, b and c are diagrams of the partitioning of unit circle by the MSBs of $\hat{\theta}$.
Figure 31C:
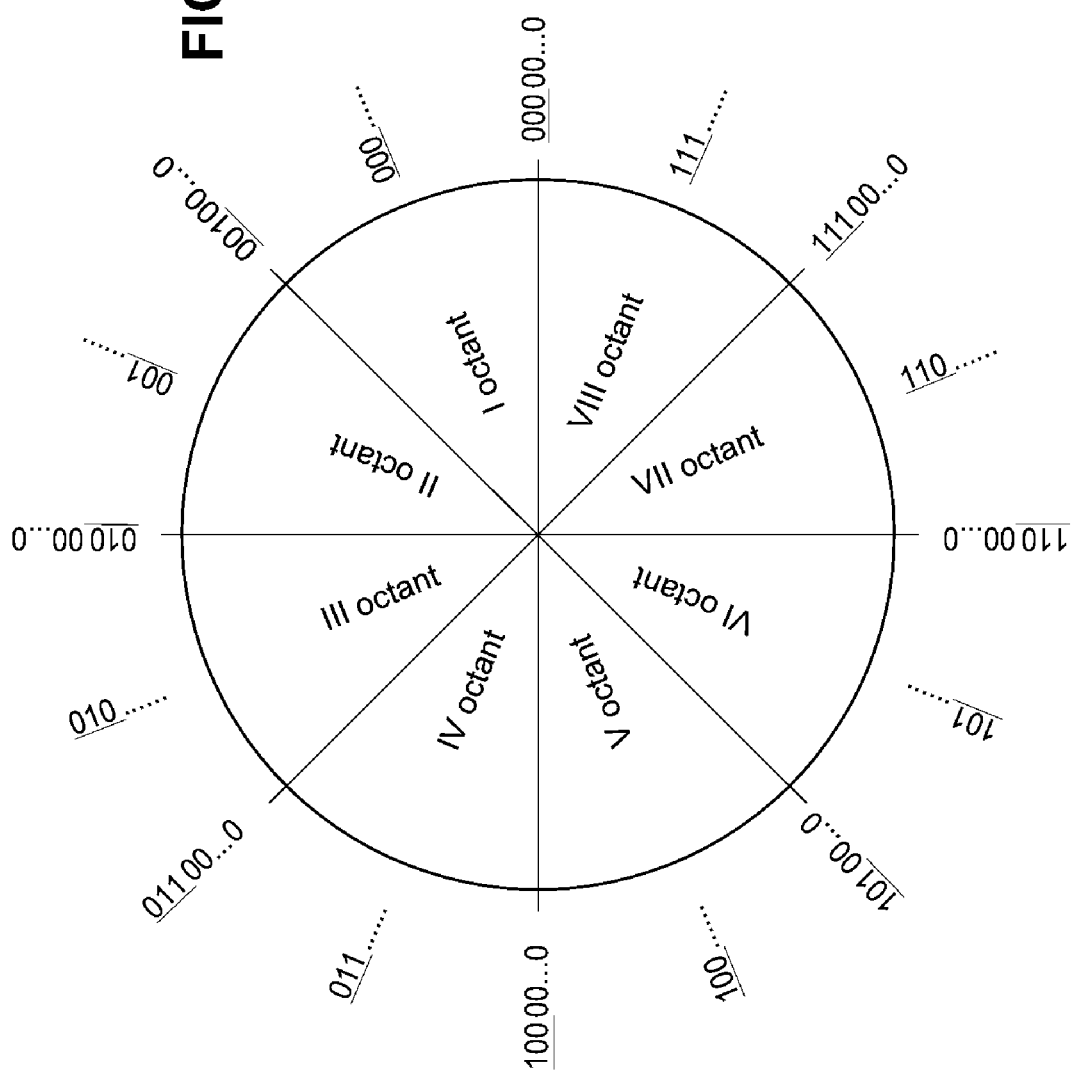
Figure 32A:
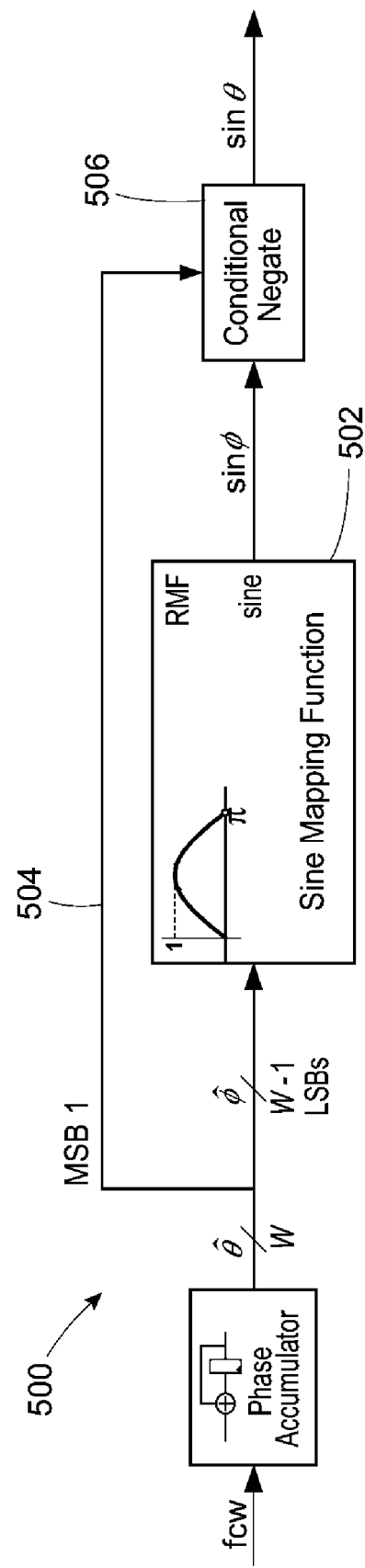
FIGS. 32 a and b are diagrams of an implementation of sine SCMF using an RMF for angles in [0, π).
Figure 32B:
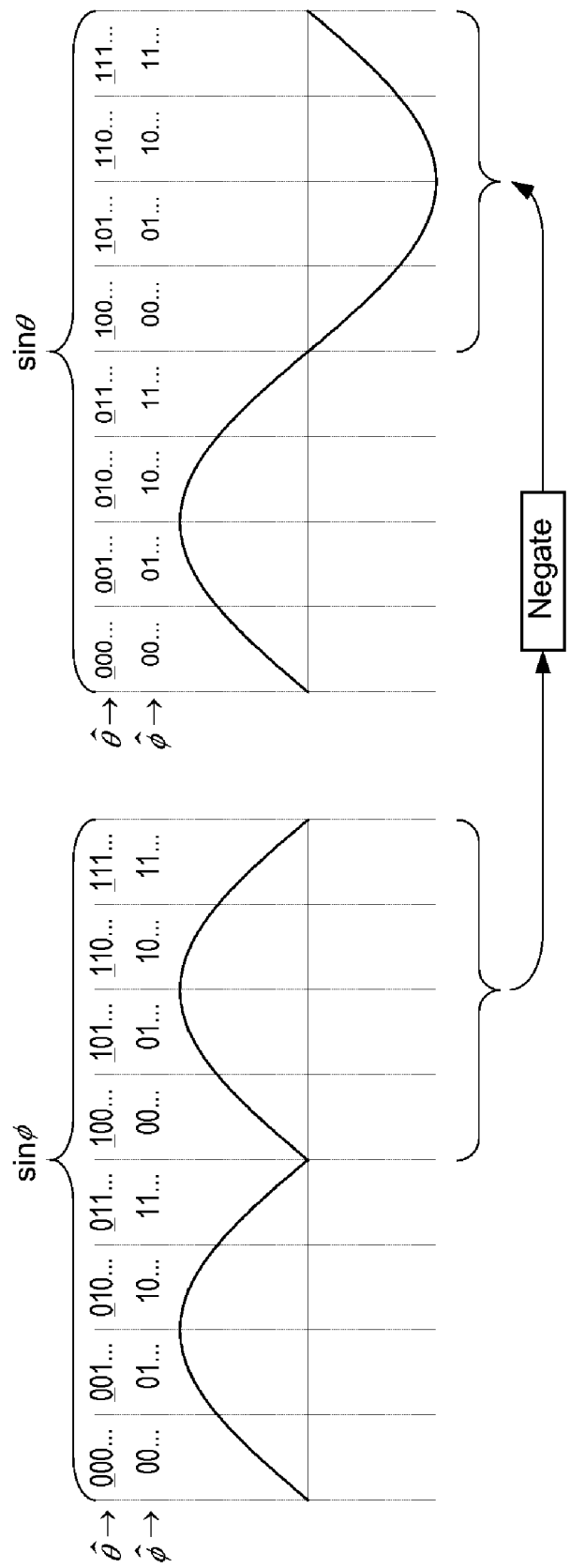
Figure 33A:
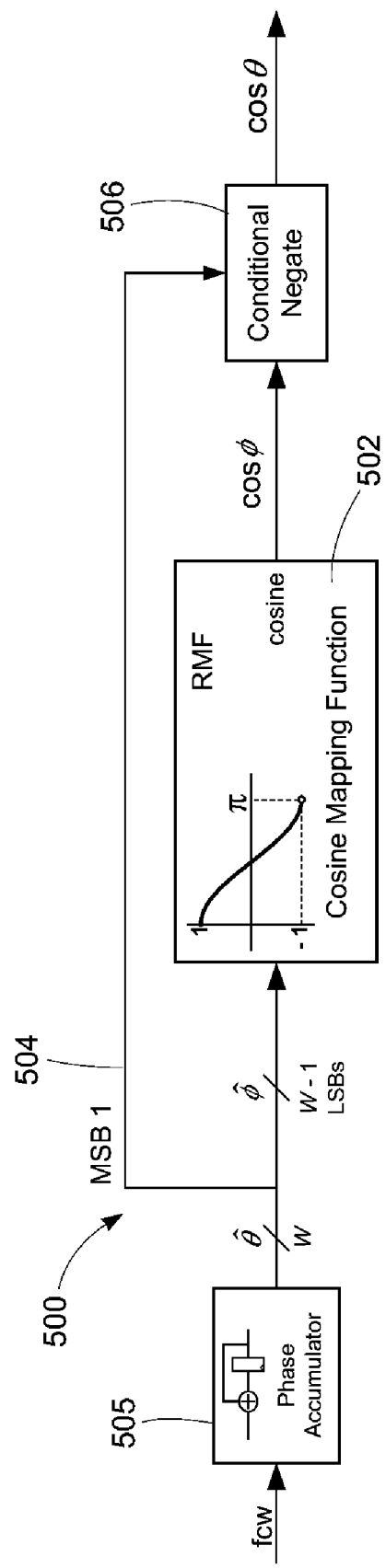
FIGS. 33 a and b are diagrams of an implementation of cosine SCMF using an RMF for angles in [0, π).
Figure 33B:
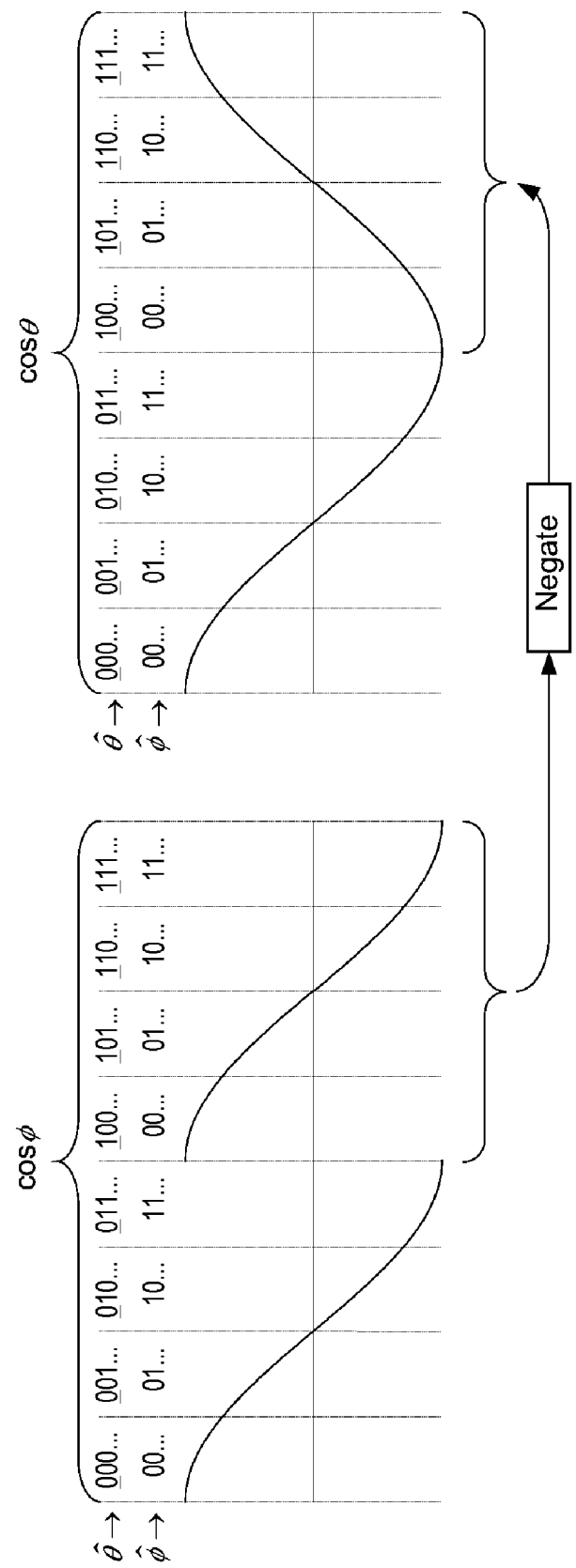
Figure 34A:
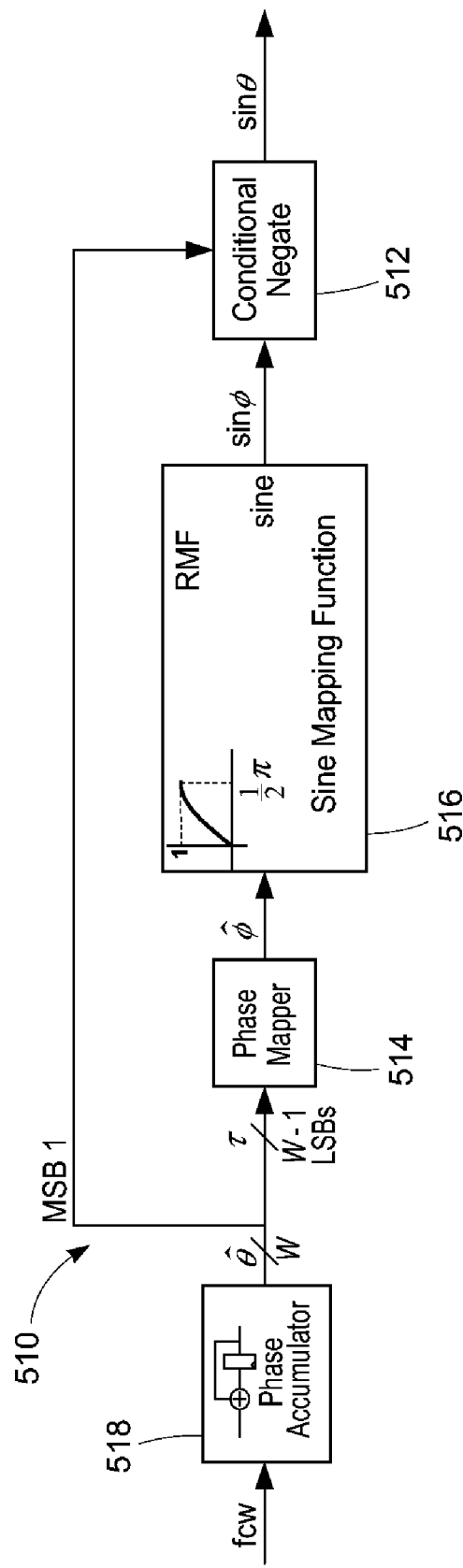
FIGS. 34 a and b are diagrams of an implementation of sine SCMF using an RMF for angles in $$\left[0, \frac{\pi}{2}\right].$$
Figure 34B:
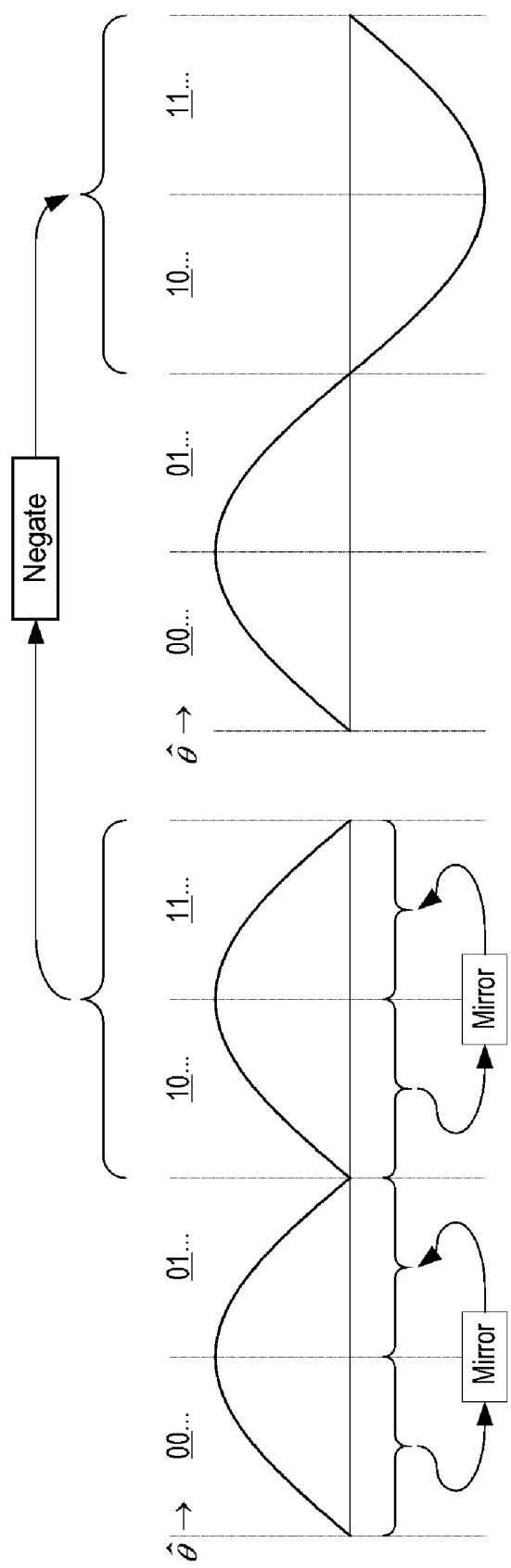
Figure 35A:
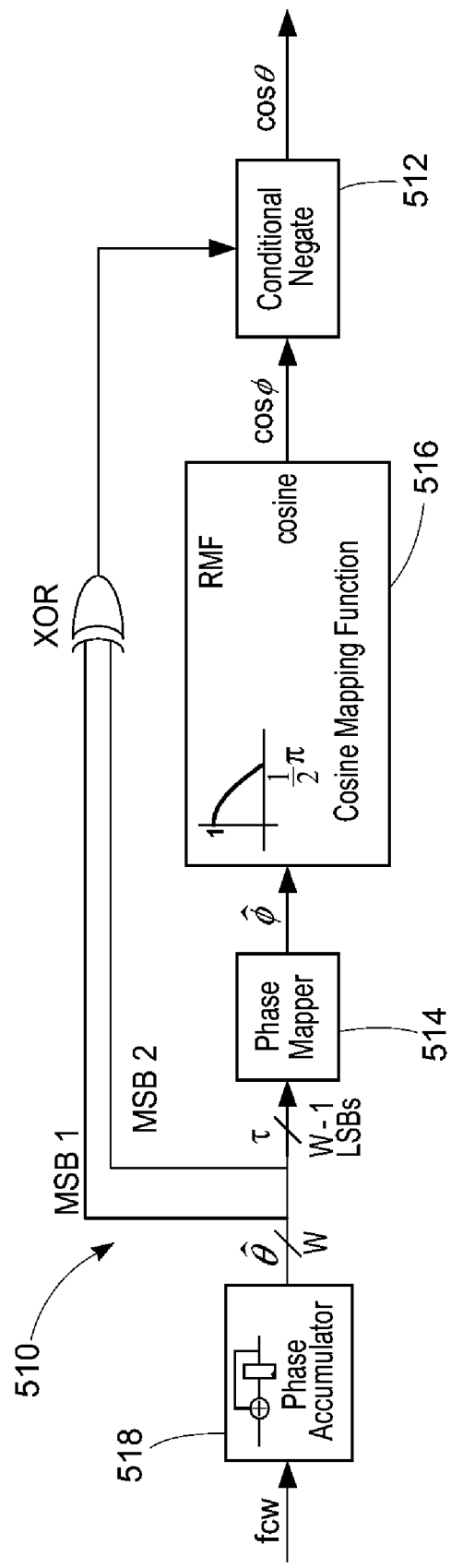
FIGS. 35 a and b are diagrams of an implementation of cosine SCMF using an RMF for angles in $$\left[0, \frac{\pi}{2}\right].$$
Figure 35B:
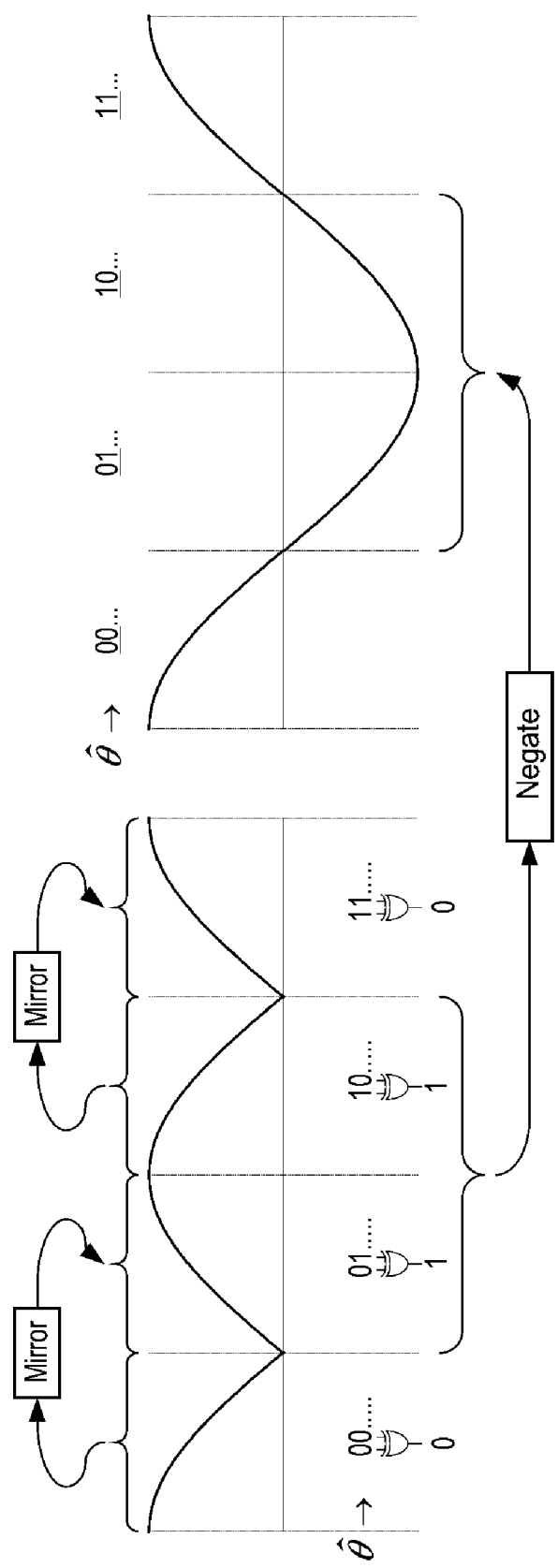

The normalized SCMF input $\hat{\theta}$ conveniently partitions the unit circle in the complex plane (depicted in FIGS. 4a and 4b) into two halves, four quadrants, and eight octants. Referring to FIG. 31a, where this partitioning is illustrated, it is apparent that the MSB of $\hat{\theta}$ indicates whether θ is in the first half (i.e., 0≦θ<π when the MSB of $\hat{\theta}$ is '0') or in the second half (i.e., π≦θ<2π when the MSB of $\hat{\theta}$ is '1'). Similarly, one observes from FIG. 31b, that the four possible combinations '00' '01' '10' and '11' for the top two MSBs of $\hat{\theta}$ indicate whether θ is in the first quadrant $$\left(\text{i.e., } 0 \le \theta < \frac{\pi}{2}\right),$$

second quadrant $$\left(\text{i.e., } \frac{\pi}{2} \le \theta < \pi\right),$$

third quadrant $$\left(\text{i.e., } \pi \le \theta < \frac{3\pi}{2}\right),$$

or fourth quadrant $$\left(\text{i.e., } \frac{3\pi}{2} \le \theta < 2\pi\right),$$

respectively. Finally, from FIG. 31c, one concludes that the eight possible combinations '000' '001' '010' '011' '100' '101' '110' and '111' for the top three MSBs of $\hat{\theta}$ indicate whether θ is in the first octant $$\left(\text{i.e., } 0 \le \theta < \frac{\pi}{4}\right),$$

second octant $$\left(\text{i.e., } \frac{\pi}{4} \le \theta < \frac{\pi}{2}\right),$$

third, fourth, etc., respectively.

The sine or cosine values for any radian angle in the range [0, 2π) can be obtained from the sine or cosine values of a related angle in the range [0, π) by the use of conditional negate operations. For example, if $$\theta = \frac{4\pi}{3},$$

then $$\sin\theta = -\frac{\sqrt{3}}{2}$$

and $$\cos\theta = -\frac{1}{2}.$$

The same results can be computed from the angle $$\frac{\pi}{3}$$

through a negate operation since $$\sin\frac{4\pi}{3} = -\sin\frac{\pi}{3}$$

and $$\cos\frac{4\pi}{3} = -\cos\frac{\pi}{3}.$$

In fact, since and cos θ=−cos(θ−π), for any angle π≦θ<2π, the sine and cosine can be computed from the angle φ obtained by subtracting π from θ and using a negate operation. This method can be used to reduce the complexity of the SCMF by reducing the range of angles from [0, 2π) to [0, π) (a reduction in angle range by a factor of two), for which the sine and cosine values need to be computed. In order to generate the sine and/or cosine values for any angle in [0, 2π) by utilizing a reduced mapping function (RMF) that generates the sine and/or cosine values for angles in [0, π), one needs to have the following three additional capabilities. First, a mechanism to decide if the SCMF input $\hat{\theta}$ represents an angle θ that is less than π or greater than or equal to π is needed. From FIG. 31a, and the previous discussion of the MSBs of $\hat{\theta}$, one concludes that just observing the MSB of $\hat{\theta}$ indicates whether the corresponding angle θ is less than π or greater than or equal to π. Second, one needs to compute the normalized angle $\hat{\theta}$ (the input to the RMF) such that its corresponding angle φ=θ when θ<π and φ=θ-π when θ≧π. Mathematically, this is equivalent to a modulo operation where φ=(θ)$_{mod\,\pi}$. Since $$\theta = \hat{\theta}\frac{2\pi}{2^W}, \hat{\phi}$$

can be obtained from $\hat{\theta}$ via the modulo operation $\hat{\phi}=(\hat{\theta})_{mod\,2^{(W-1)}}$. This modulo operation is accomplished by very simply disregarding the MSB of $\hat{\theta}$ (again refer to FIG. 31a). And third, one requires the ability to negate the sine and/or cosine output(s) from the RMF corresponding to SCMF input angles θ≧π. This is accomplished by a conditional negate block following the RMF. The conditional negate block accepts a flag that indicates whether the output is the negative of the input or the output simply equals the input. Since the RMF outputs need to be negated for θ≧π, then the MSB of $\hat{\theta}$ can be used as the flag into the conditional negate block. For most implementations, the complexity reduction of the mapping function from [0, 2π) down to [0, π) is significantly greater than the complexity added by the conditional negate block. Therefore, the use of an RMF is very attractive. FIGS. 31a and 31b and FIGS. 33a and 33b depict the implementation of the SCMF 500 using an RMF 502 and illustrate the corresponding sine and cosine waveform reconstruction dictated by the MSB 504 of $\hat{\theta}$ received from the phase accumulator 505 and the conditional negate block 506 following the RMF 502.

The RMF 502 in FIGS. 32a and 32b and FIGS. 33a and 33b can be further reduced by using the sine and cosine wave symmetries around the angles π and $$\frac{3\pi}{2}$$

radians. From sin φ in FIG. 32b one notes that, when the angle φ is in the second quadrant (i.e., the second MSB of $\hat{\phi}$ is '1'), the successive sine values from RMF are those of the first quadrant but in a mirrored fashion (mirrored around the vertical axis). This is also the case for the fourth quadrant. Similarly, from cos φ in FIG. 33b one observes that when the angle φ is in the second or fourth quadrant (i.e., the second MSB of $\hat{\phi}$ is '1'), the successive cosine values from RMF are those of the first quadrant but in a mirrored (again around the vertical axis) and negated fashion. Therefore, by introducing mirroring logic before the RMF, in addition to the conditional negate logic following the RMF, more reductions in the mapping function are achieved. Thus mirroring logic can be defined as a phase mapper. Mathematically, this mirroring phenomenon is the application of the trigonometric identities sin θ=sin(π−θ) and cos θ=−cos(π−θ) applied to any angle θ in the second (or fourth) quadrant. Therefore, using a phase mapper as well as a conditional negate block, the mapping of sine and/or cosine values is further reduced to the angles in $$[0, \frac{\pi}{2}].$$

Note that this interval includes both boundary angles 0 and $$\frac{\pi}{2}.$$

In other words, the reduced interval includes the entire first quadrant and a single angle $$\frac{\pi}{2}$$

from the second quadrant. By performing the mirroring operation π−(θ)$_{mod\,\pi}$ on the angles θ in the second and fourth quadrants, the phase mapper maps all of the angles in the second quadrant except for $$\frac{\pi}{2}$$

and all of the angles in the fourth quadrant except for $$\frac{3\pi}{2}$$

into angles in the first quadrant. The angles $$\frac{\pi}{2}$$

and $$\frac{3\pi}{2}$$

get mapped to $$\frac{\pi}{2}.$$

The input $\hat{\phi}$ to the new RMF is obtained from $\hat{\theta}$ as follows. First, the MSB of $\hat{\theta}$ (which dictates whether θ is in the first half or second half) is stripped off to create the temporary angle τ (that performs the modulo operation (θ)$_{mod\,\pi}$). Next, if the angle represented by $\hat{\theta}$ is in the first or third quadrants (i.e., the second MSB of $\hat{\theta}$ is '0') then τ simply becomes $\hat{\phi}$. Otherwise, if the angle represented by $\hat{\theta}$ is in the second or fourth quadrants (i.e., the second MSB of $\hat{\theta}$ is '1') then $\hat{\phi}$ is obtained by subtracting τ from the normalized angle corresponding to π (i.e., '1000 . . . 00').

FIGS. 34a and 34b and FIGS. 35a and 35b illustrate SCMF 510 implementations and their associated waveform reconstruction sketches for sine and cosine generation using a conditional negate block 512, a phase mapper 514, and an RMF 516 for generating sine and cosine values for angles in $$[0, \frac{\pi}{2}]$$

from inputs from the phase accumulator 518. Since the mirroring operation is required in the second and fourth quadrants, it is controlled by the second MSB of $\hat{\theta}$ (refer to FIG. 31b). For the sine output the conditional negate block 512 (FIG. 34a) is controlled by the MSB of $\hat{\theta}$ as before, but for the cosine output the conditional negate block 512 (FIG. 35a) is controlled with the signal generated by performing an XOR operation on the first and second MSBs of $\hat{\theta}$. This XOR operation generates a flag which is '0' for first and fourth quadrants (i.e., no negate operation is performed) and it is '1' for the second and third quadrants, where it is apparent from FIG. 5-6b that a negate operation is required.

The RMF can be further reduced to the angles within $$[0, \frac{\pi}{4}]$$

by coupling the generation of sine and cosine values via an interchange operation between the RMF and the conditional negate block. The RMF generates sine and cosine values for all angles in the first octant and a single angle $$\frac{\pi}{4}$$

from the second octant. FIG. 5-7 illustrates the details. To generate the RMF input $\hat{\phi}$, first the two MSBs of $\hat{\theta}$ (which provide the quadrant information) are stripped off to create the temporary angle $\tau$ (thus performing a modulo operation $$(\theta)_{mod \frac{\pi}{2}}).$$

Next, if the angle represented by $\hat{\theta}$ is in the first, third, fifth, or seventh octant (i.e., the third MSB of $\hat{\theta}$ is '0') then $\tau$ simply becomes $\hat{\phi}$. Otherwise, if the angle represented by $\hat{\theta}$ is in the second, fourth, sixth, or eighth octant (i.e., the third MSB of $\hat{\theta}$ is '1') then $\hat{\phi}$ is obtained by subtracting $\tau$ from the normalized angle corresponding to $$\frac{\pi}{2}$$

(i.e., '0100 . . . 00'). A detailed discussion of the phase mapper is the topic of Section 5.3. For most implementations of the SCMF, the additional hardware requirements imposed by the discussed mapping function reduction techniques (i.e., the increased complexity due to the phase mapper, the swap operation, and the conditional negate block) are very low in comparison to the complexity reduction achieved in the RMF. Therefore, these techniques are very widely used and the analysis of their impact on the DDS performance is important.

One can use the techniques developed in previous sections to tabulate the DDS performance over a limited range of design parameters. In Section 5.3 and Section 5.4 one can investigate different implementations for the phase mapper and conditional negate block, respectively, and analyze the impact of their various implementations on the DDS performance. Since the DDS performance depends on the specific "signature sequence" s'(n), c'(n), and cs'(n) for sine DDS, cosine DDS, and quadrature DDS, respectively, and since it would be impractical to consider all the different implementations of the SCMF, analyzing the DDS performance using their corresponding "signature sequences," one can assume that rounding the SCMF outputs to the number of specified output bits (number of fractional bits) is the only source of SCMF non-ideality. Despite the presence of many error sources due to approximations, quantizations, and other finite precision arithmetic operations, good implementations of the SCMF can generate "signature sequences" that are closely equivalent to the ones obtained by simply rounding the sine and cosine values to the desired number of output bits. This can be done by controlling the amount of error contribution from each error source (for example, by adjusting the quantization amount) and making sure the total combined error at the SCMF output due to all error sources gets "masked" by the output rounding error. In other words, the total combined error due to all imprecisions in the SCMF is smaller than the precision corresponding to the output LSB. Such an approach may generate the best possible "signature sequence" but, depending on the type of SCMF implementation this may be impossible to achieve for the desired output precision, or it may require an undesirable amount of implementation resources (since it puts restrictions on the levels of allowable quantization and approximation) to guarantee the combined contribution of all error sources to be "masked" by the output precision.

The overall performance of the DDS depends on the entire "signature sequence" and it is a function of both the individual samples comprising the sequence and their interaction with each other. Therefore, the performance of a DDS may be acceptable for implementations of the SCMF generating "signature sequences" that are not completely masked by the output quantization error for the entire sequence. This may result in significant implementation efficiencies by allowing more lenient restrictions on the individual error sources within the SCMF. Therefore, the characterization of DDS with the "signature sequence" corresponding to the specific SCMF utilized in the design of DDS is an important vehicle for design efficiency and provides performance metrics specific to the DDS at hand. This section, therefore, is intended to serve as a helpful practical guide for a DDS designer. It is not intended to replace the results of previous sections, but rather serve as a starting point for a designer to quickly approximate the DDS design parameters, such as the number of SCMF input address bits W, or the precision of DDS outputs, in order to achieve a target performance level measured in terms of SFDR and SNR.

5.3 Phase Mapper

Figure 37A:
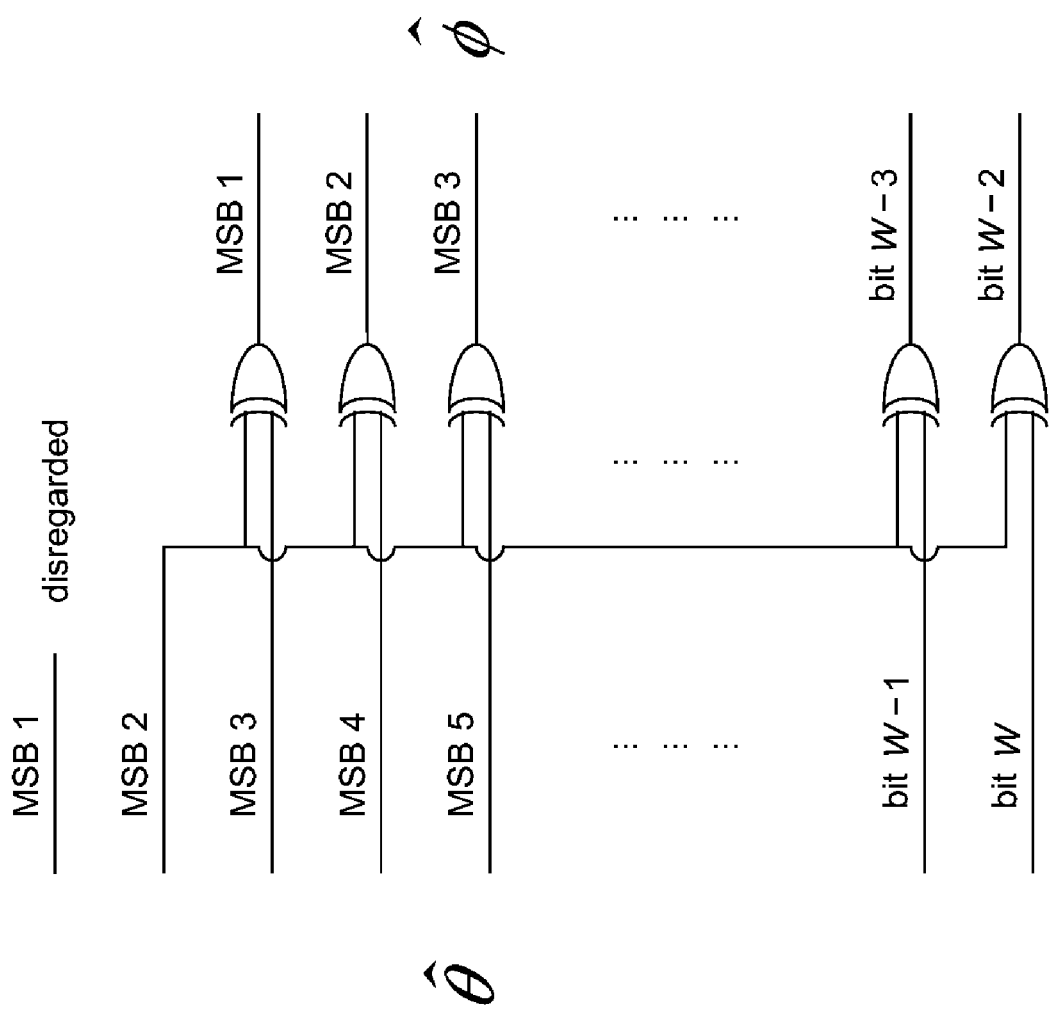
FIGS. 37 a and b are diagrams of the common implementation of phase mapper according to FIG. 34 and FIG. 35.

A conventional implementation for the phase mapper, which enables a hardware reduction of the mapping function discussed in Section 5.2, uses XOR-type logic, equivalent to a 1's complement negate, to perform the described mapping as follows. Consider the DDS implementation using an RMF as depicted in FIGS. 34*a* and 34*b* and FIGS. 35*a* and 35*b*. Here, the phase mapper performs a mirroring operation when the angles corresponding to $\hat{\theta}$ are in the second or fourth quadrant (i.e., when the second MSB of $\hat{\theta}$ is '1'). Such a conventional implementation disregards the MSB of $\hat{\theta}$ and simply performs a bitwise XOR operation between the second MSB of $\hat{\theta}$ and all the W−2 LSBs of $\hat{\theta}$ as illustrated in FIG. 37*a*. The result is a W−2 bit $\hat{\phi}$. The bitwise XOR operation is equivalent to a 1's complement negate operation. Therefore, for a W-bit $\hat{\theta}$, the relationship between the angles θ and φ represented by $\hat{\theta}$ and $\hat{\phi}$, respectively, can be mathematically expressed as $\phi = \theta_{mod\,\pi}$ for $\hat{\theta}$ in the first or third quadrants (i.e., when the second MSB of $\hat{\theta}$ is '0') and $$\phi = \pi - (\theta)_{mod\pi} - \frac{2\pi}{2^W}$$

for $\hat{\theta}$ in the second or fourth quadrants (i.e., when the second MSB of $\hat{\theta}$ is '1'). The ideal mapping of angles θ in the second and fourth quadrants is, of course, $\phi = \pi - (\theta)_{mod\,\pi}$ as discussed in Section 5.2 (refer to FIGS. 34*a* and 34*b* and FIGS. 35*a* and 35*b*). The conventional implementation of the phase mapper performs the mapping by introducing a constant $$\frac{2\pi}{2^W}$$

phase error. This phase error is present for all angles θ in the second and fourth quadrants and the amount of the error is a function of the number of SCMF input bits W. If the amplitude of the error at the DDS output, introduced by this phase error, is greater than or even equal to the amount of error introduced by the non-idealities of the RMF, then the DDS performance can be severely compromised. Due to the inaccurate mapping of the common phase mapper, the RMF input $\hat{\phi}$ represents angles solely in the first quadrant (i.e., $\hat{\phi}$ represents angles in $$[0, \frac{\pi}{2}),$$

and does not include the angle $$\frac{\pi}{2}).$$

Therefore, the input angle $$\theta = \frac{\pi}{2}$$

gets mapped to the angle $$\phi = \frac{\pi}{2} - \frac{2\pi}{2^W}$$

instead of getting mapped to itself $$\phi = \frac{\pi}{2}.$$

Figure 37B:
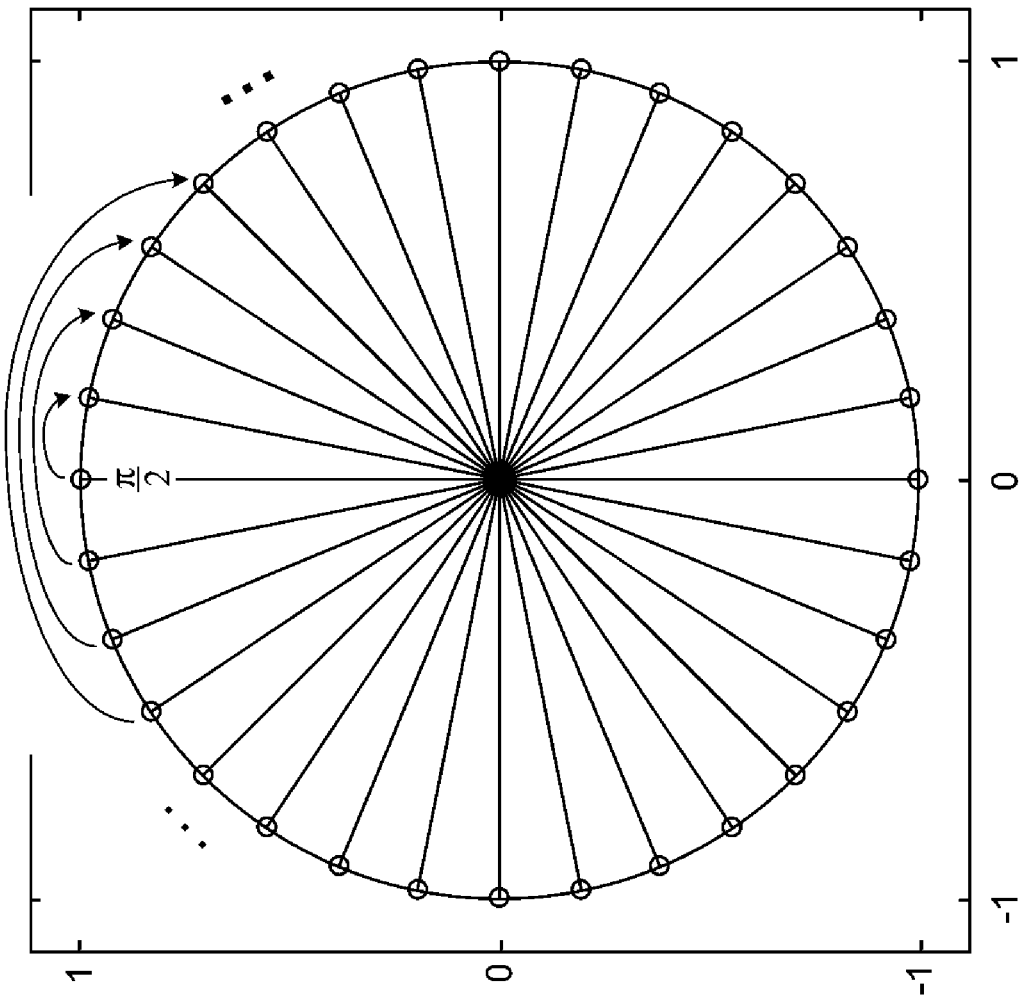

Furthermore, the input angles $$\theta = \frac{\pi}{2} + \frac{2\pi}{2^W}, \theta = \frac{\pi}{2} + 2\frac{2\pi}{2^W},$$

and $$\theta = \frac{\pi}{2} + 3\frac{2\pi}{2^W}$$

get mapped to $$\phi = \frac{\pi}{2} - 2\frac{2\pi}{2^W}, \phi = \frac{\pi}{2} - 3\frac{2\pi}{2^W},$$

and $$\phi = \frac{\pi}{2} - 4\frac{2\pi}{2^W},$$

respectively, instead of getting correctly mapped to $$\phi = \frac{\pi}{2} - \frac{2\pi}{2^W}, \phi = \frac{\pi}{2} - 2\frac{2\pi}{2^W},$$

and $$\phi = \frac{\pi}{2} - 3\frac{2\pi}{2^W},$$

respectively. The same inaccuracy is present for all the remaining angles in the second quadrant and all of the angles in the fourth quadrant. An illustration of this mapping is shown in FIG. 37*b*.

Figure 38A:
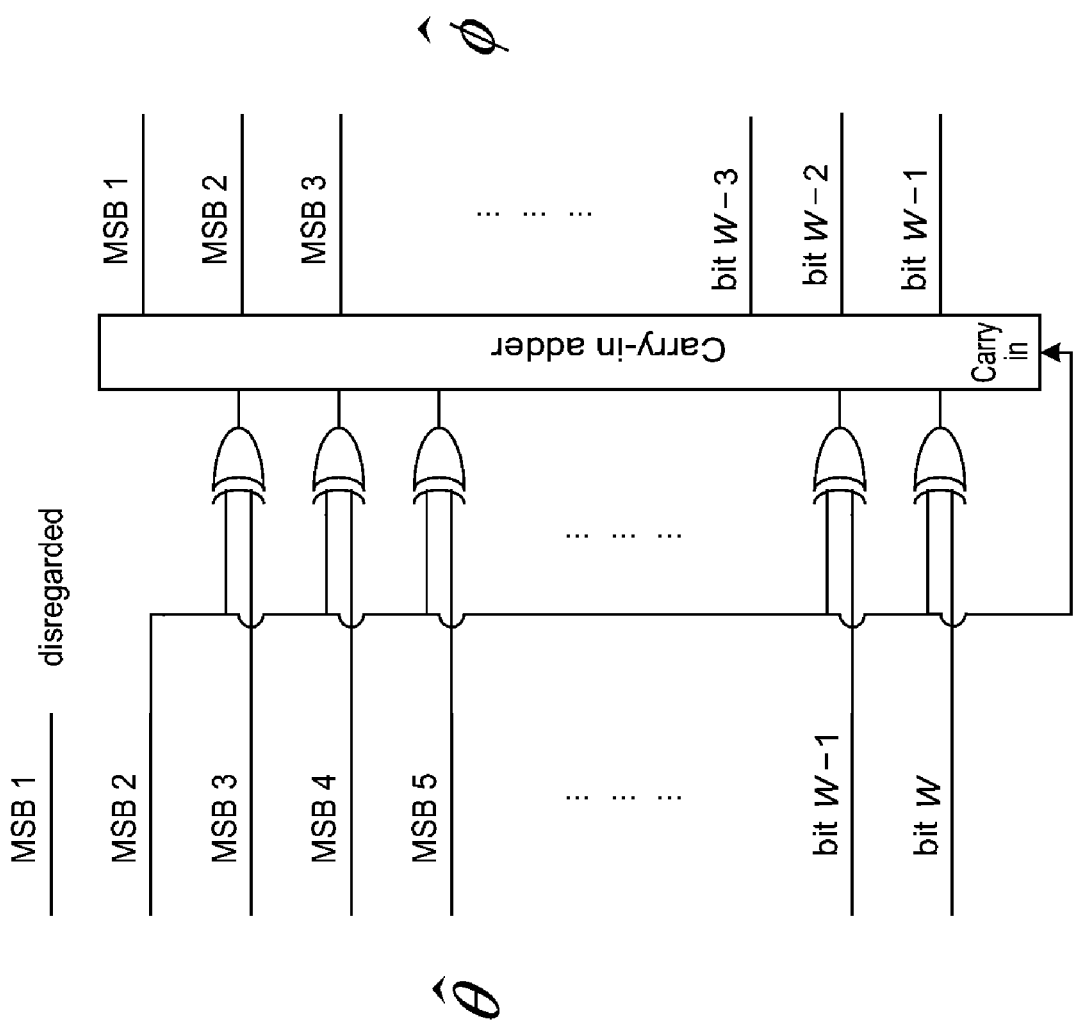
FIGS. 38 a and b are diagrams of the modified implementation of phase mapper according to FIG. 34 and FIG. 35.

Modifying the common phase mapper implementation by adding an LSB (corresponding to $$\frac{2\pi}{2^W}$$

radians) when the input angle θ is in the second or fourth quadrants (i.e., when the second MSB of $\hat{\theta}$ is '1') will completely eliminate the phase error introduced by the common phase mapper. With such a modification the phase mapper performs the desired mapping $\phi = \pi - (\theta)_{mod\,\pi}$ for all angles θ in the second and fourth quadrants. FIG. 38*a* illustrates the modification to the common phase mapper and FIG. 38b illustrates the mapping of the angles on the unit circle.

The two methods are identical for $\hat{\theta}$ representing angles in the first and third quadrants. This can be easily seen from FIG. 38a, where the second MSB of $\hat{\theta}$ for such angles will be '0' and the carry-in adder will add a '0' to the LSB and pass the inputs to the output with no modification. For such $\hat{\theta}$ the corresponding remapped angle $\phi$ is in the interval $$\left[0, \frac{\pi}{2}\right)$$

and does not include the boundary angle $$\frac{\pi}{2}.$$

Notice that, with the modified phase mapper of FIG. 38a, the addition of a '0' LSB will generate a W−1 bit $\hat{\phi}$, whose MSB bit (denoted as MSB 1 in FIG. 38a) will always be '0'. Therefore, the modified phase mapper, just as the common phase mapper, generates $\hat{\phi}$ representing angles in $$\left[0, \frac{\pi}{2}\right)$$

for $\hat{\phi}$ representing angles in the first and third quadrants. On the other hand, for $\hat{\phi}$ representing angles in the second or fourth quadrants, the corresponding remapped angle $\phi$ must be in the interval $$\left[0, \frac{\pi}{2}\right)$$

which includes the boundary angle $$\frac{\pi}{2}$$

and does not include the angle 0. That is why $\hat{\phi}$ needs one more bit at the MSB to represent the angle $$\frac{\pi}{2}.$$

Since the MSB of $\hat{\phi}$ in FIG. 38a is used to represent only $$\frac{\pi}{2},$$

when it has a value of '1' (in the event of $$\phi = \frac{\pi}{2})$$

the remaining LSBs will all be '0'. This is also apparent from FIG. 38a since the only way the MSB of $\hat{\phi}$ can be made '1' is by having the input to the carry-in adder be all ones (i.e., '111 . . . 11') and the carry in signal also be a '1'. Of course, the MSB of $\hat{\phi}$ will then become '1' while the remaining W−2

LSBs of $\hat{\phi}$ will all be zeros (i.e., '000 . . . 00'). Notice also that only the angles $$\theta = \frac{\pi}{2}$$

and $$\theta = \frac{3\pi}{2}$$

(i.e., $\hat{\theta}$='01000 . . . 00' and $\hat{\theta}$='11000 . . . 00') will produce such inputs to the carry-in adder in FIG. 38a to generate the W−1 bit output $\hat{\phi}$='1000 . . . 00' corresponding to $$\phi = \frac{\pi}{2}.$$

Figure 39:
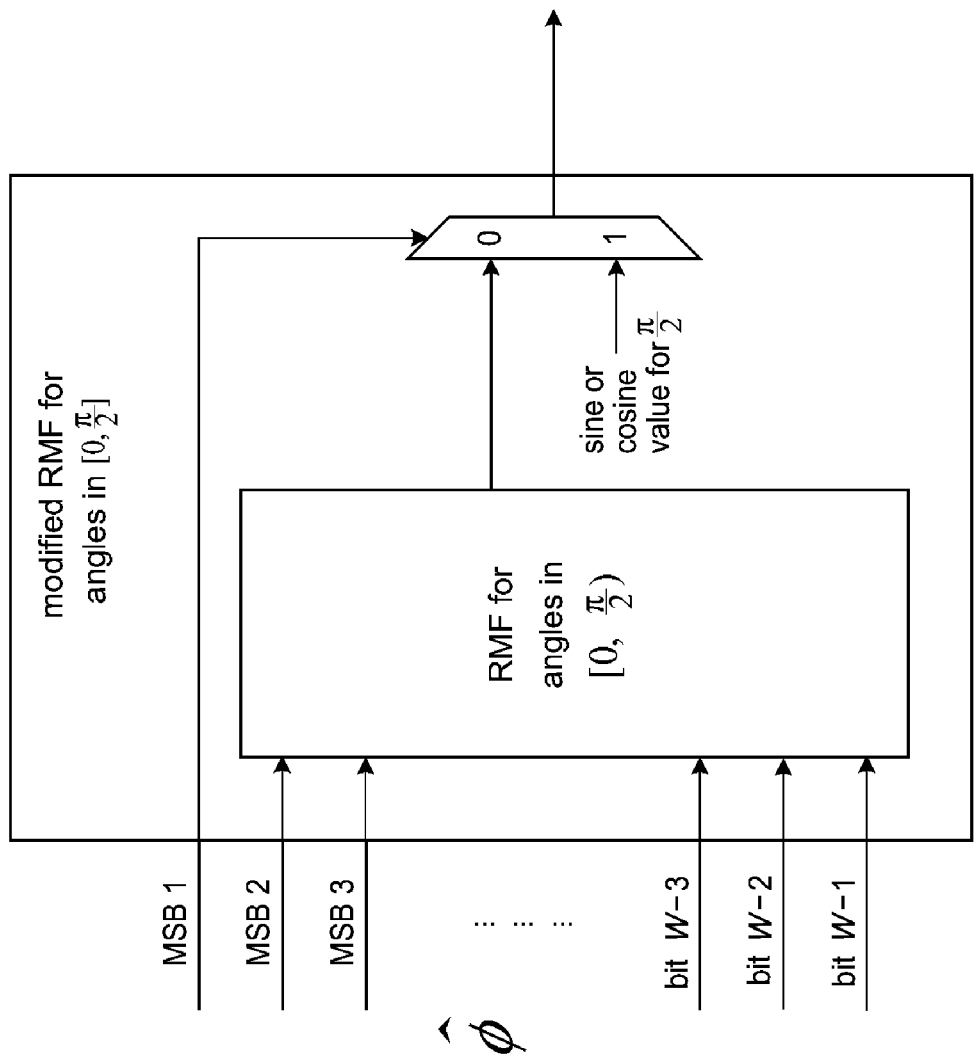
FIG. 39 is a diagram of a simple modification of the RMF to include the angle $$\frac{\pi}{2}.$$

The common phase mapper generates a W−2 bit $\hat{\phi}$ while the modified phase mapper generates a W−1 bit $\hat{\phi}$, and initially it may seem that with the modified phase mapper being used in the RMF in FIGS. 34a and 34b and FIGS. 35a and 35b one creates a mapping space that is twice as large as that corresponding to the common phase mapper. Since the MSB of $\hat{\phi}$ corresponding to the modified phase mapper only represents the angle $$\frac{\pi}{2},$$

however, the new mapping space of the RMF in FIGS. 34a and 34b and FIGS. 35a and 35b, when compared to the common phase mapper, is only increased by a single angle and not by a factor of two. In fact, the RMF could be built to perform the mapping for a W−2 bit $\hat{\phi}$, and at its output, the MSB of $\hat{\phi}$ could be used to control a mux to output sine or cosine of the angle $$\frac{\pi}{2}$$

or the sine or cosine computed from the W−2 LSBs of $\hat{\phi}$. This approach is illustrated in FIG. 39.

Figure 36A:
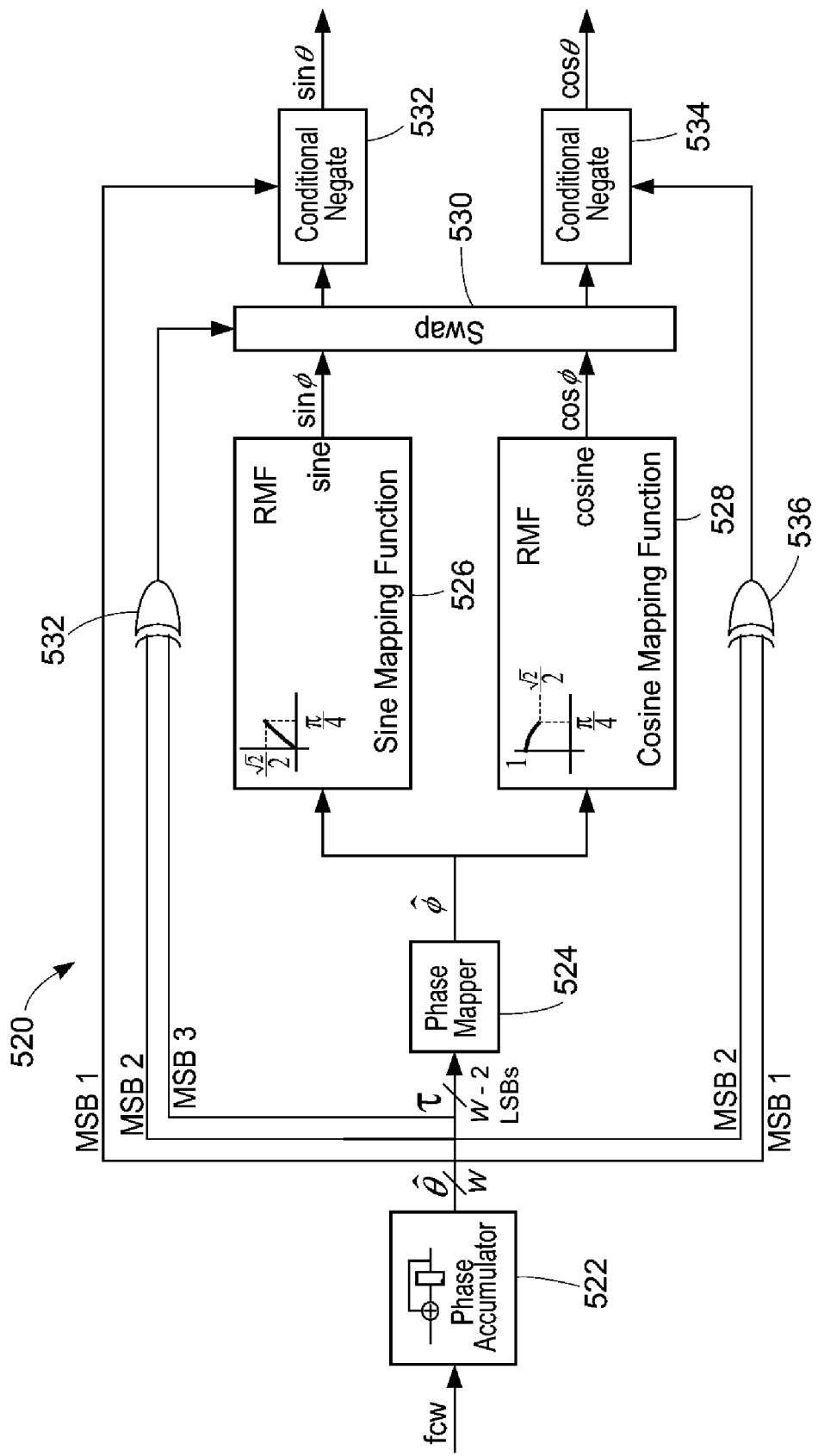
FIGS. 36 a and b are diagrams of an implementation of quadrature DDS using an RMF for angles in $$\left[0, \frac{\pi}{4}\right].$$
Figure 36B:
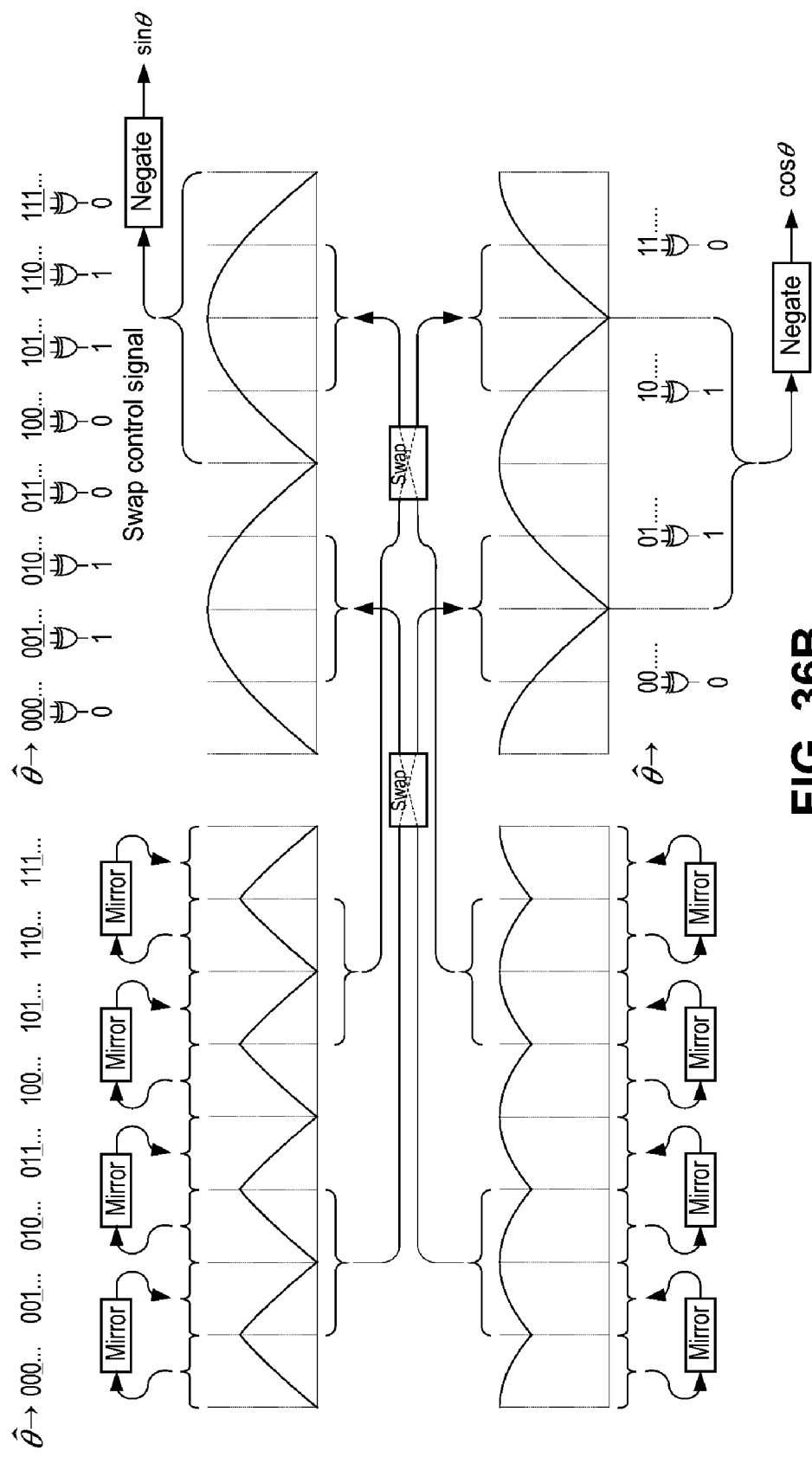
Figure 40A:
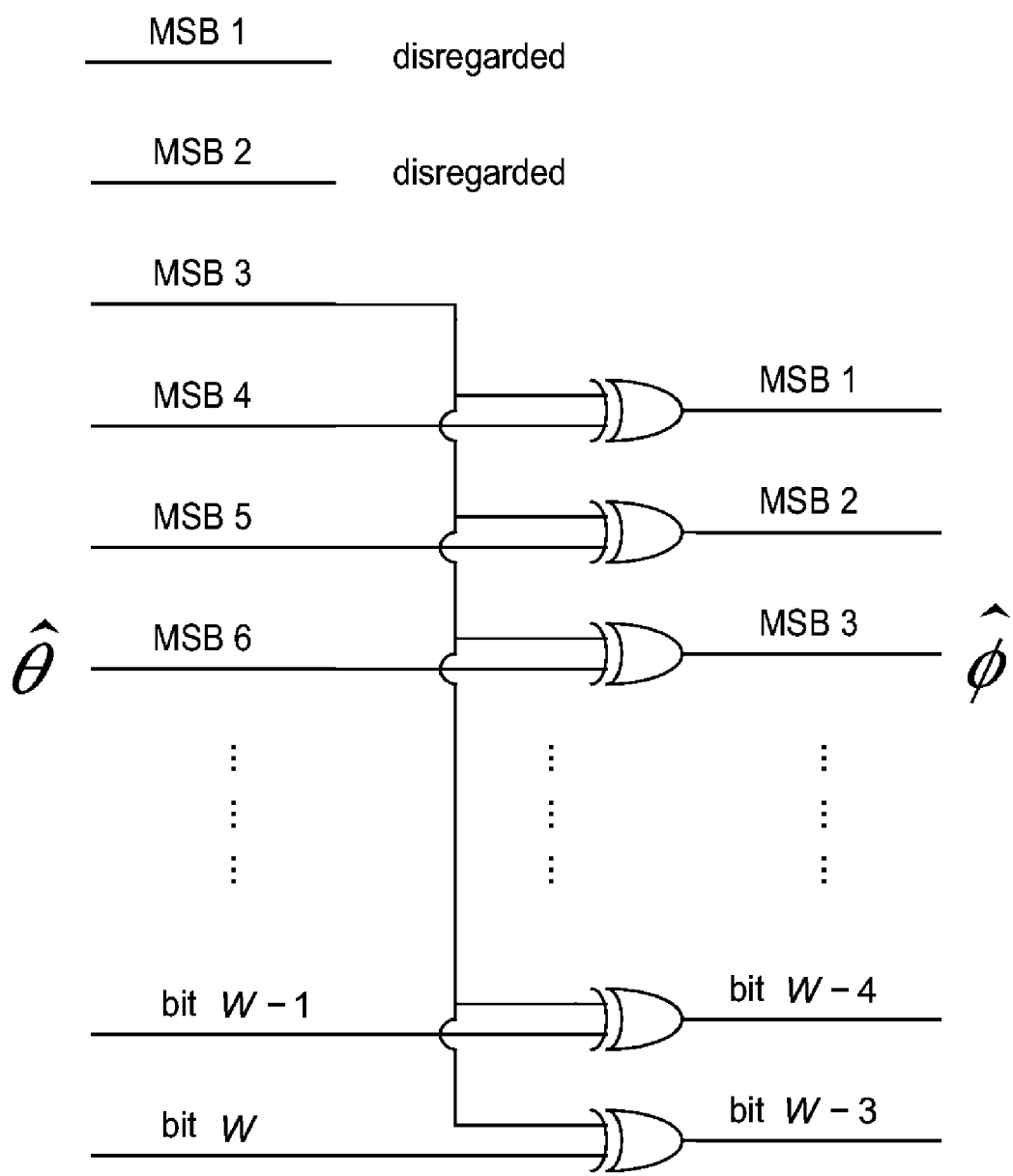
FIGS. 40 *a* and *b* are diagrams of the common phase-mapper implementation according to FIG. 36.

The arguments made for the phase mapper of FIGS. 34a and 34b and FIGS. 35a and 35b generalize to the phase mapper of FIGS. 36a and 36b except that the boundary angle in FIGS. 36a and 36b is $$\frac{\pi}{4}$$

instead of $$\frac{\pi}{2},$$

and the mapping is performed in the second, fourth, sixth, and eighth octants instead of second and fourth quadrants. FIGS. 40a and 40b depicts the common phase mapper and illustrates the mapping of angles on the unit circle, corresponding to the phase mapper used in the structure of FIGS. 36a and 36b. This is to be compared with FIGS. 41a and 41b which depicts the modified phase mapper and illustrates its mapping of angles on the unit circle.

Figure 41A:
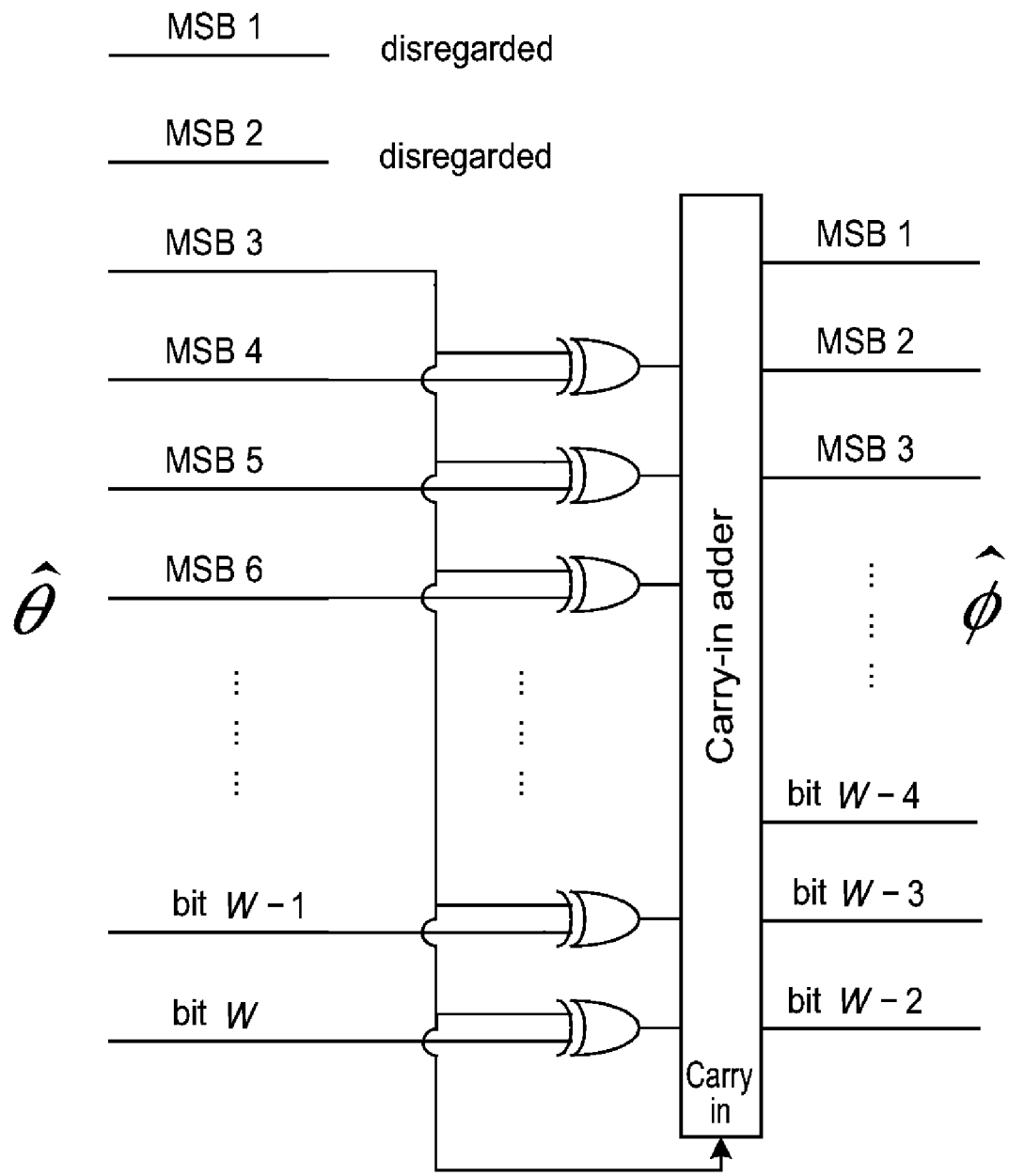
FIGS. 41 *a* and *b* are diagrams of the modified phase-mapper implementation according to FIG. 36.
Figure 41B:
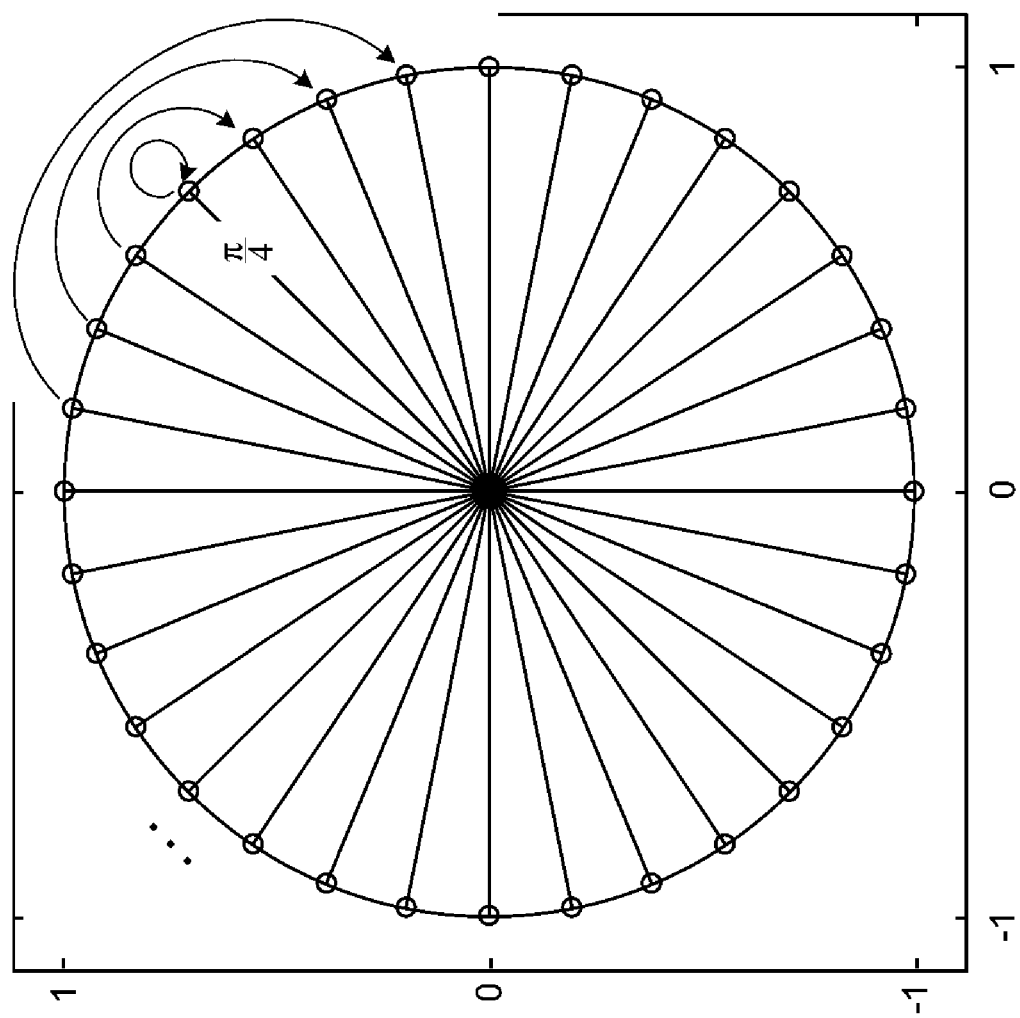

To understand the impact of replacing the common phase mapper of FIGS. 40a and 40b (and FIGS. 37a and 37b) with the modified phase mapper of FIGS. 41a and 41b (and FIGS. 38a and 38b) on the quality of DDS output spectrum, a large number of signature sequences were generated for DDS using the RMF approach depicted in FIGS. 36a and 36b with both the common and modified phase mappers, for SCMF input wordlength $5 \leq W \leq 22$, and number of DDS output fractional bits $5 \leq F \leq 22$. The SCMF 520 (FIG. 36a) receives input from a phase accumulator 522. The input is processed by a phase mapper 524 that outputs to since and cosine RMFs 526 and 528 are processed by a swap block 530 that is clocked by the XORing 532 of MSB2 and MSB3. The output of the swap block 530 feeds to respective conditional negate blocks 532 and 534 in which the first conditional negate 532 is clocked by the MSB1 lead as in the SCMF of FIG. 34a and the second conditional negate 534 is clocked by the XORing 536 of MSB1 and MSB2 as in the SCMF of FIG. 35a. The signature sequence s'(n) used for the analysis was generated by simply rounding the infinite precision sine values to the designated number of output fractional bits (i.e., rounding error is the only source of non-ideality in the RMF). To isolate the common phase mapper non-idealities even from the RMF non-idealities due to rounding of the RMF outputs, simulations were also performed with "ideal" (i.e., double precision floating-point) RMF outputs. Since the "swap" and "conditional negate" blocks follow the RMF in FIGS. 36a and 36b, it is assumed that these blocks are ideal and do not introduce any additional non-idealities into the outputs. This is, of course, a reasonable assumption for the swap operation since it does not involve any signal manipulation. The conditional negate block requires negation at the time instances dictated by the input negate flag. Negation is a very simple signal manipulation and can be done ideally, using 2's complement negation logic. Often, to simplify the negation operation even further, 1's complement negation logic is used; this is not ideal and introduces a constant LSB error. Therefore, to eliminate the influence of the non-ideal conditional negate implementation from the simulations, and to isolate the performance impact due only to the phase mapper, an ideal 2's complement negation was assumed for the conditional negate block. The results of the simulations are summarized in Table 5.1, listing the obtained SFDR, and Table 5.2, listing the obtained SNR. (The impact on DDS performance from using a non-ideal 1's complement negation logic for the conditional negate block is the topic of Section 5.4.)

The SFDR and SNR data in Table 5.1 and Table 5.2 are obtained from spectra of various signature sequences S'(k) but the obtained results can be used to make important conclusions about a wide range of DDS output spectra S(k) corresponding to various input fcw. For example, from Section 3.4 one learns that the DDS output spectrum S(k) corresponding to fcw with L>W (i.e., in the presence of phase truncation) is obtained from S'(k) via the windowing function (recall S(k)=V(k)S'(k)). The magnitudes of phase truncation spurs relative to that of the main component(s), as discussed in Section 3.4, are independent of SCMF implementation details and are dictated solely by W and L (where B=L−W). The SCMF spurs, on the other hand, depend on S'(k). More specifically, a single spur in S'(k) gives rise to $2^B$ spurs in S(k) since one period of the windowing function V(k) "windows" over $2^B$ period of S'(k). Therefore, if the magnitude of a particular spur in S'(k) is increased, the magnitudes of all $2^B$ corresponding spurs in S(k) will also increase. Moreover, since S(k)=V(k)S'(k), changing S'(k) by some factor α will change S(k) by the same factor α. In dBc, an increase (or decrease) of an SCMF spur in S'(k) by β dBc will increase (or decrease) all of the corresponding spurs in S(k) by the same β dBc. The SFDR results of Table 5.1, therefore, indicate the impact of the spur with largest magnitude in S'(k) on all of its corresponding spurs in S(k), while the SNR results of Table 5.2 are useful in

TABLE 5.1

SFDR for S'(k) with common phase mapper and modified phase mapper.

| | W = | | | | | | | | | | | | | | | | | |
|---|---|---|---|---|---|---|---|---|---|---|---|---|---|---|---|---|---|---|
| | 5 | 6 | 7 | 8 | 9 | 10 | 11 | 12 | 13 | 14 | 15 | 16 | 17 | 18 | 19 | 20 | 21 | 22 |
| F = 5 | | | | | | | | | | | | | | | | | | |
| common | 23 | 29 | 35 | 41 | 45 | 50 | 50 | 50 | 51 | 51 | 51 | 51 | 51 | 51 | 51 | 51 | 51 | 51 |
| modified | 39 | 44 | 45 | 46 | 49 | 51 | 51 | 51 | 51 | 51 | 51 | 51 | 51 | 51 | 51 | 51 | 51 | 51 |
| F = 6 | | | | | | | | | | | | | | | | | | |
| common | 23 | 30 | 36 | 41 | 47 | 53 | 59 | 59 | 59 | 58 | 58 | 58 | 58 | 58 | 58 | 58 | 58 | 58 |
| modified | 47 | 48 | 50 | 52 | 57 | 58 | 58 | 59 | 59 | 58 | 58 | 58 | 58 | 58 | 58 | 58 | 58 | 58 |
| F = 7 | | | | | | | | | | | | | | | | | | |
| common | 24 | 30 | 36 | 42 | 48 | 53 | 59 | 65 | 68 | 68 | 69 | 69 | 69 | 69 | 69 | 69 | 69 | 69 |
| modified | 54 | 55 | 58 | 61 | 62 | 66 | 67 | 67 | 68 | 68 | 68 | 68 | 69 | 69 | 69 | 69 | 69 | 69 |
| F = 8 | | | | | | | | | | | | | | | | | | |
| common | 24 | 30 | 36 | 42 | 48 | 54 | 60 | 66 | 72 | 76 | 76 | 75 | 75 | 75 | 75 | 75 | 75 | 75 |
| modified | 62 | 64 | 64 | 65 | 69 | 70 | 72 | 74 | 75 | 75 | 75 | 75 | 75 | 75 | 75 | 75 | 75 | 75 |
| F = 9 | | | | | | | | | | | | | | | | | | |
| common | 24 | 30 | 36 | 42 | 48 | 54 | 60 | 66 | 72 | 78 | 83 | 83 | 83 | 83 | 83 | 83 | 83 | 83 |
| modified | 69 | 70 | 69 | 72 | 75 | 76 | 78 | 82 | 83 | 83 | 83 | 83 | 83 | 83 | 83 | 83 | 83 | 83 |
| F = 10 | | | | | | | | | | | | | | | | | | |
| common | 24 | 30 | 36 | 42 | 48 | 54 | 60 | 66 | 72 | 78 | 84 | 90 | 92 | 92 | 92 | 92 | 92 | 92 |
| modified | 76 | 75 | 76 | 78 | 81 | 82 | 84 | 86 | 89 | 91 | 92 | 92 | 93 | 92 | 92 | 92 | 92 | 92 |

TABLE 5.1-continued

SFDR for S'(k) with common phase mapper and modified phase mapper.

| | W = | | | | | | | | | | | | | | | | | |
|---|---|---|---|---|---|---|---|---|---|---|---|---|---|---|---|---|---|---|
| | 5 | 6 | 7 | 8 | 9 | 10 | 11 | 12 | 13 | 14 | 15 | 16 | 17 | 18 | 19 | 20 | 21 | 22 |
| F = 11 | | | | | | | | | | | | | | | | | | |
| common | 24 | 30 | 36 | 42 | 48 | 54 | 60 | 66 | 72 | 78 | 84 | 90 | 96 | 100 | 100 | 100 | 101 | 101 |
| modified | 80 | 81 | 79 | 85 | 86 | 87 | 91 | 94 | 95 | 98 | 100 | 100 | 101 | 100 | 101 | 101 | 101 | 101 |
| F = 12 | | | | | | | | | | | | | | | | | | |
| common | 24 | 30 | 36 | 42 | 48 | 54 | 60 | 66 | 72 | 78 | 84 | 90 | 96 | 102 | 107 | 108 | 108 | 108 |
| modified | 83 | 83 | 89 | 89 | 91 | 95 | 98 | 100 | 103 | 104 | 106 | 107 | 108 | 108 | 108 | 108 | 108 | 108 |
| F = 13 | | | | | | | | | | | | | | | | | | |
| common | 24 | 30 | 36 | 42 | 48 | 54 | 60 | 66 | 72 | 78 | 84 | 90 | 96 | 102 | 108 | 114 | 116 | 116 |
| modified | 89 | 93 | 94 | 98 | 100 | 99 | 103 | 104 | 108 | 111 | 113 | 114 | 115 | 116 | 116 | 116 | 116 | 116 |
| F = 14 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 124 |
| modified | 97 | 96 | 101 | 103 | 106 | 107 | 109 | 111 | 115 | 117 | 120 | 121 | 122 | 124 | 124 | 124 | 124 | 124 |
| F = 15 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 101 | 106 | 106 | 110 | 112 | 114 | 116 | 117 | 121 | 122 | 125 | 128 | 130 | 131 | 131 | 132 | 132 | 132 |
| F = 16 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 109 | 109 | 115 | 115 | 117 | 118 | 120 | 125 | 127 | 128 | 131 | 134 | 136 | 137 | 139 | 140 | 141 | 141 |
| F = 17 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 115 | 120 | 119 | 119 | 121 | 126 | 126 | 129 | 132 | 135 | 137 | 139 | 143 | 145 | 146 | 147 | 149 | 149 |
| F = 18 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 118 | 122 | 124 | 126 | 129 | 130 | 132 | 136 | 139 | 141 | 141 | 146 | 149 | 152 | 152 | 155 | 155 | 156 |
| F = 19 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 127 | 128 | 131 | 130 | 134 | 135 | 137 | 141 | 143 | 146 | 150 | 153 | 155 | 157 | 160 | 161 | 162 | 163 |
| F = 20 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 135 | 135 | 135 | 138 | 139 | 141 | 145 | 147 | 150 | 153 | 156 | 158 | 160 | 163 | 166 | 169 | 170 | 171 |
| F = 21 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 138 | 143 | 145 | 145 | 148 | 149 | 151 | 154 | 156 | 159 | 162 | 165 | 167 | 170 | 171 | 174 | 176 | 178 |
| F = 22 | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | 143 | 147 | 149 | 148 | 151 | 154 | 155 | 160 | 163 | 164 | 168 | 171 | 173 | 176 | 178 | 181 | 183 | 186 |
| F = Inf | | | | | | | | | | | | | | | | | | |
| common | 24 | 30 | 36 | 42 | 48 | 54 | 60 | 66 | 72 | 78 | 84 | 90 | 96 | 102 | 108 | 114 | 120 | 126 |
| modified | Inf | Inf | Inf | Inf | Inf | Inf | Inf | Inf | Inf | Inf | Inf | Inf | Inf | Inf | Inf | Inf | Inf | Inf |

TABLE 5.2

SNR for S'(k) with common phase mapper and modified phase mapper.

| | W = | | | | | | | | | | | | | | | | | |
|---|---|---|---|---|---|---|---|---|---|---|---|---|---|---|---|---|---|---|
| | 5 | 6 | 7 | 8 | 9 | 10 | 11 | 12 | 13 | 14 | 15 | 16 | 17 | 18 | 19 | 20 | 21 | 22 |
| F = 5 | | | | | | | | | | | | | | | | | | |
| common | 20 | 25 | 31 | 35 | 37 | 38 | 38 | 38 | 38 | 38 | 38 | 38 | 38 | 38 | 38 | 38 | 38 | 38 |
| modified | 38 | 38 | 38 | 38 | 38 | 38 | 38 | 38 | 38 | 38 | 38 | 38 | 38 | 38 | 38 | 38 | 38 | 38 |
| F = 6 | | | | | | | | | | | | | | | | | | |
| common | 20 | 26 | 32 | 38 | 41 | 43 | 44 | 44 | 44 | 44 | 44 | 44 | 44 | 44 | 44 | 44 | 44 | 44 |
| modified | 43 | 43 | 43 | 44 | 44 | 44 | 44 | 44 | 44 | 44 | 44 | 44 | 44 | 44 | 44 | 44 | 44 | 44 |

TABLE 5.2-continued

SNR for S'(k) with common phase mapper and modified phase mapper.

| | W = | | | | | | | | | | | | | | | | | |
|---|---|---|---|---|---|---|---|---|---|---|---|---|---|---|---|---|---|---|
| | 5 | 6 | 7 | 8 | 9 | 10 | 11 | 12 | 13 | 14 | 15 | 16 | 17 | 18 | 19 | 20 | 21 | 22 |
| F = 7 | | | | | | | | | | | | | | | | | | |
| common | 20 | 26 | 32 | 38 | 43 | 47 | 49 | 50 | 50 | 50 | 50 | 50 | 50 | 50 | 50 | 50 | 50 | 50 |
| modified | 50 | 50 | 50 | 50 | 50 | 50 | 50 | 50 | 50 | 50 | 50 | 50 | 50 | 50 | 50 | 50 | 50 | 50 |
| F = 8 | | | | | | | | | | | | | | | | | | |
| common | 20 | 26 | 32 | 38 | 44 | 49 | 53 | 55 | 56 | 56 | 56 | 56 | 56 | 56 | 56 | 56 | 56 | 56 |
| modified | 60 | 58 | 56 | 56 | 57 | 56 | 56 | 56 | 56 | 56 | 56 | 56 | 56 | 56 | 56 | 56 | 56 | 56 |
| F = 9 | | | | | | | | | | | | | | | | | | |
| common | 20 | 26 | 32 | 38 | 44 | 50 | 55 | 59 | 61 | 62 | 62 | 62 | 62 | 62 | 62 | 62 | 62 | 62 |
| modified | 65 | 63 | 62 | 61 | 62 | 62 | 62 | 62 | 62 | 62 | 62 | 62 | 62 | 62 | 62 | 62 | 62 | 62 |
| F = 10 | | | | | | | | | | | | | | | | | | |
| common | 20 | 26 | 32 | 38 | 44 | 50 | 56 | 61 | 65 | 67 | 68 | 68 | 68 | 68 | 68 | 68 | 68 | 68 |
| modified | 72 | 69 | 69 | 69 | 69 | 68 | 68 | 68 | 68 | 68 | 68 | 68 | 68 | 68 | 68 | 68 | 68 | 68 |
| F = 11 | | | | | | | | | | | | | | | | | | |
| common | 20 | 26 | 32 | 38 | 44 | 50 | 56 | 62 | 67 | 71 | 73 | 74 | 74 | 74 | 74 | 74 | 74 | 74 |
| modified | 76 | 75 | 74 | 74 | 73 | 74 | 74 | 74 | 74 | 74 | 74 | 74 | 74 | 74 | 74 | 74 | 74 | 74 |
| F = 12 | | | | | | | | | | | | | | | | | | |
| common | 20 | 26 | 32 | 38 | 44 | 50 | 56 | 62 | 68 | 73 | 77 | 79 | 80 | 80 | 80 | 80 | 80 | 80 |
| modified | 80 | 80 | 81 | 80 | 80 | 80 | 80 | 80 | 80 | 80 | 80 | 80 | 80 | 80 | 80 | 80 | 80 | 80 |
| F = 13 | | | | | | | | | | | | | | | | | | |
| common | 20 | 26 | 32 | 38 | 44 | 50 | 56 | 62 | 68 | 74 | 79 | 83 | 85 | 86 | 86 | 86 | 86 | 86 |
| modified | 86 | 86 | 85 | 86 | 86 | 86 | 86 | 86 | 86 | 86 | 86 | 86 | 86 | 86 | 86 | 86 | 86 | 86 |
| F = 14 | | | | | | | | | | | | | | | | | | |
| common | 20 | 26 | 32 | 38 | 44 | 50 | 56 | 62 | 68 | 74 | 80 | 85 | 89 | 91 | 92 | 92 | 92 | 92 |
| modified | 93 | 93 | 94 | 93 | 93 | 92 | 92 | 92 | 92 | 92 | 92 | 92 | 92 | 92 | 92 | 92 | 92 | 92 |
| F = 15 | | | | | | | | | | | | | | | | | | |
| common | 20 | 26 | 32 | 38 | 44 | 50 | 56 | 62 | 68 | 74 | 80 | 86 | 91 | 95 | 97 | 98 | 98 | 99 |
| modified | 98 | 99 | 99 | 99 | 99 | 99 | 98 | 98 | 98 | 98 | 98 | 98 | 98 | 98 | 98 | 98 | 98 | 99 |
| F = 16 | | | | | | | | | | | | | | | | | | |
| common | 20 | 26 | 32 | 38 | 44 | 50 | 56 | 62 | 68 | 74 | 80 | 86 | 92 | 97 | 101 | 104 | 105 | 106 |
| modified | 104 | 104 | 105 | 105 | 105 | 104 | 104 | 104 | 104 | 104 | 104 | 104 | 104 | 104 | 104 | 104 | 105 | 106 |
| F = 17 | | | | | | | | | | | | | | | | | | |
| common | 20 | 26 | 32 | 38 | 44 | 50 | 56 | 62 | 68 | 74 | 80 | 86 | 92 | 98 | 104 | 109 | 114 | 119 |
| modified | 111 | 113 | 111 | 110 | 110 | 110 | 110 | 110 | 110 | 110 | 110 | 110 | 110 | 110 | 111 | 113 | 118 | 121 |
| F = 18 | | | | | | | | | | | | | | | | | | |
| common | 20 | 26 | 32 | 38 | 44 | 50 | 56 | 62 | 68 | 74 | 80 | 86 | 92 | 98 | 104 | 110 | 116 | 122 |
| modified | 117 | 116 | 117 | 116 | 116 | 116 | 116 | 116 | 116 | 116 | 116 | 117 | 117 | 119 | 124 | 132 | 131 | 137 |
| F = 19 | | | | | | | | | | | | | | | | | | |
| common | 20 | 26 | 32 | 38 | 44 | 50 | 56 | 62 | 68 | 74 | 80 | 86 | 92 | 98 | 104 | 110 | 117 | 123 |
| modified | 123 | 122 | 122 | 122 | 123 | 122 | 122 | 122 | 122 | 122 | 123 | 123 | 125 | 130 | 150 | 150 | 150 | 150 |
| F = 20 | | | | | | | | | | | | | | | | | | |
| common | 20 | 26 | 32 | 38 | 44 | 50 | 56 | 62 | 68 | 74 | 80 | 86 | 92 | 98 | 104 | 110 | 117 | 123 |
| modified | 132 | 128 | 128 | 128 | 128 | 128 | 128 | 128 | 129 | 129 | 131 | 136 | 146 | 150 | 150 | 150 | 150 | 150 |
| F = 21 | | | | | | | | | | | | | | | | | | |
| common | 20 | 26 | 32 | 38 | 44 | 50 | 56 | 62 | 68 | 74 | 80 | 86 | 92 | 98 | 104 | 110 | 117 | 123 |
| modified | 136 | 135 | 136 | 135 | 135 | 135 | 135 | 136 | 138 | 141 | 150 | 150 | 150 | 150 | 150 | 150 | 150 | 150 |
| F = 22 | | | | | | | | | | | | | | | | | | |
| common | 20 | 26 | 32 | 38 | 44 | 50 | 56 | 62 | 68 | 74 | 80 | 86 | 92 | 98 | 104 | 110 | 117 | 123 |
| modified | 140 | 140 | 141 | 140 | 141 | 142 | 150 | 150 | 150 | 150 | 150 | 150 | 150 | 150 | 150 | 150 | 150 | 150 |
| F = Inf | | | | | | | | | | | | | | | | | | |
| common | 20 | 26 | 32 | 38 | 44 | 50 | 56 | 62 | 68 | 74 | 80 | 86 | 92 | 98 | 104 | 110 | 117 | 123 |
| modified | Inf | Inf | Inf | Inf | Inf | Inf | Inf | Inf | Inf | Inf | Inf | Inf | Inf | Inf | Inf | Inf | Inf | Inf | understanding the changes of all spurs in S'(k) in a collective manner by which they influence all SCMF spurs in S(k).

The results of Table 5.1 and Table 5.2 are also useful for understanding the impact of phase mapper implementation on the spectra corresponding to fcw with L≦W (i.e., in the absence of phase truncation). For L=W, the DDS produces the signature sequences at its output and the corresponding results are exactly those of Table 5.1 and Table 5.2. For L<W, however, as discussed in Section 3.6, the DDS output can be obtained from the signature sequence via a decimation operation beginning at an initial point dictated by the initial state of the phase accumulator register. Since the constant LSB error introduced by the common phase mapper impacts the signature sequence, its impact will be similar on the sequences obtained by decimating the signature sequence. Of course, the corresponding SFDR and SNR figures will be different, especially for very small values of L (i.e., very-short-period sequences), but the observations and conclusions made, based on the data presented in Table 5.1 and Table 5.2, will still apply to some degree to these decimated outputs.

From the SFDR and SNR data presented in Table 5.1 and Table 5.2, respectively, one can make the following observations. First, for a specific output precision (i.e., a specific value of F), the performance improves as the number of SCMF input bits W is increased. The performance improvement with increasing W for the common phase mapper is substantially more rapid than the improvement for the modified phase mapper. The performance variation for the modified phase mapper is only due to the short period RMF output rounding error sequences associated with small W, as discussed in Section 3.6, and is not due to phase mapper imperfections since the modified phase mapper performs an ideal mapping. For infinite precision RMF outputs (i.e., F=∞), which completely eliminate the rounding errors, for the modified phase mapper one observes infinite SFDR and infinite SNR across all values of W. For the common phase mapper, however, the performance variation across W is due to both short period RMF output rounding error sequences and phase mapping errors introduced by the common phase mapper. Recall that the common phase mapper introduces a constant phase error of $$\frac{2\pi}{2^W}$$

in the octants (or quadrants) where mapping is performed. This constant phase error is a function of W, and it decreases with increasing W. The impact of the constant phase error due to the common phase mapper on the DDS performance is apparent in Table 5.1 and Table 5.2. For infinite precision RMF outputs there is a steady performance improvement over all values of W. The same steady performance improvement over all values of W is also apparent for very high RMF output precisions. For example the SFDR for F≧15 and the SNR for F≧19, rounded to the nearest integer, are indistinguishable from the SFDR and SNR figures corresponding to infinite precision outputs. This behavior is expected, since high output precision implies very small amplitude rounding errors and the constant phase error due to common phase mapper dominates and becomes the sole performance limitation. The reason why SNR starts deviating for F<19 while SFDR remains unchanged even for 15≦F<19 is due to the fact that SFDR depends only on the spur with largest magnitude (and, of course, the magnitude of the main component(s)), while the SNR depends on all the spurs. Therefore, a small change on any spur or small set of spurs over the entire spectrum will change the SNR while the SFDR may remain unchanged if the maximum spur remains unchanged.

Examining Table 5.1 and Table 5.2 over all RMF output precisions F and small values of W one notes a large performance improvement when going from the common phase mapper to the modified phase mapper. Again, this is to be expected since, for small W the constant phase error due to the common phase mapper is relatively large and the modified phase mapper completely eliminates this large error. As the RMF output precision decreases from the very high values of F≧19, for example F=13, one observes that the performance improves with increasing W, but reaches a "saturation" point where there is no additional improvement with increasing W. For example, with F=13 the SFDR for the common phase mapper stops significantly improving for W>19 and remains unchanged for W>20, while the SNR stops significantly improving for W>16 and remains unchanged for W>17. Furthermore, one notes that the performance due to the common phase mapper and modified phase mapper become identical for large W in "saturation" regions. The RMF output rounding errors in these regions are the dominant error sources and they "mask out" the constant phase error due to the common phase mapper. Therefore, DDS performance with the common phase mapper becomes indistinguishable from the performance of the DDS using the modified phase mapper. From Table 5.1 and Table 5.2 one can also notice that the value of W where the "saturation" point is reached decreases with decreasing RMF output precision F. For instance, for F=13, the SNR saturation point is reached at W=18 while for F=10 and F=7 the "saturation" points are reached at W=15 and W=12, respectively. A similar behavior is observed for SFDR in Table 5.1. One concludes that, for a given DDS output precision F, the DDS performance using the common phase mapper will be similar to the DDS performance using the modified phase mapper for (approximately) W≧F+5 and will have poorer performance for W<F+5 and will decrease very quickly with decreasing values of W.

To confirm the inference that the common phase mapping "saturation" point is reached at approximately W=F+5, now analyze the constant phase error introduced by the common phase mapper in more detail. Assuming ideal (i.e., infinite precision) RMF outputs and an SCMF input $\hat{\theta}$ corresponding to an angle θ that requires the phase mapper to perform a nontrivial mapping operation, the corresponding DDS output sin θ gets approximated by $$\sin\theta \approx \sin\left(\theta - \frac{2\pi}{2^W}\right). \tag{5.2}$$

The right hand side of the approximation (5.2) can be expanded by using the trigonometric identity sin(a−b)=sin a cos b−cos a sin b, which yields $$\sin\theta \approx \sin\theta\cos\frac{2\pi}{2^W} - \cos\theta\sin\frac{2\pi}{2^W}. \tag{5.3}$$

Figure 42A:
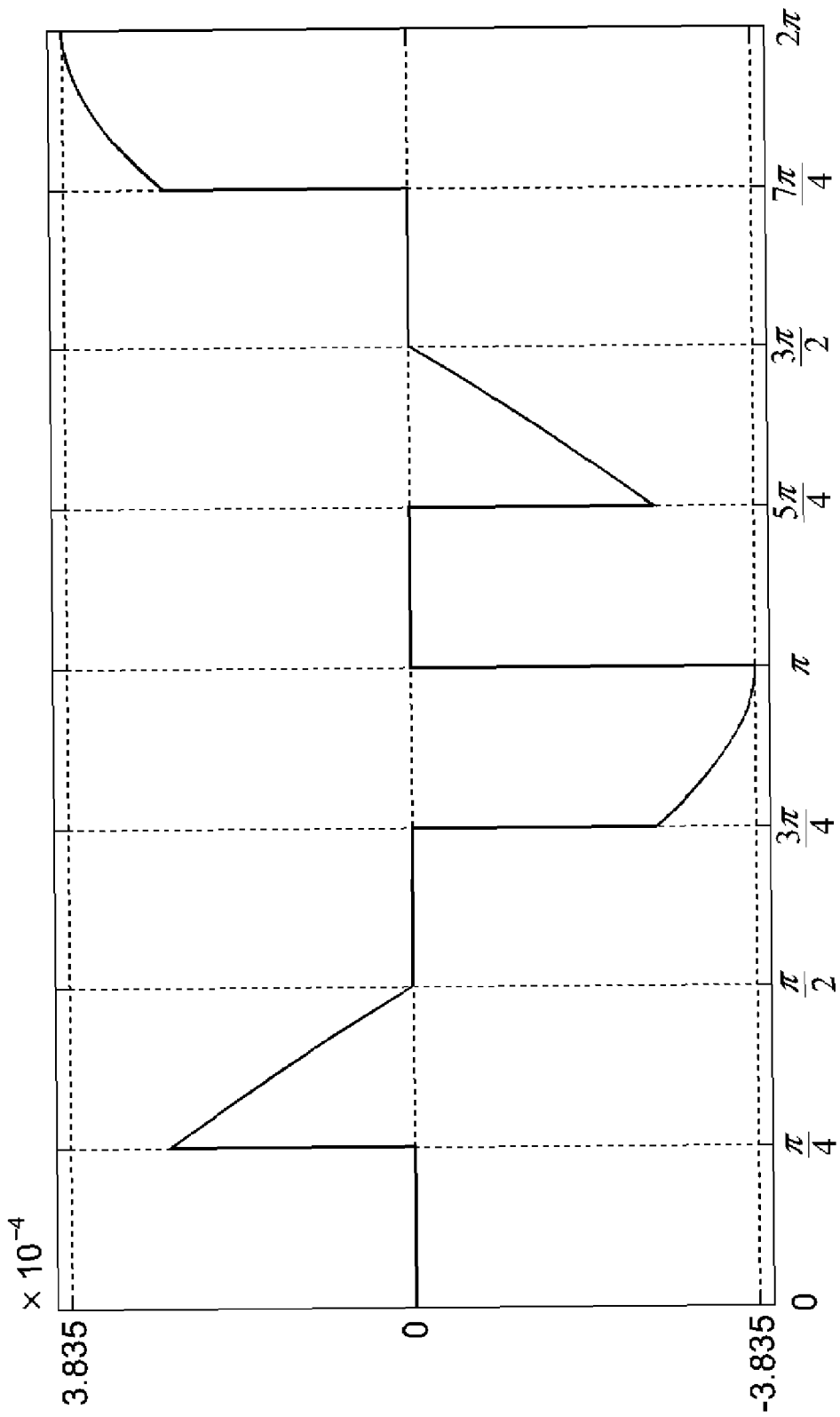
FIGS. 42 *a,b* and *c* are plots of DDS output error due to common phase mapper and RMF rounding error.
Figure 42B:
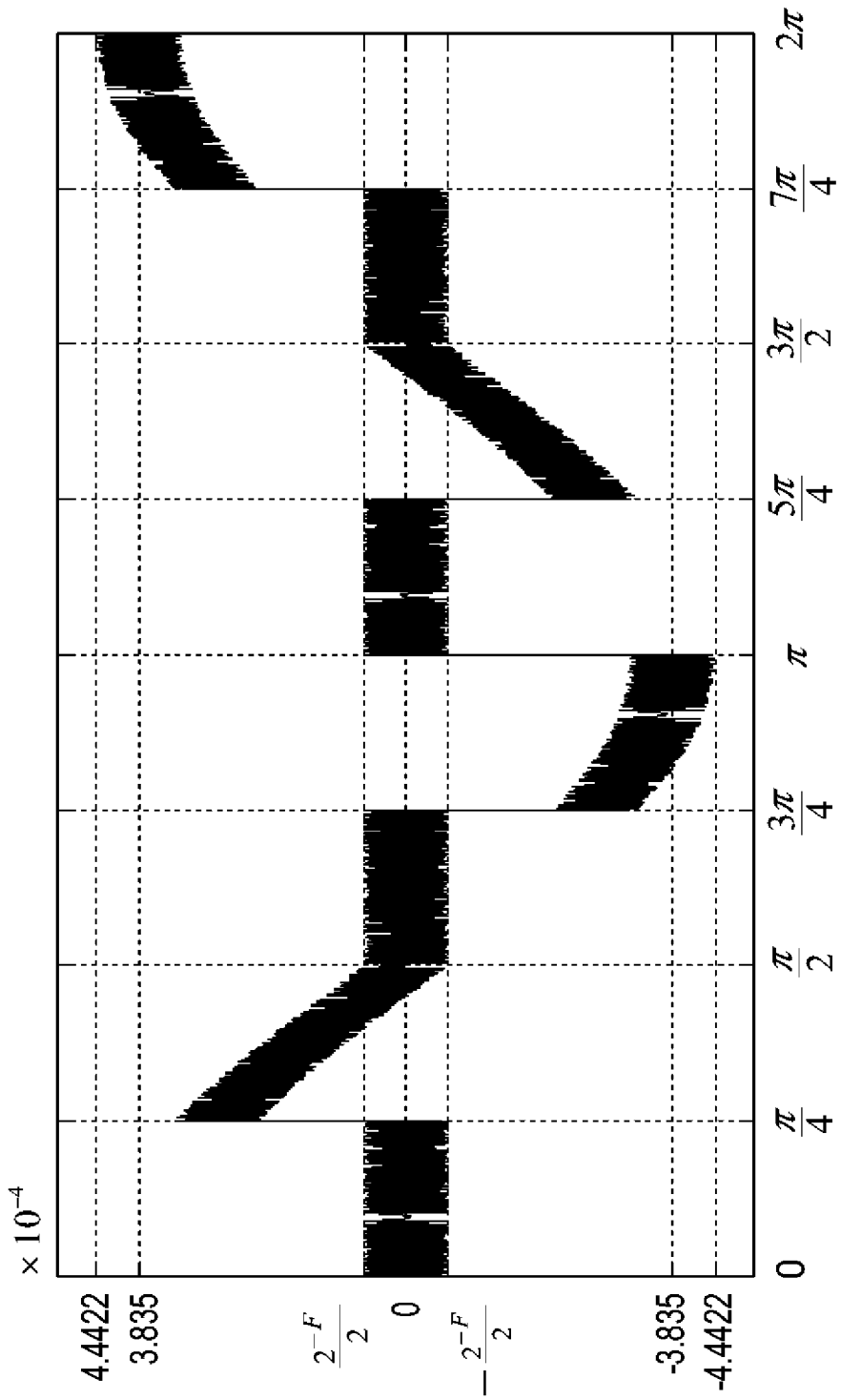
Figure 42D:
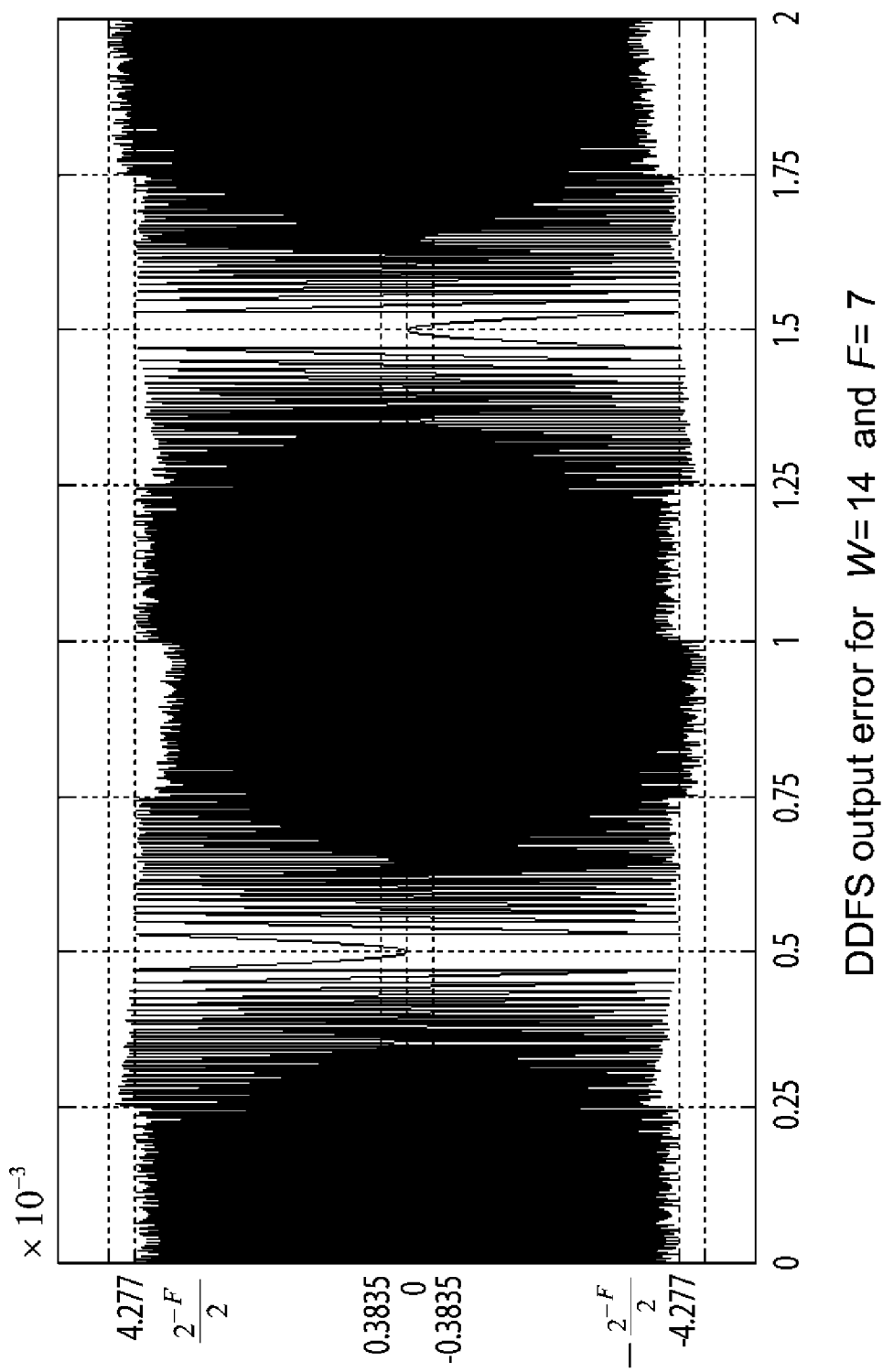

Since $$\cos\frac{2\pi}{2^W}$$

very quickly reaches one for increasing W, one concludes from (5.3) that the phase error due to the common phase mapper in the octants (or quadrants for the FIGS. 34a and 34b and FIGS. 35a and 35b implementations) where phase mapping is performed induces an error of approximately $$\eta = \cos\theta \sin\frac{2\pi}{2^W} \qquad (5.4)$$

at the DDS output. In the even octants (or quadrants) the error $\eta$ as a function of the input $\theta$ is a cosine with amplitude $$\sin\frac{2\pi}{2^W}$$

and in the odd octants (or quadrants) the error is zero. FIGS. 42a, b, c and d illustrates the DDS output error obtained by using the common phase mapper, an ideal RMF with $F=\infty$, and SCMF input word length $W=14$. The amplitude of the cosine for the error $\eta$ in (5.4) is therefore $$\sin\frac{2\pi}{2^{14}} = 3.835 \times 10^{-4},$$

which is consistent with the results shown in FIG. 42a. The RMF output rounding error can be modeled as a uniformly-distributed random process in the range $$\left[-\frac{2^{-F}}{2}, \frac{2^{-F}}{2}\right].$$

Now compute the maximum value of F that generates a rounding error distribution with maximum amplitude that is greater than or equal to the amplitude of the phase error $$\sin\frac{2\pi}{2^W}.$$

Hence, $$\frac{2^{-F}}{2} > \sin\frac{2\pi}{2^W}$$

and utilizing the tight upper bound for small angles $$\frac{2\pi}{2^W} > \sin\frac{2\pi}{2^W}$$

one obtains $$\frac{2^{-F}}{2} > \frac{2\pi}{2^W}.$$

Taking logarithms of both sides, which can be done since log is a monotone increasing function for positive real numbers, one gets $$\log_2 \frac{2^{-F}}{2} > \log_2 \frac{2\pi}{2^W}.$$

This simplifies to $F < W - 2 - \log_2 \pi$ and one obtains $$F < W - 3.65. \qquad (5.5)$$

From the bound (5.5) one concludes that, in order for the maximum rounding error to be greater than or equal to the amplitude of the "cosine-type" error due to the common implementation, the number of output fractional bits F has to be less than or equal to four bits fewer than the SCMF input bits W. Since the rounding error will have a distribution between $$\left[-\frac{2^{-F}}{2}, \frac{2^{-F}}{2}\right],$$

most of the errors will have magnitudes that are less than the distribution limits $$\frac{2^{-F}}{2}.$$

Furthermore, even if the rounding error is greater in magnitude compared to the common phase mapper error, they may combine constructively. Therefore, the rounding error can never completely "mask out" the error due to the common phase mapper. One concludes that, in order for the output rounding error to effectively "mask out" the errors due to the common phase mapper, the number of DDS output fractional bits F must be approximately five or six bits fewer than W. This confirms a "rule of thumb" that the "saturation" point is reached at approximately $W=F+5$. FIGS. 42a-d, where $W=14$, also supports such conclusions. Here one observes from FIG. 42b that with $F=13$ the dominant output error is due to the common phase mapper, with $F=10$ in FIG. 42c one observes that the rounding error is still incapable of effectively "masking out" the common phase mapper error even though the amplitude of the maximum rounding error is greater than the amplitude of the maximum common phase mapper error as expected from (5.5). Finally, in FIG. 42d with $F=7$, which is six bits fewer than W, the error due to the common phase mapper is effectively "masked out" by the output rounding error.

One concludes that the use of the common phase mapper severely impacts the spectral quality of the signature sequences by limiting the maximum number of accurate DDS output bits (i.e., limiting the maximum number of "good" bits). Since the magnitude of the error due to the common phase mapper depends on W, the impact of the common phase mapper can be minimized by increasing W. Increasing W, unfortunately, increases the complexity of the SCMF. From the data in Table 5.1 and Table 5.2 one observes that it is much more beneficial to use the modified phase mapper and keep W as small as possible instead of using the common phase mapper and increasing W. For example, with $F=13$, $W=11$, and the modified phase mapper, the SFDR of the corresponding signature sequence is greater than 100 dBc. To use the common phase mapper instead of the modified phase mapper while keeping the SFDR greater than 100 dBc will require W to be increased from 11 to 18 bits. The same conclusion can be made from Table 5.2 to achieve an SNR of 86 dB. The increase of W by seven bits will significantly increase the complexity of the RMF implementation. The complexity added by the carry-in adder in FIGS. 38*a* and 38*b* and FIGS. 41*a* and 41*b* to implement the modified phase mapper is insignificant. The carry-ripple time expenditure should also be considered inconsequential, since the overall system's critical timing constraints are likely dictated by other components-in particular the larger adder of the phase accumulator. Finally, the mapping of one additional boundary angle $$\frac{\pi}{4}$$

or $$\frac{\pi}{2}$$

in the RMF, required by the modified phase mapper approach, is easily accommodated as illustrated in FIG. 39 and does not truly represent a significant hardware increase. These results apply to sine DDS, cosine DDS, and quadrature DDS.

5.4 Conditional Negate Following the RMF

As discussed in Section 5.2, the use of a conditional negate block following the RMF is a common design technique. The two most preferred candidates for the implementation of the negation operation in the conditional negate block following the RMF in FIGS. 34*a-b*, FIGS. 35*a-b*, and FIGS. 36*a-b* are the 2's complement negation and the 1's complement negation and were briefly discussed in Section 5.3. The 2's complement negation is ideal (i.e., it introduces no errors) while the 1's complement negation is not ideal and introduces a constant LSB error. One can first investigate DDS output spectra obtained from using the ideal 2's complement negation. The analysis will then be extended to investigate the impact of using non-ideal 1's complement negation in the conditional negate block.

The spurs are examined for even-indexed DDS output DFT frequency bins, first considering the case where L>W (where there is phase-word truncation). As discussed in Section 3.4, the output spectrum $S_{W,B}(k)=V_{W,B}(k)S'_W(k)$ (from (3.4)) is the product of the windowing function $V_{W,B}(k)$ and $$S'_W(k) = \sum_{n=0}^{2^W-1} s^1(n) e^{-j\frac{2\pi}{2^W}nk}.$$

Recall from Section 3.2 that $S'_W(k)$ is periodic in k with period $2^W$ and one period of $V_{W,B}(k)$ windows over $2^B$ periods of $S'_W(k)$. Therefore, if a spur in $S'_W(k)$ is zero for a particular frequency bin k, then the corresponding $2^B$ spurs in $S_{W,B}(k)$ will also be zero. The same holds for $C'_W(k)$ and $CS'_W(k)$ for cosine DDS and quadrature DDS, respectively.

From FIGS. 32 through 36 one notes that, if the conditional negate block performs an ideal 2's complement negation when the negate flag indicates to do so, and since the input to the conditional negate block is not ideal (i.e., it is influenced by the non-idealities of the RMF), having some error associated with it, the ideal conditional negate block produces an output with an error of identical magnitude but opposite in sign. In this case the error sequence q(n) in (3.14) and error sequences $q_{cos}(n)$ and $q_{sin}(n)$ in (3.15) are symmetric, in keeping with the odd/even symmetry of the sine and/or cosine functions. In particular, $s'(n)=-s'(n+2^{W-1})$, $c'(n)=-c'(n+2^{W-1})$, and $cs'(n)=-cs'(n+2^{W-1})$, despite the fact that the RMF is non-ideal. Thus, for $S'_W(k)$ $$S'_W(k) = \sum_{n=0}^{2^W-1} s'(n) e^{-j\frac{2\pi}{2^W}nk}$$

$$= \sum_{n=0}^{2^{W-1}-1} s'(n) e^{-j\frac{2\pi}{2^W}nk} + \sum_{n=2^{W-1}}^{2^W-1} s'(n) e^{-j\frac{2\pi}{2^W}nk}$$

$$= \sum_{n=0}^{2^{W-1}-1} s'(n) e^{-j\frac{2\pi}{2^W}nk} + \sum_{n=0}^{2^{W-1}-1} s'(n+2^{W-1}) e^{-j\frac{2\pi}{2^W}(n+2^{W-1})k}$$

$$= \sum_{n=0}^{2^{W-1}-1} s'(n) e^{-j\frac{2\pi}{2^W}nk} + \sum_{n=0}^{2^{W-1}-1} -s'(n) e^{-j\frac{2\pi}{2^W}nk} e^{-j\pi k}$$

which yields $$S'_W(k) = \begin{cases} 0 & \text{if } k \text{ is even} \\ 2\sum_{n=0}^{2^{W-1}-1} s'(n) e^{-j\frac{2\pi}{2^W}nk} & \text{if } k \text{ is odd.} \end{cases}$$

That is, $S_{W,B}(k)=0$ for all even frequency bins. The same derivation can be applied to c'(n) and cs'(n) yielding $C_{W,B}(k)=0$ and $CS_{W,B}(k)=0$ for all even frequency bins.

The same results also hold for fcw with L≦W (where there is no phase truncation). Recall the matrix A from Section 3.6 and Section 4.6 and the fact that the spectra associated with different initial phase values are obtained by performing DFTs on all the columns of A. In this case the DFT size is $2^L$ and hence the even bins for all DFTs will be zero if the input sequences $s_i(n)$ (where $0 \leq i < 2^T$ denotes the column number or the initial phase condition, as in Section 4.6) to the DFTs have the symmetry $s_i(n)=-s_i(n+2^{L-1})$. With a 2's complement conditional negate block, the signature sequence, as discussed, has the property $s'(n)=-s'(n+2^{W-1})$. Thus, it is shown that $s_i(n)=-s_i(n+2^{L-1})$, from the construction of A. The first half of the signature sequence s'(n) ($0 \leq n \leq 2^{W-1}-1$) constitutes the top half of matrix A, while the second half of s'(n) is the bottom half of A. Hence, every column of A, when considered as an input vector $s_i(n)$ for the DFT, will have the necessary symmetry $s_i(n)=-s_i(n+2^{L-1})$ if $s'(n)=-s'(n+2^{W-1})$ is satisfied. The symmetry $s_i(n)=-s_i(n+2^{L-1})$ is also obtained directly from the symmetry $s'(n)=-s'(n+2^{W-1})$. Since $s_i(n)=s'(2^Tn+i)$ (see Section 4.6) then, using T=W−L, one obtains $$-s_i(n+2^{L-1}) = -s'(2^T(n+2^{L-1})+i)$$

$$= -s'(2^Tn+2^{W-1}+i)$$

$$= s'(2^Tn+i)$$

$$= s_i(n).$$

One therefore concludes that, if the conditional negate block following the RMF uses 2's complement negation, the spurs located at all even bin positions will always be zero for all frequency control words. This conclusion applies to all frequency control words since the rearrangement of spectra in (2.2) is a one-to-one mapping and all even bin positions in one spectrum are mapped to even bin positions in the other spectrum. This is a powerful result when considering SCMF implementations. This result is also consistent with the analysis of phase truncation spurs from Sections 3.2 and 3.4, since the locations of all phase truncation spurs $k \epsilon \{(d2^W \pm 1): \text{for } 1 \leq d \leq (2^B-1)\}$ for sine DDS or cosine DDS, and the locations of all phase truncation spurs $k \epsilon \{(d2^W+1): \text{for } 1 \leq d \leq (2^B-1)\}$ for quadrature DDS, are odd and independent of the signature sequences s'(n), c'(n), and cs'(n).

The use of 1's complement negation in the conditional negate block following the RMF introduces a constant error $-2^{-F}$, where F is the number of DDS output fractional bits. This error has an amplitude equal to the amplitude corresponding to the output LSB since 1's complement negation is identical to the ideal 2's complement negation except that it omits the addition of the LSB following the inversion of all the bits. Therefore, the symmetry of the signature sequence $s'(n)=-s'(n+2^{W-1})$ and, in general, the symmetry of the DDS output sequence $s(n)=-s(n+2^{L-1})$ due to an fcw having a single nonzero bit at position L will no longer be satisfied.

Consider the sine output $S_{1's\ complement}(n)$ corresponding to a DDS using a 1's complement conditional negate block obtained from an fcw having a single nonzero bit at position L and the sine output $s_{2's\ complement}(n)$ corresponding to the same DDS (i.e., having an identical RMF) but using an ideal 2's complement conditional negate block. Furthermore, since the $2^L$ distinct initial phase conditions for L>W (i.e., in the presence of phase truncation) produce outputs with identical magnitude response, as discussed in Section 3.6, for such fcw one can assume $S_{1's\ complement}(n)$ and $S_{2's\ complement}(n)$ correspond to the zero initial condition. For fcw with $L \leq W$ $s_{1's\ complement}(n)$ and $s_{2's\ complement}(n)$ correspond to any column of their corresponding matrix A (i.e., any initial phase $0 \leq \hat{\theta}_{initial} \leq 2^T-1$). For the sine output, the conditional subtract block in FIG. 5-3 through FIG. 36 performs a negate operation for all input angles $\pi \leq \theta < 2\pi$. Therefore, $s_{1's\ complement}(n)$ and $s_{2's\ complement}(n)$ for $0 \leq n \leq 2^{L-1}$ are generated by the conditional negate block without doing anything, while $s_{1's\ complement}(n)$ and $s_{2's\ complement}(n)$ for $2^{L-1} \leq n \leq 2^L$ are generated by the conditional negate block performing a negation operation. Since the error due to 1's complement negation is a constant of amount $-2^{-F}$, $s_{1's\ complement}(n)$ can be expressed in terms of $s_{2's\ complement}(n)$ as $$s_{1's\ complement}(n) = s_{1's\ complement}(n) - 2^{-F} u_L(n-2^{L-1}) \quad (5.6)$$

where $u_L(n)$ is the "box"-type function defined as $$u_L(n) = \begin{cases} 1, & 0 \leq n < 2^{L-1} \\ 0, & \text{otherwise.} \end{cases} \quad (5.7)$$

Applying the linearity property of the DFT and the circular time-shift property of DFT one obtains an expression for the 1's complement DDS output spectrum $S_{1's\ complement}(k)$ in terms of the 2's complement DDS output spectrum $S_{2's\ complement}(k)$ and the $2^L$-point DFT of $u_L(n)$ denoted as $U_L(k)$. The result is $$S_{1's\ complement}(k) = S_{2's\ complement}(k) - 2^{-F} e^{-j\pi k} U_L(k). \quad (5.8)$$

The N-point DFT of an arbitrary-width (in particular width G) "box"-type function x(n) having period N is defined as $$x(n) = \begin{cases} 1, & 0 \leq n < G \\ 0, & \text{otherwise} \end{cases} \quad (5.9)$$

to be $$X(k) = \frac{\sin\frac{\pi k G}{N}}{\sin\frac{\pi k}{N}} e^{-j\pi \frac{G-1}{N} k}. \quad (5.10)$$

Since $u_L(n)$ has period $2^L$, from (5.7) one observes that $u_L(n)$ fits (5.9) with $G=2^{L-1}$. Hence, $U_L(k)$ can be obtained from (5.10) by substituting $G=2^{L-1}$ and $N=2^L$, which produces $$U_L(k) = \frac{\sin\frac{\pi k}{N}}{\sin\frac{\pi k}{2^L}} e^{-j\frac{\pi k}{2}} e^{j\frac{\pi k}{2^L}}. \quad (5.11)$$

Using (5.11), one can now investigate some properties of $e^{-j\pi k} U_L(k)$ in (5.8). For k=0, from l'Hospital's rule, $$e^{-j\pi k} U_L(k) = U_L(0) = \frac{\frac{\pi}{2}}{\frac{\pi}{2^L}} = 2^{L-1}, \text{ for } k = 0. \quad (5.12)$$

For all even k over the remaining DFT bins $0 \leq k \leq 2^L$ one obtains $$e^{-j\pi k} U_L(k) = U_L(k) = \frac{\sin\frac{\pi k}{N}}{\sin\frac{\pi k}{2^L}} e^{-j\frac{\pi k}{2}} e^{j\frac{\pi k}{2^L}} = 0, \text{ for even } k, \quad (5.13)$$

since, for even k $$\sin\frac{\pi k}{2} = 0$$

and for $0 < k < 2^L$ $$\sin\frac{\pi k}{2^L} > 0.$$

Finally, for odd k, $$e^{-j\pi k} U_L(k) = \frac{\sin\frac{\pi k}{2}}{\sin\frac{\pi k}{2^L}} e^{-j\pi k \left(\frac{3}{2} - \frac{1}{2^L}\right)}, \text{ for odd } k. \quad (5.14)$$

The output spectrum of a DDS using a 1's complement conditional negate block following the RMF can therefore easily be obtained from the spectrum of the corresponding DDS (i.e., DDS having an identical RMF) but using a 2's complement conditional negate block via (5.8), (5.12), (5.13), and (5.14).

One knows from above that $S_{2's\ complement}(k)=0$ for all even k. From (5.8), (5.12) and (5.13) therefore one concludes that $S_{1's\ complement}(k)=0$ for all even k except for k=0 (the DC bin). In fact, from (5.8) and (5.12) one obtains the DC component $$S_{1's\ complement}(0) = -2^{L-F-1}. \quad (5.15)$$

The main components of $S_{1's\ complement}(k)$ at k=1 and k=$2^L$−1 are also impacted. The main components of $S_{2's\ complement}(k)$ can be very accurately approximated $$S_{2's\ complement}(1) = -S_{2's\ complement}(2^L - 1) \approx \frac{1}{j}2^{L-1}. \quad$$

This follows from the fact that for L≦W (i.e., in the absence of phase truncation), since the rounding errors of the RMF are uncorrelated with the input phase angles θ, their impact on the main components is negligible since they do not combine in a constructive manner to generate energy that is significant compared to the energy due to the ideal main components. Therefore, following the same discussion leading to (3.5) in Section 3.2, one concludes that for L≦W $$S_{2's\ complement}(1) = -S_{2's\ complement}(2^L-1) \approx -j2^{L-1}$$

$$|S_{2's\ complement}(1)| = |S_{2's\ complement}(2^L-1)| \approx 2^{L-1}. \quad (5.16)$$

For L>W (i.e., in the presence of phase truncation), the main components are obtained using (3.4) by multiplying the windowing function V(k) evaluated at k=1 and the main components $S'_{2's\ complement}(1)$. The main components of the signature sequence are obtained by substituting L=W into (5.16) to obtain $$|S'_{2's\ complement}(1)| \approx 2^{W-1}. \quad (5.17)$$

From (3.9) one concludes that $$|V(1)| = \frac{\sin\frac{\pi}{2^W}}{\sin\frac{\pi}{2^{(W+B)}}}.$$

Since, for typical values of W (i.e., W>5), the small-angle approximations $$\sin\frac{\pi}{2^W} \approx \frac{\pi}{2^W}$$

and $$\sin\frac{\pi}{2^{(W+B)}} \approx \frac{\pi}{2^{(W+B)}}$$

are very accurate, one has $$|V(1)| \approx 2^B. \quad (5.18)$$

Combining (5.17) and (5.18) through (3.4) yields $|S_{2's\ complement}(1)| \approx 2^{B+W-1} = 2^{L-1}$. Therefore, one concludes that (5.16) also hold for fcw having L>W.

To verify the accuracy of (5.16), Table 5.3 lists the ideal magnitude of the main components (i.e., $2^L$) in dB, the magnitude of the main components, in dB, obtained from an SCMF input with W=14 and an RMF rounding its outputs to F=13 fractional bits, and the difference between the ideal and the non-ideal main component magnitudes, again in dB. Table 5.4 verifies that (5.16) is very accurate even for small W=8 and coarse output rounding with F=7. For fcw having L≦W Table 5.3 and Table 5.4 list the magnitude of the main component, over all $2^T$ initial conditions, having the greatest absolute difference from the ideal.

TABLE 5.3

Magnitudes of ideal and actual main components for W = 14 and F = 13.

| L | Ideal Magnitude in dB | Actual Magnitude in dB | Difference in dB |
|---|---|---|---|
| 2 | 6.0206 | 6.0197 | 0.0009 |
| 3 | 12.0412 | 12.0405 | 0.0007 |
| 4 | 18.0618 | 18.0614 | 0.0004 |
| 5 | 24.0824 | 24.0821 | 0.0003 |
| 6 | 30.1030 | 30.1028 | 0.0002 |
| 7 | 36.1236 | 36.1235 | 0.0001 |
| 8 | 42.1442 | 42.1441 | 0.0001 |
| 9 | 48.1648 | 48.1648 | 0.0000 |
| 10 | 54.1854 | 54.1854 | 0.0000 |
| 11 | 60.2060 | 60.2060 | 0.0000 |
| 12 | 66.2266 | 66.2266 | 0.0000 |
| 13 | 72.2472 | 72.2472 | 0.0000 |
| 14 | 78.2678 | 78.2678 | 0.0000 |
| 15 | 84.2884 | 84.2884 | 0.0000 |
| 16 | 90.3090 | 90.3090 | 0.0000 |
| 17 | 96.3296 | 96.3296 | 0.0000 |
| 18 | 102.3502 | 102.3502 | 0.0000 |
| 19 | 108.3708 | 108.3708 | 0.0000 |
| 20 | 114.3914 | 114.3914 | 0.0000 |
| 21 | 120.4120 | 120.4120 | 0.0000 |
| 22 | 126.4326 | 126.4326 | 0.0000 |
| 23 | 132.4532 | 132.4532 | 0.0000 |
| 24 | 138.4738 | 138.4738 | 0.0000 |
| 25 | 144.4944 | 144.4944 | 0.0000 |
| 26 | 150.5150 | 150.5150 | 0.0000 |
| 27 | 156.5356 | 156.5356 | 0.0000 |
| 28 | 162.5562 | 162.5562 | 0.0000 |
| 29 | 168.5768 | 168.5768 | 0.0000 |
| 30 | 174.5974 | 174.5974 | 0.0000 |
| 31 | 180.6180 | 180.6180 | 0.0000 |
| 32 | 186.6386 | 186.6386 | 0.0000 |

TABLE 5.4

Magnitudes of ideal and actual main components for W = 8 and F = 7.

| L | Ideal Magnitude in dB | Actual Magnitude in dB | Difference in dB |
|---|---|---|---|
| 2 | 6.0206 | 5.9858 | 0.0348 |
| 3 | 12.0412 | 12.0155 | 0.0257 |
| 4 | 18.0618 | 18.0450 | 0.0168 |
| 5 | 24.0824 | 24.0655 | 0.0169 |
| 6 | 30.1030 | 30.0959 | 0.0071 |
| 7 | 36.1236 | 36.1243 | 0.0007 |
| 8 | 42.1442 | 42.1461 | 0.0019 |
| 9 | 48.1648 | 48.1666 | 0.0018 |
| 10 | 54.1854 | 54.1871 | 0.0017 |
| 11 | 60.2060 | 60.2077 | 0.0017 |
| 12 | 66.2266 | 66.2283 | 0.0017 |
| 13 | 72.2472 | 72.2489 | 0.0017 |
| 14 | 78.2678 | 78.2695 | 0.0017 |
| 15 | 84.2884 | 84.2901 | 0.0017 |
| 16 | 90.3090 | 90.3107 | 0.0017 |
| 17 | 96.3296 | 96.3313 | 0.0017 |
| 18 | 102.3502 | 102.3519 | 0.0017 |

TABLE 5.4-continued

Magnitudes of ideal and actual main components for W = 8 and F = 7.

| L | Ideal Magnitude in dB | Actual Magnitude in dB | Difference in dB |
|---|---|---|---|
| 19 | 108.3708 | 108.3725 | 0.0017 |
| 20 | 114.3914 | 114.3931 | 0.0017 |
| 21 | 120.4120 | 120.4137 | 0.0017 |
| 22 | 126.4326 | 126.4343 | 0.0017 |
| 23 | 132.4532 | 132.4549 | 0.0017 |
| 24 | 138.4738 | 138.4755 | 0.0017 |
| 25 | 144.4944 | 144.4961 | 0.0017 |
| 26 | 150.5150 | 150.5167 | 0.0017 |
| 27 | 156.5356 | 156.5373 | 0.0017 |
| 28 | 162.5562 | 162.5579 | 0.0017 |
| 29 | 168.5768 | 168.5785 | 0.0017 |
| 30 | 174.5974 | 174.5991 | 0.0017 |
| 31 | 180.6180 | 180.6197 | 0.0017 |
| 32 | 186.6386 | 186.6403 | 0.0017 |

Using (5.8) and (5.14) evaluated at k=1 and (5.16) one obtains $$S_{1's\ complement}(1) = -S_{1's\ complement}(2^L - 1) = -j2^{L-1} - j2^{-F}\left(\csc\frac{\pi}{2^L}\right)e^{j\frac{\pi}{2^L}}$$

for the main components of a DDS using a 1's complement conditional negate block following the RMF. And for $$L > 5,\ e^{j\frac{\pi}{2^L}} \approx 1$$

and $$S_{1's\ complement}(1) = -S_{1's\ complement}(2^L - 1) = -j\left(2^{L-1} + 2^{-F}\csc\frac{\pi}{2^L}\right) \quad (5.19)$$

$$|S_{1's\ complement}(1)| = |S_{1's\ complement}(2^L - 1)| = 2^{L-1} + 2^{-F}\csc\frac{\pi}{2^L}.$$

One obtains the DC component in dBc through (5.15) and (5.19) which is $$|S_{1's\ complement}(0)|_{dBc} = 20\log_{10}\frac{|S_{1's\ complement}(0)|}{|S_{1's\ complement}(1)|} \quad (5.20)$$

$$= 20\log_{10}\frac{2^{L-F-1}}{2^{L-1} + 2^{-F}\csc\frac{\pi}{2^L}}$$

$$= -20\log_{10}\left(2^F + 2^{(-L+1)}\csc\frac{\pi}{2^L}\right)\ dBc.$$

For L>5, (5.20) can be simplified, using the small angle approximation $$\csc\frac{\pi}{2^L} = \frac{1}{\sin\frac{\pi}{2^L}} \approx \frac{1}{\frac{\pi}{2^L}} = \frac{2^L}{\pi}.$$

Using this approximation one obtains $$|S_{1's\ complement}(0)|_{dBc} \approx -20\log_{10}\left(2^F + \frac{2}{\pi}\right) dBc. \quad (5.21)$$

For typical values of F>4, (5.21) can be further simplified as $$|S_{1's\ complement}(0)|_{dBc} \approx -20\log_{10}2^F = -6.02F\ dBc. \quad (5.22)$$

With F=11, using (5.22) the DC spur is −66.22 dBc. With F=11 and W=15, one knows from the data of Table 5.1 that the worst spur found in the spectrum of the signature sequence S'(k) for a DDS using a 2's complement conditional negate block, is 100 dBc. The use of 1's complement negation instead of 2's complement negation in the conditional negate block will reduce the SFDR of S'(k) from 100 dB to 66 dB, a very substantial difference of 34 dB.

In addition to the very undesirable large-magnitude DC spur, the 1's complement conditional negate following the RMF also introduces large-magnitude spurs residing at odd frequency indices. To investigate the impact of 1's complement conditional negate on these odd-indexed spurs using (5.8), one first investigates the behavior of $|-2^{-F}e^{-j\pi k}U_L(k)|$ for odd k. From (5.14) one obtains $$|-2^{-F}e^{-j\pi k}U_L(k)| = 2^{-F}\left|\frac{\sin\frac{\pi k}{2}}{\sin\frac{\pi k}{2^L}}\right|$$

and realizing that, for odd k, $0 < k < 2^L$, $$\sin\frac{\pi k}{2} = \pm 1$$

and $$\sin\frac{\pi k}{2^L} > 0,$$

one obtains $$|-2^{-F}e^{-j\pi k}U_L(k)| = \frac{2^{-F}}{\sin\frac{\pi k}{2^L}},\ \text{for odd}\ k. \quad (5.23)$$

$|S_{1's\ complement}(k)|$ is an even function since $s_{1's\ complement}(n)$ is a real-valued sequence, therefore, to compute the magnitudes of all spurs, one needs to investigate the values of $0 \leq k \leq 2^{L-1}$. Using the fact that $$\sin\frac{\pi k}{2^L}$$

is a monotone increasing function for $0 \leq k \leq 2^{L-1}$, one concludes from (5.23) that $|-2^{-F}e^{-j\pi k}U_L(k)|$ is a monotone decreasing function for odd k. Since k=1 corresponds to the main component, the components with largest magnitude due to 1's complement conditional negate following the RMF, other than the DC component, are at k=3, 5, 7, . . . , in a decreasing order. The contribution of spur magnitudes due to the 1's complement conditional negate can be computed exactly using (5.23), and in general, the exact output spectrum $S_{1's\ complement}(k)$ can be computed exactly via (5.8) and (5.11).

To make a practical assessment for the largest spurs introduced by a 1's complement conditional negate (other than the large DC component) and to gain an overall understanding of the impact of a 1's complement conditional negate on the DDS output spectrum, one can perform the following very accurate approximation. For L>5 and small odd values of k (i.e., k={3, 5, 7}) using the small angle approximation $$\sin\frac{\pi k}{2^L} \approx \frac{\pi k}{2^L},$$

(5.23) can be accurately approximated as $$|-2^{-F}e^{-j\pi k}U_L(k)| \approx \frac{2^{(L-F)}}{\pi k}$$

and, in dB relative to the main components (i.e., in dBc) using (5.19) one obtains $$|-2^{-F}e^{-j\pi k}U_L(k)|_{dBc} \approx 20\log_{10}\frac{2^{L-F}}{\pi k\left(2^{L-1}+2^{-F}\csc\frac{\pi}{2^L}\right)} \quad (5.24)$$

$$= -20\log_{10}\pi k\left(2^{F-1}+2^{-L}\csc\frac{\pi}{2^L}\right)$$

$$\approx -20\log_{10}(\pi k 2^{F-1}+k) \approx -20\log_{10}(\pi k 2^{F-1})$$

$$= -20\log_{10}(\pi) - (F-1)(20\log_{10}2) - 20\log_{10}k$$

$$= -3.92 - 6.02F - 20\log_{10}k\ dBc.$$

Evaluating (5.24) for k=3, k=5, and k 7, one gets $$|-2^{-F}e^{-j\pi k}U_L(3)|_{dBc} \approx -13.46 - 6.02F\ dBc, \quad (5.25)$$

$$|-2^{-F}e^{-j\pi k}U_L(5)|_{dBc} \approx -17.90 - 6.02F\ dBc,$$

$$|-2^{-F}e^{-j\pi k}U_L(7)|_{dBc} \approx -20.82 - 6.02F\ dBc,$$

Now one can compute the magnitudes of three largest non-DC components due to a 1's complement conditional negate following the RMF for 5<F<22 using (5.25). Table 5.5 lists the results. When compared with the magnitude of the largest spur in the entire signature sequence spectrum $S'_{2's\ complement}(k)$ given by Table 5.1, one concludes that

TABLE 5.5

The three largest-magnitude non-DC components due to 1's complement conditional negate following the RMF for $5 \leq F \leq 22$.

| F | $|-2^{-F}e^{-j\pi k}U_L(3)|_{dBc}$ | $|-2^{-F}e^{-j\pi k}U_L(5)|_{dBc}$ | $|-2^{-F}e^{-j\pi k}U_L(7)|_{dBc}$ |
|---|---|---|---|
| 5  | −43.56  | −48.00  | −50.92 |
| 6  | −49.58  | −54.02  | −56.94 |
| 7  | −55.60  | −60.04  | −62.96 |
| 8  | −61.62  | −66.06  | −68.98 |
| 9  | −67.64  | −72.08  | −75.00 |
| 10 | −73.66  | −78.10  | −81.02 |
| 11 | −79.68  | −84.12  | −87.04 |
| 12 | −85.70  | −90.14  | −93.06 |
| 13 | −91.72  | −96.16  | −99.08 |
| 14 | −97.74  | −102.18 | −105.10 |
| 15 | −103.76 | −108.20 | −111.12 |
| 16 | −109.78 | −114.22 | −117.14 |
| 17 | −115.80 | −120.24 | −123.16 |
| 18 | −121.82 | −126.26 | −129.18 |
| 19 | −127.84 | −132.28 | −135.20 |
| 20 | −133.86 | −138.30 | −141.22 |
| 21 | −139.88 | −144.32 | −147.24 |
| 22 | −145.90 | −150.34 | −153.26 | the large-magnitude components due to a 1's complement conditional negate are much greater than the largest spur in the $S'_{2's\ complement}(k)$. For example, with F=11 the largest non-DC component due to a 1's complement conditional negate is −80 dBc (from Table 5.5), while with F=11 and any W>14 the magnitude of the largest spur in $S'_{2's\ complement}(k)$ is smaller than −100 dBc, a difference of more than 20 dB.

Similar conclusions can be obtained for other values of F. The signature sequence spectrum $S'_{1's\ complement}(k)$, is obtained from $S'_{2's\ complement}(k)$ via (5.8). Therefore, the spur magnitudes of $S'_{1's\ complement}(k)$ are determined by the manner in which spurs of $S'_{2's\ complement}(k)$ combine with $-2^{-F}e^{-j\pi k}U_L(k)$, where both magnitude and phase information have to be taken into consideration. In other words, the corresponding spectral components $S'_{2's\ complement}(k)$ and $-2^{-F}e^{-j\pi k}U_L(k)$, for every k, may combine constructively or destructively. From earlier conclusion $|-2^{-F}e^{-j\pi k}U_L(k)| >> |S'_{2's\ complement}(k)|$ for small odd frequency indices (i.e., k=3, 5, 7, . . . ), therefore $|S'_{1's\ complement}(k)|$ for such k will most likely be overwhelmingly dominated by $|-2^{-F}e^{-j\pi k}U_L(k)|$ even under the best case conditions (i.e., in the case of the largest spurs of $S'_{2's\ complement}(k)$ residing at small odd frequency indices and combining destructively with $-2^{-F}e^{-j\pi k}U_L(k)$).

Since the error sequence $u_L(n)$ due to the 1's complement conditional negate given in (5.7) preserves its "box"-type shape relative to its length for all values of L, and since, for fcw having L≦W (i.e., in the absence of phase truncation) the RMF output corresponds to some sub-sequence of the signature sequence, one concludes that the impact of 1's complement conditional negate on spectra $S_{1's\ complement}(k)$ corresponding to any fcw with L≦W will be severely degrading similar to its impact on the signature sequence spectra $S'_{1's\ complement}(k)$ discussed earlier. For fcw having L>W (i.e., in the presence of phase truncation), the spectra $S_{1's\ complement}(k)$ can be generated from signature sequence spectra $S'_{1's\ complement}(k)$ and the windowing function V using (3.4). In the construction of $S_{1's\ complement}(k)$ by concatenation of $2^B$ copies of $S'_{1's\ complement}(k)$ and windowing them by the windowing function V, the large-magnitude spurs in $S'_{1's\ complement}(k)$ may be greatly attenuated by the windowing function V if their locations are near the nulls of the windowing function. Unfortunately, the DC component and the large-magnitude spurs from the first copy (i.e., near the origin) of $S'_{1's\ complement}(k)$ correspond to the locations where the windowing function offers the least attenuation. In fact, the DC component, relative to the main components, is increased by the windowing function. This can be seen from the definition of the windowing function in (3.4) and the illustration of FIG. 16 and FIG. 19. The spur characterization method of Section 3.7 was used to compute the worst three spurs and their locations for a DDS using a 1's complement conditional negate block and 2's complement conditional negate block following the RMF with W=15, F=13, and having the structure of FIG. 36a. The results are in Table 5.6 and Table 5.7.

In Table 5.6, which corresponds to a DDS using a 1's complement conditional negation, the very large DC spur sets the output SFDR for all L. Notice the accuracy of (5.22) for the computation of DC spur magnitude. For L<W, the spurs with largest magnitudes are searched over all possible $2^T$ initial phase conditions. Therefore, the spur with largest magnitude, the spur with second largest magnitude, and the spur with third largest magnitude may correspond to different initial phase conditions. One sees from Table 5.6, for example, that for L=4 or L=5, the second and third spur with largest magnitudes are both at k=3. Similar behavior is found for L=7 and L=8. These are spurs from different initial phase conditions. For L≧W, where there are no multiple initial conditions to be considered, this behavior is absent. In addition, one notes that for L>6, and even for all L, with a single exception, the second and third largest-magnitude

TABLE 5.6

The three largest-magnitude spurs, their indices, and SNR for DDS with W = 15, F = 11, and 1's complement conditional negate following the RMF.

| L | Magnitude of the largest spur in dBc (−SFDR) | Index k of the largest spur | Magnitude of the 2nd largest spur in dBc | Index k of the 2nd largest spur | Magnitude of the 3rd largest spur in dBc | Index k of the 3rd largest spur | SNR |
|---|---|---|---|---|---|---|---|
| 2 | −66.23 | 0 | −inf | NA | −inf | NA | 69.24 |
| 3 | −66.23 | 0 | −67.94 | 3 | −inf | NA | 65.53 |
| 4 | −66.23 | 0 | −69.91 | 3 | −73.28 | 3 | 65.99 |
| 5 | −66.23 | 0 | −72.13 | 3 | −75.17 | 3 | 66.49 |
| 6 | −66.23 | 0 | −74.27 | 5 | −76.79 | 21 | 66.83 |
| 7 | −66.23 | 0 | −75.34 | 5 | −79.04 | 5 | 66.98 |
| 8 | −66.23 | 0 | −76.77 | 3 | −79.94 | 3 | 67.09 |
| 9 | −66.23 | 0 | −78.04 | 3 | −81.41 | 5 | 67.17 |
| 10 | −66.23 | 0 | −78.91 | 3 | −82.33 | 5 | 67.31 |
| 11 | −66.23 | 0 | −79.25 | 3 | −82.87 | 5 | 67.35 |
| 12 | −66.23 | 0 | −79.40 | 3 | −82.88 | 5 | 67.41 |
| 13 | −66.23 | 0 | −79.54 | 3 | −83.91 | 5 | 67.41 |
| 14 | −66.23 | 0 | −79.60 | 3 | −83.91 | 5 | 67.42 |
| 15 | −66.23 | 0 | −79.71 | 3 | −83.98 | 5 | 67.42 |
| 16 | −66.23 | 0 | −79.71 | 3 | −83.98 | 5 | 67.37 |
| 17 | −66.23 | 0 | −79.71 | 3 | −83.98 | 5 | 67.35 |
| 18 | −66.23 | 0 | −79.71 | 3 | −83.98 | 5 | 67.35 |
| 19 | −66.23 | 0 | −79.71 | 3 | −83.98 | 5 | 67.35 |
| 20 | −66.23 | 0 | −79.71 | 3 | −83.98 | 5 | 67.35 |
| 21 | −66.23 | 0 | −79.71 | 3 | −83.98 | 5 | 67.35 |
| L > 21 | −66.23 | 0 | −79.71 | 3 | −83.98 | 5 | 67.35 |

TABLE 5.7

The three largest-magnitude spurs, their indices, and SNR for DDS with W = 15, F = 11, and 2's complement conditional negate following the RMF.

| L | Magnitude of the largest spur in dBc (−SFDR) | Index k of the largest spur | Magnitude of the 2nd largest spur in dBc | Index k of the 2nd largest spur | Magnitude of the 3rd largest spur in dBc | Index k of the 3rd largest spur | SNR |
|---|---|---|---|---|---|---|---|
| 2 | −inf | NA | −inf | NA | −inf | NA | +inf |
| 3 | −70.74 | 3 | −inf | NA | −inf | NA | 70.74 |
| 4 | −72.33 | 5 | −75.32 | 7 | −78.32 | 7 | 71.23 |
| 5 | −74.06 | 11 | −77.56 | 11 | −79.17 | 7 | 72.44 |
| 6 | −77.05 | 21 | −79.14 | 23 | −80.78 | 7 | 72.63 |
| 7 | −79.25 | 5 | −81.86 | 43 | −82.43 | 25 | 73.30 |
| 8 | −82.15 | 21 | −82.94 | 113 | −85.21 | 19 | 73.31 |
| 9 | −84.99 | 157 | −86.51 | 21 | −87.41 | 41 | 73.48 |
| 10 | −87.21 | 471 | −88.83 | 159 | −89.61 | 461 | 73.71 |
| 11 | −90.80 | 517 | −90.94 | 133 | −91.76 | 563 | 73.70 |
| 12 | −93.55 | 161 | −93.60 | 191 | −94.19 | 517 | 73.88 |
| 13 | −95.12 | 3579 | −95.70 | 3763 | −96.04 | 3513 | 73.98 |
| 14 | −97.83 | 3849 | −98.35 | 7551 | −99.18 | 3605 | 74.03 |
| 15 | −100.06 | 12843 | −100.19 | 12851 | −100.48 | 12811 | 74.04 |
| 16 | −86.39 | 32767 | −101.82 | 12843 | −101.96 | 12851 | 73.79 |
| 17 | −89.40 | 32767 | −89.40 | 32769 | −92.41 | 65535 | 73.73 |
| 18 | −90.08 | 32767 | −90.08 | 32769 | −95.42 | 65535 | 73.72 |
| 19 | −90.25 | 32767 | −90.25 | 32769 | −96.11 | 65535 | 73.72 |
| 20 | −90.29 | 32767 | −90.30 | 32769 | −96.27 | 65535 | 73.71 |
| 21 | −90.31 | 32767 | −90.31 | 32769 | −96.32 | 65535 | 73.71 |
| L > 21 | −90.31 | 32767 | −90.31 | 32769 | −96.33 | 65535 | 73.71 | spurs are, as expected from the earlier discussion, at indices k=3 and k=5. Furthermore, for L>8 the indices of three spurs with largest magnitudes are k=0, 3, 5 in the order of decreasing magnitude, which is exactly what one expects, and their magnitudes relative to the main components are well approximated by (5.22) for k=0 and (5.25) for k=3,5 (also refer to Table 5.5). Finally, comparing the results between Table 5.6 and Table 5.7, one concludes that the 1's complement conditional negate may have a severe impact on the spectral quality of DDS output, generating undesirable large-magnitude spurs, hence adversely impacting the SFDR. The SFDR, for typical values of F, will most likely be set by the very-large-magnitude DC spur, while the increased spur magnitudes at DC and other locations, collectively, have an adverse impact on the SNR.

The impact of a 1's complement conditional negate following the RMF on the DDS output SNR can be studied more carefully using the methods discussed in Section 4. In particular, the SNR asymptotes can be computed using the method of Section 4.5 applied to the DDS output sequence (5.6). As discussed in Section 4.5, the quantization and approximation error, q(n) in (3.14), at the output of the RMF can be accurately modeled as a uniformly-distributed random process in the range $$\left[-\frac{2^{-F}}{2}, \frac{2^{-F}}{2}\right].$$

To obtain the large-W asymptotes, using (5.6) and (3.14) one first considers $$\sum_{n=0}^{2^W-1} |S'_{1,s}(n)|^2 = \sum_{n=0}^{2^W-1} (S'_{2,s}(n) - 2^{-F} u_W(n - 2^{W-1}))^2 \quad (5.26)$$

$$= \sum_{n=0}^{2^W-1} \left(\sin\left(\frac{2\pi n}{2^W}\right) + q(n) - 2^{-F} u_W(n - 2^{W-1})\right)^2$$

$$= \sum_{n=0}^{2^W-1} \left(\sin^2\left(\frac{2\pi n}{2^W}\right) + q^2(n) + 2^{-2F} u_W^2(n - 2^{W-1}) + \right.$$

$$2\sin\left(\frac{2\pi n}{2^W}\right)q(n) - 2\sin\left(\frac{2\pi n}{2^W}\right)2^{-F} u_W(n - 2^{W-1}) -$$

$$2q(n)2^{-F} u_W(n - 2^{W-1}))$$

where the subscripts 1's and 2's are abbreviated versions of the subscripts in (5.6). Since q(n) is a well-defined probability distribution (i.e., uniform) and since it is uncorrelated with $$\sin\left(\frac{2\pi n}{2^W}\right)$$

and $u_w(n-2^{W-1})$), the expression (5.26) can be simplified by use of the expectation operator E. The error sequence q(n) has zero mean, hence E (q(n))=0 and from its uniform distribution one obtains $$E(q^2(n)) = \frac{2^{-2F}}{12}.$$

Applying the expectation operator to (5.26) one obtains:

$$\sum_{n=0}^{2^W-1} |s'_{1,s}(n)|^2 = \sum_{n=0}^{2^W-1} E\left(\sin^2\left(\frac{2\pi n}{2^W}\right) + q^2(n) - 2^{-2F} u_W^2(n - 2^{W-1}) + \right. \quad (5.27)$$

$$2\sin\left(\frac{2\pi n}{2^W}\right)q(n) - 2\sin\left(\frac{2\pi n}{2^W}\right)2^{-F} u_W(n - 2^{W-1}) -$$

$$2q(n)2^{-F} u_W(n - 2^{W-1}))$$

$$= \sum_{n=0}^{2^W-1} \left[E\left(\sin^2\left(\frac{2\pi n}{2^W}\right)\right) + E(q^2(n)) + \right.$$

$$2^{-2F} E(u_W^2(n - 2^{W-1})) +$$

$$2E\left(\sin\frac{2\pi n}{2^W}\right)E(q(n)) -$$

$$2^{-F+1} E\left(\sin\left(\frac{2\pi n}{2^W}\right)u_W(n - 2^{W-1})\right) -$$

$$2^{-F+1} E(q(n))E(u_W(n - 2^{W-1}))]$$

$$= \sum_{n=0}^{2^W-1} \sin^2\left(\frac{2\pi n}{2^W}\right) + \sum_{n=0}^{2^W-1} E(q^2(n)) +$$

$$2^{-2F} \sum_{n=0}^{2^W-1} u_W^2(n - 2^{W-1}) -$$

$$2^{-F+1} \sum_{n=0}^{2^W-1} \sin\left(\frac{2\pi n}{2^W}\right)u_W(n - 2^{W-1})$$

$$= 2^{W-1} + 2^W \frac{2^{-2F}}{12} + 2^{-2F} \sum_{n=2^{W-1}}^{2^W-1} 1 -$$

$$2^{-F+1} \sum_{n=0}^{2^W-1} \sin\left(\frac{2\pi n}{2^W}\right)u_W(n - 2^{W-1})$$

$$= 2^{W-1} + 2^W \frac{2^{-2F}}{12} + 2^{-2F} 2^{W-1} + 2^{-F+1} \cot\frac{\pi}{2^W}$$

where $$\sum_{n=0}^{2^W-1} \sin\left(\frac{2\pi n}{2^W}\right)u_W(n - 2^{W-1}) = -\cot\frac{\pi}{2^W}.$$

Proof of $$\sum_{n=0}^{2^W-1} \sin\left(\frac{2\pi n}{2^W}\right)u_W(n - 2^{W-1}) = -\cot\frac{\pi}{2^W}$$

Proof: Let $$x(n) = \sin\left(\frac{2\pi n}{2^W}\right)$$

and $y(n)=u_w(n-2^{W-1}) y^*(n)$. Both x(n) and y(n) have a period of $2^W$ samples (refer to (5.7) for the definition of y(n)). The $2^W$-point DFT of x(n) is $$X(k) = \frac{1}{2j}(2^W \delta(k - 1) - 2^W \delta(k - (2^W - 1))) \quad (C.1)$$

as shown in the derivation process of (3.5) in Section 3.2. The $2^W$-point DFT of y(n) is obtained from the DFT shift property, $$DFT\{z(n-l)_N\} \to Z(k)e^{-j\frac{2\pi kl}{N}}$$

[16] (where N is the period of the sequence z), applied to the $2^W$-point DFT of $u_w(n)$ given by (5.11) where W=L. The result is $$Y(k) = \frac{\sin\frac{\pi k}{2}}{\sin\frac{\pi k}{2^W}} e^{-j\frac{\pi k}{2}} e^{j\frac{\pi k}{2^W}} e^{-j\pi k}. \qquad (C.2)$$

Applying Parseval's theorem $$\sum_{n=0}^{2^W-1} x(n)y^*(n) = \frac{1}{2^W}\sum_{n=0}^{2^W-1} X(k)Y^*(k)$$

[16] and substituting (C.1) and $$Y^*(k) = \frac{\sin\frac{\pi k}{2}}{\sin\frac{\pi k}{2^W}} e^{j\frac{\pi k}{2}} e^{-j\frac{\pi k}{2^W}} e^{j\pi k}$$

obtained from (C.2), one gets $$\sum_{n=0}^{2^W-1}\sin\left(\frac{2\pi n}{2^W}\right)u_W(n-2^{W-1}) = \qquad (C.3)$$

$$\sum_{k=0}^{2^W-1}\left(\left(\frac{1}{2j}\delta(k-1) - \frac{1}{2j}\delta(k-(2^W-1))\right)\frac{\sin\frac{\pi k}{2}}{\sin\frac{\pi k}{2^W}} e^{j\frac{\pi k}{2}} e^{-j\frac{\pi k}{2^W}} e^{j\pi k}\right) =$$

-continued $$\frac{1}{2j}\underbrace{\frac{\sin\frac{\pi}{2}}{\sin\frac{\pi}{2^W}}}_{\csc\frac{\pi}{2^W}} e^{j\frac{\pi}{2}} e^{-j\frac{\pi}{2^W}} \frac{e^{j\pi}}{-1} -$$

$$\frac{1}{2j}\frac{\sin\frac{\pi(2^W-1)}{2}}{\sin\frac{\pi(2^W-1)}{2^W}} \underbrace{\frac{e^{j\frac{\pi(2^W-1)}{2}}}{-j}}_{-j} \underbrace{\frac{e^{-j\frac{\pi(2^W-1)}{2^W}}}{-e^{-j\frac{\pi}{2^W}}}} \frac{e^{j\pi(2^W-1)}}{-1} =$$

$$-\frac{1}{2}\csc\frac{\pi}{2^W} e^{-j\frac{\pi}{2^W}} + \frac{1}{2}\frac{\sin\frac{\pi(2^W-1)}{2}}{\sin\frac{\pi(2^W-1)}{2^W}} e^{j\frac{\pi}{2^W}}.$$

Further simplifying (C.3) by using $$\sin\frac{\pi(2^W-1)}{2} = \sin\left(2\pi 2^{(W-2)} - \frac{\pi}{2}\right) = -\sin\frac{\pi}{2} = -1$$

and $$\sin\frac{\pi(2^W-1)}{2^W} = \sin\left(\pi - \frac{\pi}{2^W}\right) = \sin\frac{\pi}{2^W}$$

yields the desired result $$\sum_{n=0}^{2^W-1}\sin\left(\frac{2\pi n}{2^W}\right)u_W(n-2^{W-1}) = -\frac{1}{2}\csc\frac{\pi}{2^W}e^{-j\frac{\pi}{2^W}} - \frac{1}{2}\csc\frac{\pi}{2^W}e^{j\frac{\pi}{2^W}}$$

$$= -\csc\frac{\pi}{2^W}\left(\frac{1}{2}e^{-j\frac{\pi}{2^W}} + \frac{1}{2}e^{j\frac{\pi}{2^W}}\right)$$

$$= -\csc\frac{\pi}{2^W}\cos\frac{\pi}{2^W}$$

$$= -\cot\frac{\pi}{2^W}.\square$$

Substituting (5.19) and (5.27) into (4.17) one gets the SNR asymptote as a function of DDS output precision (i.e., number of fractional bits F):

$$SNR^{1's}_{asymptote} = 10\log_{10}\frac{\left(2^{(W-1)} + 2^{-F}\csc\frac{\pi}{2^W}\right)^2}{2^{(W-1)}\left(2^{(W-1)} + 2^W\frac{2^{-2F}}{12} + 2^{-2F}2^{(W-1)} + 2^{(-F+1)}\cot\frac{\pi}{2^W}\right) - \left(2^{(W-1)} + 2^{-F}\csc\frac{\pi}{2^W}\right)^2} \qquad (5.28)$$

$$= 10\log_{10}\frac{2^{(2W-2)} + 2^{(W-F)}\csc\frac{\pi}{2^W} + 2^{-2F}\csc^2\frac{\pi}{2^W}}{2^{(2W-2)} + 2^{(2W-1)}\frac{2^{-2b}}{12} + 2^{(2W-2F-2)} + 2^{(W-F)}\cot\frac{\pi}{2^W} - \left(2^{(2W-2)} + 2^{(W-F)}\csc\frac{\pi}{2^W} + 2^{-2F}\csc^2\frac{\pi}{2^W}\right)}$$

-continued
$$= 10\ \log_{10} \frac{2^{(2W-2)} + 2^{(W-F)}\csc\frac{\pi}{2^W} + 2^{-2F}\csc^2\frac{\pi}{2^W}}{2^{(2W-1)}\frac{2^{-2b}}{12} + 2^{(2W-2F-2)} + 2^{(W-F)}\cot\frac{\pi}{2^W} - 2^{(W-F)}\csc\frac{\pi}{2^W} - 2^{-2F}\csc^2\frac{\pi}{2^W}}.$$

Since typically $$W > 5, \cot\frac{\pi}{2^W} \approx \csc\frac{\pi}{2^W}$$

and $$\csc\frac{\pi}{2^W} \approx \frac{2^W}{\pi}.$$

Applying these approximations to (5.28) one obtains $$SNR_{asymptote}^{1's} \approx 10\ \log_{10} \frac{2^{(2W-2)} + 2^{(W-F)}\frac{2^W}{\pi} + \frac{2^{(2W-2F)}}{\pi^2}}{2^{(2W-1)}\frac{2^{-2F}}{12} + 2^{(2W-2F-2)} - \frac{2^{(2W-2F)}}{\pi^2}}$$

$$= 10\ \log_{10} \frac{1 + 2\frac{2(-F+1)}{\pi} + \left(\frac{2^{(-F+1)}}{\pi}\right)^2}{\frac{2^{-2F}}{6} + 2^{-2F} - \frac{2^{(-2F+2)}}{\pi^2}} = 10\ \log_{10} \frac{\left(1 + \frac{2^{(-F+1)}}{\pi}\right)^2}{2^{-2F}\left(\frac{7}{6} - \frac{4}{\pi^2}\right)}$$

$$= 20\ \log_{10}\left(1 + \frac{2^{(-F+1)}}{\pi}\right) - 10\ \log_{10}\left(\frac{7}{6} - \frac{4}{\pi^2}\right) + 20F\ \log_{10}2.$$

(5.29)

Finally, for typical values of $$F > 5, 20\log_{10}\left(1 + \frac{2^{(-F+1)}}{\pi}\right) < 0.1\ \text{dB}$$

and can be omitted from (5.29) to produce $$SNR_{asymptote}^{1's} \approx 1.18 + 6.02F\ \text{dB}.$$

(5.30)

The SNR asymptote (5.30) holds for sine DDS, cosine DDS, and quadrature DDS. For a DDS with F=11, the SNR asymptote from (5.30) is 67.4 dB, which is very accurate when compared with the results of Table 5.6. Similarly, the SNR asymptote from (4.22), corresponding to 2's complement conditional negate block following the RMF, is 74 dB, which is again very consistent with the data of Table 5.7.

Figure 43:
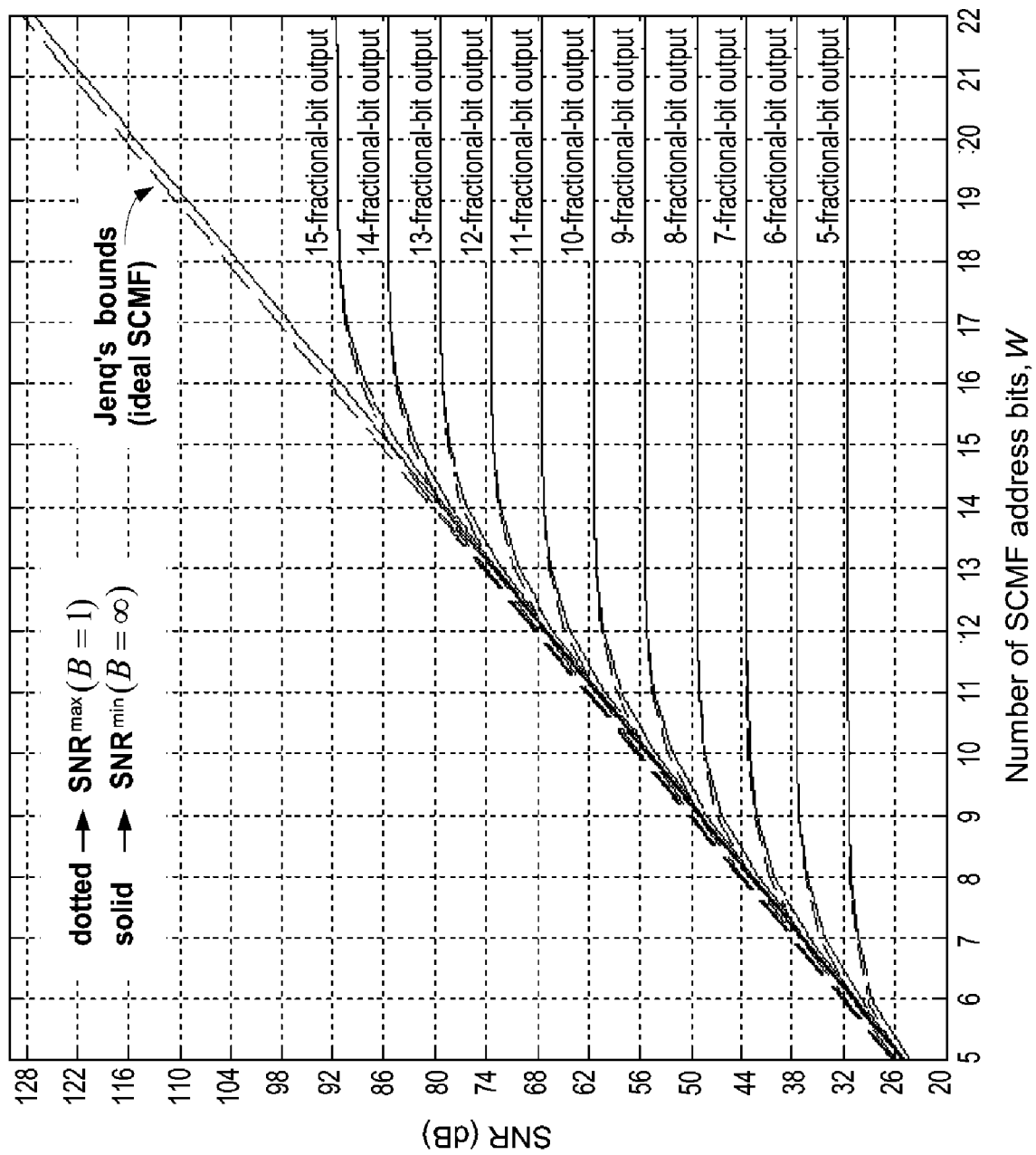
FIG. 43 is a plot of SNR curves for quadrature DDS using 1's complement conditional negate block following the RMF with various output precisions.

From (5.30) one concludes that, similar to (4.22), every additional output bit will raise the asymptote by approximately 6 dB. Furthermore, comparing (5.30) with (4.22) one concludes that a 1's complement conditional negate reduces the SNR asymptotes by 6.6 dB. Therefore, the SNR curves corresponding to 1's complement conditional negate would resemble the curves in FIG. 28 but with asymptotes that are 6.6 dB lower. To verify these conclusions and verify the asymptote expression (5.30), an exercise similar to the one in Section 4.4 that produced FIG. 28 was performed. Signature sequences cs'$_F$(n) with various output precisions 5≤F≤15 corresponding to a quadrature DDS implementation depicted in FIG. 5.7a with an RMF introducing only output rounding errors and a 1's complement conditional negate block following the RMF were produced. The plots for SNR bounds vs. the number of SCMF address bits W are easily generated by employing (4.11) and (4.12) with the various values of W and their corresponding signature sequences cs'$_F$(n). The results are illustrated in FIG. 43.

As seen from the curves in FIG. 543, the SNR asymptote expression (5.30) is very accurate and the curves resemble the curves in FIG. 28 with asymptotes that are 6.6 dB lower. Therefore, considering the substantial amount of reduction in SFDR, the reduction in SNR, and the reduced overall quality of the output spectrum, along with the small amount of additional hardware required to implement a 2's complement negation instead of a 1's complement negation, the choice of a 1's complement conditional negate block following the RMF appears not to be a desirable choice.

Efficient Discrete Fourier Transform for DDS Characterization 6.1 Matrix A and all Initial Phase Conditions Section 3.6 analyzes the characterization of DDS outputs corresponding to frequency control words having a rightmost nonzero bit positioned at or above location W, i.e. L≤W. As discussed in Section 3.6, the set of spurs for such fcw is obtained simply by computing the DFT of the SCMF output. The state of the phase accumulator register's MSB bits 1, . . . , W at the time when a new fcw is applied could be a factor in determining the output spurs, which could impact the output SFDR and SNR. Therefore, a complete characterization needs to account for all possible initial phase conditions, which could influence the DDS output spectra S(k), C(k), or CS(k), for sine DDS, cosine DDS, and quadrature DDS, respectively. For an fcw with its rightmost nonzero bit T bits above W, i.e. T=W−L>0, the DDS accesses every $2^T$-th entry in the SCMF starting at an initial point $\hat{\theta}_{initial}$ dictated by the state of the phase accumulator register at the time when this new fcw is applied. From Section 3.6 one learns that, by considering the $2^T$ initial points $0 \leq \hat{\theta}_{initial} < 2^T$ and by analyzing the DDS output spectra corresponding to these $2^T$ initial points, one completely characterizes the DDS performance for any initial condition. This complete characterization is accomplished by generating the $2^L \times 2^T$ matrix A obtained by arranging the entire $2^W$-point signature sequence s'(n), c(n), or cs(n), in a row-priority fashion. For notational simplicity, one can just use s'(n) to denote the signature sequence (which now represents c'(n) for cosine DDS and cs'(n) for quadrature DDS). The construction of A is such that the first $2^T$ elements of s'(n) constitute the first row of A, the next $2^T$ elements of s'(n) constitute the second row of A, and so forth until the last of the $2^L$ sets, which makes up the last row of A. The matrix A will contain all of the $2^W$ elements of s'(n) and will have the following special property: The first column of A is one period of the DDS output corresponding to the initial phase $\hat{\theta}_{initial}=0$, the second column is one period of the DDS output corresponding to $\hat{\theta}_{initial}=1$, and so on until the last column, corresponding to $\hat{\theta}_{initial}=2^T-1$. Therefore, by simply performing $2^L$-point DFTs on the columns of A one will obtain spectra for the fcw with L≦W associated with all $0 \leq \hat{\theta}_{initial} < 2^T-1$. FIGS. 3-13 illustrates the construction of A from s'(n) for W=8, L=2, and T=6, while FIG. 4-3 illustrates the construction of A from s'(n) for W=8, L=2, and T=5.

To evaluate the DDS performance for all fcw with L≦W, the construction of the matrix A and the computation of DFTs on the columns of A needs to be done W times, corresponding to all possible rightmost nonzero bit positions 1≦L≦W for all fcw generating no phase truncation. Step 1 of the spur characterization method of Section 3.7 and Step 1 of the SNR computation methods of Section 4.7 require the construction of A and the computation of DFTs on the columns of A for each value of 1≦L≦W. As expected, for L=W the matrix A collapses to a vector of length $2^W$ since it has a single column comprised of the entire signature sequence s'(n). Therefore, the construction of A and the computation of DFT on the column of A is equivalent to the computation of S'(k) (or C'(k) or CS'(k)), the DFT of the signature sequence s'(n) (or c'(n) or cs'(n)). S'(k) also appears in Step 2 of the spur characterization method of Section 3.7 and in Steps 2 and 3 of the SNR computation method of Section 4.7. From the method developed in Section 3, one knows that the spectra corresponding to an fcw with L>W (i.e., ones which generate phase truncation) are obtained from S'(k) and the windowing function V(k). Therefore, the computation of S'(k) (or C'(k) or CS'(k)) is an elementary operation common to both spur and SNR characterization methods of Sections 3.6 and 4.7. Using a small example with W=4, Section 6.3 illustrates a nested decimation-in-time Fast Fourier Transform (FFT) method for the computation of S'(k) where the results corresponding to the construction of the matrix A and the computation of the DFTs on the columns of A for all values of 1≦L≦W are obtained as intermediate results encountered during the computation of S'(k). Furthermore, the particular nested decimation-in-time method for the computation of S'(k) that generates all of the pertinent intermediate results is one which, from the standpoint of efficiency for computing S'(k) alone, is one of the most efficient FFT methods. In other words, if one wanted to compute just S'(k) (i.e., without being concerned with generating any useful intermediate results) in a computationally most efficient way, the nested decimation-in-time method would be a suitable choice. The absence of any inefficiencies in this overall computation of S'(k) with the simultaneous generation of all spectra corresponding to all relevant initial phase conditions and all fcw with 1≦L≦W as byproducts of intermediate results obtained from the S'(k) computation is an important point. The computational requirement for a complete DDS characterization for fcw with 1≦L≦W and for all corresponding initial phase conditions $0 \leq \hat{\theta}_{initial} \leq 2^T-1$ for each value of L, is equivalent to the computational requirement for a single $2^W$-point FFT (i.e., the computational requirement for computing S'(k), C'(k), or CS'(k)).

6.2 Decimation-in-Time FFT Method

Fast Fourier Transform (FFT) methods have been developed to efficiently compute a specific size DFT. In general, applications of a DFT require a single DFT operating on a specific input sequence and having a specific size (i.e., specific length such as a 512-point DFT). For such circumstances the objective is to obtain the required DFT outputs from the DFT input sequence in the most efficient manner. A wide range of FFT methods are available, allowing choices based on available computational and storage resources and system requirements such as throughput and computational accuracy. The construction of all matrices A and the computation of the DFTs on their columns is an atypical application for a DFT. It is atypical in the sense that numerous DFTs of various sizes are performed on the signature sequence and a large number of its subsequences (i.e., the various subsequences generated in the columns of numerous matrices A obtained from various values of 1≦L≦W). For such DFT applications it may be beneficial to choose FFT methods and devise computational strategies such as resource sharing among the various FFTs, if possible, to optimize the computation of all DFTs in a collective manner as opposed to performing all of the DFTs independently of one another and optimizing the computation of each DFT via a specific FFT method on an individual basis.

One begins the understanding of computing S'(k), the DFT of the signature sequence s'(n), in a manner which generates the spectra corresponding to all relevant initial phase conditions for all values of 1≦L≦W, with a brief review of the decimation-in-time FFT. Consider a length-N sequence x(n) and its DFT X(k) given by $$X(k) = \sum_{n=0}^{N-1} x(n) e^{-j\frac{2\pi}{N}kn}. \tag{6.1}$$

The direct computation of (6.1) requires N complex multiplications and N complex additions for each value of k. Therefore, the entire computation of X(k) requires $N^2$ complex multiplications and $N^2$ complex additions.

If N is not prime and can be written as the product of two integers R and C as $$N = R \times C \tag{6.2}$$

then the input sequence x(n), where 0≦n≦N, can be arranged in an R-by-C two-dimensional array (i.e., an R×C matrix) in a row-priority fashion as illustrated in FIG. 44. Notice that this arrangement of x(n) is similar to the arrangement of the signature sequence s'(n) in the matrix A. The first row of the R×C matrix will contain the first C elements of x(n) (i.e., x(n) for 0≦n≦C-1), the second row will contain the second set of C elements of x(n) (i.e., x(n) for C≦n≦2C-1), and so forth until the last (R-th) row, which will contain the R-th set of C elements of x(n) (i.e., x(n) for (R-1)C≦n≦RC-1). The C columns of the resulting matrix will contain the C subsequences $x_m(l)$ of x(n) where 0≦m≦C-1, 0≦l≦R-1 and $x_m(l)$ can be expressed in terms of x(n) as $$x_m(l) = x(Cl+m). \tag{6.3}$$

The arrangement of the one-dimensional x(n) into an R-by-C two-dimensional array via row-priority arrangement is an index mapping between the one-dimensional index n and the two-dimensional index pair (l, m) given by $$n = Cl + m. \tag{6.4}$$

The subsequences $x_m(l)$ can be obtained from x(n) via a decimation operation by picking every C-th element of x(n) (decimating by a factor of C) beginning at the initial point x(m). Furthermore, since x(n) (the input to the DFT) is typically a time-domain sequence, the resulting FFT method has been appropriately named a decimation-in-time FFT.

The one-dimensional DFT sequence X(k), where $0 \leq k \leq N-1$, can also be mapped into an R-by-C two-dimensional array. Consider the index mapping between the one-dimensional index k and the two-dimensional index pair (p, q), where $0 \leq p \leq R-1$ and $0 \leq q \leq C-1$, given by $$k = p + Rq. \tag{6.5}$$

This index mapping corresponds to an arrangement of X(k) in an R×C matrix in a column-priority fashion, as illustrated in FIG. 45. That is, the first column of the matrix will contain the first R elements of X(k) (i.e., X(k) for $0 \leq k \leq R-1$), the second column of the matrix will be comprised of the second set of R elements of X(k) (i.e., X(k) for $R \leq k \leq 2R-1$), and so forth until the last C-th column, which will contain the C-th set of R elements of X(k) (i.e., X(k) for $(C-1)R \leq k \leq CR-1$). The R rows of the resulting matrix will contain the R subsequences $X_p(q)$ of X(k) where $X_p(q)$ can be expressed in terms of X(k) as $$X_p(q) = X(p + Rq). \tag{6.6}$$

The DFT expression (6.1) can now be rewritten in terms of the subsequences $x_m(l)$ of (6.3) and using the index mapping of (6.4) for n. One obtains $$X(k) = \sum_{l=0}^{R-1} x_0(l) e^{-j\frac{2\pi}{N}k(Cl+0)} + \sum_{l=0}^{R-1} x_1(l) e^{-j\frac{2\pi}{N}k(Cl+1)} + \sum_{l=0}^{R-1} x_2(l) e^{-j\frac{2\pi}{N}k(Cl+2)} +$$

$$\sum_{l=0}^{R-1} x_3(l) e^{-j\frac{2\pi}{N}k(Cl+3)} + \ldots + \sum_{l=0}^{R-1} x_{C-1}(l) e^{-j\frac{2\pi}{N}k(Cl+C-1)}$$

which can be conveniently expressed as the following double summation $$X(k) = \sum_{m=0}^{C-1} \sum_{l=0}^{R-1} x_m(l) e^{-j\frac{2\pi}{N}k(Cl+m)}. \tag{6.7}$$

The complex exponential $$e^{-j\frac{2\pi}{N}k(Cl+m)}$$

in (6.7) can be expressed as the product of two exponentials $$e^{-j\frac{2\pi}{N}kCl} = e^{-j\frac{2\pi}{N}km}$$

and moving $$e^{-j\frac{2\pi}{N}km}$$

out of the inner summation over l in (6.7) while using (6.2) to simplify $$e^{-j\frac{2\pi}{N}kCl} = e^{-j\frac{2\pi}{R}kl}$$

one obtains $$X(k) = \sum_{m=0}^{C-1} e^{-j\frac{2\pi}{N}km} \sum_{l=0}^{R-1} x_m(l) e^{-j\frac{2\pi}{R}kl}. \tag{6.8}$$

Using the index mapping of (6.5) for k and the subsequences of X(k) given by (6.6) to rewrite (6.8), one obtains $$X_p(q) = \sum_{m=0}^{C-1} e^{-j\frac{2\pi}{N}(p+Rq)m} \sum_{l=0}^{R-1} x_m(l) e^{-j\frac{2\pi}{R}kl} \tag{6.9}$$

$$= \sum_{m=0}^{C-1} e^{-j\frac{2\pi}{N}pm} \left( \sum_{l=0}^{R-1} x_m(l) e^{-j\frac{2\pi}{R}kl} \right) e^{-j\frac{2\pi}{N}Rqm}.$$

And using (6.2) to simplify $$e^{-j\frac{2\pi}{N}Rqm} = e^{-j\frac{2\pi}{C}qm}$$

in (6.9) one obtains $$X_p(q) = \sum_{m=0}^{C-1} e^{-j\frac{2\pi}{N}pm} \left( \sum_{l=0}^{R-1} x_m(l) e^{-j\frac{2\pi}{R}kl} \right) e^{-j\frac{2\pi}{C}qm}. \tag{6.10}$$

Notice that the inner summation over l in (6.10) is the R-point DFT of the subsequence $x_m(l)$. In other words, it is the R-point DFT of the m-th column of the R×C matrix obtained by arranging the input sequence x(n) in a row-priority fashion. Furthermore, considering $$e^{-j\frac{2\pi}{N}pm} \left( \sum_{l=0}^{R-1} x_m(l) e^{-j\frac{2\pi}{R}kl} \right)$$

in (6.10) as an ordinary sequence of length C indexed by m, one observes that the outer summation over m in (6.10) is the C-point DFT of the sequence $$e^{-j\frac{2\pi}{N}pm}\left(\sum_{l=0}^{R-1} x_m(l)e^{-j\frac{2\pi}{R}kl}\right).$$

In summary, the decimation-in-time FFT method for the computation of an N-point DFT, where N can be expressed as the product N=R×C, and matrices A, B, C, and D are all R×C matrices, is as follows:

Outline for an N-point decimation-in-time FFT method (where N=R×C)

1. Construct A by arranging x(n) in A in a row-priority fashion.
2. Generate B by performing R-point DFTs on all columns of A.
3. Generate C by multiplying each element of B with index pair (p, m) by the complex exponential (often referred to as twiddle factors)

$$e^{-j\frac{2\pi}{N}pm}.$$

4. Generate D from C by performing C-point DFTs on all rows of C.
5. D will contain the entire X(k), where D(p, q)=X(p+Rq).

Figure 46:
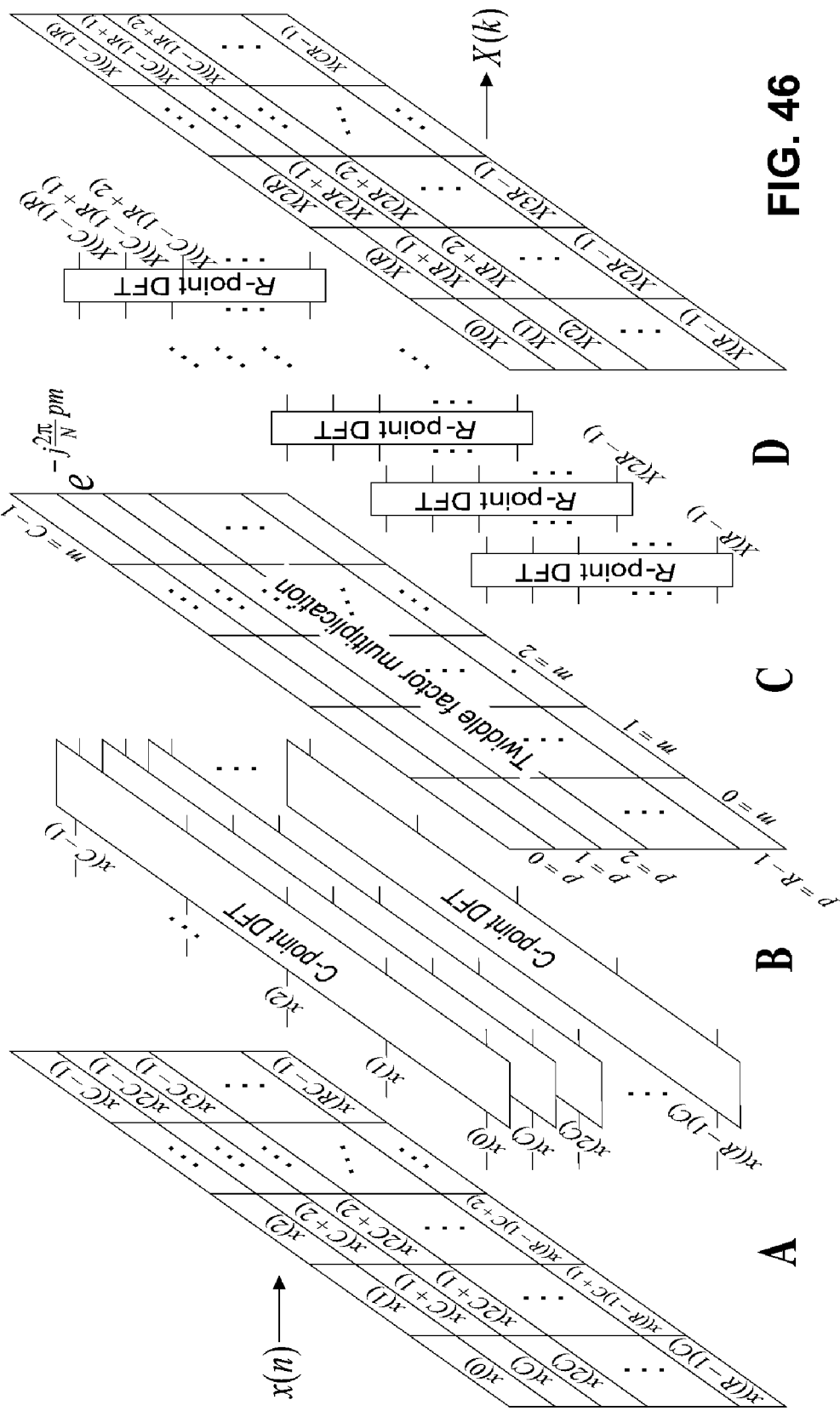
FIG. 46 is a diagram of a matrix of N-point decimation-in-time FFT algorithm.

FIG. 46 depicts the first four steps of the above decimation-in-time FFT method. Now one can estimate the complexity of the decimation-in-time method by counting the number of required complex multiplications and additions under the assumption that the DFTs on rows and columns of Step 2 and Step 4 are performed by the direct application of (6.1). Step 1 requires no multiplications or additions. Step 2 requires $CR^2$ multiplications and $CR^2$ additions. Step 3 requires N multiplications and Step 4 requires $RC^2$ multiplications and $RC^2$ additions. Step 5 is void of any multiplications or additions. Therefore, the total number of complex multiplications is $N+CR^2+RC^2$ and the total number of complex additions is $CR^2+RC^2$. Substituting (6.2) one obtains N(1+R+C) for the total number of complex multiplications and N(R+C) for the total number of complex additions. For typical values of N corresponding to the length of the signature sequence $N=2^W$, $N(R+C)<N(1+R+C)<<N^2$. For example, with $N=2^{14}$, R=2, and $C=2^{13}$, the number of complex multiplications and additions for the direct computation of (6.1) is $N^2=2^{28}=268,435,456$, while the decimation-in-time method requires N(1+R+C)=134,266,880 multiplications and N(R+C)=134,250,496 additions. The computational complexity, in this case, is reduced by approximately a factor of two. The complexity can be further reduced by applying the decimation-in-time method to the DFTs on the columns and DFTs on the rows of Step 2 and Step 4, when possible (i.e., when C and R can be further reduced as products of smaller integers).

6.3 Nested Decimation-in-Time FFT Method

Figure 47:
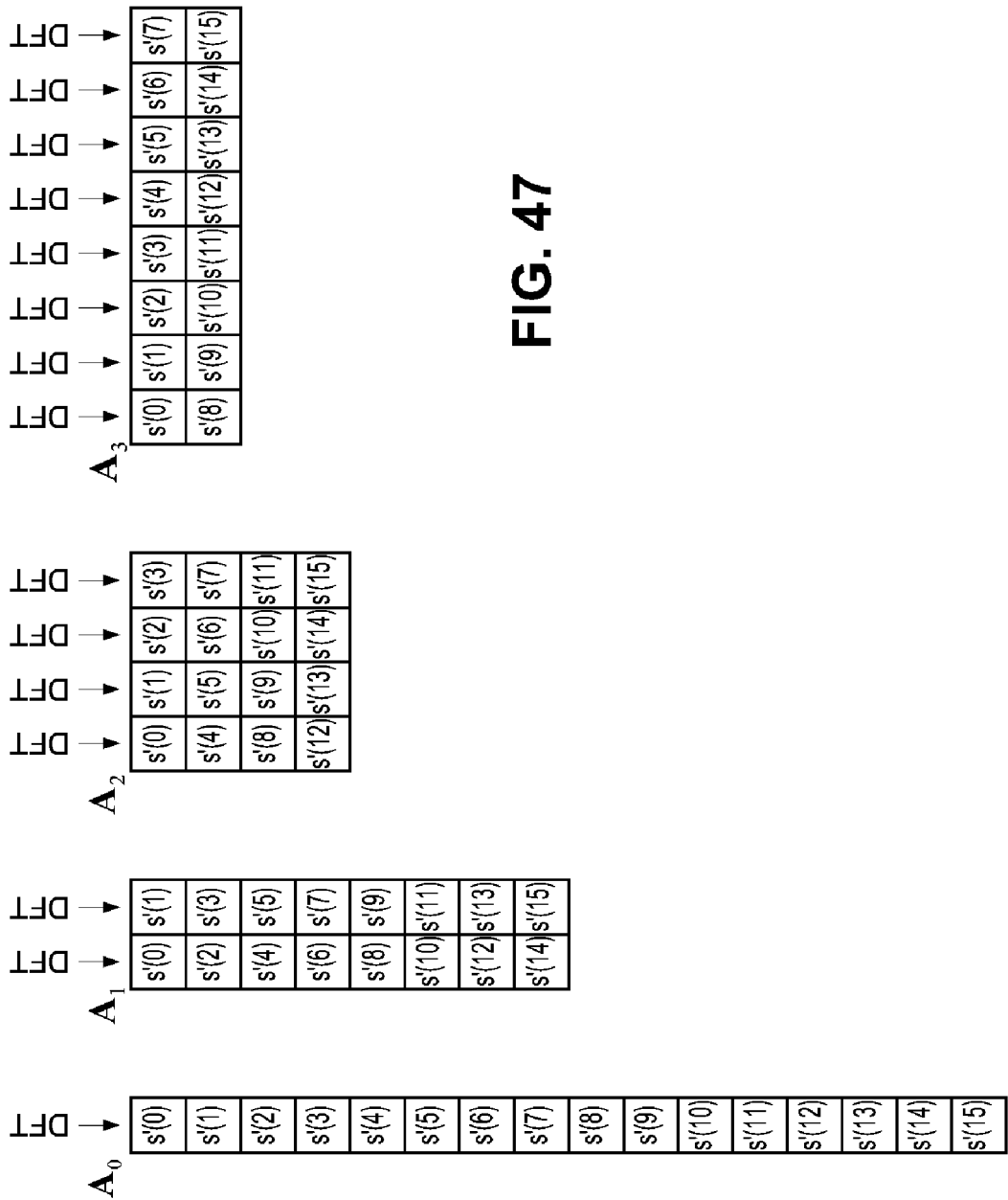
FIG. 47 is a diagram of all matrices $A_T$ and the DFTs for all initial conditions for W=4.

The DFT of the signature sequence s'(n) is very special since the length N in this case is $N=2^W$, and 2 is the only factor of N. This means that the decimation-in-time FFT of Section 6.2 can be applied recursively and the entire DFT computation can be done via 2-point DFTs and twiddle factor multiplications. To illustrate this recursive application of the decimation-in-time FFT and the simultaneous computation of all the DFTs corresponding to DDS output spectra for all fcw with L≦W and all initial conditions $0 \leq \theta_{initial} < 2^T$ (where T=W−L), as discussed in Section 3.6, consider a length N=16 signature sequence s'(n) (i.e., W=4) and its 16-point DFT S'(k). The matrices $A_T$ corresponding to the four values of T where 0≦T≦3 and the DFTs necessary on the columns of all $A_T$ are illustrated in FIG. 47.

Figure 48:
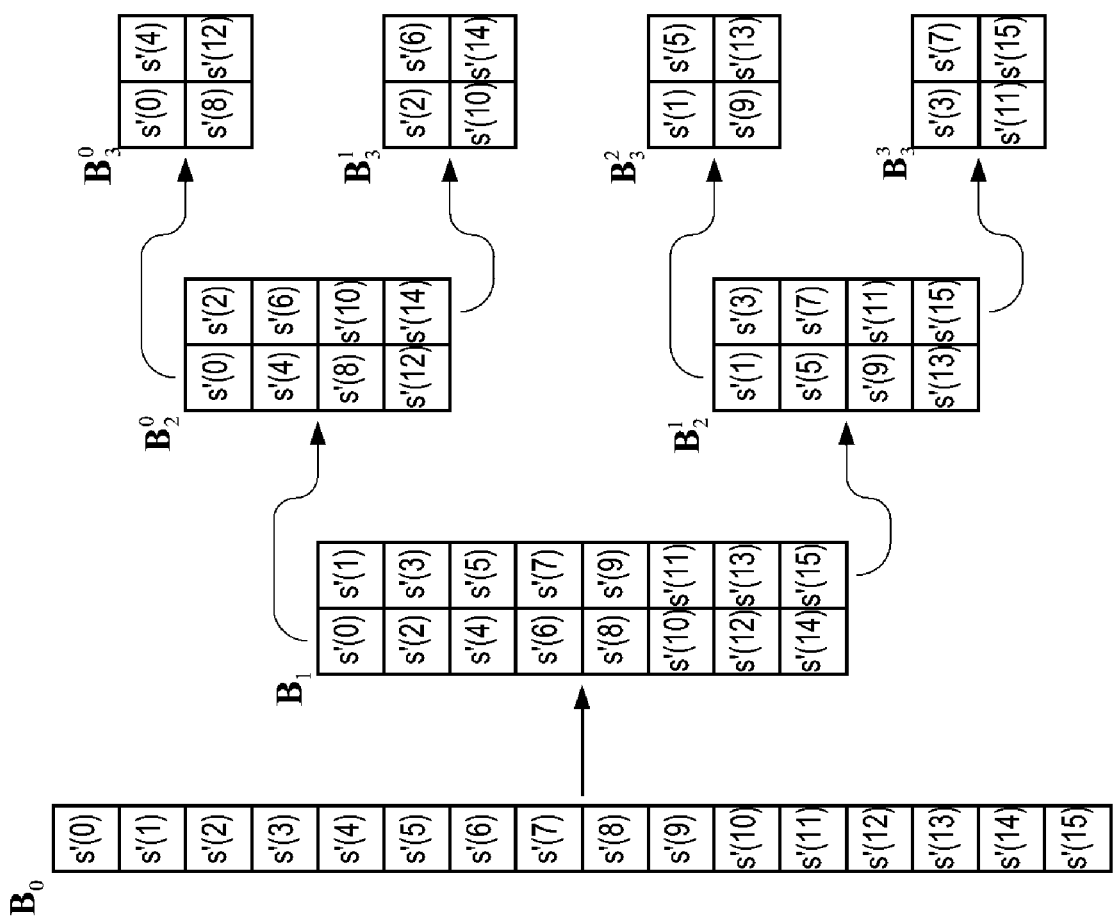
FIG. 48 is a diagram of a complete decomposition of the computation of S'(k) via nested decimation-in-time FFT algorithm.

Now apply the decimation-in-time FFT method for the computation of S'(k) by factoring 16 as the product of R=8 and C=2. The result will be an 8×2 matrix $B_1$ (from Step 1 of the decimation in time FFT), shown in FIG. 48, where 8-point DFTs are performed on the two columns (Step 2) of $B_1$ followed by $$e^{-j\frac{2\pi}{16}pm}$$

twiddle factor multiplication (Step 3) and computing 2-point DFTs on the eight rows of the matrix obtained following the twiddle factor multiplication. The computation of 8-point DFTs on the columns of $B_1$ can be done by applying the decimation-in-time FFT on each one of the 8-point DFTs by factoring 8 as the product R=4 and C=2. The result for each 8-point DFT will be a 4×2 matrix (from Step 1 of the decimation-in-time FFT), denoted as $B_2^0$ and $B_2^1$ in FIG. 48, where 4-point DFTs are performed on the two columns (Step 2) of $B_2^0$ and two columns of $B_2^1$, followed by $$e^{-j\frac{2\pi}{8}pm}$$

twiddle factor multiplication (Step 3) on both matrices, and computing 2-point DFTs on the four rows of both matrices obtained following the twiddle factor multiplication. Finally, the computation of 4-point DFTs on the columns of $B_2^0$ and $B_2^1$ can be done by applying the decimation-in-time FFT on each one of the 4-point DFTs by factoring 4 as the product R=2 and C=2. The result for each 4-point DFT will be a 2×2 matrix (from Step 1 of the decimation in time FFT), denoted as $B_3^0$, $B_3^1$, $B_3^2$, and $B_3^3$ in FIG. 48, where 2-point DFTs are performed on the two columns (Step 2) of $B_3^0$, $B_3^1$, $B_3^2$, and $B_3^3$, followed by $$e^{-j\frac{2\pi}{4}pm}$$

twiddle factor multiplication (Step 3) on all four matrices, and computing 2-point DFTs on the two rows of all four matrices obtained following the twiddle factor multiplication. The details of the described decomposition are depicted in FIG. 6-5.

In summary, the computation of S'(k) via the described nested decimation-in-time FFT approach (and depicted in FIGS. 6-5), is as follows:

1. Construct the matrices $B_3^0$, $B_3^1$, $B_3^2$, and $B_3^3$, and perform 2-point DFTs on their columns.
2. Perform twiddle factor multiplication by $$e^{-j\frac{2\pi}{4}pm}$$

on the resulting four matrices and compute 2-point DFTs on all the rows following the twiddle factor multiplication.

3. The results of Step 2 produce the DFTs of the columns of $B_2^0$ and $B_2^1$. Arrange them appropriately into two 4×2 matrices (see FIGS. 6-5).
4. Perform twiddle factor multiplication by $$e^{-j\frac{2\pi}{8}pm}$$

on the resulting two matrices and compute 2-point DFTs on all the rows following the twiddle factor multiplication.
5. The results of Step 4 produce the DFTs of the columns of $B_1$. Arrange them appropriately into an 8×2 matrix (see FIG. 6-5).
6. Perform twiddle factor multiplication by $$e^{-j\frac{2\pi}{16}pm}$$

on the resulting matrix and compute 2-point DFTs on all the rows following the twiddle factor multiplication.
7. The results of Step 6 produce the DFT of the column of $B_0$, which corresponds to S'(k). Arrange them appropriately into S'(k), an array of length 16.

Now examine the intermediate results obtained from the nested decimation-in-time FFT method, just described, with the assistance of FIGS. 6-4 and FIGS. 6-5. The computation of eight 2-point DFTs on the columns of $B_3^0$, $B_3^1$, $B_3^2$, and $B_3^3$ in Step 1 above produces all of the DFTs on the columns of $A_3$ in FIGS. 6-4, which corresponds to the DDS output spectra for an fcw with L=1 and all 23 initial conditions. Step 3 from above produces all of the DFTs on the columns of $A_2$ in FIGS. 6-4, which corresponds to the DDS output spectra for an fcw with L=2 and all 22 initial conditions. Similarly, Step 5 produces all of the DFTs on the columns of $A_1$ in FIGS. 6-4, which corresponds to the DDS output spectra for an fcw with L=3 and both initial conditions. Finally, Step 7 produces the DFT of the column of $A_0$ in FIGS. 6-4, which corresponds to the DDS output spectrum for an fcw with L=4, this is also the DFT of the signature sequence S'(k).

The efficient nested decimation-in-time FFT method described above can be applied to the computation of the DFT for arbitrary length-$2^W$ signature sequences in a similar fashion. The intermediate results, as illustrated, will correspond to DDS output spectra for all fcw having L≦W, and all $2^T$ relevant initial conditions for each value of L. As the intermediate results provide the DFTs of the columns of matrices A corresponding to the various values of L and all $2^T$ initial conditions, the SNR for each column can be computed via (4.28) for sine DDS and cosine DDS and via (4.29) for quadrature DDS. Similarly, since the DFTs of the columns of matrices A become available as intermediate results of the nested decimation-in-time FFT method, the SFDR for each initial condition (i.e., each column of A) can be computed using (4.30) or (4.31) for cosine DDS or sine DDS, respectively, and via (4.32) for quadrature DDS.

DDFS Characterization and Design Methods 7.1 DDS Analysis Methods

The DDS analysis methods can be categorized as follows. There are three types of DDS. A DDS generating only a sine output is referred to as a sine DDS, a DDS generating only a cosine output is referred to as a cosine DDS, and a DDS generating both sine and cosine outputs is referred to as a quadrature DDS. The analysis methods for all three types of DDS are similar but not identical. In building analysis tools that implement the novel methods disclosed above, it should be noted that some functional blocks necessary for the analysis of all three types of DDS are identical and some require slightly different types of operations. For example, for a sine DDS one of ordinary skill in the art will appreciate that an index-updating engine may require different updating mechanism when compared to the one required for a quadrature DDS.

In developing the DDS analysis tools one should consider that analysis can be broken down into two categories. The first category applies to DDS input fcw that are free from phase truncation and a second category which applies to DDS input fcw that generate phase truncation.

Finally, DDS analysis can also be categorized in terms of two kinds of DDS performance metrics. The first category applies to DDS spur and spurious free dynamic range analysis. The second category applies to DDS signal-to-noise ratio analysis.

The following are examples of possible analysis tools that may be constructed using the various invented analysis methods for the cases devised from the individual categories described above. However, those skilled in the art will appreciate that the methods described above are not limited to those described below and other combinations are possible.

Figure 49:
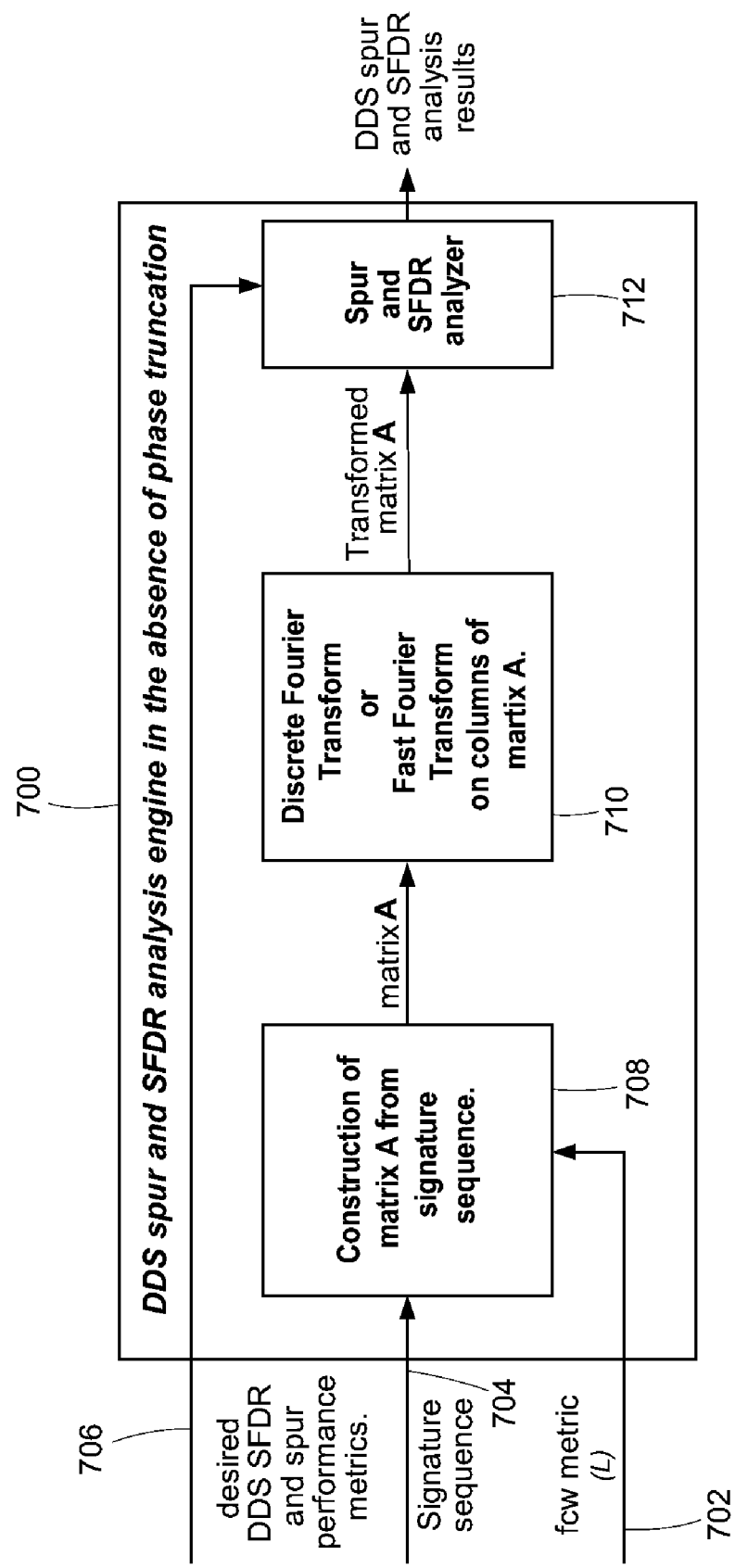
FIG. 49 is a block diagram for DDS spur and SFDR (spurious free dynamic range) analysis for fcw generating output(s) unaffected by phase truncation.

With reference to FIG. 49, a DDS spur and SFDR (spurious free dynamic range) analysis engine 700 for fcw generating output(s) unaffected by phase truncation is described. This engine 700 can be applied to sine DDS, cosine DDS, and quadrature DDS in accordance with the methods described above in which inputs are received including a few metric 702, signature sequence 704, and analysis metrics 706. A logic engine 708 constructs matrix A from the signature sequence 704 and fcw metric 702. Matrix A data is fed into a transformer 710 for processing by a Fourier transform in accordance with the discussions above. The transformed matrix A is fed into an analyzer 712 for spur and SFDR analysis and the results are then output.

Figure 50:
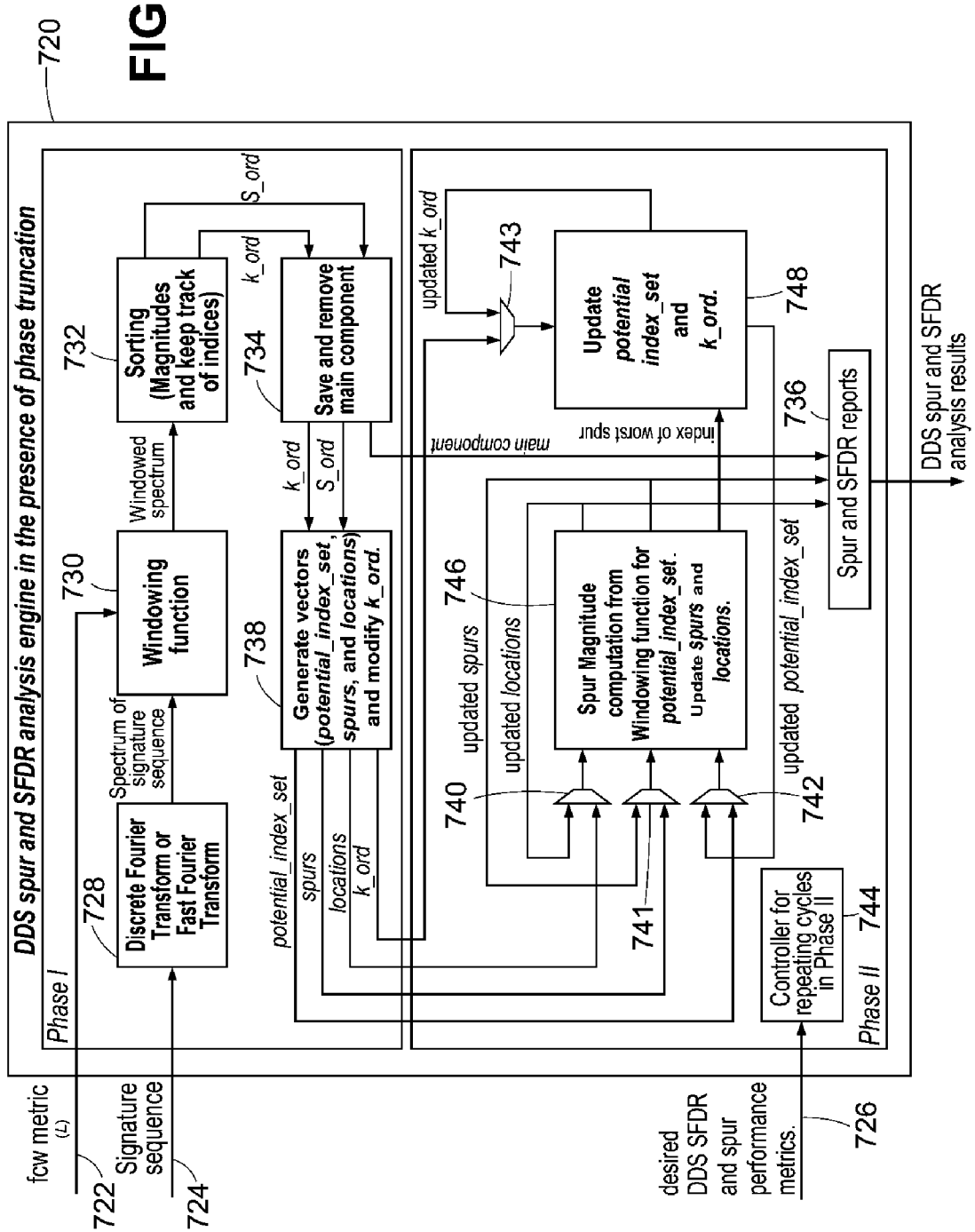
FIG. 50 is a block diagram for DDS spur and SFDR (spurious free dynamic range) analysis for fcw generating output(s) affected by phase truncation.

With reference to FIG. 50, a DDS spur and SFDR analysis engine 720 for fcw generating output(s) affected by phase truncation. This engine 720 can be applied to sine DDS, cosine DDS and quadrature DDS in accordance with the methods described above in which inputs are received including a fcw metric 722, signature sequence 724 and analysis metrics 726. A transformer 728 receives the signature sequence 724 and processes a Fourier transform on the data in accordance with the discussions above. The output of the transformer is fed along with the fcw metric 722 to a windowing engine 730 which uses the transformed signature sequence to obtain a windowed spectrum from the fcw metric. The windowed spectrum of data is in turn fed into a sorting engine 732 that in turn generates k_ord and s_ord. A filter 734 saves and removes the main component which is sent to a report engine 736. The filtered k_ord and s_ord are sent to a vectoring generator 738. The transformer 728, windowing engine 730, the sorting engine 732, filter 734 and vectoring generator 738 define the basic functional elements that make up a Phase I analysis discussed earlier in the application. The output of the vectoring generator is fed in gates 740-743 under the controller a controller 744. The gates 740-742 ensure data is cycled in to a spur magnitude generator 746 in which the initial input, including potential index set data, spur data and locations data is received from the vectoring generator 738. Subsequent inputs are fed back from the output of the spur magnitude generator 746. Additionally, k_ord output from the vectoring generator 738 is received by gate 743 for entering k_ord date into an index updater 748 which also receives potential index set updates from the spur magnitude generator. The updater 748 produces revised k_ord and index information which is fed back into the updater 748 and the spur magnitude generator 746. The controller cycles the data through the spur magnitude generator and updater until an analysis is completed. Then the output of the spur generator is combined with the main component data from the filter at the reporting engine 736. It will be appreciated that the reporting engine 736 may be configured to report the analysis results at the end of the phase II cycles or during each subsequent cycle. The controller 744, gates 740-743, spur magnitude controller 746 and updater 748 define the basic functional elements that make up a phase II analysis discussed earlier in the application.

Figure 51:
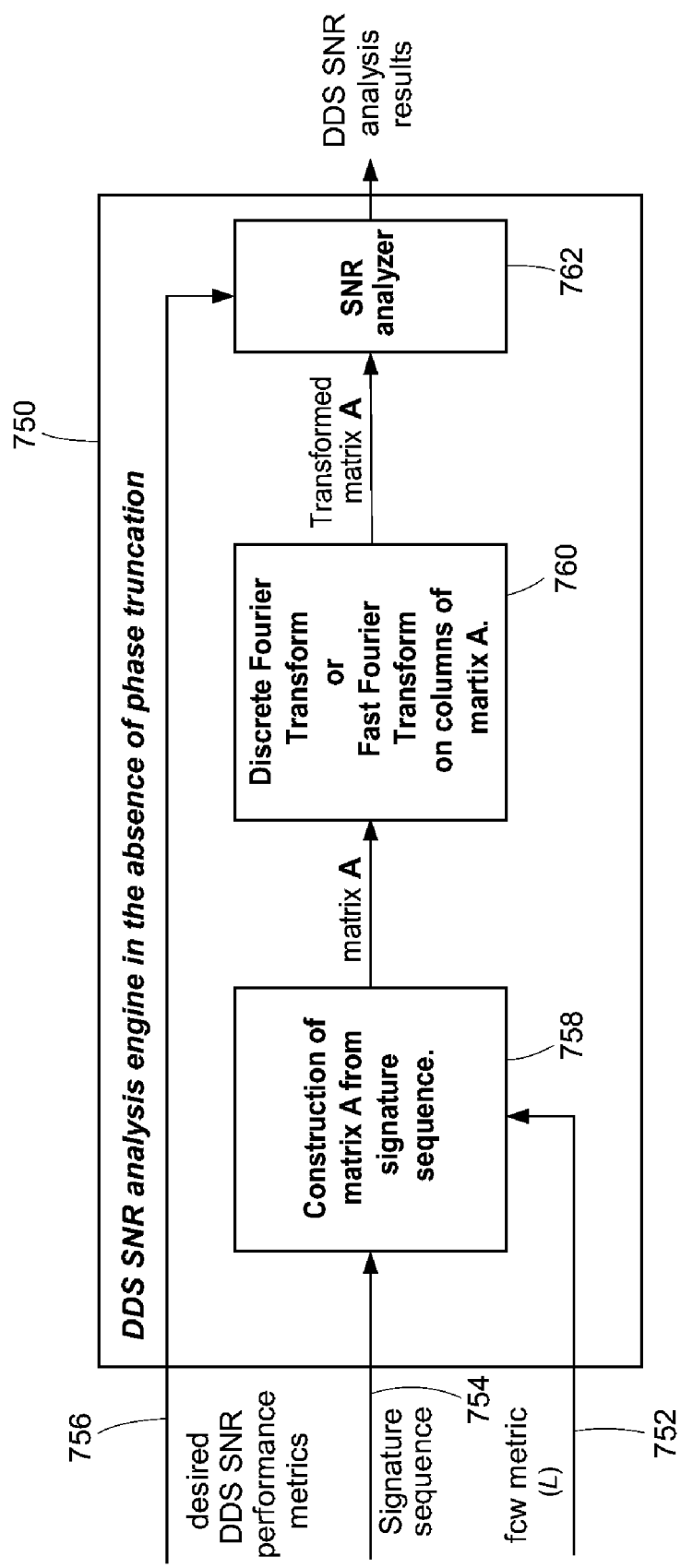
FIG. 51 is a block diagram for DDS signal-to-noise ratio (SNR) analysis for fcw generating output(s) unaffected by phase truncation.

A DDS signal-to-noise ratio (SNR) analysis engine 750 for fcw generating output(s) unaffected by phase truncation, illustrated by FIG. 51, receives inputs including a fcw metric 752, signature sequence 754, and analysis metrics 756. This engine 750 diagram can be applied to sine DDS, cosine DDS, and quadrature DDS in accordance with the methods described above. A logic engine 758 constructs matrix A from the signature sequence 754 and fcw metric 752. Matrix A data is fed into a transformer 760 for processing by a Fourier transform in accordance with the discussions above. The transformed matrix A is fed into an SNR analyzer 762 for SNR analysis and the results are then output.

Figure 52:
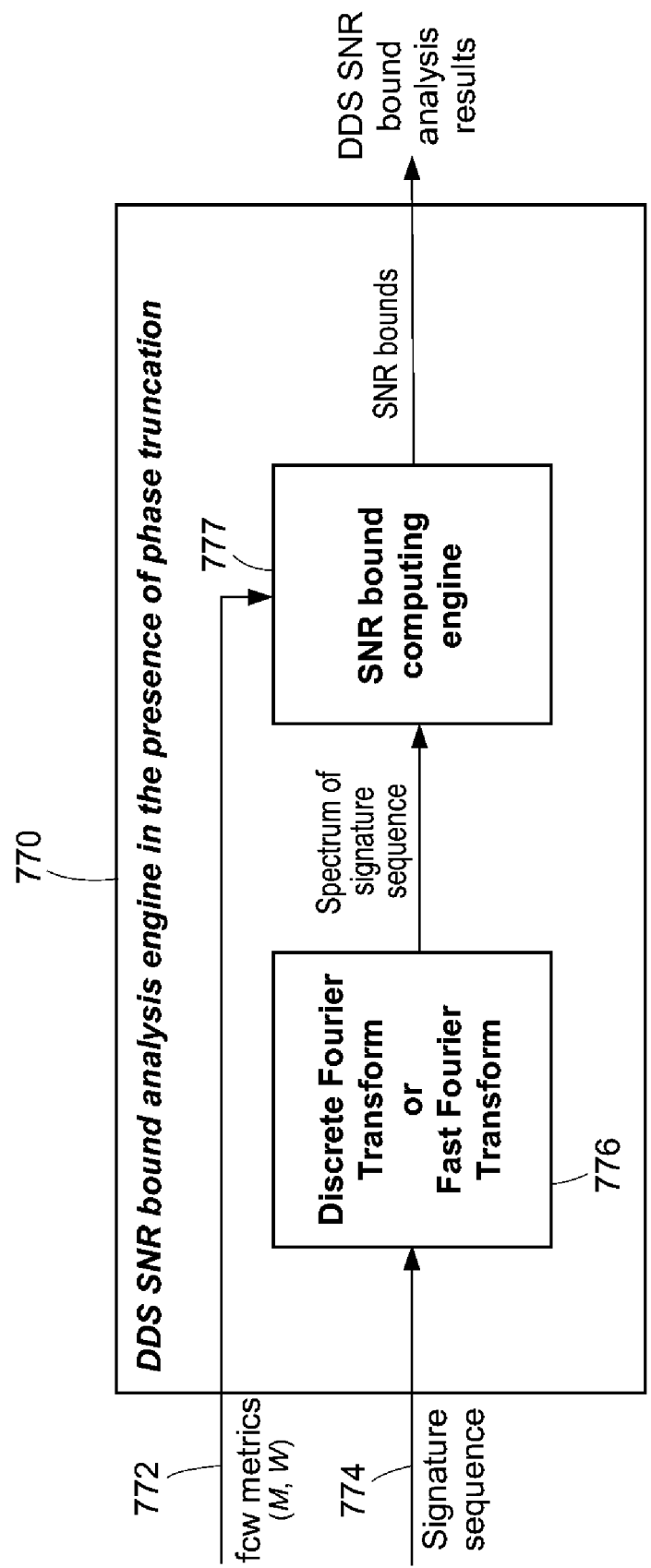
FIG. 52 is a block diagram for DDS signal-to-noise ratio (SNR) bound analysis for fcw generating output(s) affected by phase truncation.

A DDS signal-to-noise ratio (SNR) bound analysis engine 770 for fcw generating output(s) affected by phase truncation, illustrated by FIG. 52, receives inputs including a fcw metric 772 and signature sequence 774. This engine 770 can be applied to sine DDS, cosine DDS, and quadrature DDS in accordance with the methods described above. Signature sequence 774 data is fed into a transformer 776 for processing by a Fourier transform in accordance with the discussions above. The transformed signature sequence data is fed along with the fcw metrics data 772 into an SNR bound computing engine 777 for SNR bound analysis and the results are then output.

Figure 53:
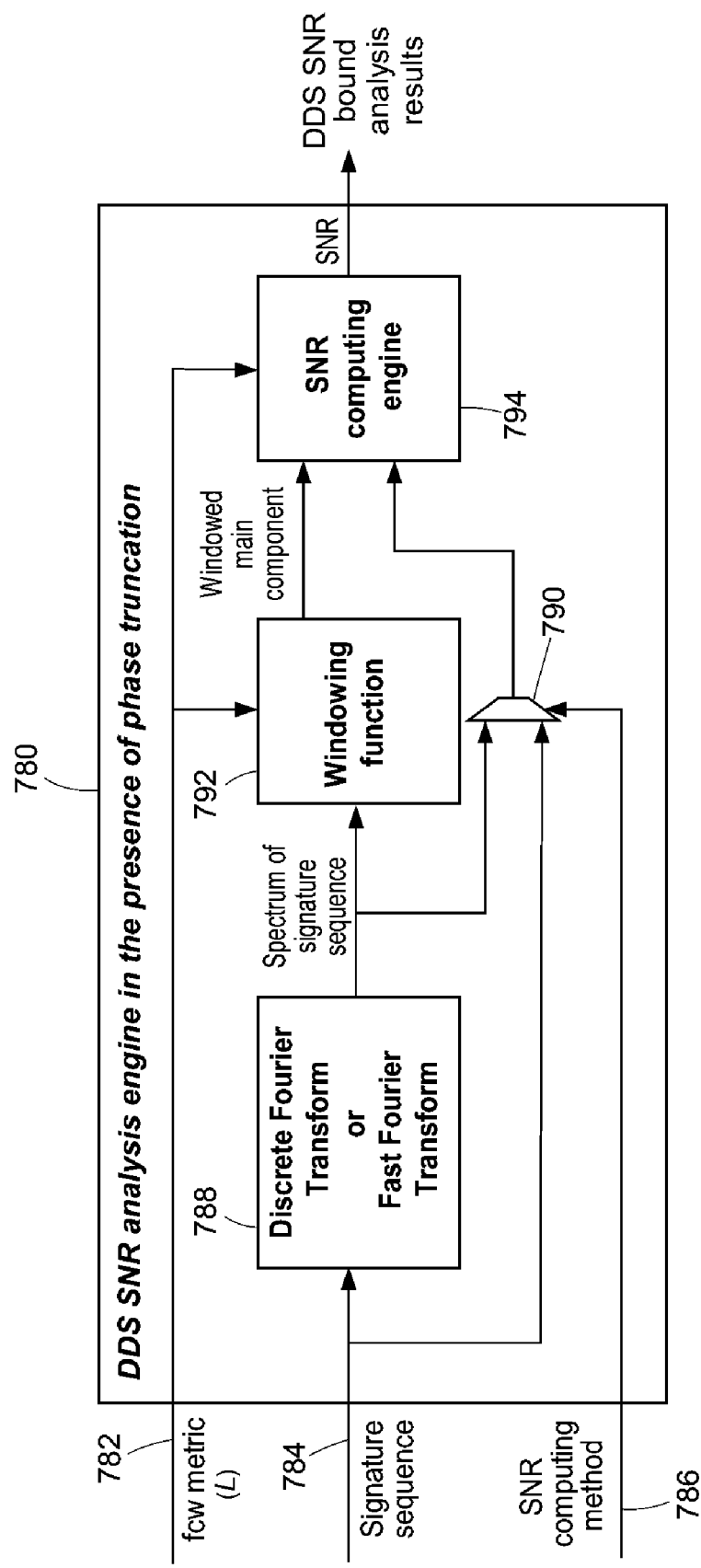
FIG. 53 is a block diagram for DDS signal-to-noise ratio (SNR) analysis for fcw generating output(s) affected by phase truncation.

Also, a DDS signal-to-noise ratio (SNR) analysis engine 780 for fcw generating output(s) affected by phase truncation, illustrated by FIG. 53, receives inputs including a fcw metric 782, signature sequence 784 and SNR computing method flag 786. This engine 780 can be applied to sine DDS, cosine DDS, and quadrature DDS in accordance with the methods described above. Signature sequence 784 data is fed into a transformer 788 for processing by a Fourier transform in accordance with the discussions above as well as a computing gate 790 switched by the SNR computing flag 786. The transformed signature sequence data is fed into the computing gate 790 and is also fed along with the fcw metrics data 782 into a windowing engine 792. The output of the windowing engine along with fcw metric data 782 and the output of the computing gate 790 are fed into an SNR computing engine 794 for SNR analysis and the results are then output.

Figure 54A:
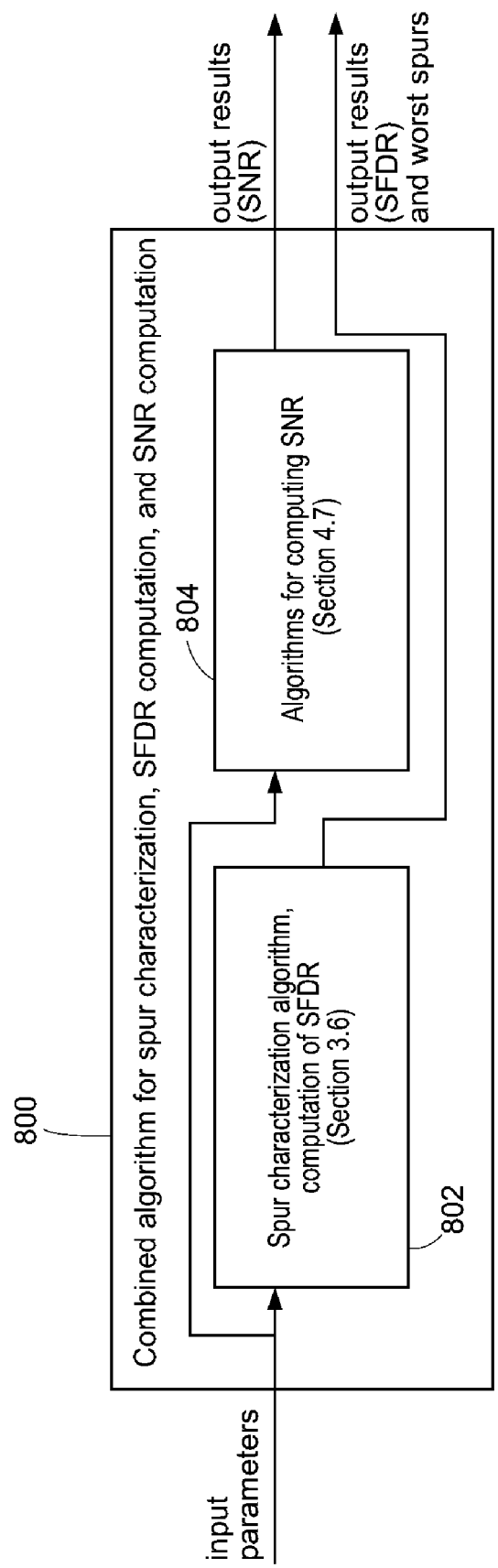
FIG. 54*a* is a block diagram for combined algorithm for spur characterization, SFDR computation, and SNR computation.
Figure 54B:
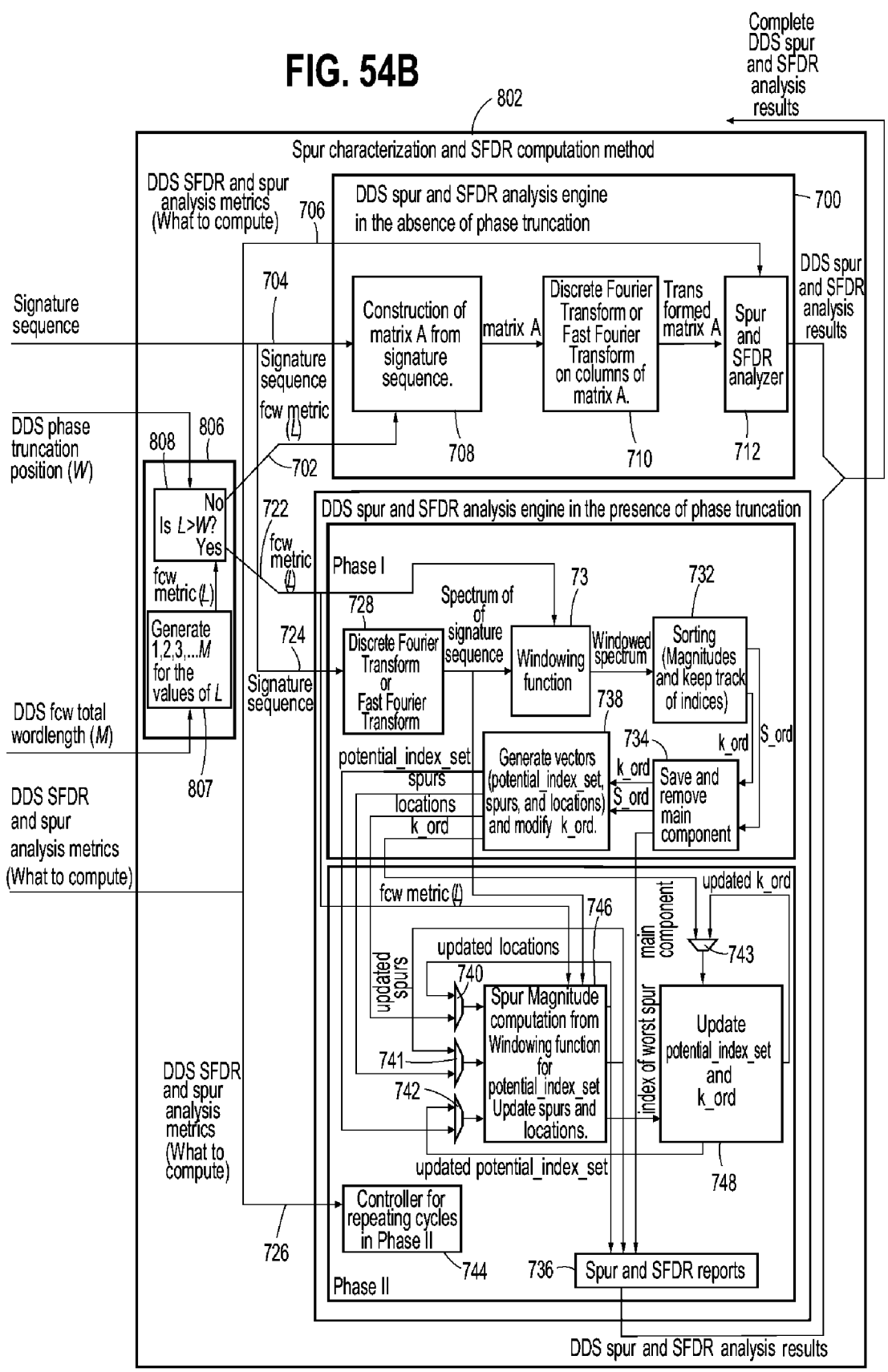
FIG. 54*b* is a block diagram for spur characterization and SFDR computation method.
Figure 54C:
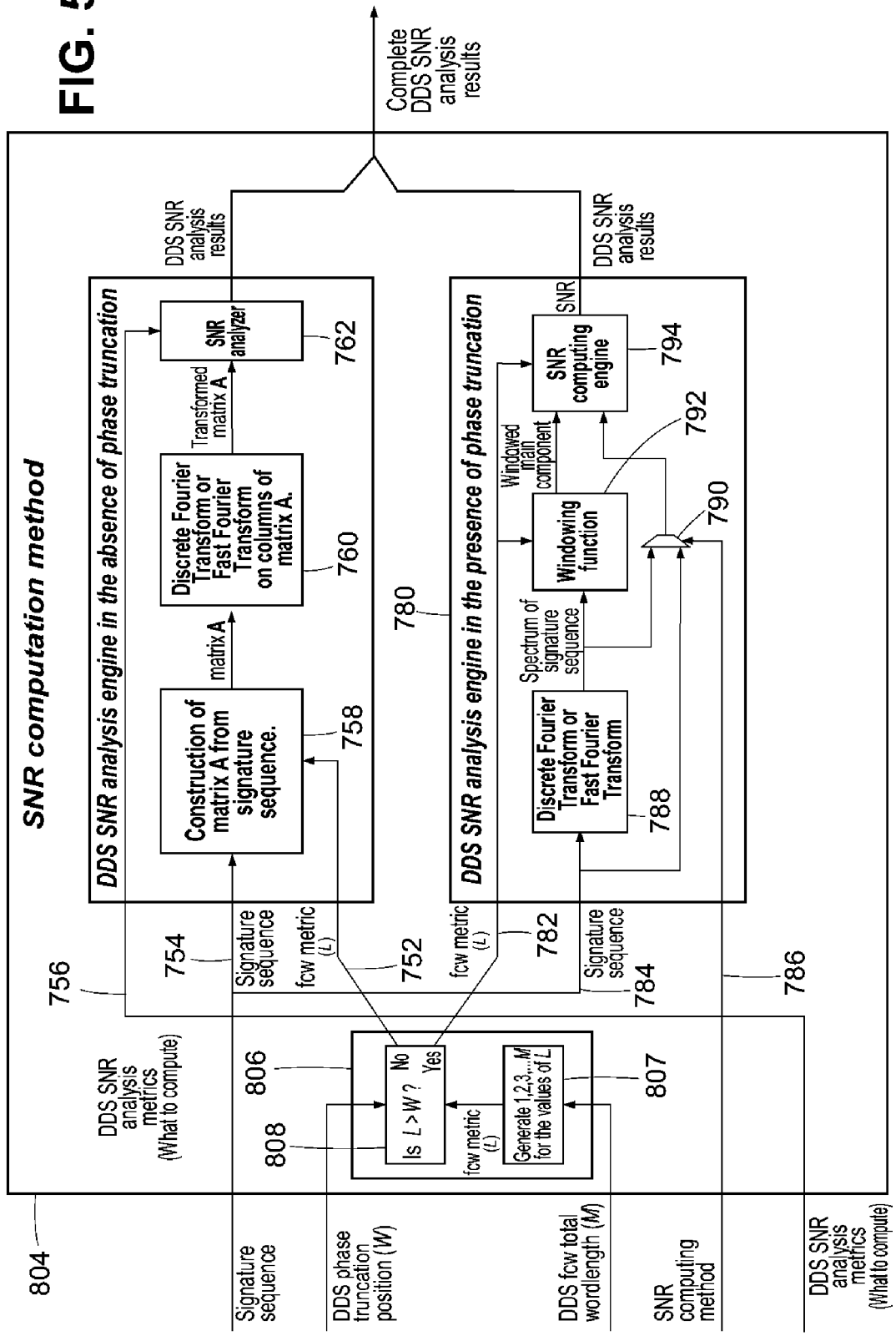
FIG. 54*c* is a block diagram for SNR computation method.
Figure 54D:
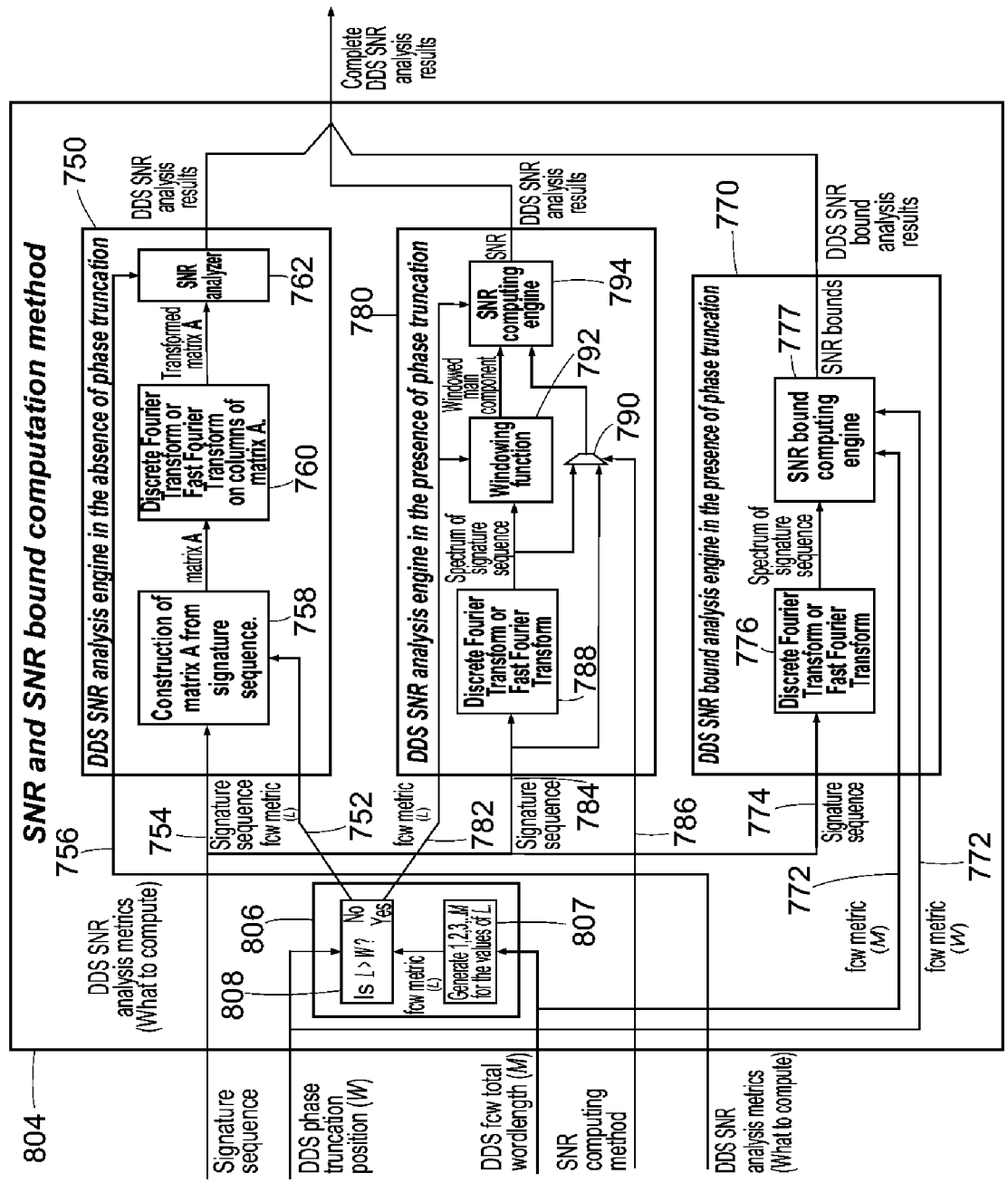
FIG. 54*d* is a block diagram for SNR and SNR bound computation method.

7.2 Combined Method for Spur Characterization, SFDR Computation, and SNR Computation The method of Section 3.7 (which uses the methods of Section 3.5) and the method of Section 4.7 can be combined into a single method for the complete characterization of DDFS. It will compute the magnitudes and locations of the worst N spurs, where N is a user-specified integer, or all magnitudes and locations of the spurs above a user-specified threshold, it will also compute the SFDR for all input fcws and the SNR for all input fcws. FIG. 54a illustrates the combined method 800 in a sketch, where the box titled "Spur characterization method, computation of SFDR" 802 refers to the method of Section 3.7 and the box titled "Method for computing SNR" 804 refers to the method of Section 4.7. Similarly, this method 800 can be used to compute the magnitudes and locations of best N spurs, or N through M spurs, or all spurs below or between user specified thresholds. Similarly, in FIGS. 54b-d where like reference numerals are used to represent like structures, the combined method 800 block 802 (FIG. 54b) can built with the functional architecture of section 7.1 in which a logic controller 806 directs the processing for those input parameters subject to or not subject phase truncation at block 808 and for all values of fcw L within the M range at block 807. Block 804 (FIGS. 54c and d) can also be built with the functional architecture of section 7.1 in which a logic controller 806 directs the processing for those input parameters subject to or not subject phase truncation at block 808 and for all values of fcw L within the M range at block 807.

7.3 Combined Method for Spur Characterization, SFDR Computation, and SNR Computation Which Generates the Sequences s'(n), c'(n), and cs'(n)

The combined method of FIG. 54 can be modified to automatically generate input parameters. For example, the signature sequences s'(n), c'(n), or cs'(n) can be generated by the modified method by utilizing an implementation of the SCMF in FIG. 3. The sequences s'(n), c'(n), or cs'(n) can also be generated by performing a manipulation on the ideal sequences $$s'(n) = \sin\frac{2\pi n}{2^W}, c'(n) = \cos\frac{2\pi n}{2^W},$$

and $$cs'(n) = \cos\frac{2\pi n}{2^W} + j\sin\frac{2\pi n}{2^W}.$$

Rounding them or truncating them to a desired number of bits are examples of such manipulations. Yet another way to generate the sequences s'(n) c'(n), and cs'(n) is by adding noise sequences q(n), $q_{cos}$(n), and $q_{sin}$(n) as in (3.14) and (3.15). A sketch for the combined method 810 which includes a generator 812 that generates s'(n), c'(n), and cs'(n) from some input parameters is depicted in FIG. 55.

7.4 Methods for Spur Characterization and SFDR Computation Which Generates the Sequences s'(n), c'(n), and Cs'(n), and a method for SNR Computation Which Generates the Sequences s'(n), c'(n), and cs'(n)

Figure 55:
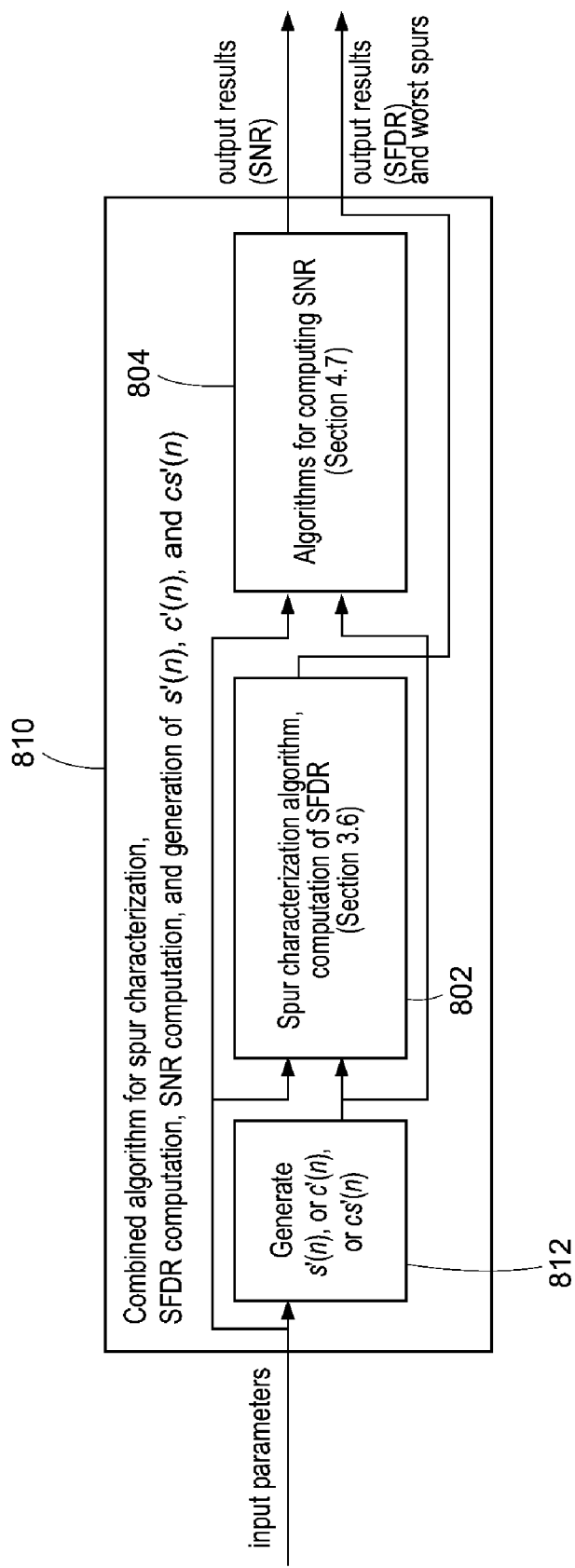
FIG. 55 is a block diagram for combined analysis for spur characterization, SFDR computation, and SNR computation.
Figure 56:
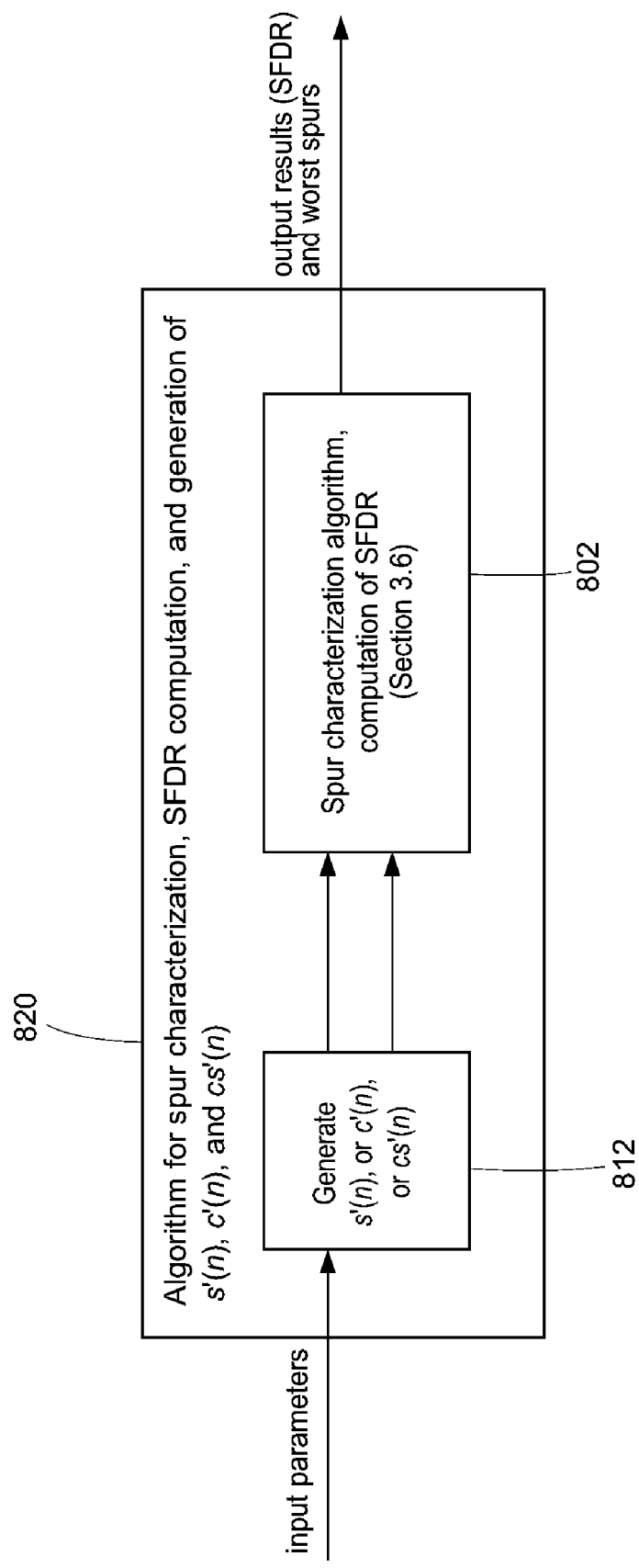
FIG. 56 is a block diagram for spur characterization and SFDR computation.
Figure 57:
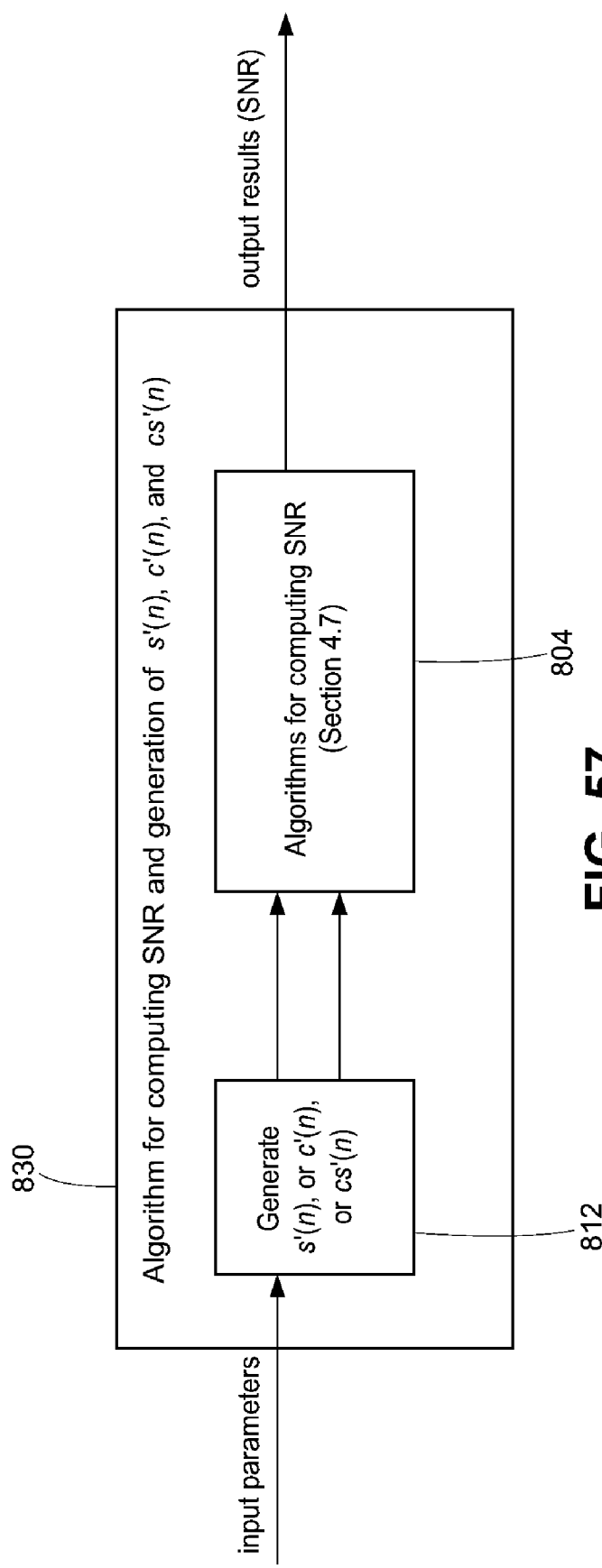
FIG. 57 is a block diagram for SNR computation.

Methods 820 (FIG. 56) and 830 (FIG. 57) similar to that of FIG. 55 using a generator 812 that generates s'(n), c'(n), and cs'(n) from some input parameters and that utilizes only the spur characterization method 802 and SFDR computation of Section 3.7 or only the method 804 for computing the SNR of Section 4.7 is sketched out in FIG. 56 and FIG. 57, respectively.

Figure 58:
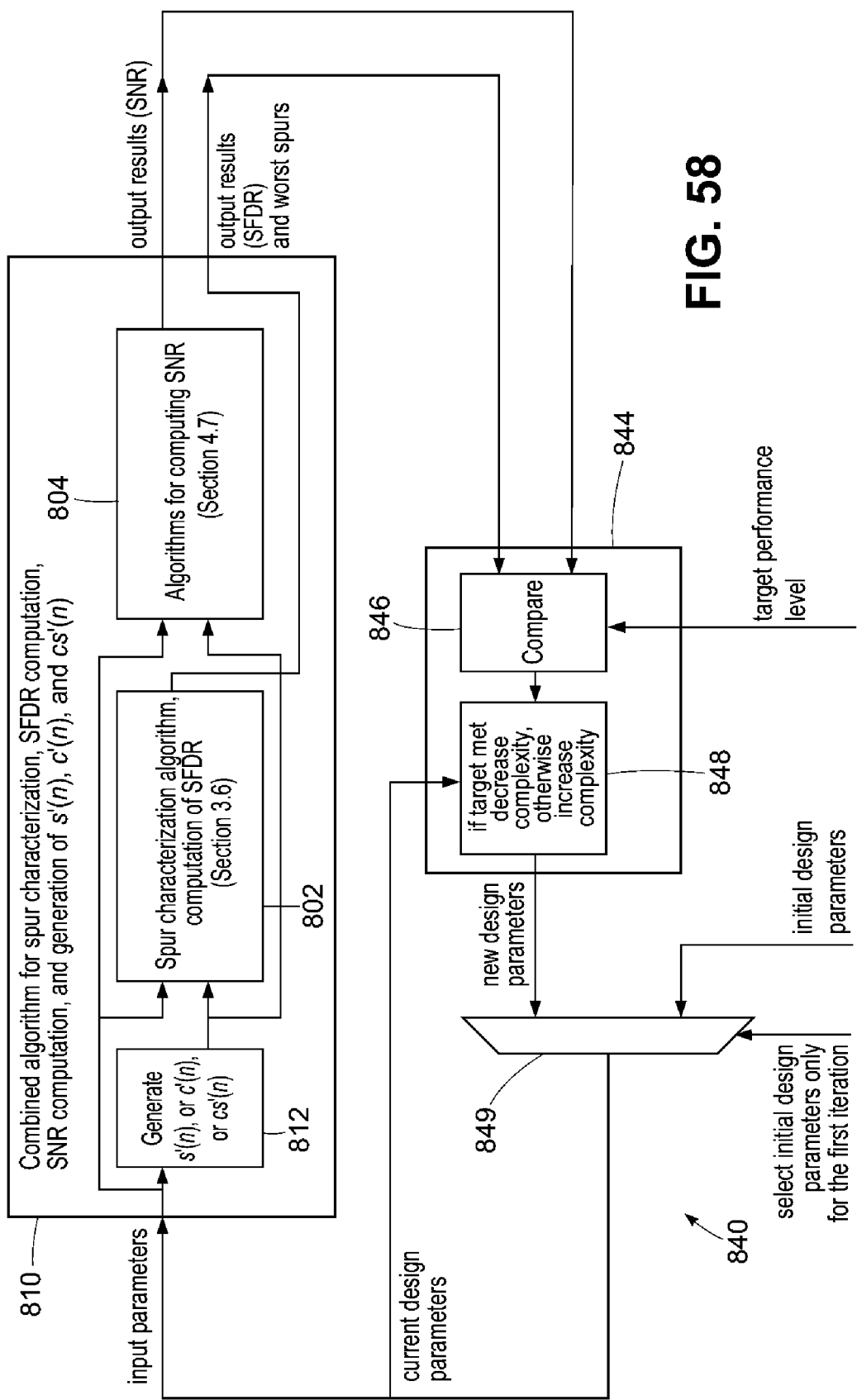
FIG. 58 is a block diagram for DDFS design tool for obtaining best design parameters to meet a specified performance level based on SFDR and SNR.

7.5 DDS Design Tool for Obtaining Best Design Parameters to meet a Specified Performance Level Based on SFDR and SNR As indicated in Section 1, with the assistance of the methods of Section 3.7 and Section 4.7, a DDS design tool 840 (FIG. 58) can be made to perform iterative DDS performance analysis and implementation tradeoffs to converge to the best possible implementation (i.e., DDS design parameters) while still meeting performance and system requirement specifications. A set of initial design parameters 842 can start the design process. With the assistance of the method of FIG. 55 where the generation of the sequences s'(n), c'(n), and cs'(n) is accomplished by applying the input design parameters to the DDS architecture under investigation the DFS performance metrics (i.e., worst spur magnitudes, SFDR, and SNR) can be obtained. Control logic 844 having a comparator 846 and updater 848 review the analyzer 810 results. If the obtained performance metrics are satisfactory, the design parameters can be modified to reduce (or change) the complexity of the DDS implementation. The characterization method of FIG. 55 will then be executed with the new design parameters. On the other hand, if the obtained performance metrics are unsatisfactory, the design parameters can be modified to increase (or change) the performance of the DDS, possibly with an increase in the complexity of the DDS implementation. The characterization method of FIG. 55 will then be executed with the new design parameters controlled by gate 849. Such an iterative procedure will result in the best possible DDS implementation (i.e., DDS implementation with least amount of complexity) while meeting a specified target performance level.

During the iterative cycles, the design parameters can be modified to target a specific aspect of the design. For example, they can be modified to reduce power consumption, or they can be modified to increase the maximum frequency of operation, or they can be modified to reduce the die size, or combination of these and any other aspects of the design.

Figure 59:
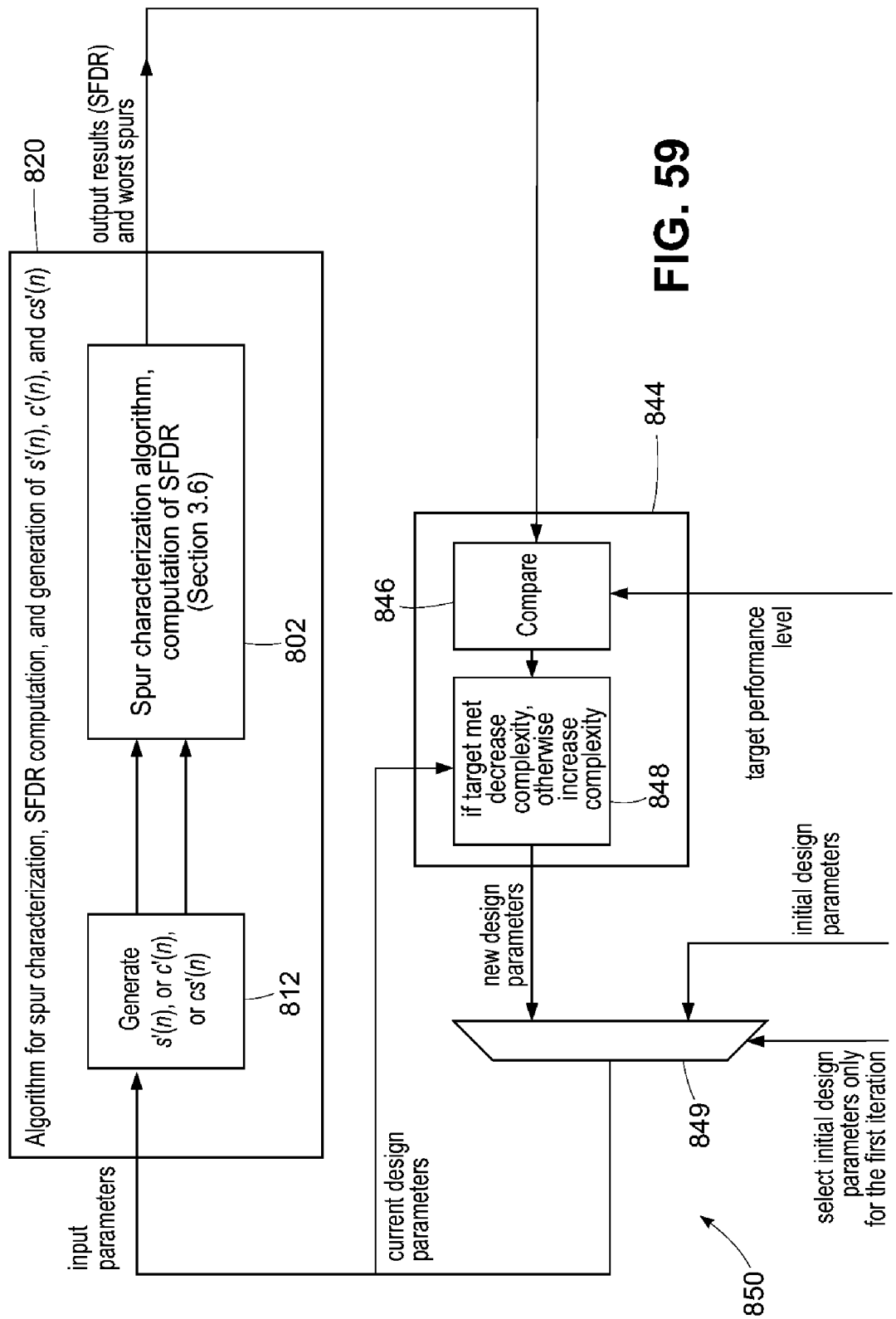
FIG. 59 is a block diagram for DDFS design tool for obtaining best design parameters to meet a specified performance level based on SFDR.
Figure 60:
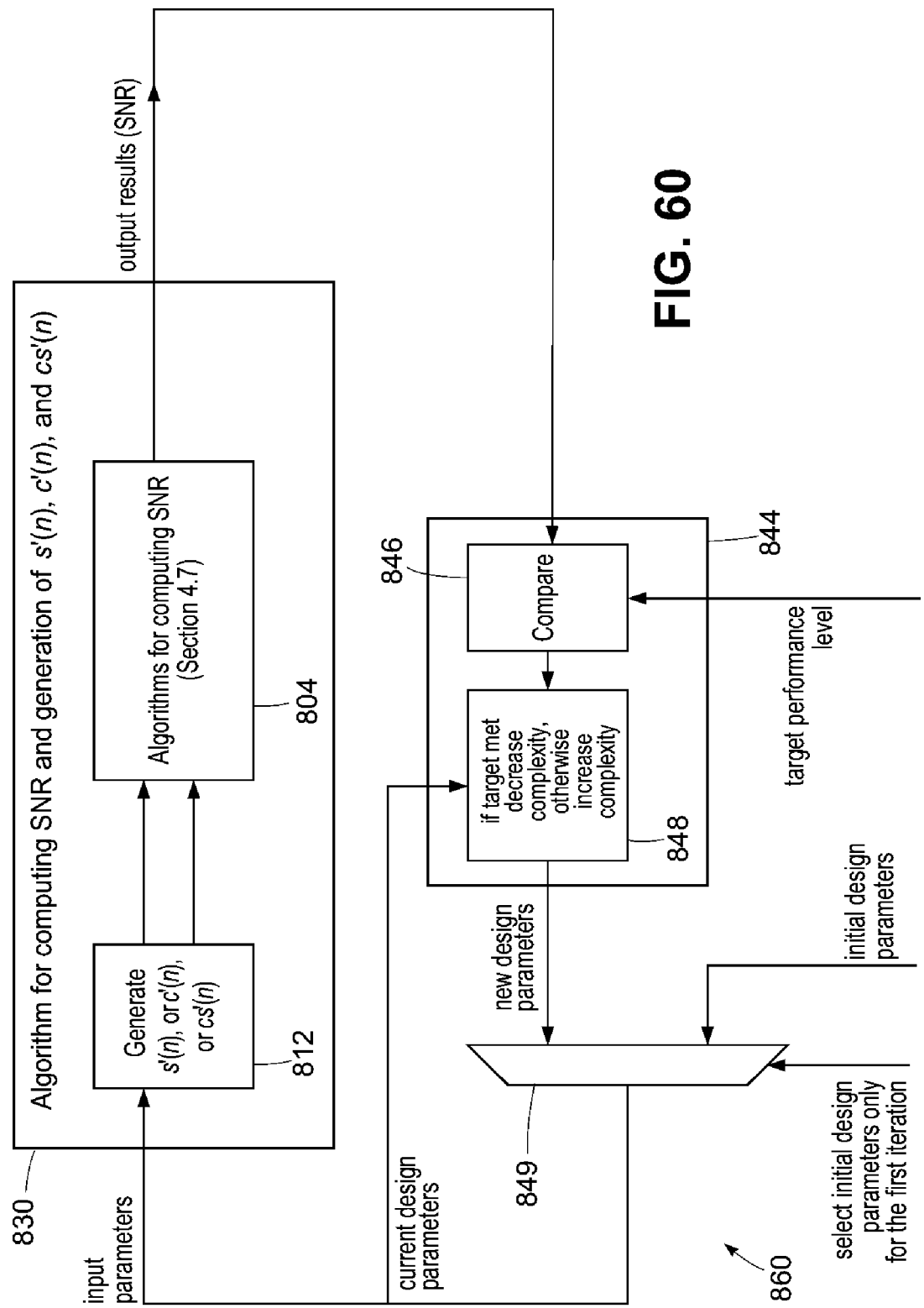
FIG. 60 is a block diagram for DDFS design tool for obtaining best design parameters to meet a specified performance level based on SNR.

7.6 DDS Design Tools for Obtaining Best Design Parameters to Meet a Specified Performance Level Based on SFDR and Based on SNR Independently If the performance metric to be met in a design is just what can be computed by the spur characterization and SFDR computation method of Section 3.7, or if the performance metric to be met is just what can be computed by the method for SNR computation of Section 4.7, then design tool 840 (FIG. 58) can be simplified to design tools 850 (FIG. 59) and 860 (FIG. 60) to include only the method 802 of Section 3.7 or the method 804 of Section 4.7, respectively.

Figure 61:
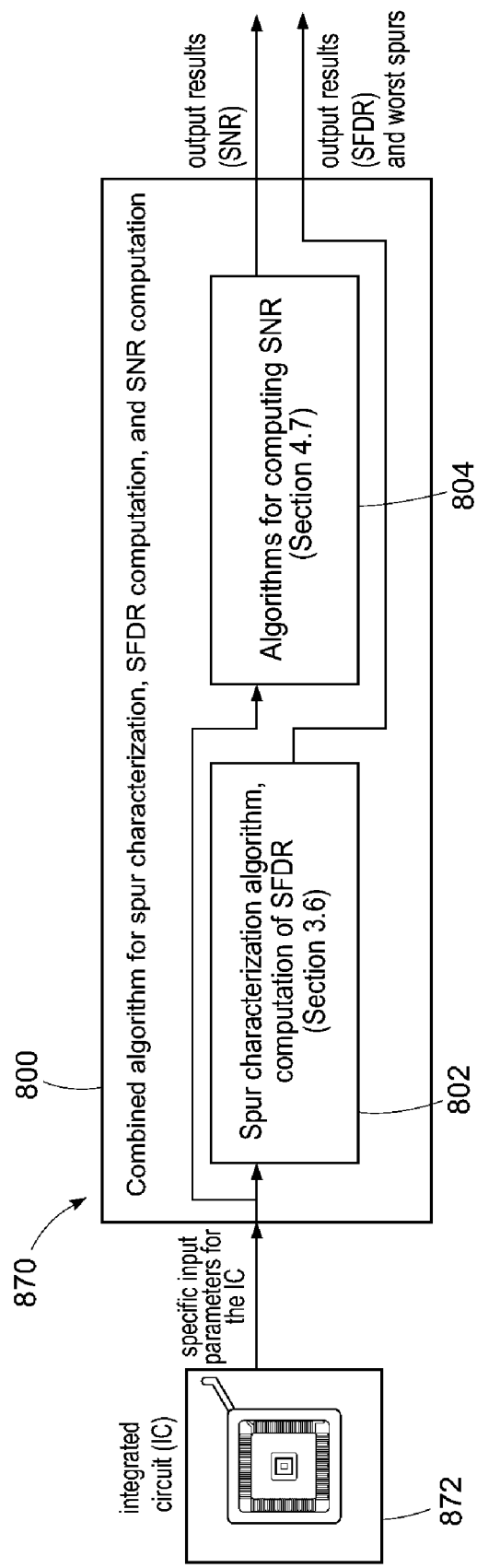
FIG. 61 is a block diagram for performance evaluation of a fabricated IC based on both SFDR and SNR.
Figure 62:
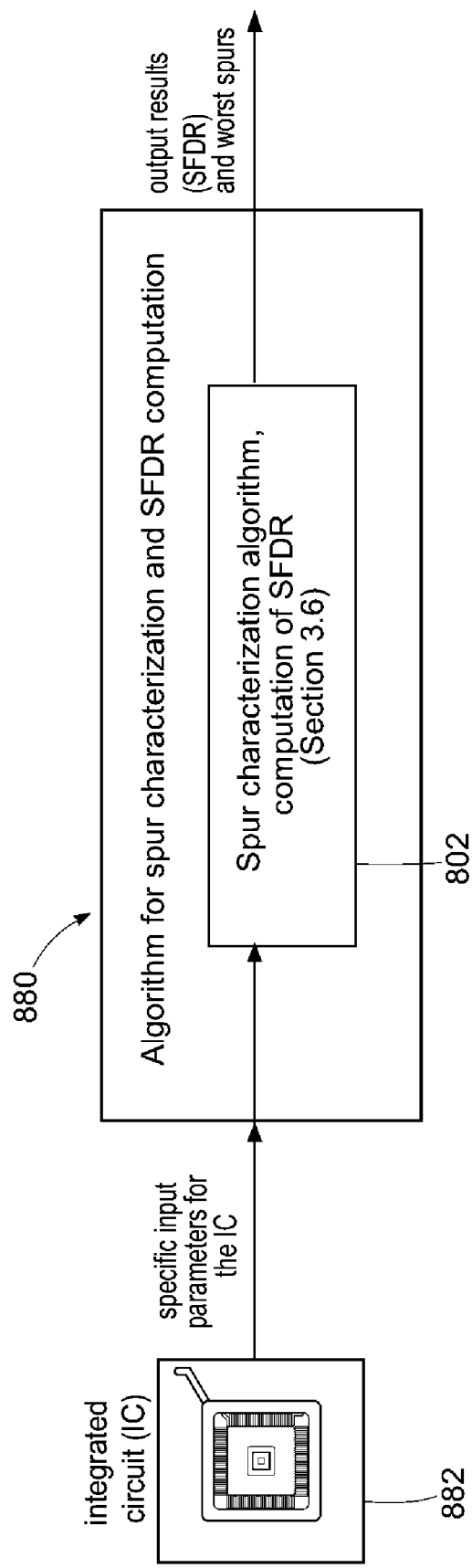
FIG. 62 is a block diagram for performance evaluation of a fabricated IC based on SFDR.
Figure 63:
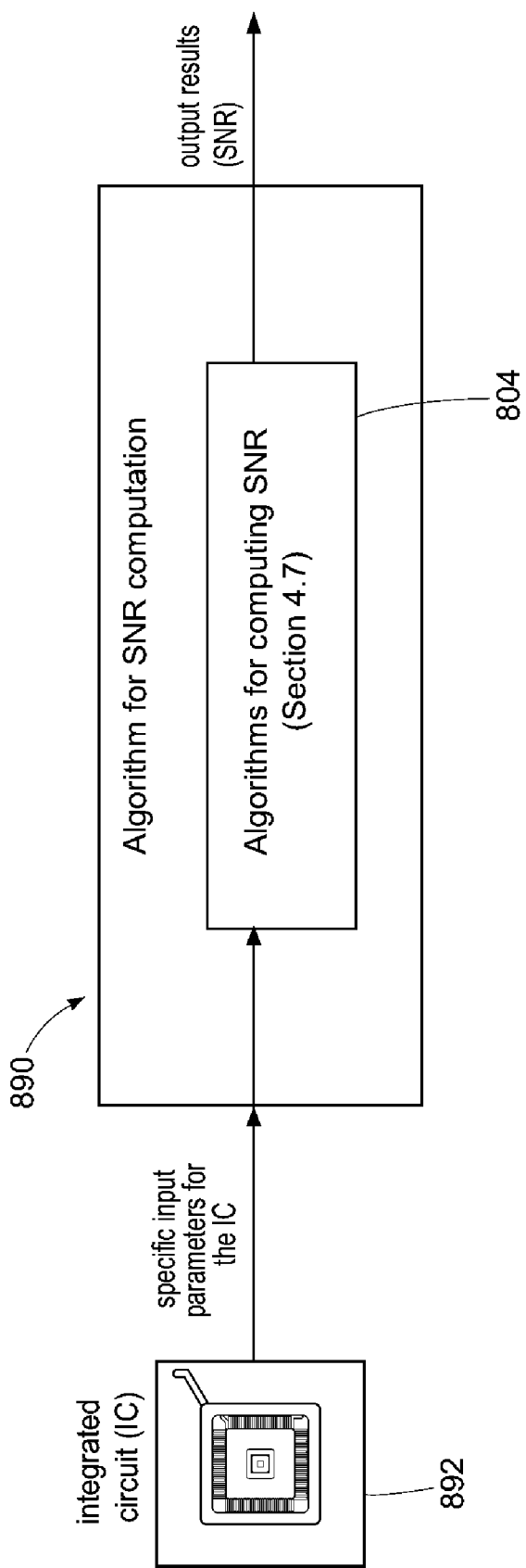
FIG. 63 is a block diagram for performance evaluation of a fabricated IC based on SNR.

7.7 Performance Evaluation of a Fabricated IC, INS=or any Digital Device Precessing Digital Data Based on Both SFDR and SNR, Based on Only SFDR, and Based on Only SNR The methods of Section 3.7 and Section 4.7 can be used to compute specific performance metrics for fabricated integrated circuits INS for specific input fcw, a group of fcw, or all fcw. Performance tools 870 (FIG. 61), 880 (FIG. 62) and 890 (FIG. 63) utilize with a DDS 872 (FIG. 61), 882 (FIG. 62) and 892 (FIG. 63) the use of both methods of Section 3.7 and Section 4.7, the use of only the method of Section 3.7, and the use of only the method of Section 4.7, respectively.

Figure 64:
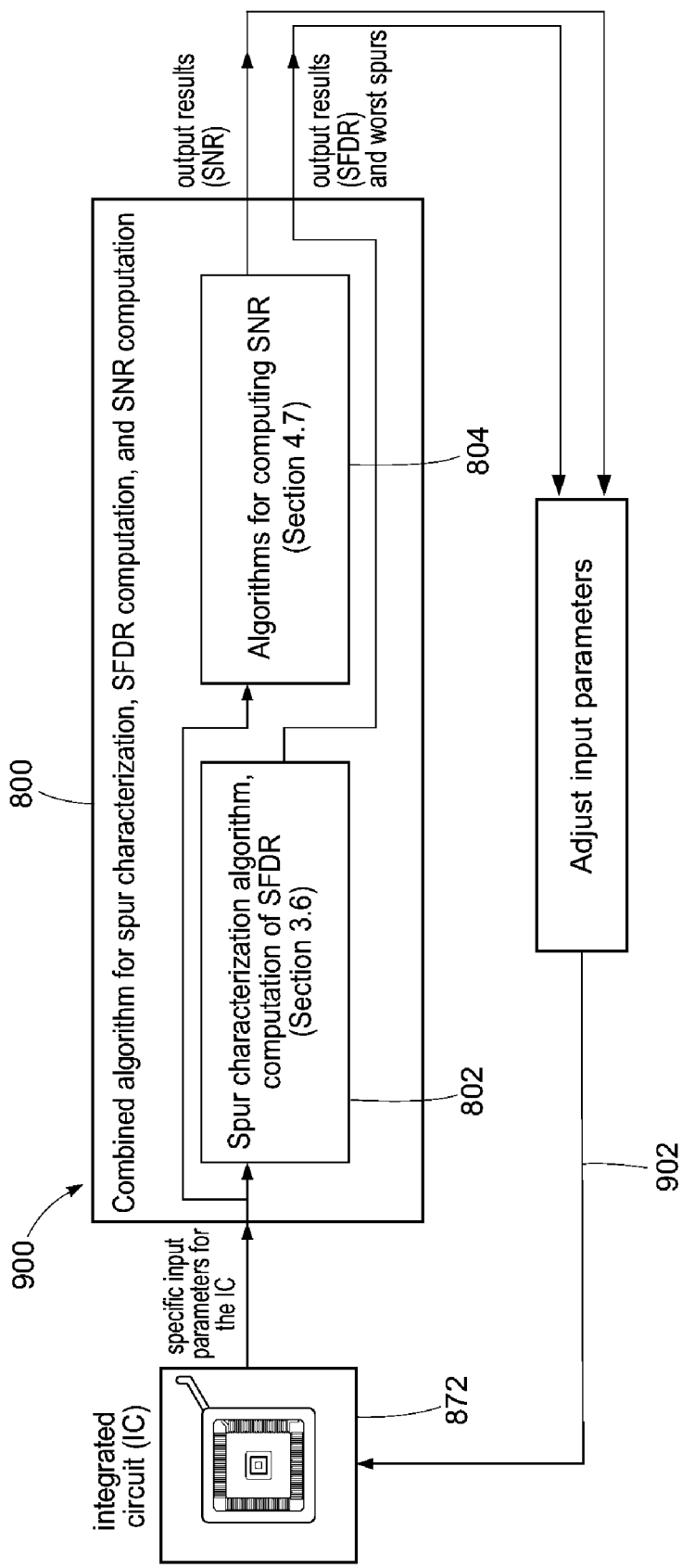
FIG. 64 is a block diagram for performance improvement of a fabricated IC based on both SFDR and SNR.
Figure 65:
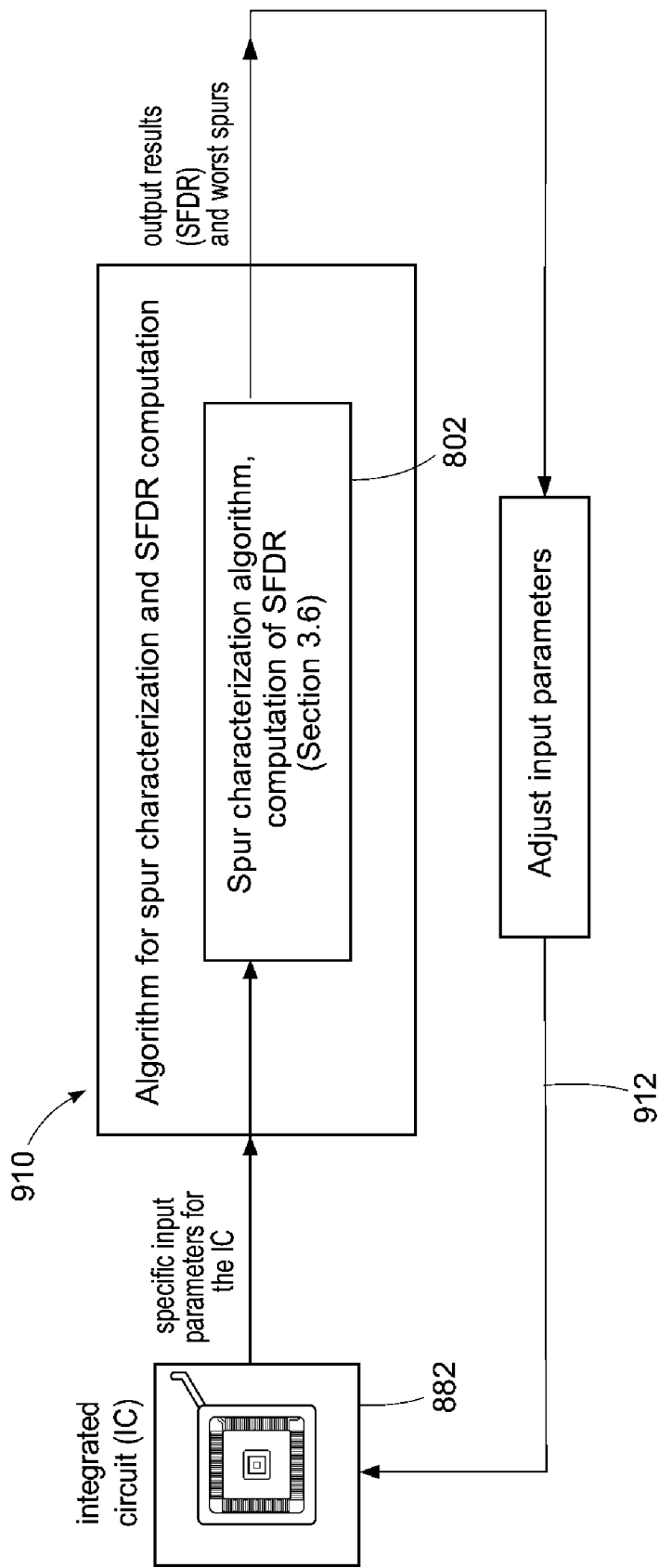
FIG. 65 is a block diagram for performance improvement of a fabricated IC based on SFDR.
Figure 66:
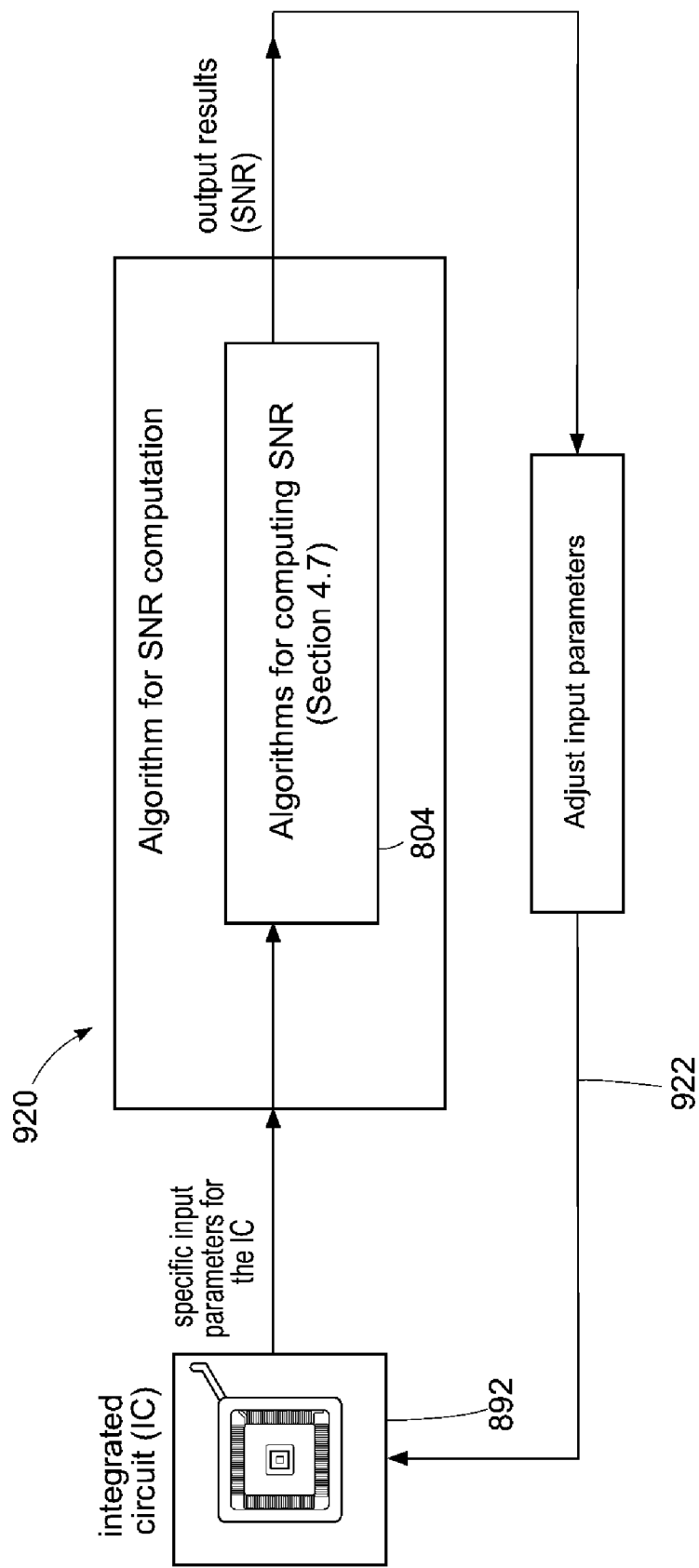
FIG. 66 is a block diagram for performance improvement of a fabricated IC based on SNR.

7.8 Performance Improvement of a Fabricated IC INS Based on Both SFDR and SNR, Based on Only SFDR, and Based on Only SNR The performance of a fabricated IC INS may be improved (or changed) by using the performance evaluation systems 900 (FIG. 64), 910 (FIG. 65) and 920 (FIG. 66) to construct a feedback loop 902 (FIG. 64), 912 (FIG. 65) and 922 (FIG. 66) to adjust the input parameter(s) such as to limit the allowed input fcws.

Figure 67:
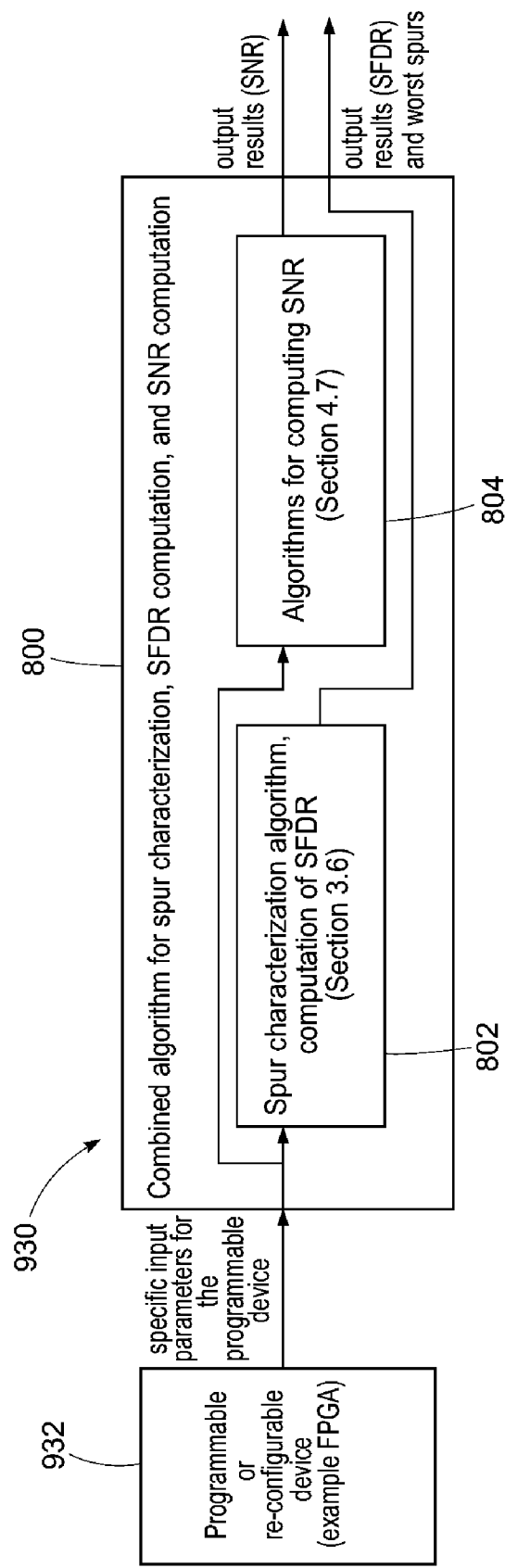
FIG. 67 is a block diagram for performance evaluation of a programmable or re-configurable device based on both SFDR and SNR.
Figure 68:
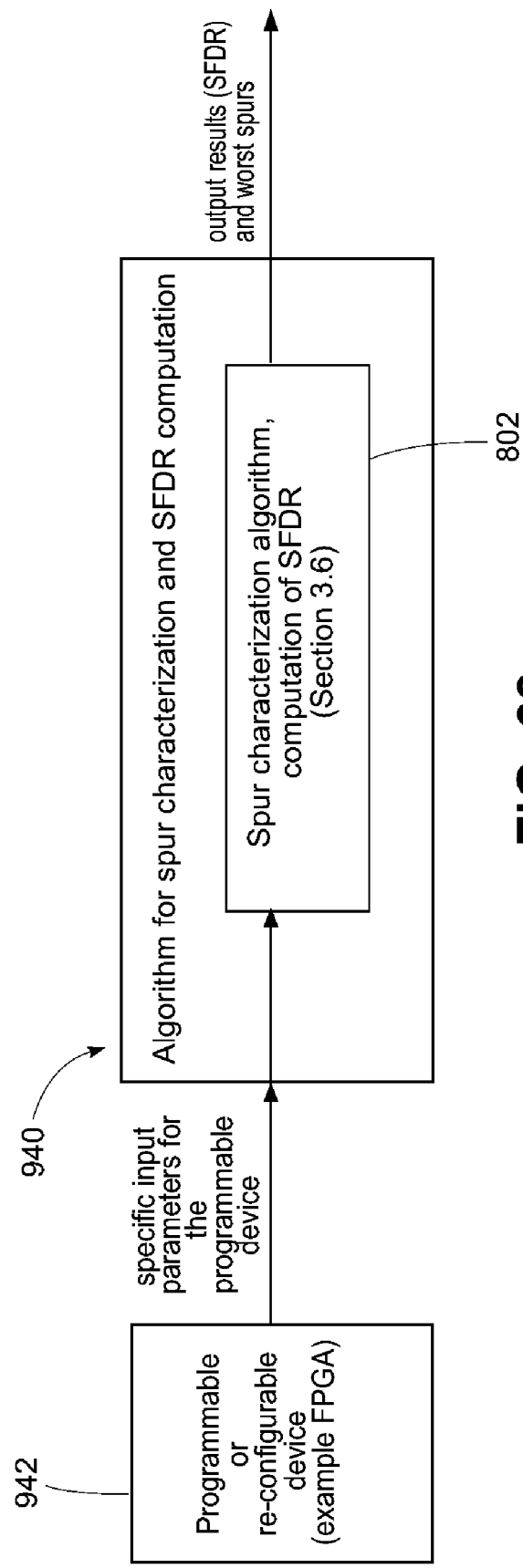
FIG. 68 is a block diagram for performance evaluation of a programmable or re-configurable device based on SFDR.
Figure 69:
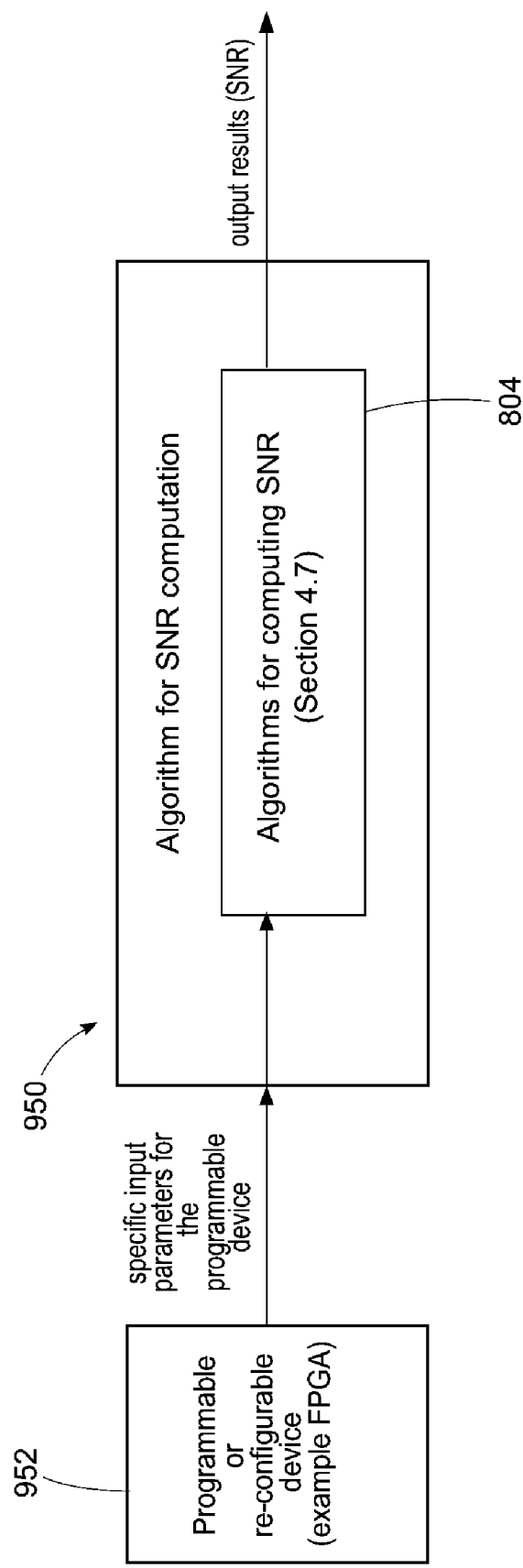
FIG. 69 is a block diagram for performance evaluation of a programmable or re-configurable device based on SNR.

7.9 Performance Evaluation of a Re-Configurable or Programmable Device Based on Both SFDR and SNR, Based on Only SFDR, and Based on Only SNR The methods of Section 3.7 and Section 4.7 can be used to compute specific performance metrics in a re-configurable or programmable environment (such as the one using a field programmable gate array (FPGA)) for specific input fcw, a group of fcw, or all fcw. Performance engines 930 (FIG. 67), 940 (FIG. 68) and 950 (FIG. 69) include the use of both methods 800 (FIG. 54) of Section 3.7 and Section 4.7, the use of only the method 802 of Section 3.7, and the use of only the method 804 of Section 4.7, respectively, with an FPGA 932 (FIG. 67), 942 (FIG. 68), 952 (FIG. 69).

Figure 70:
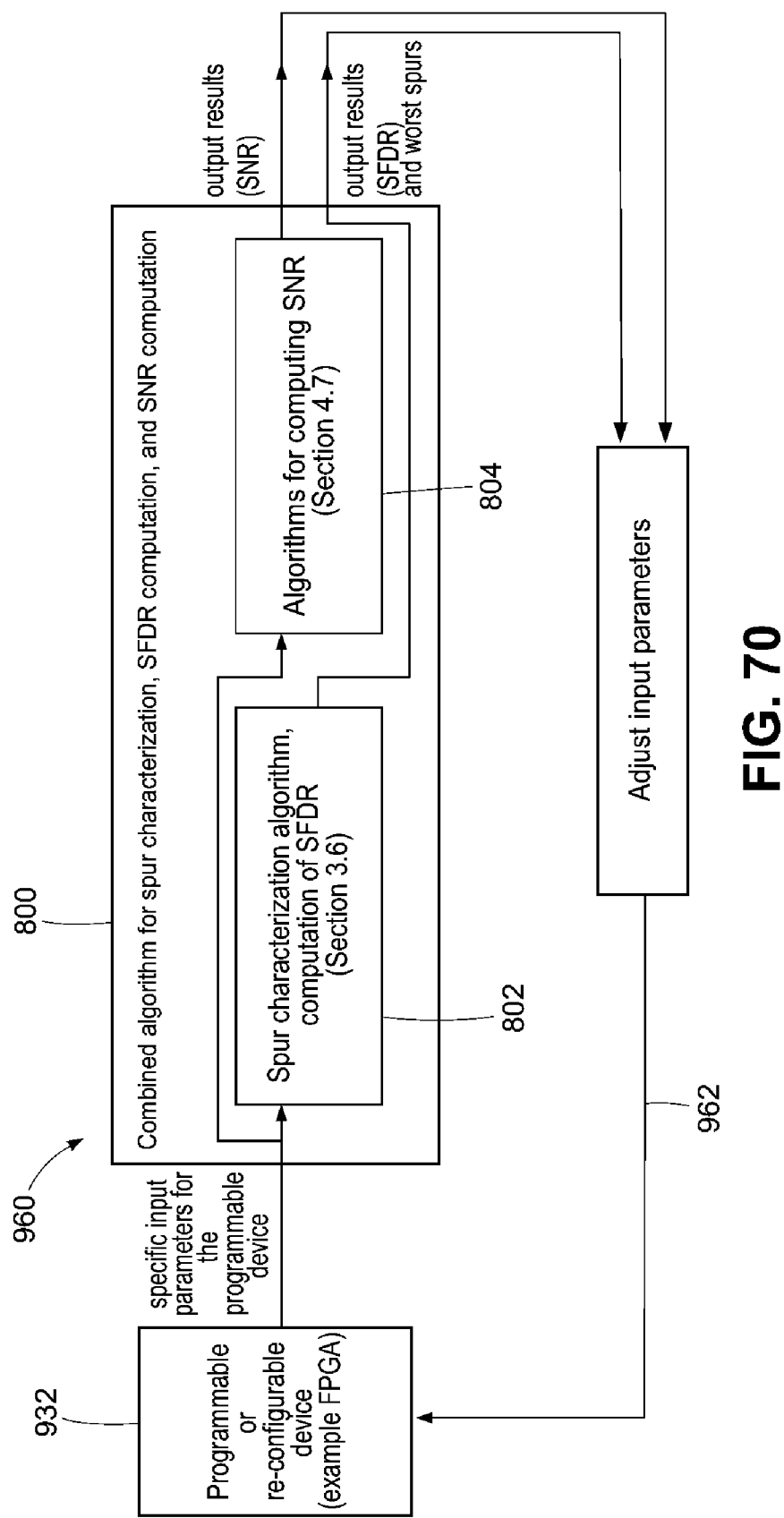
FIG. 70 is a block diagram for performance improvement of a programmable or re-configurable device based on both SFDR and SNR.
Figure 71:
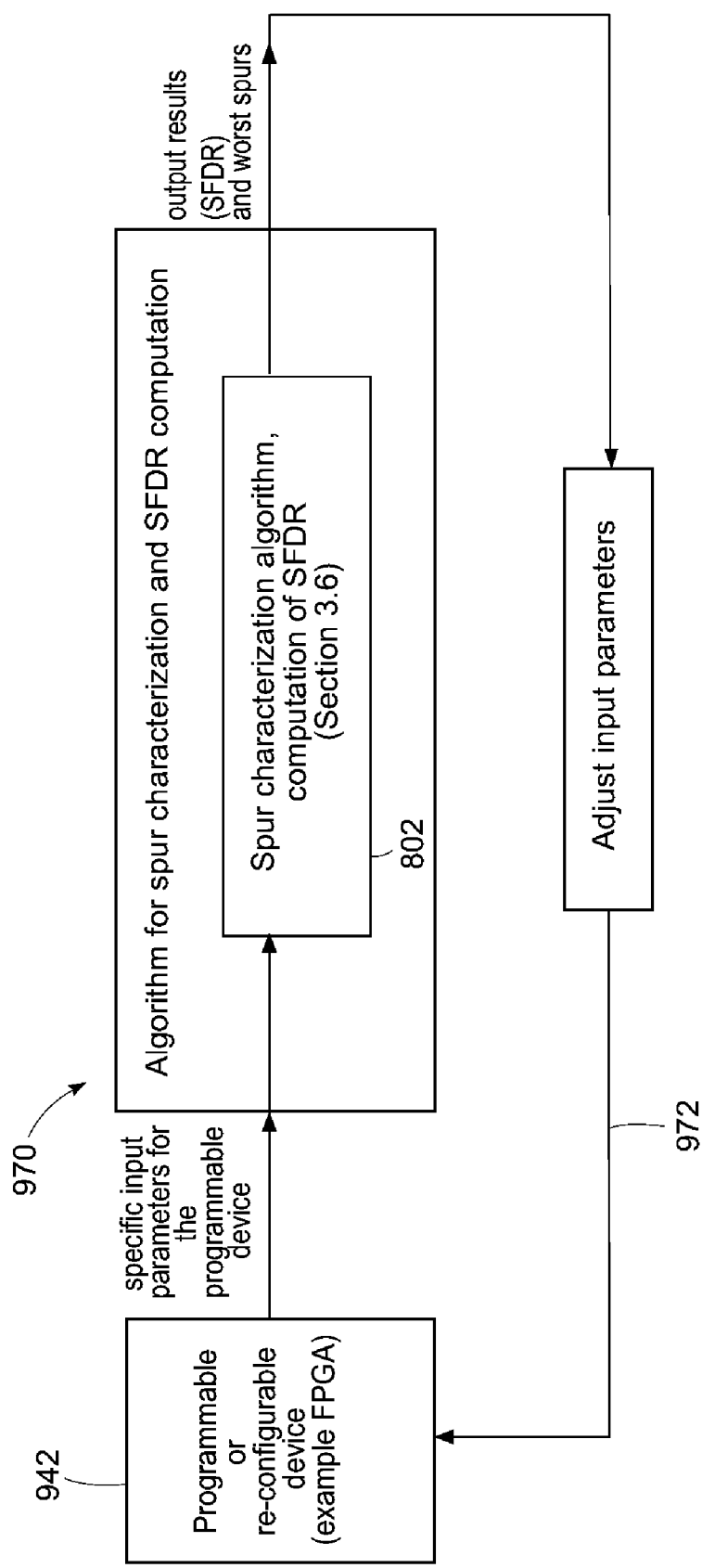
FIG. 71 is a block diagram for performance improvement of a programmable or re-configurable device based on SFDR.
Figure 72:
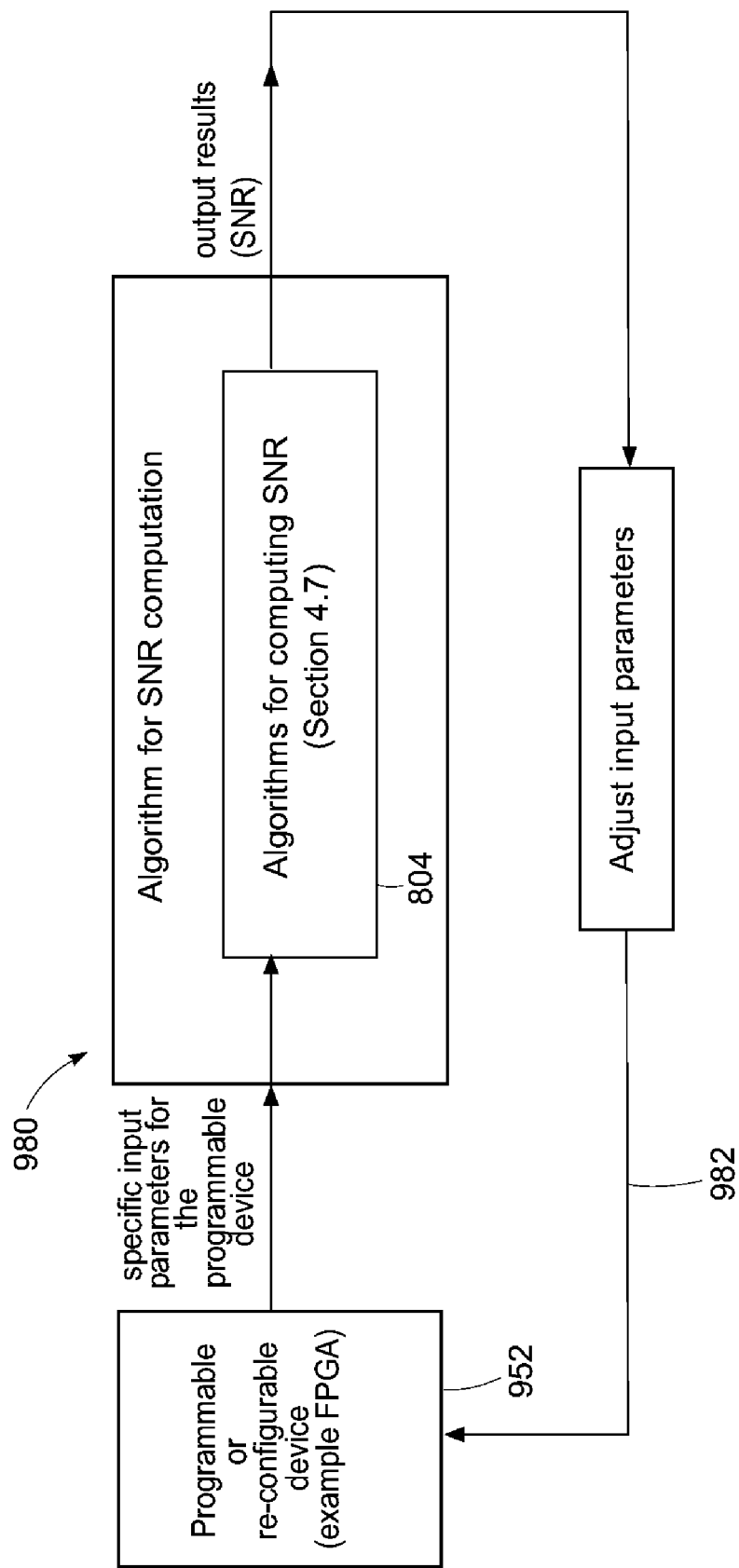
FIG. 72 is a block diagram for performance improvement of a programmable or re-configurable device based on SNR.

7.10 Performance Improvement of a Re-Configurable or Programmable Device Based on Both SFDR and SNR, Based on Only SFDR, and Based on Only SNR The performance of a re-configurable or programmable device (such as the field programmable gate array (FPGA)) may be improved (or changed) by using the performance evaluation systems 960 (FIG. 70), 970 (FIG. 71) and 980 (FIG. 72) to construct a feedback loop 962 (FIG. 70), 972 (FIG. 71) and 982 (FIG. 72) to adjust the input parameter(s) (for example, limit the allowed input fcws).

It will be appreciated by those skilled in the art that all the implementations of methods discussed above are capable of being implemented in hardware, software or any combination thereof.

It will also be appreciated by those skilled in the art that all of the methods discussed above can be applied to DDS implementations embodied in hardware, software, or any combination thereof.

8.1 DDS Analysis Examples

Some of the methods presented have been used for the characterization of the spurs of a DDS/mixer that was designed and built, when configured as a quadrature DDS having 13-bit (11 fractional bit) outputs. The DDS analysis methods were run on a Dell Precision 330 workstation having a 1.7 GHz Pentium 4 processor and 512 MB of RAM. The following results were obtained for the complete DDS spur and SNR characterization methods of Sections 3.7 and 4.7, respectively.

1. With W=15, M=32, and N=10 (i.e., characterization of worst 10 spurs), the complete DDS characterization method (i.e., for M single-nonzero-bit fcw, computing the magnitudes and identifying the locations of the worst 10 spurs and computing the SNR for each one of the M single-nonzero-bit fcw) took 3.36 seconds to complete.

2. With W=15, M=32, and N=100 (i.e., characterization of worst 100 spurs), the complete DDS characterization method (i.e., for M single-nonzero-bit fcw, computing the magnitudes and identifying the locations of the worst 100 spurs and computing the SNR for each one of the M single-nonzero-bit fcw) took 6.922 seconds to complete.

For the complete DDS characterization, such as in the examples above, with every additional bit increase for both W and M the method will take approximately 2.2 times longer to complete. Table 7.1 lists the runtime for the complete DDS characterization for various values of W, M, and N. For example, based on the results of Example 2 above, but with W=19, M=36, and N=100, one would expect the method to complete in approximately $6.922 \times 2.2^{(19-15)} = 6.922 \times 2.2^4 = 162.152$ seconds, which is close to the result (165.438 sec.) reported in Table 7.1.

TABLE 7.1

Run times for complete DDS characterization with various values of W, M, and N.

|  | N = 10 | N = 100 |
|---|---|---|
| W = 15, M = 32 | 3.360 sec. | 6.922 sec. |
| W = 16, M = 33 | 8.110 sec. | 14.016 sec. |
| W = 17, M = 34 | 15.625 sec. | 30.171 sec. |
| W = 18, M = 35 | 33.984 sec. | 76.172 sec. |
| W = 19, M = 36 | 72.891 sec. | 165.438 sec. |
| W = 20, M = 37 | 161.578 sec. | 370.078 sec. |

It will be appreciated by those skilled in the art, that the principles underlying the present invention are concluded in section 6 with a Fast Fourier Transform (FFT) method specifically devised for the computation of DDS output spectra arising from fcw that are void of any phase truncation. For such fcw it is shown that the initial phase conditions can have a significant impact on the DDS output spectrum. Therefore, the complete DDS characterization needs to address all possible initial conditions. The presently developed nested decimation-in-time FFT method computes the FFT of the DDS signature sequence, which is necessary for the characterization of spurs from fcw generating phase truncation, in such a way that the DDS spectra corresponding to all fcw generating no phase truncation and all of their corresponding initial phase conditions are intermediate results. It should be noted that the developed FFT method computes the transform of the signature sequence in the most efficient way; in other words, the efficiency of performing the FFT of the signature sequence is not reduced by the generation of all of the desired intermediate results.

It will be understood that certain features and sub-combinations are of utility and may be employed without reference to other features and sub-combinations as they are outlined within the claims. While the preferred embodiment and application of the invention has been described, it is apparent to those skilled in the art that the objects and features of the present invention are only limited as set forth in claims attached hereto.

What is claimed is:

1. A system for analyzing spurs from a direct digital frequency synthesizer (DDS) comprising:
an engine to compute all DDS spur magnitudes that are greater than a threshold value, wherein the system employs a technique that avoids the computing of every DDS spur magnitude.

2. The system of claim 1 wherein said engine includes:
an engine to perform discrete Fourier transform (DFT) computations; and
a windowing engine to reduce the total amount of computations performed.

3. The system of claim 2 wherein:
said DFT engine computes $|S'_W(k)|$ from $s'(n)$ for $0 \leq k < 2^W$; and
said windowing engine computes $|S_{W,B}(k)| = |V_{W,B}(k)||S'_W(k)|$ for $0 \leq k < 2^W$.

4. The system of claim 1 wherein said threshold is user specified.

5. A direct digital frequency synthesizer (DDS) analysis system comprising:
an engine to compute spurs due to phase-to-amplitude mapping imprecision, for a DDS, that includes influence of initial conditions of a DDS phase accumulator on values of DDS spur magnitudes.

6. The system of claim 5 wherein said engine includes an engine to perform discrete Fourier transform (DFT) computations.

7. The system of claim 6 wherein said DFT engine performs multiple transforms each pertaining to a different initial condition.

8. A system for characterizing spurs in a direct digital frequency synthesizer using input parameters from said direct digital frequency synthesizer comprising:
an engine to compute one of the largest spur magnitudes, in a set of spurs among all spurs caused by phase truncation and phase-to-amplitude mapping imprecision, for a direct digital frequency synthesizer (DDS), wherein the system avoids the computing of every DDS spur magnitude;
wherein said engine includes:
a windowing engine to reduce computational complexity.

9. The system of claim 8 wherein said set is the set of all spurs caused by phase truncation and phase-to-amplitude mapping imprecision.

10. The system of claim 8 wherein said windowing engine includes:
a sorting engine to locate, size, and arrange spurs and correspondingly arrange their locations.

11. The system of claim 8 wherein said engine includes:
an engine to perform discrete Fourier transform (DFT) computations.

12. The system of claim 11 wherein said engine further includes:
a sorting engine to locate, size, and arrange spurs and correspondingly arrange their locations;
said DFT engine computes $|S'_W(k)|$ from $s'(n)$ for $0 \leq k < 2^W$; and
said windowing engine computes $|S_{W,B}(k)| = |V_{W,B}(k)||S'_W(k)|$ for $0 \leq k < 2^W$.

13. The system of claim 8 wherein said one of the largest spur magnitudes is the N-th largest spur, where N is a specified positive integer.

14. The system of claim 8 wherein said set is the set of all spurs caused by phase-to-amplitude mapping imprecision.

15. A DDS analysis system comprising:
an engine to compute spur magnitudes for spurs in a direct digital frequency synthesizer (DDS), including spurs caused by phase-to-amplitude mapping imprecision;
said engine including:
an engine to perform discrete Fourier transform (DFT) computations; and
a windowing engine to reduce the total amount of computations performed.

16. The system of claim 15 wherein said engine receives input data from said DDS including a DDS signature sequence, a DDS phase accumulator word length, and a length of the truncated DDS phase word.

17. The system of claim 16 wherein said engine computes spur magnitudes for spurs caused by phase truncation and phase-to-amplitude mapping imprecision.

18. The system of claim 15 wherein:
said DFT engine computes $|S'_W(k)|$ from $s'(n)$ for $0 \leq k \leq 2^W$; and
said windowing engine computes $|S_{W,B}(k)| = |V_{W,B}(k)||S'_W(k)|$ for $0 \leq k \leq 2^W$.

19. The system of claim 15 wherein said windowing engine includes:
an engine to sort spurs in the order of decreasing magnitudes.

20. The system of claim 19, wherein said sorting engine and said windowing engine identify relationships between spurs thereby reducing computational complexity of said windowing engine.

21. The system of claim 20 wherein said DFT engine uses a sequence length to satisfy a DDS-output periodicity property to enable exact computation of DDS spurs.

22. The system of claim 15 wherein said engine computes spur magnitudes for spurs caused by phase truncation and phase-to-amplitude mapping imprecision.

23. The system of claim 15 wherein said DFT engine uses a sequence length to satisfy a DDS-output periodicity property to enable exact computation of DDS spurs.

24. The system of claim 15 wherein said windowing engine includes:
   a sorting engine to locate, size, and arrange spurs and correspondingly arrange their locations.

25. A system for characterizing spurs in a direct digital frequency synthesizer using input parameters from said direct digital frequency synthesizer comprising:
   an engine to compute one of the largest spur magnitudes, in a set of spurs among all spurs caused by phase truncation and phase-to-amplitude mapping imprecision, for a direct digital frequency synthesizer (DDS), wherein the system avoids the computing of every DDS spur magnitude;
   wherein said engine is under control of software to perform the steps of:
   a. computing $S'_W(k)$ from $s'(n)$ for $0 \leq k < 2^W$;
   b. computing $|S_{W,B}(k)| = |V_{W,B}(k)||S'_W(k)|$ for $0 \leq k \leq 2^W$
   c. sorting in a magnitude vector in the order of decreasing magnitudes and also keeping track of indices in an indicia vector, where a first element of the sorted indicia vector is 1, corresponding to the index of a main component, and a first element of the magnitude vector will contain a magnitude of the main component;
   d. saving the magnitude of the main component and removing the main component magnitude value from the magnitude vector and removing the main component index from the indicia vector;
   e. constructing a next-location vector which keeps track of the potential locations for the next largest-magnitude spur, initializing the next-location vector with the first element of the indicia vector, and removing that first element from the indicia vector, and appending the next-location vector with a second potential location;
   f. creating two vectors, spur magnitudes and spur locations, to store the magnitudes and locations of the largest-magnitude spurs; and
   g. computing spur magnitudes for indices in the next-location vector and storing the magnitude and location of the resulting largest-magnitude spur in the magnitude and location vectors respectively and updating the next-location vector for the computation of the next largest-magnitude spur.

26. The system of claim 25 wherein for each of the largest-magnitude spurs said computing engine is further adapted to update said next-location vector and repeat step g for a range of spur magnitudes.

* * * * *